(12) United States Patent
Challa et al.

(10) Patent No.: US 7,855,415 B2
(45) Date of Patent: Dec. 21, 2010

(54) POWER SEMICONDUCTOR DEVICES HAVING TERMINATION STRUCTURES AND METHODS OF MANUFACTURE

(75) Inventors: Ashok Challa, Sandy, UT (US); Jaegil Lee, Puchon-Si (KR); Jinyoung Jung, Kyunggi-do (KR); Hocheol Jang, Kyoungki-do (KR)

(73) Assignee: Fairchild Semiconductor Corporation, South Portland, ME (US)

( * ) Notice: Subject to any disclaimer, the term of this patent is extended or adjusted under 35 U.S.C. 154(b) by 86 days.

(21) Appl. No.: 12/032,123

(22) Filed: Feb. 15, 2008

(65) Prior Publication Data

US 2008/0135931 A1 Jun. 12, 2008

Related U.S. Application Data

(63) Continuation of application No. 11/026,276, filed on Dec. 29, 2004, now Pat. No. 7,345,342, and a continuation-in-part of application No. 10/640,742, filed on Aug. 14, 2003, now Pat. No. 6,870,220, and a continuation-in-part of application No. 10/442,670, filed on May 20, 2003, now Pat. No. 6,916,745.

(60) Provisional application No. 60/533,790, filed on Dec. 30, 2003.

(51) Int. Cl.
*H01L 29/78* (2006.01)
(52) U.S. Cl. ............... 257/341; 257/331; 257/492; 257/E29.2; 257/E29.257; 257/E29.201
(58) Field of Classification Search ............... 257/341
See application file for complete search history.

(56) References Cited

U.S. PATENT DOCUMENTS 3,404,295 A 10/1968 Warner et al.

(Continued)

FOREIGN PATENT DOCUMENTS

CN 1036666 A 10/1989

(Continued)

OTHER PUBLICATIONS

German Patent and Trademark Office (DPMA) office action for DPMA patent application DE202004021424.5 (Aug. 29, 2008 ).

(Continued)

*Primary Examiner*—Jerome Jackson, Jr.
(74) *Attorney, Agent, or Firm*—Townsend and Townsend and Crew LLP

(57) ABSTRACT

A semiconductor power device includes a drift region of a first conductivity type, a well region extending above the drift region and having a second conductivity type opposite the first conductivity type, an active trench extending through the well region and into the drift region, source regions having the first conductivity type formed in the well region adjacent the active trench, and a first termination trench extending below the well region and disposed at an outer edge of an active region of the device. The sidewalls and bottom of the active trench are lined with dielectric material, and substantially filled with a first conductive layer forming an upper electrode and a second conductive layer forming a lower electrode, the upper electrode being disposed above the lower electrode and separated therefrom by inter-electrode dielectric material. The first termination trench can be lined with a layer of dielectric material that is thicker than the dielectric material lining the sidewalls of the active trench, and is substantially filled with conductive material.

7 Claims, 72 Drawing Sheets

U.S. PATENT DOCUMENTS

| | | |
|---|---|---|
| 3,412,297 A | 11/1968 | Amlinger |
| 3,497,777 A | 2/1970 | Teszner et al. |
| 3,564,356 A | 2/1971 | Wilson |
| 3,660,697 A | 5/1972 | Berglund et al. |
| 4,003,072 A | 1/1977 | Matsushita et al. |
| 4,011,105 A | 3/1977 | Paivinen et al. |
| 4,062,747 A | 12/1977 | Chang et al. |
| 4,300,150 A | 11/1981 | Colak |
| 4,324,038 A | 4/1982 | Chang et al. |
| 4,326,332 A | 4/1982 | Kenney et al. |
| 4,337,474 A | 6/1982 | Yukimoto |
| 4,345,265 A | 8/1982 | Blanchard |
| 4,445,202 A | 4/1984 | Geotze et al. |
| 4,541,001 A | 9/1985 | Schutten et al. |
| 4,568,958 A | 2/1986 | Baliga |
| 4,579,621 A | 4/1986 | Hine |
| 4,621,414 A | 11/1986 | Iranmanesh |
| 4,636,281 A | 1/1987 | Buiguez et al. |
| 4,638,344 A | 1/1987 | Cardwell, Jr. |
| 4,639,761 A | 1/1987 | Singer et al. |
| 4,666,556 A | 5/1987 | Fulton et al. |
| 4,698,653 A | 10/1987 | Cardwell, Jr. |
| 4,716,126 A | 12/1987 | Cogan |
| 4,745,079 A | 5/1988 | Pfiester |
| 4,746,630 A | 5/1988 | Hui et al. |
| 4,754,310 A | 6/1988 | Coe |
| 4,767,722 A | 8/1988 | Blanchard |
| 4,774,556 A | 9/1988 | Fujii et al. |
| 4,801,986 A | 1/1989 | Chang et al. |
| 4,821,095 A | 4/1989 | Temple |
| 4,823,176 A | 4/1989 | Baliga et al. |
| 4,824,793 A | 4/1989 | Richardson et al. |
| 4,833,516 A | 5/1989 | Hwang et al. |
| 4,853,345 A | 8/1989 | Himelick |
| 4,868,624 A | 9/1989 | Grung et al. |
| 4,893,160 A | 1/1990 | Blanchard |
| 4,914,058 A | 4/1990 | Blanchard |
| 4,941,026 A | 7/1990 | Temple |
| 4,961,100 A | 10/1990 | Baliga et al. |
| 4,967,245 A | 10/1990 | Cogan et al. |
| 4,969,028 A | 11/1990 | Baliga |
| 4,974,059 A | 11/1990 | Kinzer |
| 4,979,004 A | 12/1990 | Esquivel et al. |
| 4,990,463 A | 2/1991 | Mori |
| 4,992,390 A | 2/1991 | Chang |
| 5,027,180 A | 6/1991 | Nishizawa et al. |
| 5,032,888 A | 7/1991 | Seki |
| 5,034,785 A | 7/1991 | Blanchard |
| 5,065,273 A | 11/1991 | Rajeevakumar |
| 5,071,782 A | 12/1991 | Mori |
| 5,072,266 A | 12/1991 | Bulucea et al. |
| 5,079,608 A | 1/1992 | Wodarczyk et al. |
| 5,105,243 A | 4/1992 | Nakagawa et al. |
| 5,111,253 A | 5/1992 | Korman et al. |
| 5,134,448 A | 7/1992 | Johnsen et al. |
| 5,142,640 A | 8/1992 | Iwanatsu |
| 5,155,059 A | 10/1992 | Hieda |
| 5,156,989 A | 10/1992 | Williams et al. |
| 5,164,325 A | 11/1992 | Cogan et al. |
| 5,164,802 A | 11/1992 | Jones et al. |
| 5,168,331 A | 12/1992 | Yilmaz et al. |
| 5,188,973 A | 2/1993 | Omura et al. |
| 5,208,657 A | 5/1993 | Chatterjee et al. |
| 5,216,275 A | 6/1993 | Chen |
| 5,219,777 A | 6/1993 | Kang |
| 5,219,793 A | 6/1993 | Cooper et al. |
| 5,233,215 A | 8/1993 | Baliga |
| 5,242,845 A | 9/1993 | Baba et al. |
| 5,250,450 A | 10/1993 | Lee et al. |
| 5,262,336 A | 11/1993 | Pike, Jr. et al. |
| 5,268,311 A | 12/1993 | Euen et al. |
| 5,275,961 A | 1/1994 | Smayling et al. |
| 5,275,965 A | 1/1994 | Manning |
| 5,281,548 A | 1/1994 | Prall |
| 5,283,201 A | 2/1994 | Tsang et al. |
| 5,294,824 A | 3/1994 | Okada |
| 5,298,781 A | 3/1994 | Cogan et al. |
| 5,300,447 A | 4/1994 | Anderson |
| 5,300,452 A | 4/1994 | Chang et al. |
| 5,326,711 A | 7/1994 | Malhi |
| 5,346,834 A | 9/1994 | Hisamoto et al. |
| 5,350,937 A | 9/1994 | Yamazaki et al. |
| 5,363,327 A | 11/1994 | Henkles et al. |
| 5,365,102 A | 11/1994 | Mehrotra et al. |
| 5,366,914 A | 11/1994 | Takahashi et al. |
| 5,389,815 A | 2/1995 | Takahashi |
| 5,405,794 A | 4/1995 | Kim |
| 5,418,376 A | 5/1995 | Muraoka et al. |
| 5,424,231 A | 6/1995 | Yang |
| 5,429,977 A | 7/1995 | Lu et al. |
| 5,430,311 A | 7/1995 | Murakami et al. |
| 5,430,324 A | 7/1995 | Bencuya |
| 5,434,435 A | 7/1995 | Baliga |
| 5,436,189 A | 7/1995 | Beasom |
| 5,438,007 A | 8/1995 | Vinal et al. |
| 5,438,215 A | 8/1995 | Tihanyi |
| 5,442,214 A | 8/1995 | Yang |
| 5,473,176 A | 12/1995 | Kakumoto |
| 5,473,180 A | 12/1995 | Ludikhuize |
| 5,474,943 A | 12/1995 | Hshieh et al. |
| 5,488,010 A | 1/1996 | Wong |
| 5,519,245 A | 5/1996 | Tokura et al. |
| 5,532,179 A | 7/1996 | Chang et al. |
| 5,541,425 A | 7/1996 | Nishihara |
| 5,554,552 A | 9/1996 | Chi |
| 5,554,862 A | 9/1996 | Omura et al. |
| 5,567,634 A | 10/1996 | Hebert et al. |
| 5,567,635 A | 10/1996 | Acovic et al. |
| 5,572,048 A | 11/1996 | Sugawara |
| 5,576,245 A | 11/1996 | Cogan et al. |
| 5,578,851 A | 11/1996 | Hshieh et al. |
| 5,583,065 A | 12/1996 | Miwa |
| 5,592,005 A | 1/1997 | Floyd et al. |
| 5,593,909 A | 1/1997 | Han et al. |
| 5,595,927 A | 1/1997 | Chen et al. |
| 5,597,765 A | 1/1997 | Yilmaz et al. |
| 5,605,852 A | 2/1997 | Bencuya |
| 5,616,945 A | 4/1997 | Williams |
| 5,623,152 A | 4/1997 | Majumdar et al. |
| 5,629,543 A | 5/1997 | Hshieh et al. |
| 5,637,898 A | 6/1997 | Baliga |
| 5,639,676 A | 6/1997 | Hshieh et al. |
| 5,640,034 A | 6/1997 | Malhi |
| 5,648,670 A | 7/1997 | Blanchard |
| 5,656,843 A | 8/1997 | Goodyear et al. |
| 5,665,619 A | 9/1997 | Kwan et al. |
| 5,670,803 A | 9/1997 | Beilstein, Jr. et al. |
| 5,684,320 A | 11/1997 | Kawashima |
| 5,693,569 A | 12/1997 | Ueno |
| 5,705,409 A | 1/1998 | Witek |
| 5,710,072 A | 1/1998 | Krautschneider et al. |
| 5,714,781 A | 2/1998 | Yamamoto et al. |
| 5,719,409 A | 2/1998 | Singh et al. |
| 5,723,891 A | 3/1998 | Malhi |
| 5,744,372 A | 4/1998 | Bulucea |
| 5,767,004 A | 6/1998 | Balasubramanian et al. |
| 5,770,878 A | 6/1998 | Beasom |
| 5,773,851 A | 6/1998 | Nakamura et al. |
| 5,776,813 A | 7/1998 | Huang et al. |
| 5,780,343 A | 7/1998 | Bashir |
| 5,801,417 A | 9/1998 | Tsang et al. |
| 5,814,858 A | 9/1998 | Williams |
| 5,821,583 A | 10/1998 | Hshieh et al. |
| 5,877,528 A | 3/1999 | So |

| | | | | | | |
|---|---|---|---|---|---|---|
| 5,879,971 | A | 3/1999 | Witek | 6,194,741 | B1 | 2/2001 | Kinzer et al. |
| 5,879,994 | A | 3/1999 | Kwan et al. | 6,198,127 | B1 | 3/2001 | Kocon |
| 5,894,157 | A | 4/1999 | Han et al. | 6,201,279 | B1 | 3/2001 | Pfirsch |
| 5,895,951 | A | 4/1999 | So et al. | 6,204,097 | B1 | 3/2001 | Shen et al. |
| 5,895,952 | A | 4/1999 | Darwish et al. | 6,207,994 | B1 | 3/2001 | Rumennik et al. |
| 5,897,343 | A | 4/1999 | Mathew et al. | 6,222,229 | B1 | 4/2001 | Herbert et al. |
| 5,897,360 | A | 4/1999 | Kawaguchi | 6,222,233 | B1 | 4/2001 | D'Anna |
| 5,900,663 | A | 5/1999 | Johnson et al. | 6,225,649 | B1 | 5/2001 | Minato |
| 5,906,680 | A | 5/1999 | Meyerson | 6,228,727 | B1 | 5/2001 | Lim et al. |
| 5,907,776 | A | 5/1999 | Hshieh et al. | 6,236,099 | B1 | 5/2001 | Boden, Jr. |
| 5,917,216 | A | 6/1999 | Floyd et al. | 6,239,463 | B1 | 5/2001 | Williams et al. |
| 5,929,481 | A | 7/1999 | Hshieh et al. | 6,239,464 | B1 | 5/2001 | Tsuchitani et al. |
| 5,943,581 | A | 8/1999 | Lu et al. | 6,265,269 | B1 | 7/2001 | Chen et al. |
| 5,949,104 | A | 9/1999 | D'Anna et al. | 6,271,082 | B1 | 8/2001 | Hou et al. |
| 5,949,124 | A | 9/1999 | Hadizad et al. | 6,271,100 | B1 | 8/2001 | Ballantine et al. |
| 5,959,324 | A | 9/1999 | Kohyama | 6,271,552 | B1 | 8/2001 | D'Anna |
| 5,960,271 | A | 9/1999 | Wollesen et al. | 6,271,562 | B1 | 8/2001 | Deboy et al. |
| 5,972,741 | A | 10/1999 | Kubo et al. | 6,274,904 | B1 | 8/2001 | Tihanyi |
| 5,973,360 | A | 10/1999 | Tihanyi | 6,274,905 | B1 | 8/2001 | Mo |
| 5,973,367 | A | 10/1999 | Williams | 6,277,706 | B1 | 8/2001 | Ishikawa |
| 5,976,936 | A | 11/1999 | Miyajima et al. | 6,281,547 | B1 | 8/2001 | So et al. |
| 5,981,344 | A | 11/1999 | Hshieh et al. | 6,285,060 | B1 | 9/2001 | Korec et al. |
| 5,981,996 | A | 11/1999 | Fujishima | 6,291,298 | B1 | 9/2001 | Williams et al. |
| 5,998,833 | A | 12/1999 | Baliga | 6,291,856 | B1 | 9/2001 | Miyasaka et al. |
| 6,005,271 | A | 12/1999 | Hshieh | 6,294,818 | B1 | 9/2001 | Fujihira |
| 6,008,097 | A | 12/1999 | Yoon et al. | 6,297,534 | B1 | 10/2001 | Kawaguchi et al. |
| 6,011,298 | A | 1/2000 | Blanchard | 6,303,969 | B1 | 10/2001 | Tan |
| 6,015,727 | A | 1/2000 | Wanlass | 6,307,246 | B1 | 10/2001 | Nitta et al. |
| 6,020,250 | A | 2/2000 | Kenney et al. | 6,309,920 | B1 | 10/2001 | Laska et al. |
| 6,034,415 | A | 3/2000 | Johnson et al. | 6,313,482 | B1 | 11/2001 | Baliga |
| 6,037,202 | A | 3/2000 | Witek | 6,316,806 | B1 | 11/2001 | Mo |
| 6,037,628 | A | 3/2000 | Huang | 6,326,656 | B1 | 12/2001 | Tihanyi |
| 6,037,632 | A | 3/2000 | Omura et al. | 6,337,499 | B1 | 1/2002 | Werner |
| 6,040,600 | A | 3/2000 | Uenishi et al. | 6,346,464 | B1 | 2/2002 | Takeda et al. |
| 6,048,772 | A | 4/2000 | D'Anna | 6,346,469 | B1 | 2/2002 | Greer |
| 6,049,108 | A | 4/2000 | Williams et al. | 6,351,018 | B1 | 2/2002 | Sapp |
| 6,051,488 | A | 4/2000 | Lee et al. | 6,353,252 | B1 | 3/2002 | Yasuhara et al. |
| 6,057,558 | A | 5/2000 | Yamamoto et al. | 6,359,308 | B1 * | 3/2002 | Hijzen et al. ................ 257/341 |
| 6,063,678 | A | 5/2000 | D'Anna | 6,362,112 | B1 | 3/2002 | Hamerski |
| 6,064,088 | A | 5/2000 | D'Anna | 6,362,505 | B1 | 3/2002 | Tihanyi |
| 6,066,878 | A | 5/2000 | Neilson | 6,365,462 | B2 | 4/2002 | Baliga |
| 6,069,043 | A | 5/2000 | Floyd et al. | 6,365,930 | B1 | 4/2002 | Schillaci et al. |
| 6,077,733 | A | 6/2000 | Chen et al. | 6,368,920 | B1 | 4/2002 | Beasom |
| 6,081,009 | A | 6/2000 | Neilson | 6,368,921 | B1 | 4/2002 | Hijzen et al. |
| 6,084,264 | A | 7/2000 | Darwish | 6,376,314 | B1 | 4/2002 | Jerred |
| 6,084,268 | A | 7/2000 | de Fresart et al. | 6,376,315 | B1 | 4/2002 | Hshieh et al. |
| 6,087,232 | A | 7/2000 | Kim et al. | 6,376,878 | B1 | 4/2002 | Kocon |
| 6,096,608 | A | 8/2000 | Williams | 6,376,890 | B1 | 4/2002 | Tihanyi |
| 6,097,063 | A | 8/2000 | Fujihira | 6,384,456 | B1 | 5/2002 | Tihanyi |
| 6,103,578 | A | 8/2000 | Uenishi et al. | 6,388,286 | B1 | 5/2002 | Baliga |
| 6,103,619 | A | 8/2000 | Lai | 6,388,287 | B2 | 5/2002 | Deboy et al. |
| 6,104,054 | A | 8/2000 | Corsi et al. | 6,400,003 | B1 | 6/2002 | Huang |
| 6,110,799 | A | 8/2000 | Huang | 6,426,260 | B1 | 7/2002 | Hshieh |
| 6,114,727 | A | 9/2000 | Ogura et al. | 6,429,481 | B1 | 8/2002 | Mo et al. |
| 6,137,152 | A | 10/2000 | Wu | 6,433,385 | B1 | 8/2002 | Kocon et al. |
| 6,144,054 | A | 11/2000 | Agahi et al. | 6,436,779 | B2 | 8/2002 | Hurkx et al. |
| 6,150,697 | A | 11/2000 | Teshigahara et al. | 6,437,399 | B1 | 8/2002 | Huang |
| 6,156,606 | A | 12/2000 | Michaelis | 6,441,454 | B2 | 8/2002 | Hijzen et al. |
| 6,156,611 | A | 12/2000 | Lan et al. | 6,444,574 | B1 | 9/2002 | Chu |
| 6,163,052 | A | 12/2000 | Liu et al. | 6,452,230 | B1 | 9/2002 | Boden, Jr. |
| 6,165,870 | A | 12/2000 | Shim et al. | 6,461,918 | B1 | 10/2002 | Calafut |
| 6,168,983 | B1 | 1/2001 | Rumennik et al. | 6,465,304 | B1 | 10/2002 | Blanchard et al. |
| 6,168,996 | B1 | 1/2001 | Numazawa et al. | 6,465,843 | B1 | 10/2002 | Hirler et al. |
| 6,171,935 | B1 | 1/2001 | Nance et al. | 6,465,844 | B2 * | 10/2002 | Saito et al. ................ 257/336 |
| 6,174,769 | B1 | 1/2001 | Lou | 6,465,869 | B2 | 10/2002 | Ahlers et al. |
| 6,174,773 | B1 | 1/2001 | Fujishima | 6,472,678 | B1 | 10/2002 | Hshieh et al. |
| 6,174,785 | B1 | 1/2001 | Parekh et al. | 6,472,708 | B1 | 10/2002 | Hshieh et al. |
| 6,184,545 | B1 | 2/2001 | Werner et al. | 6,475,884 | B2 | 11/2002 | Hshieh et al. |
| 6,184,555 | B1 | 2/2001 | Tihanyi et al. | 6,476,443 | B1 | 11/2002 | Kinzer |
| 6,188,104 | B1 | 2/2001 | Choi et al. | 6,479,352 | B2 | 11/2002 | Blanchard |
| 6,188,105 | B1 | 2/2001 | Kocon et al. | 6,489,652 | B1 | 12/2002 | Jeon et al. |
| 6,190,978 | B1 | 2/2001 | D'Anna | 6,498,061 | B2 | 12/2002 | Divakaruni et al. |
| 6,191,447 | B1 | 2/2001 | Baliga | 6,501,146 | B1 | 12/2002 | Harada |

| | | |
|---|---|---|
| 6,534,825 B2 | 3/2003 | Calafut |
| 6,566,804 B1 | 5/2003 | Trujillo et al. |
| 6,580,123 B2 | 6/2003 | Thapar |
| 6,608,350 B2 | 8/2003 | Kinzer et al. |
| 6,621,121 B2 | 9/2003 | Baliga |
| 6,657,254 B2 | 12/2003 | Hshieh et al. |
| 6,677,641 B2 | 1/2004 | Kocon |
| 6,683,346 B2 | 1/2004 | Zeng |
| 6,710,403 B2 | 3/2004 | Sapp |
| 6,720,616 B2 | 4/2004 | Hirler et al. |
| 6,734,066 B2 | 5/2004 | Lin et al. |
| 6,750,508 B2 | 6/2004 | Omura et al. |
| 6,762,127 B2 | 7/2004 | Boiteux et al. |
| 6,780,714 B2 | 8/2004 | Gajda et al. |
| 6,806,533 B2 | 10/2004 | Henninger et al. |
| 6,833,584 B2 | 12/2004 | Henninger et al. |
| 6,838,722 B2 | 1/2005 | Bhalla et al. |
| 6,870,220 B2 | 3/2005 | Kocon et al. |
| 6,916,745 B2 | 7/2005 | Herrick et al. |
| 6,936,890 B2 * | 8/2005 | Hueting et al. ............... 257/330 |
| 7,345,342 B2 | 3/2008 | Challa et al. |
| 2001/0023961 A1 | 9/2001 | Hsieh et al. |
| 2001/0026989 A1 | 10/2001 | Thapar |
| 2001/0028083 A1 | 10/2001 | Onishi et al. |
| 2001/0032998 A1 | 10/2001 | Iwamoto et al. |
| 2001/0041400 A1 | 11/2001 | Ren et al. |
| 2001/0049167 A1 | 12/2001 | Madson |
| 2001/0050394 A1 | 12/2001 | Onishi et al. |
| 2002/0008284 A1 | 1/2002 | Zeng |
| 2002/0009832 A1 | 1/2002 | Blanchard |
| 2002/0014658 A1 | 2/2002 | Blanchard |
| 2002/0066924 A1 | 6/2002 | Blanchard |
| 2002/0070418 A1 | 6/2002 | Kinzer et al. |
| 2002/0100933 A1 | 8/2002 | Marchant |
| 2003/0006452 A1 | 1/2003 | Challa |
| 2003/0060013 A1 | 3/2003 | Marchant |
| 2003/0073287 A1 | 4/2003 | Kocon |
| 2003/0127702 A1 * | 7/2003 | Blair et al. ................... 257/510 |
| 2003/0132450 A1 | 7/2003 | Minato et al. |
| 2003/0178673 A1 | 9/2003 | Bhalla et al. |
| 2003/0178676 A1 | 9/2003 | Henninger et al. |
| 2003/0178678 A1 | 9/2003 | Wei et al. |
| 2003/0193067 A1 | 10/2003 | Kim |
| 2003/0197220 A1 | 10/2003 | Disney |
| 2003/0209757 A1 | 11/2003 | Henninger et al. |
| 2004/0031987 A1 | 2/2004 | Henninger et al. |
| 2004/0089910 A1 | 5/2004 | Hirler et al. |
| 2004/0121572 A1 | 6/2004 | Darwish et al. |
| 2004/0232407 A1 | 11/2004 | Calafut |
| 2005/0017293 A1 | 1/2005 | Zundel et al. |
| 2005/0173758 A1 * | 8/2005 | Peake et al. ................. 257/330 |

FOREIGN PATENT DOCUMENTS

| | | |
|---|---|---|
| DE | 4300806 C | 12/1993 |
| DE | 19736981 A1 | 8/1998 |
| EP | 0975024 A2 | 1/2000 |
| EP | 1026749 A1 | 8/2000 |
| EP | 1054451 A2 | 11/2000 |
| EP | 2003/1168455 A2 | 1/2002 |
| EP | 0747967 B1 | 2/2002 |
| EP | 1205980 A1 | 5/2002 |
| EP | 2003/1369927 A2 | 12/2003 |
| JP | 56-058267 A | 5/1981 |
| JP | 62-069562 | 5/1981 |
| JP | 63-186475 | 3/1987 |
| JP | 63-288047 | 8/1988 |
| JP | 2000-040822 | 1/1989 |
| JP | 01-192174 A | 8/1989 |
| JP | 03024765 A | 2/1991 |
| JP | 08186258 A | 7/1996 |
| JP | 64-022051 | 11/1998 |
| JP | 2000-040872 | 2/2000 |
| JP | 2000-156978 A | 2/2000 |
| JP | 2000-277726 A | 10/2000 |
| JP | 2000-277728 | 10/2000 |
| JP | 2001-015448 | 1/2001 |
| JP | 2001-015752 | 1/2001 |
| JP | 2001-102577 A | 4/2001 |
| JP | 2001-111041 A | 4/2001 |
| JP | 2001-135819 A | 5/2001 |
| JP | 2001-144292 A | 5/2001 |
| JP | 2001-244461 A | 9/2001 |
| JP | 2001-313391 | 9/2001 |
| JP | 2002-083976 A | 3/2002 |
| TW | 224372 B | 11/2004 |
| WO | 00/33386 A2 | 6/2000 |
| WO | WO 00/42665 A1 | 7/2000 |
| WO | 00/68997 A1 | 11/2000 |
| WO | 00/68998 A1 | 11/2000 |
| WO | WO 00/75965 A2 | 12/2000 |
| WO | WO 01/06550 A1 | 1/2001 |
| WO | WO 01/06557 A1 | 1/2001 |
| WO | WO 01/45155 A1 | 6/2001 |
| WO | WO 01/59847 A2 | 8/2001 |
| WO | WO 01/71815 A2 | 9/2001 |
| WO | WO 01/95385 A1 | 12/2001 |
| WO | WO 01/95398 A1 | 12/2001 |
| WO | WO 02/01644 A2 | 1/2002 |
| WO | WO 02/47171 A1 | 6/2002 |
| WO | WO 03/023861 A2 | 3/2003 |

OTHER PUBLICATIONS

USPTO Office Action dated Nov. 5, 2009 for U.S. Appl. No. 12/041,546.

USPTO Office Action dated Oct. 30, 2009 for U.S. Appl. No. 12/018,166.

USPTO Office Action dated Jan. 12, 2010 for U.S. Appl. No. 11/963,668.

USPTO Office Action dated Jan. 26, 2010 for U.S. Appl. No. 11/964,419.

German Patent and Trademark Office (DPMA) search report for DPMA patent application DE202004021424.5 (Sep. 24, 2008).

German Patent and Trademark Office (DPMA) office action for DPMA patent application DE112004003054.4 (Sep. 29, 2008).

USPTO office action dated Jan. 22, 2009 for U.S. Appl. No. 11/445,111.

German Patent and Trademark Office (DPMA) office action for DPMA patent application DE112004003046.3-33 (Jan. 21, 2008).

State Intellectual Property Office of China (SIPO) office action for SIPO patent application CN200480042161.1 (Feb. 27, 2008).

USPTO office action dated Jan. 16, 2009 for U.S. Appl. No. 11/445,020.

Bai et al., "Novel automated optimization of power MOSFET for 12V input, high-frequency DC-DC converter," International Symposium on Power Semiconductors and ICs, *Technical Digest*, (2003), pp. 366-369.

Baliga "New Concepts in Power Rectifiers," Physics of Semiconductor Devices, Proceedings of the Third Int'l Workshop, Madras (India), Committee on Science and Technology in Developing Countries (1985). pp. 471-481.

Baliga "Options for CVD of Dielectrics Include Low-k Materials," Technical Literature from Semiconductor International Jun. 1998., 4 pages total.

Baliga et al., "Improving the reverse recovery of power MOSFET integral diodes by electron irradiation," (Dec. 1983) *Solid State Electronics*, vol. 26, No. 12, pp. 1133-1141.

Brown et al. Novel Trench Gate Structure Developments Set the Benchmark for Next Generation Power MOSFET Switching Performance. Power Electronics—May 2003 Proceedings (PCIM), Nurenburg, vol. 47, pp. 275-278.

Bulucea "Trench DMOS Transistor Technology For High Current (100 A Range) Switching" Solid-State Electronics vol. 34 No. pp. 493-507 (1991).

Chang et al. "Numerical and experimental Analysis of 500-V Power DMOSFET with an Atomic-Lattice Layout," IEEE Transactions on Electron Devices 36:2623 (1989).

Chang et al. "Self-Aligned UMOSFET's with a Specific On-Resistance of 1m.OMEGA.cm.sup.2," IEEE Transactions on Electron Devices 34:2329-2333 (1987).

Cheng et al. , "Fast reverset recovery body diodie in high-voltage VDMOSFET using cell-dsistributed schottky contacts," (May 2003) IEEE Transactions on Electron Devices, vol. 50. No. 5, pp. 1422-1425.

"CoolMOS.TM. the second generation," Infineon Technologies product information (2000), 2 pages total.

Curtis et al. "APCVD TEOS: 03 Advanced Trench Isolation Applications," Semiconductor Fabtech 9th Edition (1999) 8 pages total.

Darwish et al. A New Power W-Gated Trench MOSFET (WMOSFET) with High Switching Performance. ISPSD Proceedings—Apr. 2003, Cambridge, 4 pages total.

Djekic, O. et al., "High frequency synchronous buck converter for low voltage applications," (1998) Proc. IEEE Power Electronics Specialist Conf. (PESC), pp. 1248-1254.

Fujihara "Theory of Semiconductor Superjunction Devices" Jpn. J. Appl. Phys. vol. 36 pp. 6254-6252 (1997).

Gan et al. "Poly Flanked VDMOS (PFVDMOS): A Superior Technology for Superjunction Devices," IEEE Power Electronics Specialists Conference, Jun. 17-22, 2001, Vancouver, Canada, 4 pages total.

Glenn et al. "A Novel Vertical Deep Trench Resurf DMOS (VTR-DMOS)" IEEE ISPD 2000, May 22-25, Toulouse France, pp. 197-200.

"IR develops CoolMOS.TM.—equivalent technology, positions it at the top of a 3-tiered line of new products for SMPS," International Rectifiers company information available at http://www.irf.com (1999), 3 pages total.

Kao et al. "Two Dimensional Thermal Oxidation of Silicon-I. Experiments,", IEEE Transactions on Electron Devices, vol. ED-34, No. 5, May 1987, pp. 1008-1017.

Kao et al. "Two Dimensional Thermal Oxidation of Silicon-II. Modeling Stress Effects in Wet Oxides,", IEEE Transactions on Electron Devices, vol. ED-35, No. 1, Jan. 1988, pp. 25-37.

Kassakian, J.G. et al., "High-frequency high-density converters for distributed power supply systems," (Apr. 1988) Proceedings of the IEEE, vol. 76, No. 4, pp. 362-376.

Korman, C.S. et al., "High performance power DMOSFET with integrated schottky diode," (1989) Proc. IEEE Power Electronics Specialist Conf. (PESC), pp. 176-179.

Lorenz et al. "Cool MOS—An important milestone towards a new Power MOSFET generation" power Conversion pp. 151-160 (1988).

Maksimovic, A.M. et al., "Modeling and simulation of power electronic converters," (Jun. 2001) Proceedings of the IEEE, vol. 89, No. 6, pp. 898-912.

Mehrotra, M. et al., "Very low forward drop JBS rectifiers fabricated using submicron technology," (Nov. 1993) IEEE Transactions on Electron Devices, vol. 40, No. 11, pp. 2131-2132.

Miller, "Power Management & Supply—Market, Applications Technologies—an Overview," Infineon Technologies, downloaded from the internet <<http://www.ewh.ieee.org/r8/germany/ias-pels/m_regensburg/overview_miller.pdf>>, May 5, 2003, 53 pages total.

Moghadam "Delivering Value Around New Industry Paradigms," Technical Literature from Applied Materials, pp. 1-11, vol. 1, Issue 2, Nov. 1999.

Park et al., "Lateral Trench Gate Super-Junction SOI-LDMOSFETs with Low On-Resistance," Institute for Microelectronics, University of Technology Vienna, Austria, (2002). pp. 283-285.

Sakai et al., "Experimental investigation of dependence of electrical characteristics of device parameters in trench MOS barrier, schottky diodes," (1998) International Symposium on Power Semiconductors and ICs, Technical Digest, pp. 293-296.

Shenai et al., "Current transport mechanisms in atomically abrupt metal-semiconductor interfaces," (Apr. 1988) IEEE Transactions on Electron Devices, vol. 35, No. 4, pp. 468-482.

Shenai et al., "Monolithically integrated power MOSFET and schottky diode with improved reverse recovery characteristics,"(Apr. 1990) IEEE Transactions on Electron Devices, vol. 37, No. 4, pp. 1167-1169.

Shenoy et al. "Analysis of the Effect of Charge Imbalance on the Static and Dynamic Characteristic of the Super Junction MOSFET," IEEE International Symposium on Power Semiconductor Devices 1999, pp. 99-102 (1999).

Singer "Empty Spaces in Silicon (ESS): An Alternative to SOI," Semiconductor International p. 42, Dec. 1999.

Tabisz et al., "A MOSFET resonant synchronous rectifier for high-frequency dc/dc converters," (1990) Proc. IEEE Power Electronics Specialist Conf. (PESC), pp. 769-779.

Technical Literature from Quester Technology, Model APT-4300 300 mm Atmospheric TEOS/Ozone CVD System, ( unknown date), 3 pages total.

Technical Literature from Quester Technology, Model APT-6000 Atmospheric TEOS-Ozone CVD System, (unknown date), 2 pages total.

Technical Literature from Silicon Valley Thermal Systems, APNext, High Throughput APCVD Cluster Tool for 200 mm/300 mm Wafer Processing, unknown date.

Ueda et al. "An Ultra-Low On-Resistance Power MOSFET Fabricated by Using a Fully Self-Aligned Process," IEEE Transactions on Electron Devices 34:926-930 (1987).

Wilamowski et al. "Schottky Diodes with High Breakdown Voltages," Solid-State Electronics 26:491-493 (1983).

Wolf "Silicon Processing for The VLSI Era" vol. 2 Process Integration Lattice Press (1990), 3 pages total.

Wolf et al., "Silicon Processing for The VLSI Era" vol. 1—Process Technology, Second Edition, (1990), pp. 658.

Yamashita et al., Conduction Power loss in MOSFET synchronous rectifier with parallel-connected schottky barrier diode, (Jul. 1998) IEEE Transactions on Power electronics, vol. 13, No. 4, pp. 667-673.

Yang, et al.; "Tunable Oxide-Bypassed Trench Gate MOSFET: Breaking the Ideal Superjunction MOSFET Performance Line at Equal Column Width;" IEEE Electron Device Letters; Nov. 2003; pp. 704-706; vol. 24; No. 11.

Office Action for U.S. Appl. No. 11/026,276 on Mar. 28, 2007.

Office Action for U.S. Appl. No. 11/445,020 on Jan. 16, 2008.

German Search Report for PCT/US2004/043965 on Nov. 20, 2007.

USPTO Office Action dated Jul. 2, 2008 for U.S. Appl. No. 11/445,111.

USPTO Office Action dated Jun. 10, 2009 for U.S. Appl. No. 11/445,111.

USPTO Notice of Allowance dated Sep. 11, 2009 for U.S. Appl. No. 11/445,111.

USPTO Notice of Allowance dated Aug. 27, 2009 for U.S. Appl. No. 11/445,020.

China State Intellectual Property Office (SIPO) office action for SIPO patent application CN200780039592.6 (May 12, 2010).

USPTO Office Action dated May 6, 2010 for U.S. Appl. No. 12/018,166.

USPTO Office Action dated Jun. 29, 2010 for U.S. Appl. No. 12/041,546.

USPTO Office Action dated May 20, 2010 for U.S. Appl. No. 12/032,599.

* cited by examiner

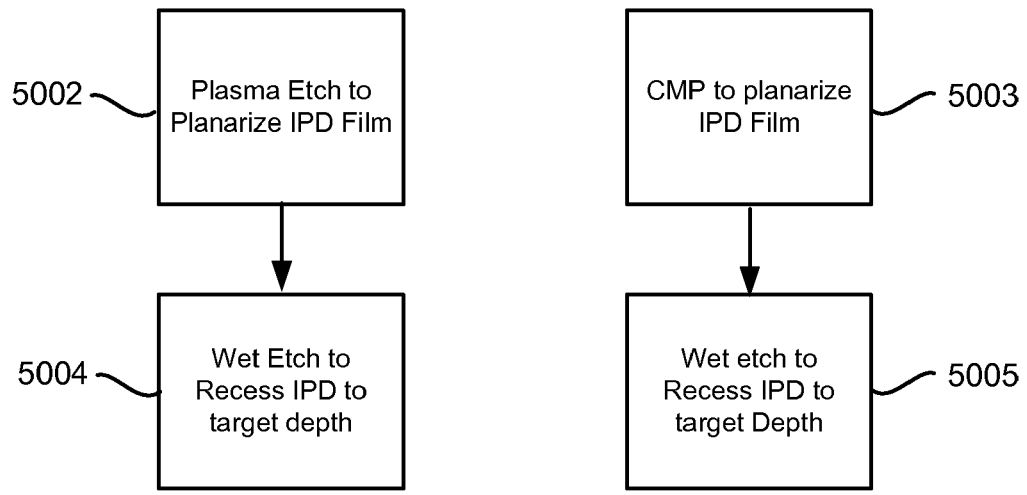
*Fig. 50A*  *Fig. 50B*
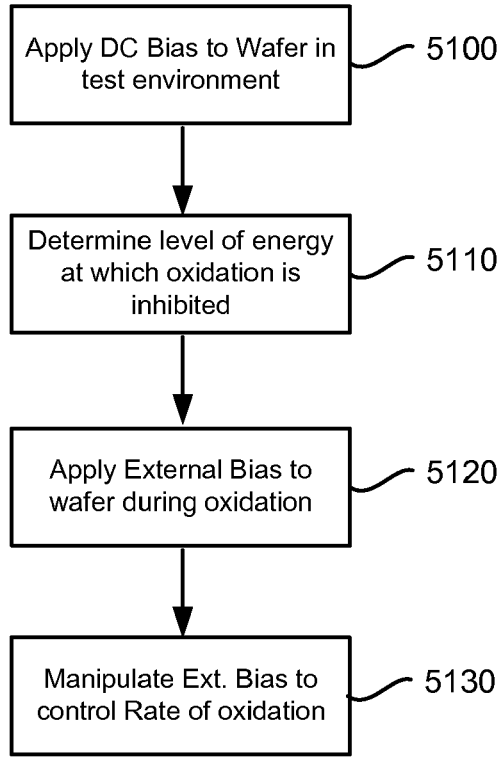
*Fig. 51*

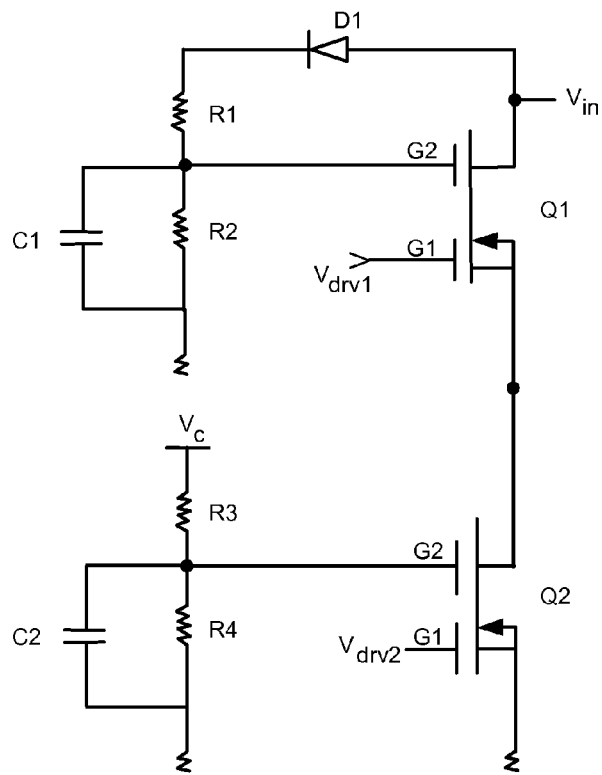
*Fig. 69*
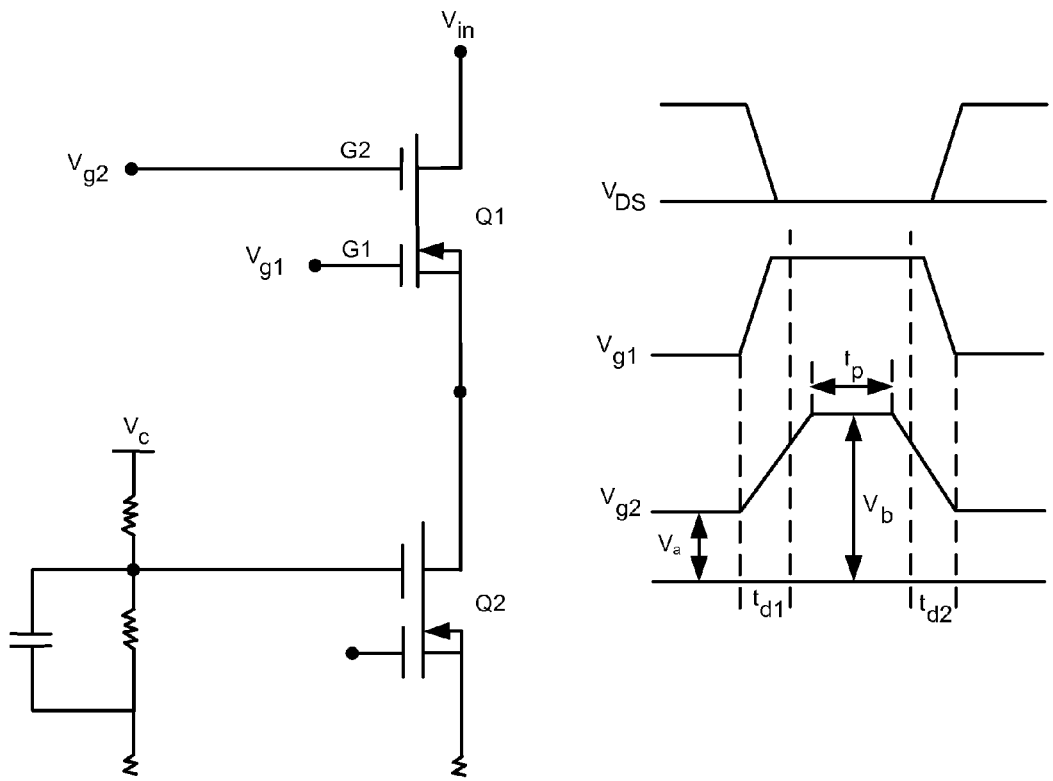
*Fig. 70A*   *Fig. 70B*

POWER SEMICONDUCTOR DEVICES HAVING TERMINATION STRUCTURES AND METHODS OF MANUFACTURE

CROSS-REFERENCES TO RELATED APPLICATIONS

This application is a continuation of the following commonly-assigned U.S. patent application:

Ser. No. 11/026,276, entitled "Power Semiconductor Devices and Methods of Manufacture," by Challa et al., filed Dec. 29, 2004;

which claims the benefit of the following U.S. Provisional patent application:

No. 60/533,790, entitled "Power Semiconductor Devices and Methods of Manufacture," by Challa et al. filed Dec. 30, 2003;

and is a continuation-in-part of the following commonly-assigned U.S. patent applications:

Ser. No. 10/640,742, entitled "Improved MOS Gating Method for Reduced Miller Capacitance and Switching Losses," by Kocon et al., filed Aug. 14, 2003 (now U.S. Pat. No. 6,870,220);

Ser. No. 10/442,670, entitled "Structure and Method for Forming a Trench MOSFET Having Self-Aligned Features," by Herrick, filed May 20, 2003 (now U.S. Pat. No. 6,916,745);

and is related to the following commonly-assigned U.S. patent applications:

Ser. No. 10/155,554, entitled "Field Effect Transistor and Methods of its Manufacture," by Mo et al., filed May 24, 2002 (now U.S. Pat. No. 6,710,406);

Ser. No. 10/209,110, entitled "Dual Trench Power MOSFET," by Sapp, filed Jul. 30, 2002 (now U.S. Pat. No. 6,710,403);

Ser. No. 09/981,583, entitled "Semiconductor Structure with Improved Smaller Forward Loss and Higher Blocking Capability," by Kocon, filed Oct. 17, 2001 (now U.S. Pat. No. 6,677,641);

Ser. No. 09/774,780, entitled "Field Effect Transistor Having a Lateral Depletion Structure," by Marchant, filed Jan. 30, 2001 (now U.S. Pat. No. 6,713,813);

Ser. No. 10/200,056, entitled "Vertical Charge Control Semiconductor Device with Low Output Capacitance," by Sapp et al., filed Jul. 18, 2002 (now U.S. Pat. No. 6,803,626);

Ser. No. 10/288,982, entitled "Drift Region Higher Blocking Lower Forward Voltage Drop Semiconductor Structure," by Kocon et al., filed Nov. 5, 2002 (now U.S. Pat. No. 7,132,712);

Ser. No. 10/315,719, entitled "Method of Isolating the Current Sense on Planar or Trench Stripe Power Devices while Maintaining a Continuous Stripe Cell," by Yedinak, filed Dec. 10, 2002 (now U.S. Pat. No. 6,906,362);

Ser. No. 10/222,481, entitled "Method and Circuit for Reducing Losses in DC-DC Converters," by Elbanhawy, filed Aug. 16, 2002 (now U.S. Pat. No. 6,930,473);

Ser. No. 10/235,249, entitled "Unmolded Package for a Semiconductor Device," by Joshi, filed Sep. 4, 2002 (now U.S. Pat. No. 6,740,541); and Ser. No. 10/607,633, entitled "Flip Chip in Leaded Molded Package and Method of Manufacture Thereof," by Joshi et al., filed Jun. 27, 2003 (now U.S. Pat. No. 6,949,410).

All of the above-listed applications are hereby incorporated by reference in their entirety.

BACKGROUND OF THE INVENTION

The present invention relates in general to semiconductor devices and in particular to various embodiments for improved power semiconductor devices such as transistors and diodes, and their methods of manufacture, including packages and circuitry incorporating the same.

The key component in power electronic applications is the solid state switch. From ignition control in automotive applications to battery-operated consumer electronic devices, to power converters in industrial applications, there is a need for a power switch that optimally meets the demands of the particular application. Solid state switches including, for example, the power metal-oxide-semiconductor field effect transistor (power MOSFET), the insulated-gate bipolar transistor (IGBT) and various types of thyristors have continued to evolve to meet this demand. In the case of the power MOSFET, for example, double-diffused structures (DMOS) with lateral channel (e.g., U.S. Pat. No. 4,682,405 to Blanchard et al.), trenched gate structures (e.g., U.S. Pat. No. 6,429,481 to Mo et al.), and various techniques for charge balancing in the transistor drift region (e.g., U.S. Pat. Nos. 4,941,026 to Temple, 5,216,275 to Chen, and 6,081,009 to Neilson) have been developed, among many other technologies, to address the differing and often competing performance requirements.

Some of the defining performance characteristics for the power switch are its on-resistance, breakdown voltage and switching speed. Depending on the requirements of a particular application, a different emphasis is placed on each of these performance criteria. For example, for power applications greater than about 300-400 volts, the IGBT exhibits an inherently lower on-resistance as compared to the power MOSFET, but its switching speed is lower due to its slower turn off characteristics. Therefore, for applications greater than 400 volts with low switching frequencies requiring low on-resistance, the IGBT is the preferred switch while the power MOSFET is often the device of choice for relatively higher frequency applications. If the frequency requirements of a given application dictate the type of switch that is used, the voltage requirements determine the structural makeup of the particular switch. For example, in the case of the power MOSFET, because of the proportional relationship between the drain-to-source on-resistance $R_{DSon}$ and the breakdown voltage, improving the voltage performance of the transistor while maintaining a low $R_{DSon}$ poses a challenge. Various charge balancing structures in the transistor drift region have been developed to address this challenge with differing degrees of success.

Device performance parameters are also impacted by the fabrication process and the packaging of the die. Attempts have been made to address some of these challenges by developing a variety of improved processing and packaging techniques.

Whether it is in ultra-portable consumer electronic devices or routers and hubs in communication systems, the varieties of applications for the power switch continue to grow with the expansion of the electronic industry. The power switch therefore remains a semiconductor device with high development potential.

BRIEF SUMMARY OF THE INVENTION

The present invention provides various embodiments for power devices, as well as their methods of manufacture, packaging, and circuitry incorporating the same for a wide variety of power electronic applications. Broadly, one aspect of the invention combines a number of charge balancing techniques and other techniques for reducing parasitic capacitance to arrive at various embodiments for power devices with improved voltage performance, higher switching speed, and lower on-resistance. Another aspect of the invention provides improved termination structures for low, medium and high voltage devices. Improved methods of fabrication for power devices are provided according to other aspects of the invention. Improvements to specific processing steps, such as formation of trenches, formation of dielectric layers inside trenches, formation of mesa structures, processes for reducing substrate thickness, among others are offered by various embodiments of the invention. According to another aspect of the invention, charge balanced power devices incorporate temperature and current sensing elements such as diodes on the same die. Other aspects of the invention improve equivalent series resistance (ESR), or gate resistance, for power devices, incorporate additional circuitry on the same chip as the power device and provide improvements to the packaging of charge balanced power devices.

These and other aspects of the invention are described below in greater detail in connection with the accompanying drawings.

BRIEF DESCRIPTION OF THE DRAWINGS

FIG. 50A shows an anisoptric plasma etch process for IPD planarization;

FIG. 50B shows an alternate IPD planarization method using a chemical mechanical process;

FIG. 51 is a flow diagram for an examplary method for controlling oxidation rate;

FIG. 69 shows an exemplary driver circuit for a dual gate MOSFET;

FIG. 70A shows an alternate embodiment with separately driven gate electrodes;

FIG. 70B shows a timing diagram illustrating the operation of the circuit of FIG. 70A;

DETAILED DESCRIPTION OF THE INVENTION

The power switch can be implemented by any one of power MOSFET, IGBT, various types of thyristors and the like. Many of the novel techniques presented herein are described in the context of the power MOSFET for illustrative purposes. It is to be understood however that the various embodiments of the invention described herein are not limited to the power MOSFET and can apply to many of the other types of power switch technologies, including, for example, IGBTs and other types of bipolar switches and various types of thyristors, as well as diodes. Further, for the purposes of illustration, the various embodiments of the invention are shown to include specific p and n type regions. It is understood by those skilled in the art that the teachings herein are equally applicable to devices in which the conductivities of the various regions are reversed.

Figure 1:
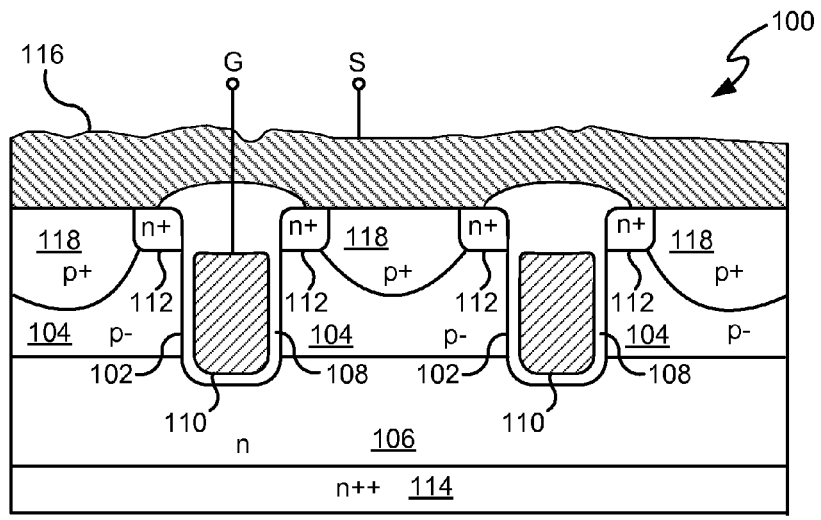
FIG. 1 shows a cross-sectional view of a portion of an exemplary n-type trench power MOSFET.

Referring to FIG. 1, there is shown a cross-sectional view of a portion of an exemplary n-type trench power MOSFET 100. As with all other figures described herein, it is to be understood that the relative dimensions and sizes of various elements and components depicted in the figures do not exactly reflect actual dimensions and are for illustrative purposes only. Trench MOSFET 100 includes a gate electrode that is formed inside trenches 102 that extend from the top surface of the substrate through a p-type well or body region 104, terminating in an n-type drift or epitaxial region 106. Trenches 102 are lined with thin dielectric layers 108 and are substantially filled with conductive material 110 such as doped polysilicon. N-type source regions 112 are formed inside body region 104 adjacent to trenches 102. A drain terminal for MOSFET 100 is formed at the backside of the substrate connecting to a heavily-doped n+ substrate region 114. The structure shown in FIG. 1 is repeated many times on a common substrate made of, for example, silicon, to form an array of transistors. The array may be configured in various cellular or striped architectures known in this art. When the transistor is turned on, a conducting channel is formed vertically between source regions 112 and drift region 106 along the walls of gate trenches 102.

Because of its vertical gate structure, MOSFET 100 enables a higher packing density when compared with a planar gate device, and the higher packing density translates to relatively lower on-resistance. To improve the breakdown voltage performance of this transistor, p+ heavy body region 118 is formed inside p-well 104 such that at the interface between p+ heavy body 118 and p-well 104 an abrupt junction is formed. By controlling the depth of p+ heavy body 118 relative to the trench depth and the depth of the well, electric fields that are generated when voltage is applied to the transistor are moved away from the trenches. This increases avalanche current handling capability of the transistor. Variations on this improved structure and processes for forming the transistor, and in particular the abrupt junction, are described in greater detail in commonly owned U.S. Pat. No. 6,429,481, to Mo et al., which is hereby incorporated by reference in its entirety.

Although vertical trench MOSFET 100 exhibits good on-resistance and improved ruggedness, it has a relatively high input capacitance. The input capacitance for trench MOSFET 100 has two components: gate-to-source capacitance Cgs and gate-to-drain capacitance Cgd. The gate-to-source capacitance Cgs results from the overlap between gate conductive material 110 and source regions 112 near the top of the trench. The capacitance formed between the gate and the inverted channel in the body also contributes to Cgs since in typical power switching applications the body and source electrodes of the transistor are shorted together. The gate-to-drain capacitance Cgd results from the overlap between gate conductive material 110 at the bottom of each trench and drift region 106 which connects to the drain. The gate-to-drain capacitance Cgd, or Miller capacitance, limits the transistor $V_{DS}$ transition time. Therefore, higher Cgs and Cgd results in appreciable switching losses. These switching losses are becoming increasingly important as power management applications move toward higher switching frequencies.

One way to reduce the gate-to-source capacitance Cgs is to reduce the channel length of the transistor. A shorter channel length directly reduces the gate-to-channel component of Cgs. A shorter channel length is also directly proportional to $R_{DSon}$ and enables obtaining the same device current capacity with fewer gate trenches. This reduces both Cgs and Cgd by reducing the amount of gate-to-source and gate-to-drain overlap. A shorter channel length, however, renders the device vulnerable to punch through when the depletion layer formed as a result of the reverse-biased body-drain junction pushes deep into the body region and approaches the source regions. Decreasing the doping concentration of the drift region so that it sustains more of the depletion layer has the undesirable effect of increasing the on-resistance $R_{DSon}$ of the transistor.

Figure 2A:
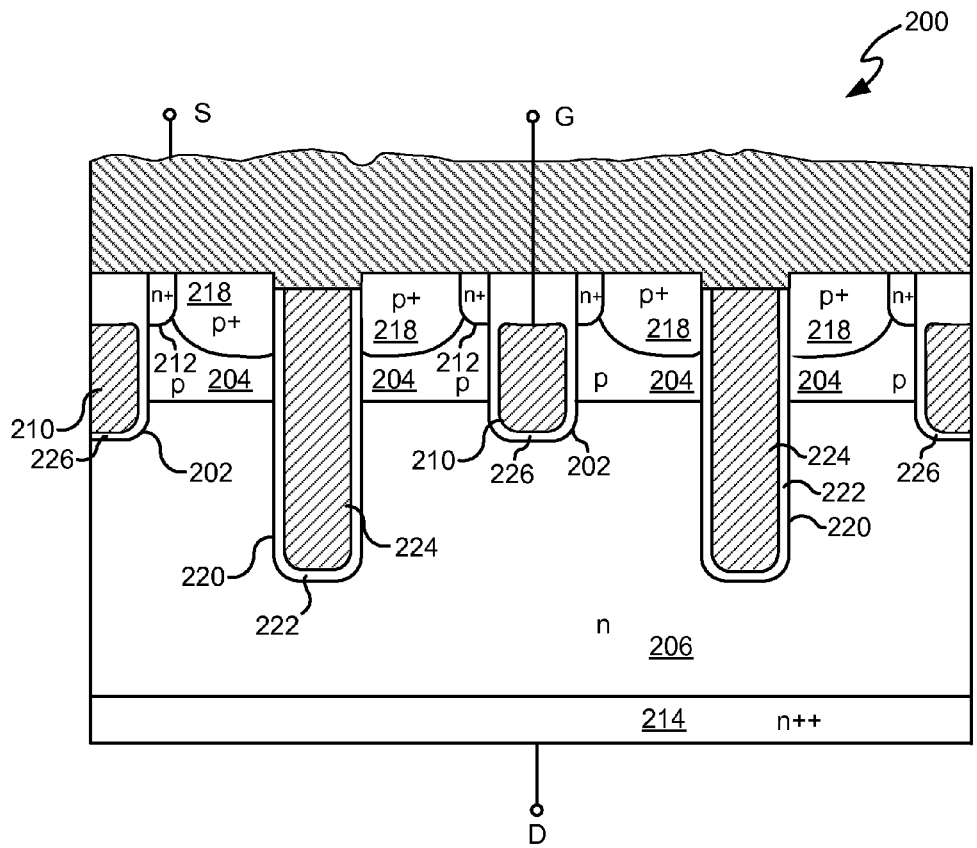
FIG. 2A shows an exemplary embodiment of a dual trench power MOSFET.

An improvement to the transistor structure that allows a reduction in channel length and is also effective in addressing the above drawbacks uses additional "shield" trenches that are laterally spaced from gate trenches. Referring to FIG. 2A, there is shown an exemplary embodiment of a dual trench MOSFET 200. The terminology "dual trench" refers to the transistor having two different types of trenches as opposed to the total number of similar trenches. In addition to the structural features that are common to the MOSFET of FIG. 1, dual trench MOSFET 200 includes shield trenches 220 that are interposed between adjacent gate trenches 202. In the exemplary embodiment shown in FIG. 2A, shield trenches 220 extend from the surface through p+ region 218, body region 204 and into drift region 206 well below the depth of gate trenches 202. Trenches 220 are lined with a dielectric material 222 and are substantially filled with conductive material 224 such as doped polysilicon. A metal layer 216 electrically connects conductive material 224 inside trenches 220 with the n+ source regions 212 and p+ heavy body regions 218. In this embodiment, trenches 220 can therefore be referred to as source shield trenches. An example of this type of dual trench MOSFET, and process of manufacture and circuit applications for the same are described in greater detail in commonly-assigned, U.S. patent application Ser. No. 10/209,110, entitled "Dual Trench Power MOSFET," by Steven Sapp, which is hereby incorporated by reference in its entirety.

Figure 2B:
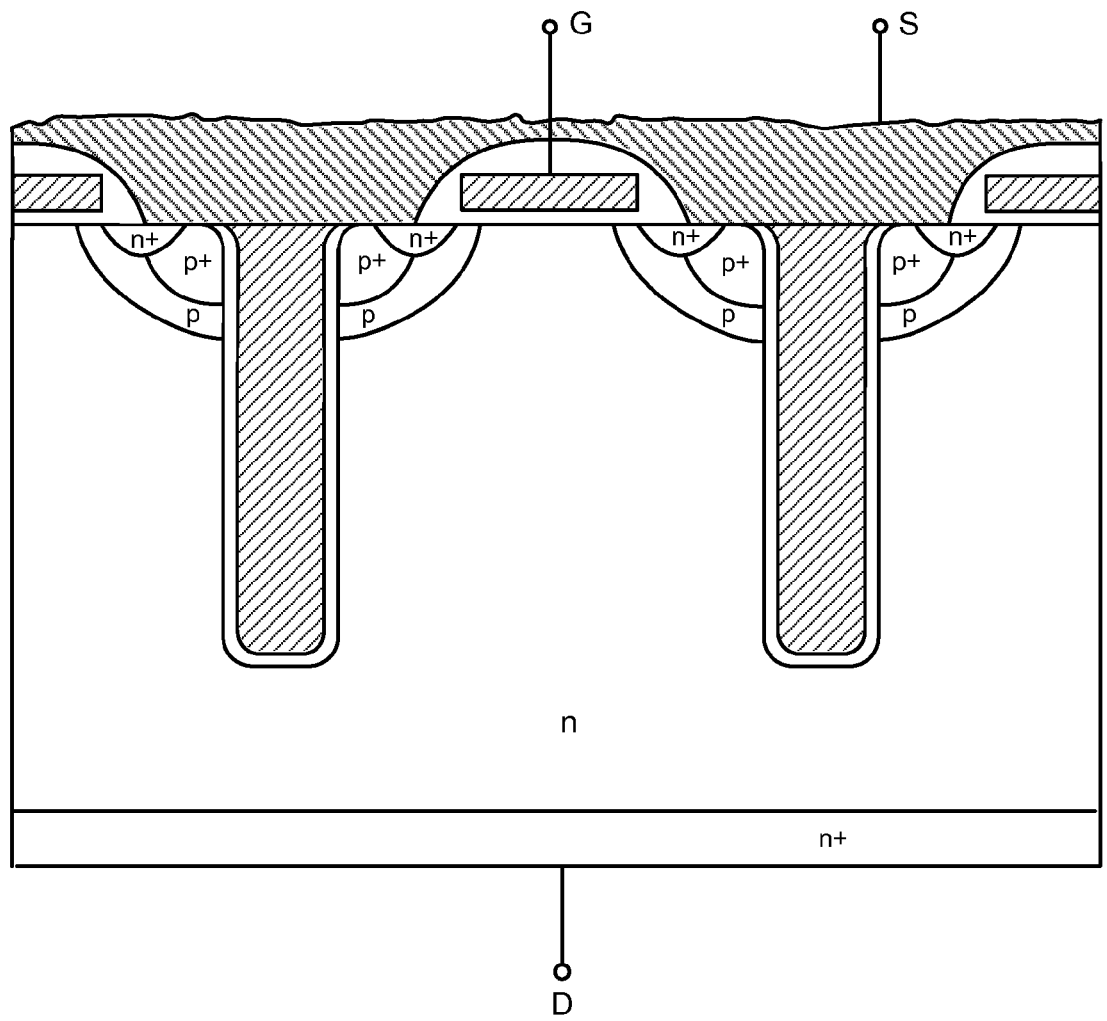
FIG. 2B shows an exemplary embodiment for a planar gate MOSFET with source shield trench structure.

The impact of deeper source shield trenches 220 is to push the depletion layer formed as a result of the reverse-biased body-drain junction deeper into drift region 206. Thus, a wider depletion region can result without increasing the electric field. This allows the drift region to be more highly doped without lowering the breakdown voltage. A more highly doped drift region reduces the transistor on-resistance. Moreover, the reduced electric field near the body-drain junction allows the channel length to be substantially reduced which further reduces the on-resistance of the transistor and substantially reduces the gate-to-source capacitance Cgs. Also, as compared to the MOSFET of FIG. 1, the dual trench MOSFET enables obtaining the same transistor current capacity with far fewer gate trenches. This significantly reduces the gate-to-source and gate-to-drain overlap capacitances. Note that in the exemplary embodiment shown in FIG. 2A, gate trench conductive layer 210 is buried inside the trench eliminating the need for the interlayer dielectric dome that is present above trenches 102 in MOSFET 100 shown in FIG. 1. Also, the use of source shield trenches as taught herein is not limited to trench gated MOSFETs and similar advantages are obtained when source shield trenches are employed in planar MOSFETs where the gate is formed horizontally on the top surface of the substrate. An exemplary embodiment for a planar gate MOSFET with source shield trench structure is shown in FIG. 2B.

To further reduce the input capacitance, additional structural improvements can be made that focus on reducing the gate-to-drain capacitance Cgd. As discussed above, the gate-to-drain capacitance Cgd is caused by the overlap between the gate and the drift region at the bottom of the trench. One method of reducing this capacitance increases the thickness of the gate dielectric layer at the bottom of the trench. Referring back to FIG. 2A, gate trenches 202 are depicted as having a thicker dielectric layer 226 at the bottom of the trench where there is overlap with drift region 206 (the transistor drain terminal) as compared to dielectric layer along the sidewalls of the gate trench. This reduces the gate-to-drain capacitance Cgd without degrading the forward conduction of the transistor. Creating a thicker dielectric layer at the bottom of the gate trench can be accomplished in a number of different ways. One exemplary process for creating the thicker dielectric layer is described in commonly-owned U.S. Pat. No. 6,437, 386 to Hurst et al. which is hereby incorporated by reference in its entirety. Other processes for forming a thick dielectric layer at the bottom of a trench are described further below in connection with FIGS. 56 to 59. Another way to minimize the gate-to-drain capacitance is to include a centrally disposed second dielectric core inside the trench that extends upwardly from the dielectric liner on the trench floor. In one embodiment, the second dielectric core may extend all the way up to contact the dielectric layer above the trench conductive material 210. An example of this embodiment, and variations thereof, are described in greater detail in commonly-owned U.S. Pat. No. 6,573,560 to Shenoy.

Figure 3A:
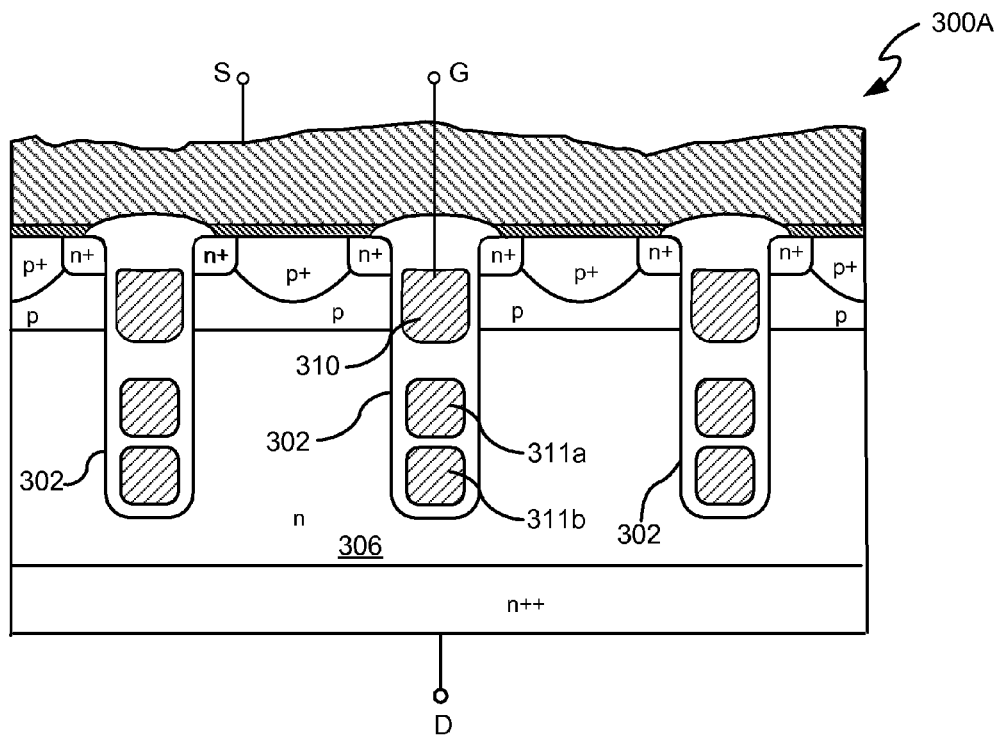
FIG. 3A shows part of an exemplary embodiment of a shielded gate trench power MOSFET.

Another technique for reducing the gate-to-drain capacitance Cgd involves shielding the gate using one or more biased electrodes. According to this embodiment, inside the gate trench and below the conductive material that forms the gate electrode, one or more electrodes are formed to shield the gate from the drift region, thereby substantially reducing the gate-to-drain overlap capacitance. Referring to FIG. 3A, there is shown part of an exemplary embodiment of a shielded gate trench MOSFET 300A. Trenches 302 in MOSFET 300A include a gate electrode 310 and, in this example, two additional electrodes 311a and 311b under gate electrode 310. Electrodes 311a and 311b shield gate electrode 310 from having any substantial overlap with drift region 306 almost eliminating the gate-to-drain overlap capacitance. Shield electrodes 311a and 311b can be independently biased at optimal potential. In one embodiment, one of shield electrodes 311a or 311b may be biased at the same potential as the source terminal. Similar to the dual trench structure, the biasing of the shield electrodes can also help in widening of the depletion region formed at the body-drain junction which further reduces Cgd. It is to be understood that the number of shield electrodes 311 can vary depending on the switching application and in particular the voltage requirements of the application. Similarly, the size of the shield electrodes in a given trench can vary. For example, shield electrode 311a can be larger than shield electrode 311b. In one embodiment, the smallest shield electrode is the closest to the bottom of the trench and the remaining shield electrodes gradually increase in size as they near the gate electrode. Independently biased electrodes inside trenches can also be used for vertical charge control purposes to improve smaller forward voltage loss and higher blocking capability. This aspect of the transistor structure, which will be described further below in connection with higher voltage devices, is also described in greater detail in commonly-assigned U.S. patent application Ser. No. 09/981,583, entitled "Semiconductor Structure with Improved Smaller Forward Voltage Loss and Higher Blocking Capability," by Kocon, which is hereby incorporated by reference in its entirety.

Figure 3B:
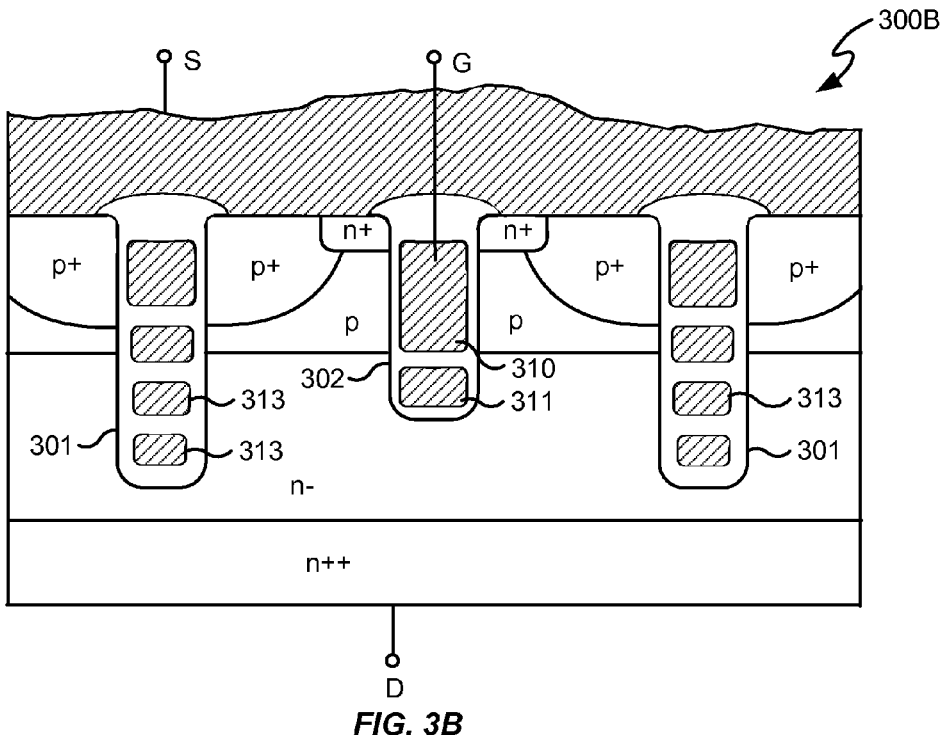
FIG. 3B illustrates an alternative embodiment for a shielded gate trench power MOSFET that combines the dual trench structure of FIG. 2A with the shielded gate structure of FIG. 3A.

FIG. 3B illustrates an alternative embodiment for a shielded gate trench MOSFET 300B that combines the dual trench structure of FIG. 2A with the shielded gate structure of FIG. 3A. In the exemplary embodiment shown in FIG. 3B, gate trench 301 includes gate poly 310 above shield poly 311 similar to trench 302 of MOSFET 300A. MOSFET 300B, however, includes non-gate trenches 301 that may be deeper than gate trenches 302 for vertical charge control purposes. While the charge control trenches 301 may have a single layer of conductive material (e.g., polysilicon) connecting to the source metal at the top of the trench, as in FIG. 2A, the embodiment shown in FIG. 3B uses multiple stacked poly electrodes 313 that can be independently biased. The number of electrodes 313 stacked in a trench can vary depending on the application requirements, as can the sizes of electrodes 313 as shown in FIG. 3B. The electrodes can be independently biased or tied together electrically. Also the number of charge control trenches inside a device will depend on the application.

Figure 4A:
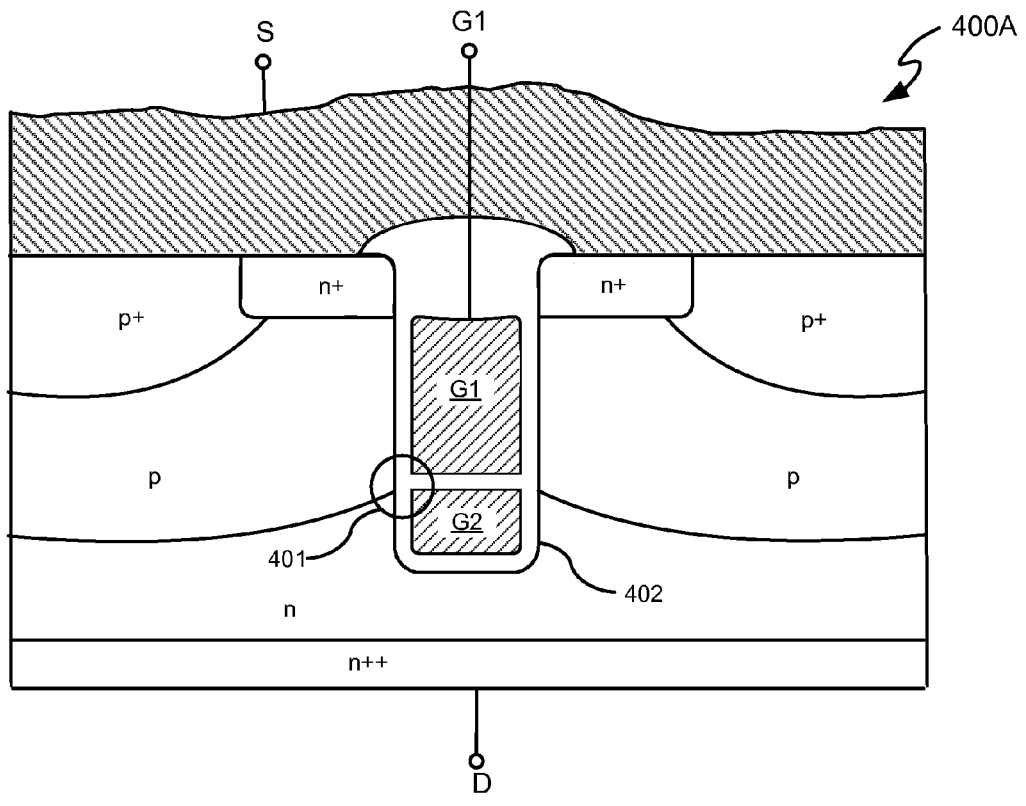
FIG. 4A is a simplified partial diagram of an exemplary embodiment of a dual gate trench power MOSFET.

Yet another technique for improving the switching speed of the power MOSFET reduces the gate-to-drain capacitance Cgd by employing a dual gate structure. According to this embodiment, the gate structure inside the trench is split into two segments: a first segment that performs the conventional gate function receiving the switching signal, and a second segment that shields the first gate segment from the drift (drain) region and can be independently biased. This dramatically reduces the gate-to-drain capacitance of the MOSFET. FIG. 4A is a simplified partial diagram of an exemplary embodiment of a dual gate trench MOSFET 400A. As depicted in FIG. 4A, the gate of MOSFET 400A has two segments G1 and G2. Unlike the shielding electrodes (311a and 311b) in MOSFET 300A of FIG. 3A, the conductive material that forms G2 in MOSFET 400A has an overlap region 401 with the channel and therefore acts as a gate terminal. This secondary gate terminal G2, however, is biased independently of the primary gate terminal G1 and does not receive the same signal that drives the switching transistor. Instead, in one embodiment, G2 is biased at a constant potential just above the threshold voltage of the MOSFET to invert the channel in overlap region 401. This will ensure that a continuous channel is formed when transitioning from secondary gate G2 to primary gate G1. Also, Cgd is reduced because the potential at G2 is higher than the source potential, and the charge transfer away from the drift region and into the secondary gate G2 further contributes to the reduction in Cgd. In another embodiment, instead of a constant potential, secondary gate G2 can be biased to a potential above the threshold voltage just prior to a switching event. In other embodiments, the potential at G2 can be made variable and optimally adjusted to minimize any fringing portion of the gate-to-drain capacitance Cgd. The dual gate structure can be employed in MOSFETs with planar gate structure as well as other types of trench gate power devices including IGBTs and the like. Variations on the dual gate trench MOS gated devices and processes for manufacturing such devices are described in greater detail in commonly-assigned U.S. patent application Ser. No. 10/640,742, entitled "Improved MOS Gating Method for Reduced Miller Capacitance and Switching Losses," by Kocon et al., which is hereby incorporated by reference in its entirety.

Figure 4B:
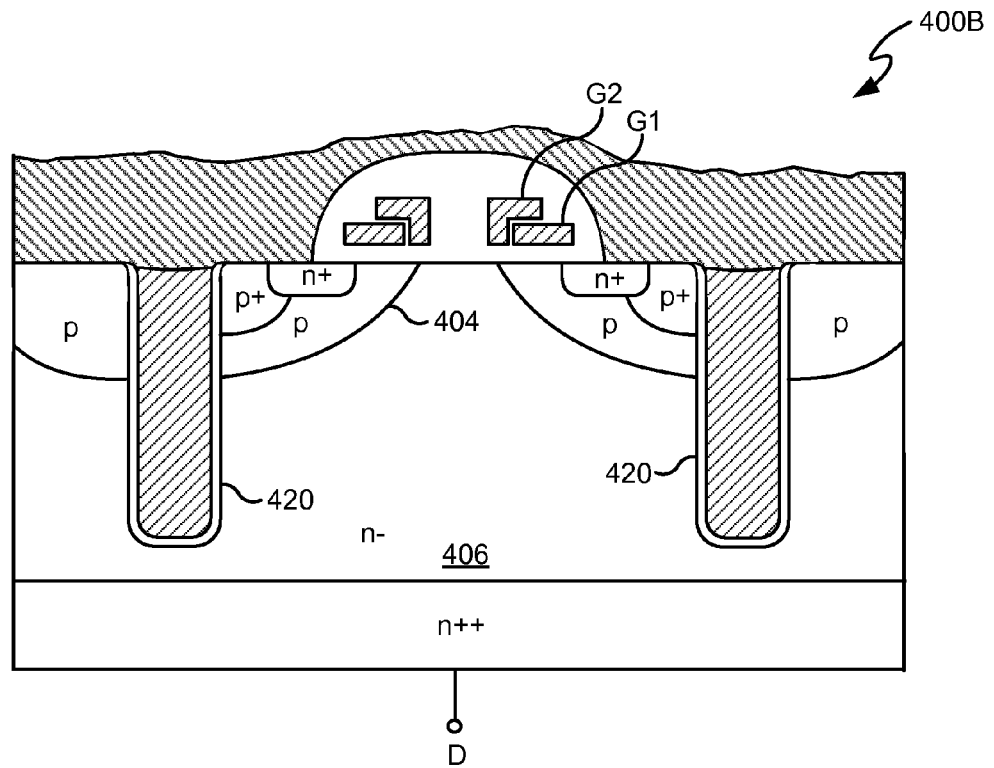
FIG. 4B shows an exemplary power MOSFET that combines a planar dual gate structure with trenched electrodes for vertical charge control.

Another embodiment for an improved power MOSFET is shown in FIG. 4B, wherein an exemplary MOSFET 400B combines a planar dual gate structure with trenched electrodes for vertical charge control. Primary and secondary gate terminals G1 and G2 function in a similar fashion as the trenched dual gate structure of FIG. 4A, while deep trenches 420 provide an electrode in the drift region to spread charge and increase breakdown voltage of the device. In the embodiment shown, shield or secondary gate G2 overlaps the upper portion of primary gate G1 and extends over p well 404 and drift region 406. In an alternative embodiment, primary gate G1 extends over shield/secondary gate G2.

The various techniques described thus far such as gate shielding and trenched electrodes for vertical charge control can be combined to obtain power devices, including lateral and vertical MOSFETs, IGBTs, diodes and the like, whose performance characteristics are optimized for a given application. For example, the trenched dual gate structure shown in FIG. 4A can be advantageously combined with vertical charge control trench structures of the types shown in FIG. 3B or 4B. Such a device would include an active trench with dual gate structure as shown in FIG. 4A as well as deeper charge control trenches that are either substantially filled by a single layer of conductive material (as in trenches 420 in FIG. 4B) or by multiple stacked conductive electrodes (as in trenches 301 in FIG. 3B). For lateral devices where the drain terminal is located on the same surface of the substrate as the source terminal (i.e., current flows laterally), the charge control electrodes would be laterally disposed forming field plates, instead of being stacked in vertical trenches. The orientation of the charge control electrodes is generally parallel to the direction of current flow in the drift region.

Figure 4C:
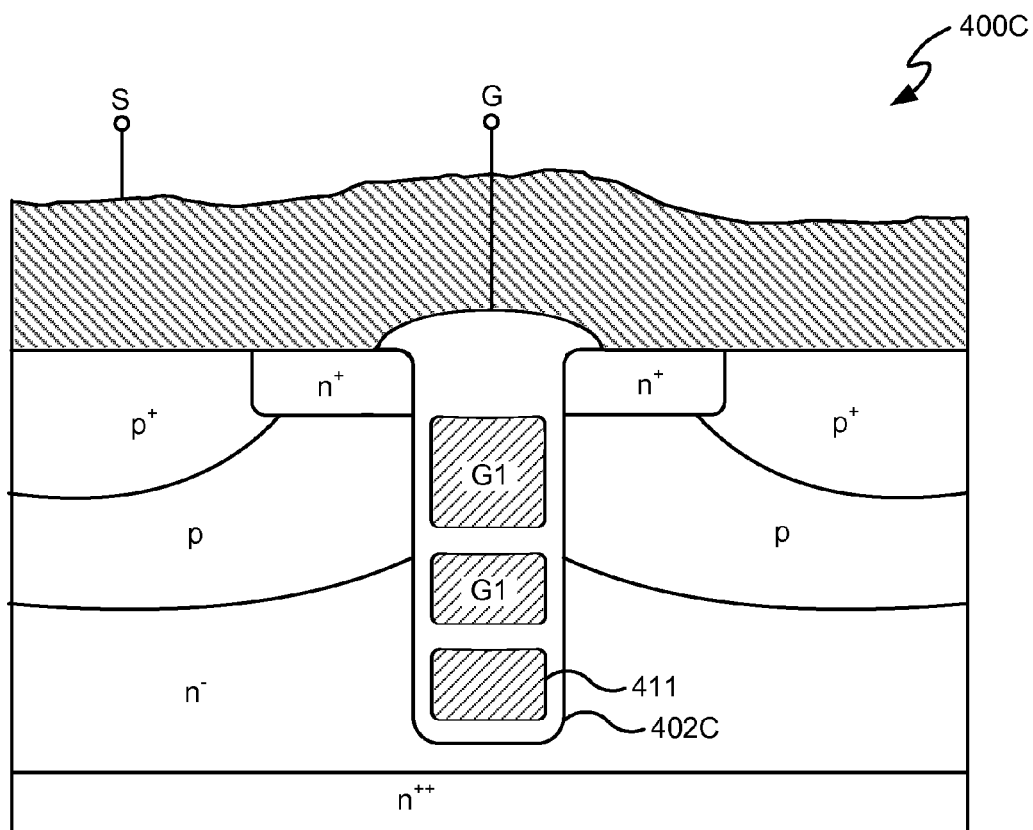
FIG. 4C shows an exemplary implementation of a power MOSFET that combines the dual gate and shielded gate techniques inside the same trench.

In one embodiment, the dual gate and shielded gate techniques are combined inside the same trench to provide switching speed and blocking voltage enhancements. FIG. 4C shows a MOSFET 400C wherein trench 402C includes a primary gate G1, a secondary gate G2 and a shield layer 411 stacked in a single trench as shown. Trench 402C can be made as deep and may include as many shield layers 411 as the application demands. Using the same trench for both charge balance and shielding electrodes enables higher density, since it eliminates the need for two trenches and combines it into one. It also enables more current spreading and improves device on-resistance. It is to be understood, however, that embodiments combining active trenches having the shielded dual gate structure of the type shown in FIG. 4C with separate charge balancing trenches of the various types described herein are also possible.

Figure 4D:
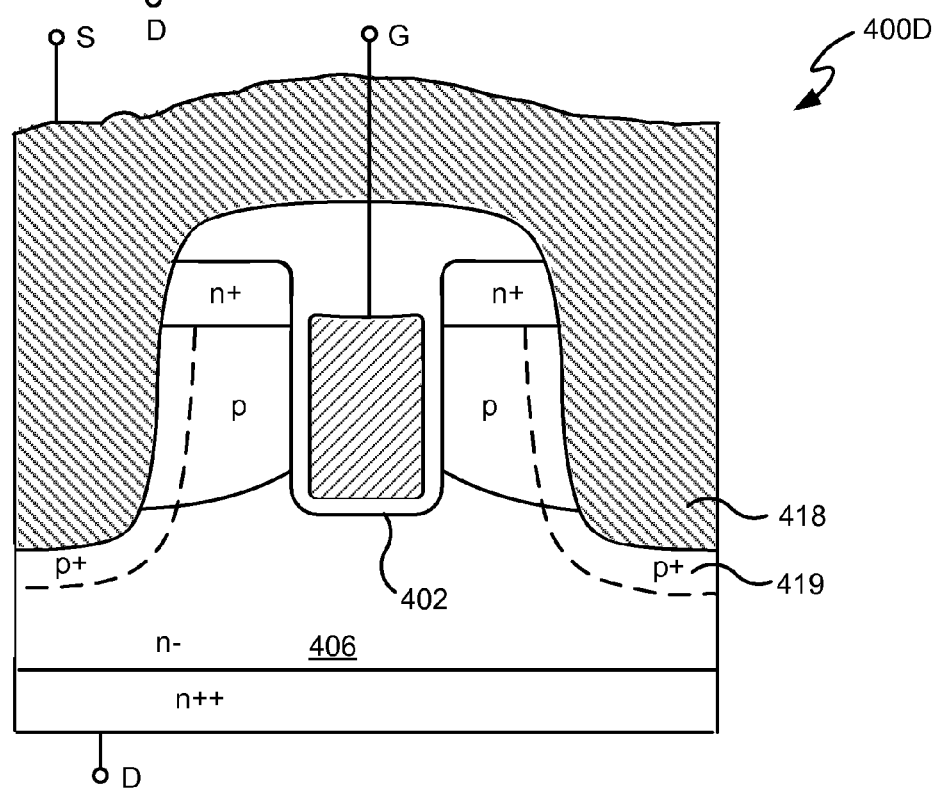
FIGS. 4D and 4E are cross-sectional diagrams of alternative embodiments for a power MOSFET with deep body structure.

The devices described thus far employ combinations of shielded gate, dual gate and other techniques to reduce parasitic capacitance. Due to fringing effects, however, these techniques do not fully minimize the gate-to-drain capacitance Cgd. Referring to FIG. 4D, there is shown a partial cross-sectional view of an exemplary embodiment of MOSFET 400D with deep body design. According to this embodiment, the body structure is formed by a trench 418 that is etched through the center of the mesa formed between gate trenches 402, and extends as deep or deeper than gate trench 402. Body trench 418 is filled with source metal as shown. The source metal layer may include a thin refractory metal at the metal-diffusion boundary (not shown). In this embodiment, the body structure further includes a p+ body implant 419 that substantially surrounds body trench 418. P+ implant layer 419 enables additional shielding to alter the potential distribution inside the device especially close to the gate electrode. In an alternate embodiment shown in FIG. 4E, body trench 418 is substantially filled with epitaxial material using, for example, selective epitaxial growth (SEG) deposition. Alternatively, body trench 418E is substantially filled with doped polysilicon. In either of these two embodiments, instead of implanting p+ shield junction 419, subsequent temperature treatment will diffuse dopants from the filled body into the silicon to form p+ shield junction 419. A number of variations for trenched body structure and formation are described in greater detail in commonly-assigned U.S. Pat. Nos. 6,437, 399 and 6,110,799, both to Huang, which are hereby incorporated by reference in their entirety.

Figure 4E:
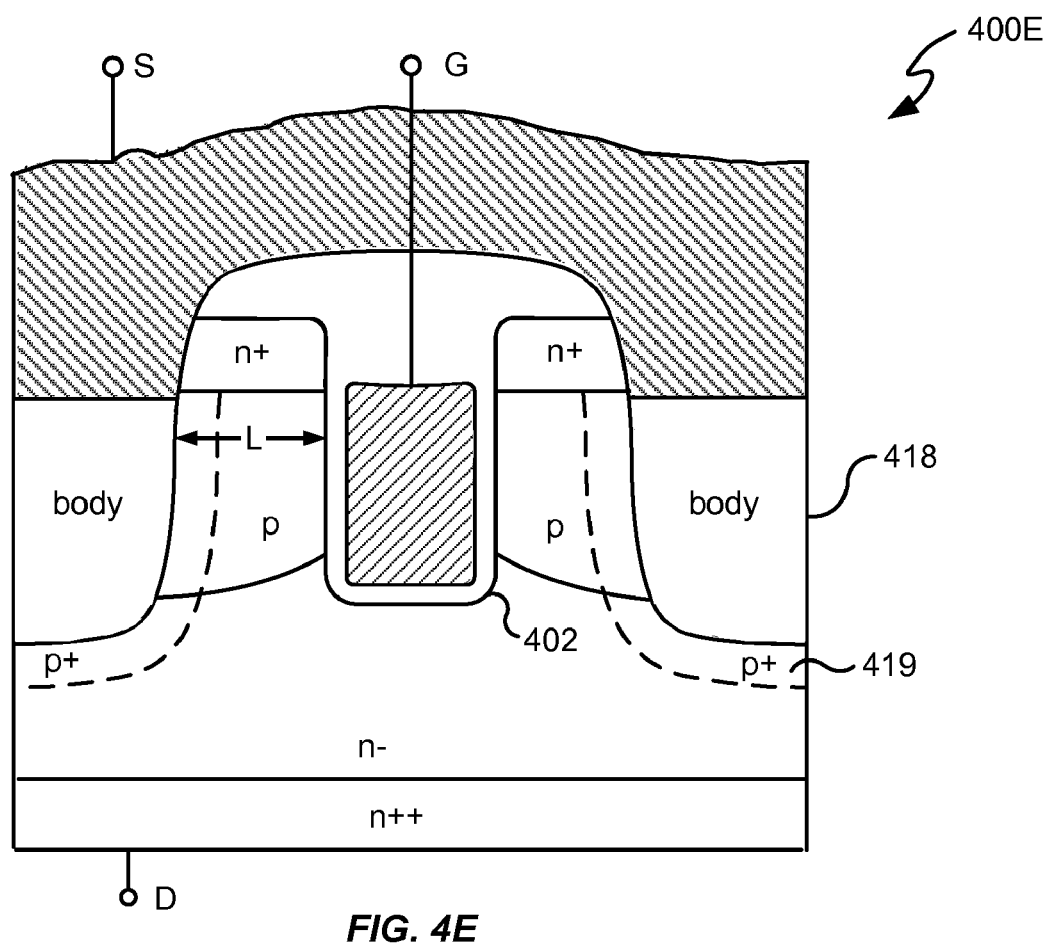
Figures 4F, 4G:
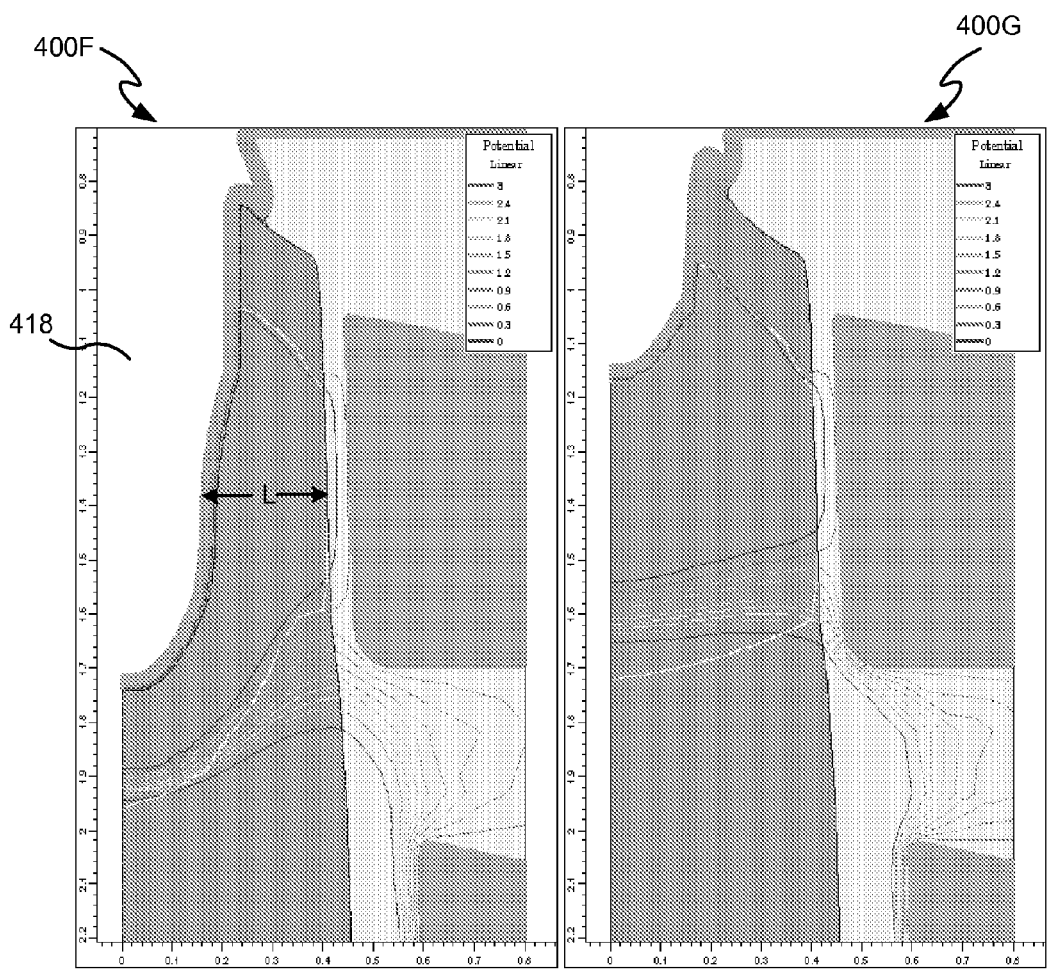
FIGS. 4F and 4G illustrate the impact of trenched deep body structures on the distribution of potential lines inside the power MOSFET near the gate electrode.

In both embodiments shown in FIGS. 4D and 4E, the distance L between gate trench 402 and body trench 418, as well as the relative depths of the two trenches are controlled to minimize fringing gate-to-drain capacitance. In the embodiments using SEG or poly filled body trenches, the spacing between the outer edges of the layer 419 and the wall of the gate trench can be adjusted by varying the doping concentration of the SEG or poly inside body trench 418. FIGS. 4F and 4G illustrate the impact of the trenched deep body on the distribution of the potential lines inside the device near the gate electrode. For illustrative purposes, FIGS. 4F and 4G use MOSFETs with shielded gate structures. FIG. 4F shows the potential lines for a reverse biased shielded gate MOSFET 400F with trenched deep body 418, and FIG. 4G shows the potential lines for a reverse biased shielded gate MOSFET 400G with a shallow body structure. The contour lines in each device show potential distribution inside the device when reverse biased (i.e., blocking off-state). The white line shows the well junction and also defines the bottom of the channel located next to the gate electrode. As can be seen from the diagrams, there is a lower potential and lower electric field imposed on the channel and surrounding gate electrode for the trenched deep body MOSFET 400F of FIG. 4F. This decreased potential enables a reduced channel length which reduces the total gate charge for the device. For example, the depth of gate trench 402 can be reduced to below, e.g., 0.5 um, and can be made shallower than body trench 418 with the spacing L being about 0.5 um or smaller. In one exemplary embodiment, the spacing L is less than 0.3 um. Another advantage of this embodiment is the reduction in the gate-drain charge Qgd and Miller capacitance Cgd. The lower the value of these parameters, the faster the device is able to switch. This improvement is realized through the reduction of potential that is present next to the gate electrode. The improved structure has much lower potential that will be switched and the induced capacitive current in the gate is much lower. This in turn enables the gate to switch faster.

The trenched deep body structure as described in connection with FIGS. 4D and 4E can be combined with other charge balancing techniques such as shielded gate or dual gate structures, to further improve the switching speed, on-resistance, and blocking capability of the device.

The improvements provided by the above power devices and variations thereof have yielded robust switching elements for relatively lower voltage power electronic applications. Low voltage as used herein refers to a voltage range from, for example, about 30V-40V and below, though this range may vary depending on the particular application. Applications requiring blocking voltages substantially above this range necessitate some type of structural modification to the power transistor. Typically, the doping concentration in the drift region of the power transistor is reduced in order for the device to sustain higher voltages during the blocking state. A more lightly doped drift region, however, results in an increase in the transistor on-resistance $R_{DSon}$. The higher resistivity directly increases the power loss of the switch. The power loss has become more significant as recent advances in semiconductor manufacturing have further increased the packing density of power devices.

Attempts have been made to improve the device on-resistance and power loss while maintaining high blocking voltage. Many of these attempts employ various vertical charge control techniques to create a largely flat electric field vertically in the semiconductor device. A number of device structures of this type have been proposed including the lateral depletion device disclosed in commonly-owned U.S. Pat. No. 6,713,813, entitled "Field Effect Transistor Having a Lateral Depletion Structure," by Marchant, and the devices described in commonly-owned U.S. Pat. No. 6,376,878, to Kocon, both of which are hereby incorporated by reference in their entirety.

Figure 5A:
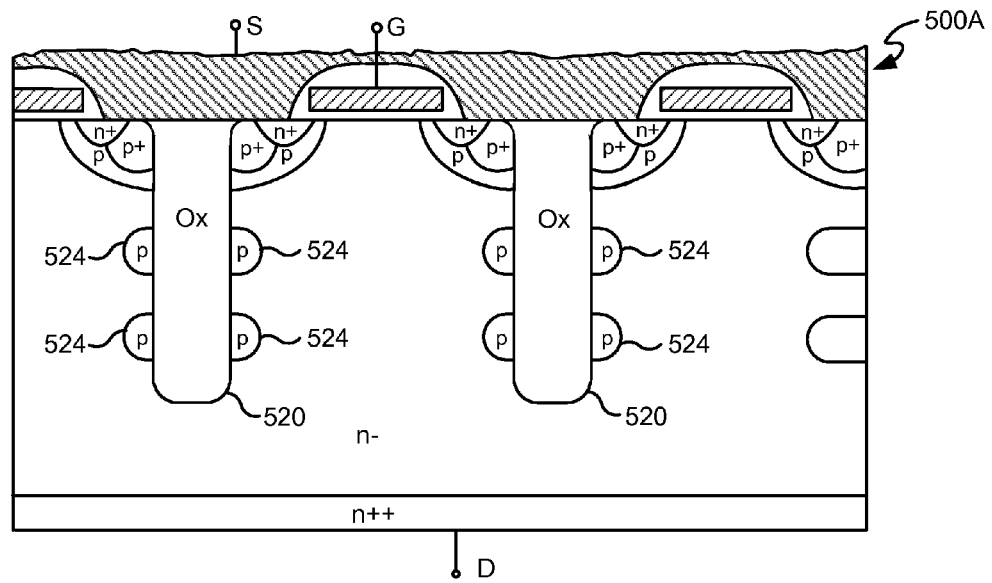
FIGS. 5A, 5B and 5C are cross-sectional diagrams showing portions of exemplary power MOSFETs with various vertical charge balancing structures.

FIG. 5A shows a cross-sectional view of a portion of an exemplary power MOSFET 500A with a planar gate structure. MOSFET 500A appears to have similar structure to that of planar MOSFET 200B of FIG. 2B, but it differs from that device in two significant respects. Instead of filling trenches 520 with conductive material, these trenches are filled with dielectric material such as silicon dioxide, and the device further includes discontinuous floating p-type regions 524 spaced adjacent the outer sidewalls of trenches 520. As described in connection with the dual trench MOSFET of FIG. 2A, the conductive material (e.g., polysilicon) in source trenches 202 help improve the cell breakdown voltage by pushing the depletion region deeper into the drift region. Eliminating the conductive material from these trenches would thus result in lowering the breakdown voltage unless other means of reducing the electric field are employed. Floating p regions 524 serve to reduce the electric field.

Figure 5B:
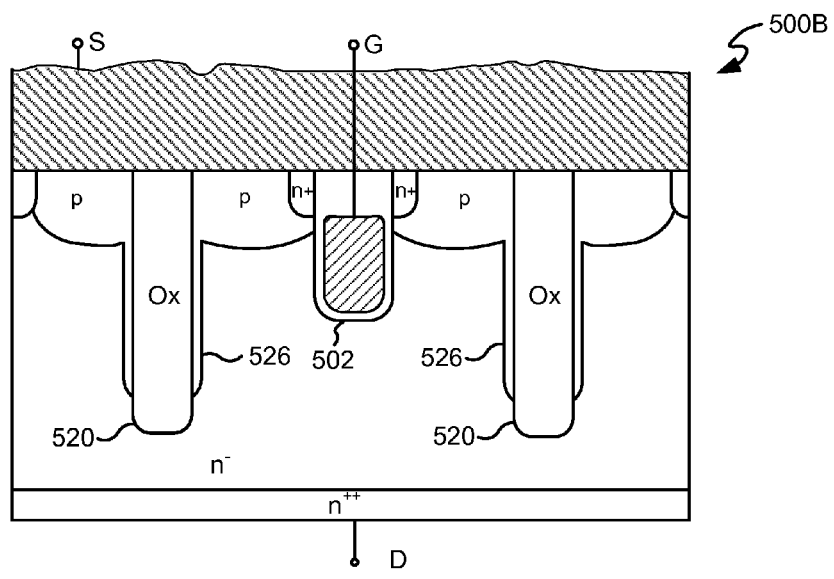

Referring to MOSFET 500A shown in FIG. 5A, as the electric field increases when the drain voltage is increased, floating p regions 524 acquire a corresponding potential determined by their position in the space charge region. The floating potential of these p regions 524 causes the electric field to spread deeper into the drift region resulting in a more uniform field throughout the depth of the mesa region in between trenches 520. As a result, the breakdown voltage of the transistor is increased. The advantage of replacing the conductive material in the trenches with insulating material is that a greater portion of the space charge region appears across an insulator rather than the drift region which could be silicon. Because the permittivity of an insulator is lower than that of, e.g. silicon, and because the area of the depletion region in the trench is reduced, the output capacitance of the device is significantly reduced. This further enhances the switching characteristics of the transistor. The depth of dielectric-filled trenches 520 depends on the voltage requirements; the deeper the trenches the higher the blocking voltage. An added advantage of the vertical charge control technique is that it allows the transistor cells to be laterally displaced for thermal isolation without appreciable added capacitance. In an alternative embodiment, instead of the floating p regions, p-type layers line the exterior sidewalls of the dielectrically-filled trenches to achieve similar vertical charge balancing. A simplified and partial cross-sectional view of this embodiment is shown in FIG. 5B, where the exterior sidewalls of trenches 520 are covered by a p-type layer or liner 526. In the exemplary embodiment shown in FIG. 5B the gate is also trenched, which further improves the device transconductance. Other embodiments for improved power devices employing variations of this technique are described in greater detail in commonly-assigned U.S. patent application Ser. No. 10/200,056, entitled "Vertical Charge Control Semiconductor Device with Low Output Capacitance," by Sapp et al., which is hereby incorporated by reference in its entirety.

Figure 5C:
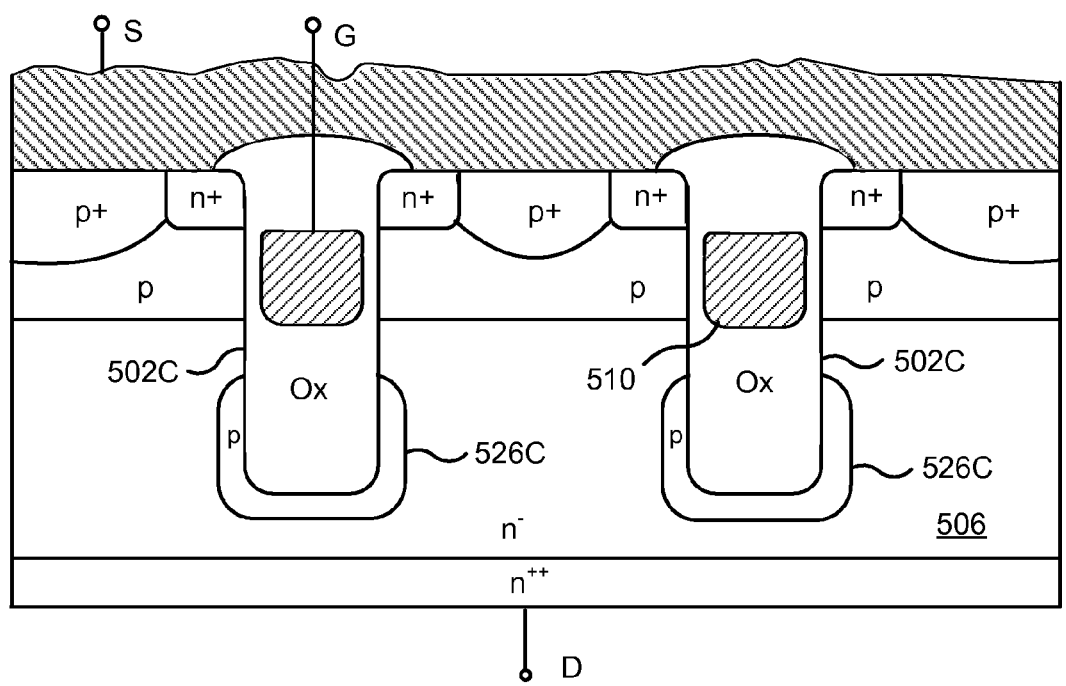

As described above, trench MOSFET 500B of FIG. 5B exhibits reduced output capacitance and improved breakdown voltage. However, because the active trench (gate trench 502) is positioned between dielectric-filled charge control trenches 520, the channel width of MOSFET 500B is not as large as conventional trench MOSFET structures. This may result in a higher on-resistance $R_{DSon}$. Referring to FIG. 5C, there is shown an alternative embodiment for a trench MOSFET 500C with vertical charge control that eliminates the secondary charge control trenches. Trenches 502C in MOSFET 500C include gate poly 510 and a dielectric-filled lower portion that extends deep into drift region 506. In one embodiment, trenches 502C extend to a depth below about half the depth of drift region 506. A p-type liner 526C surrounds the exterior walls along the lower portion of each trench as shown. This single-trench structure eliminates the secondary charge control trench, allowing for increased channel width and lower $R_{DSon}$. The lower portion of deeper trench 502C that is surrounded by a p-type liner 526C on its exterior walls supports a major portion of the electric field in order to reduce output capacitance and gate-to-drain capacitance. In an alternative embodiment, p-type liner 526C is made into a plurality of discontinuous regions along the sides and the bottom of trench 502C. Other embodiments are possible by combining the single trench charge control structure with shielded gate or dual gate techniques described above, to further reduce device parasitic capacitance.

Figure 6:
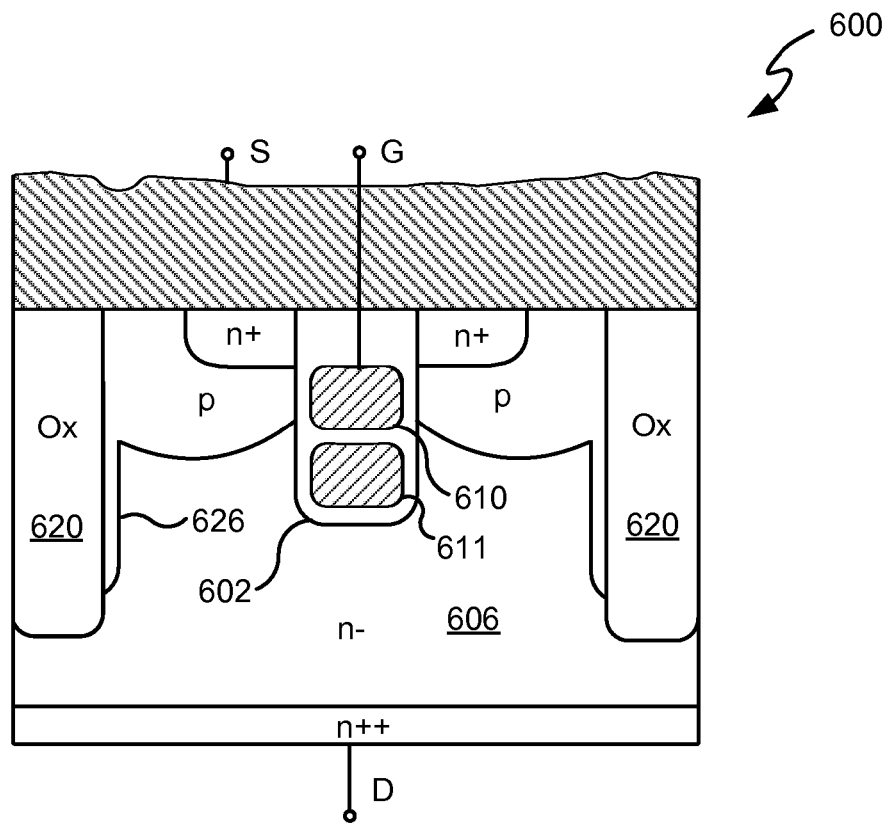
FIG. 6 shows a simplified cross-sectional view of a power MOSFET that combines an exemplary vertical charge control structure with a shielded gate structure.

Referring to FIG. 6, there is shown a simplified cross-sectional view of a power MOSFET 600 that is suitable for higher voltage applications that also require faster switching. MOSFET 600 combines vertical charge control to improve breakdown voltage, with shielded gate structure that improves switching speed. As shown in FIG. 6, a shield electrode 611 is positioned inside gate trench 602 between gate conductive material 610 and the bottom of the trench. Electrode 611 shields the gate of the transistor from underlying drain region (drift region 606) which significantly reduces the gate-to-drain capacitance of the transistor and thus increases its maximum switching frequency. Dielectric-filled trenches 620 with p doped liners 626 help create a largely flat electric field vertically to improve the breakdown voltage of the device. While in operation, the combination of dielectric-filled trenches 620 with p-type liner 626, and the shielded gate structure reduces the parasitic capacitance and helps deplete the n drift region which disperses the electric field concentrating on the edge portion of the gate electrode. Devices of this type can be used in RF amplifier or in high frequency switching applications.

Figure 7:
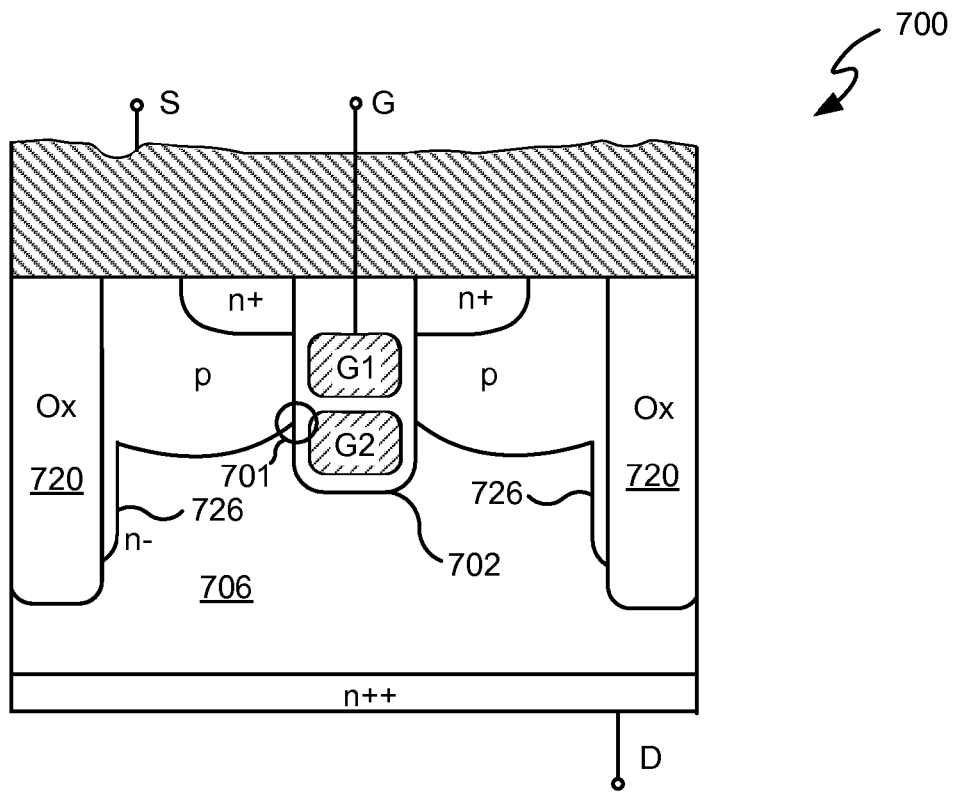
FIG. 7 shows a simplified cross-sectional view of another power MOSFET that combines an exemplary vertical charge control structure with a dual gate structure.

FIG. 7 depicts an alternative embodiment for another power MOSFET suitable for higher voltage, higher frequency applications. In the simplified example shown in FIG. 7, MOSFET 700 combines vertical charge control to improve breakdown voltage with dual gate structure that improves switching speed. Similar to the device shown in FIG. 6, vertical charge control is implemented by the use of dielectric-filled trenches 720 with p-doped liners 726. Reduction in parasitic capacitance is achieved by the use of a dual gate structure whereby a primary gate electrode G1 is shielded from the drain (n-drift region 706) by a secondary gate electrode G2. Secondary gate electrode G2 can be either continuously biased or only biased prior to a switching event in order invert the channel in region 701 to ensure an uninterrupted flow of current through a continuous channel when the device is turned on.

Figure 8:
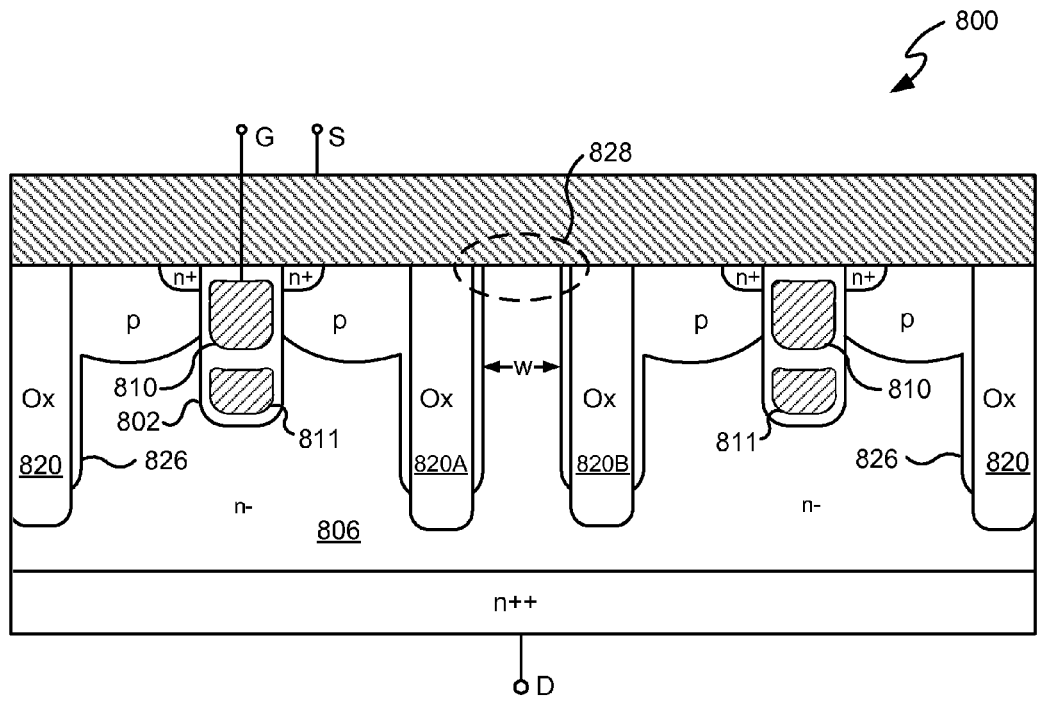
FIG. 8 shows one example of a shielded gate power MOSFET with vertical charge control structure and integrated Schottky diode.

In another embodiment, the shielded vertical charge control MOSFET also employs the doped sidewall dielectric-filled trenches to implement an integrated Schottky diode. FIG. 8 shows one example of a shielded gate MOSFET 800 according to this embodiment. In this example, electrode 811 in the lower part of trench 802 shields gate electrode 810 from drift region 806 to reduce parasitic gate-to-drain capacitance. Dielectric-filled trenches 820 with p doped liners on their exterior sidewalls provide for vertical charge control. A Schottky diode 828 is formed between two trenches 820A and 820B that form a mesa of width W. This Schottky diode structure is interspersed throughout the trench MOSFET cell array to enhance the performance characteristics of the MOSFET switch. The forward voltage drop is reduced by taking advantage of the low barrier height of Schottky structure 828. In addition, this diode will have an inherent reverse recovery speed advantage compared to the normal PN junction of the vertical power MOSFET. By doping of the sidewalls of dielectric-filled trenches 820 with, e.g., Boron, sidewall leakage path due to phosphorus segregation is eliminated. Features of the trench process can be used to optimize the performance of Schottky diode 828. In one embodiment, for example, the width W is adjusted such that depletion in the drift region of Schottky structure 828 is influenced and controlled by the adjacent PN junction to increase the reverse voltage capability of Schottky diode 828. An example of a monolithically integrated trench MOSFET and Schottky diode can be found in commonly-assigned U.S. Pat. No. 6,351,018 to Sapp, which is hereby incorporated by reference in its entirety.

Figure 9A:
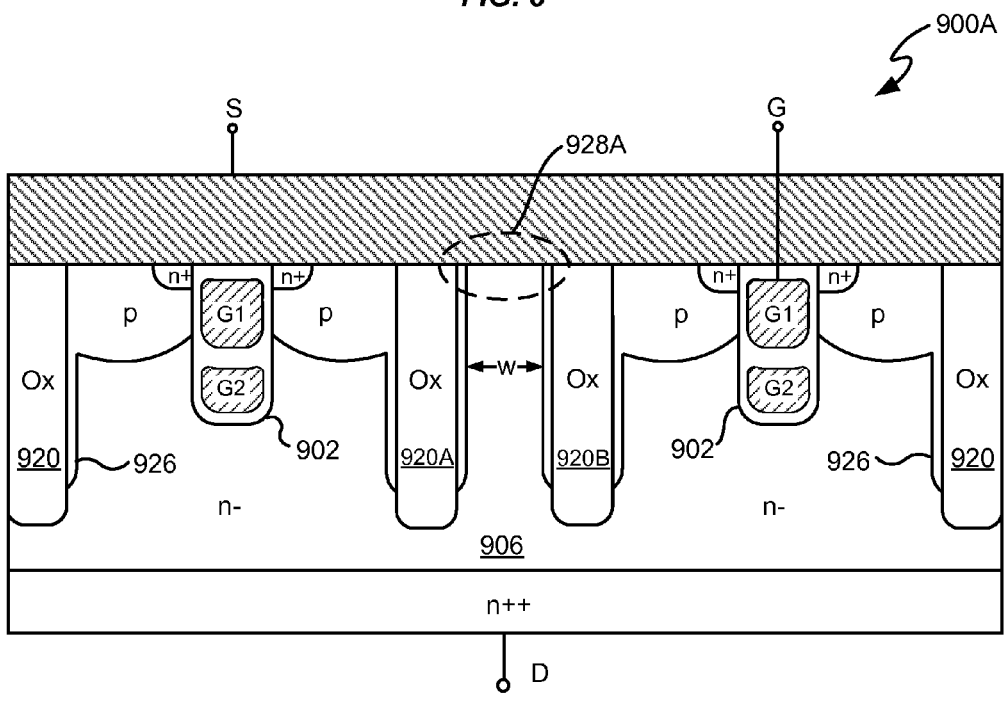
FIGS. 9A, 9B and 9C depict various exemplary embodiments for power MOSFETs with integrated Schottky diode.
Figure 9B:
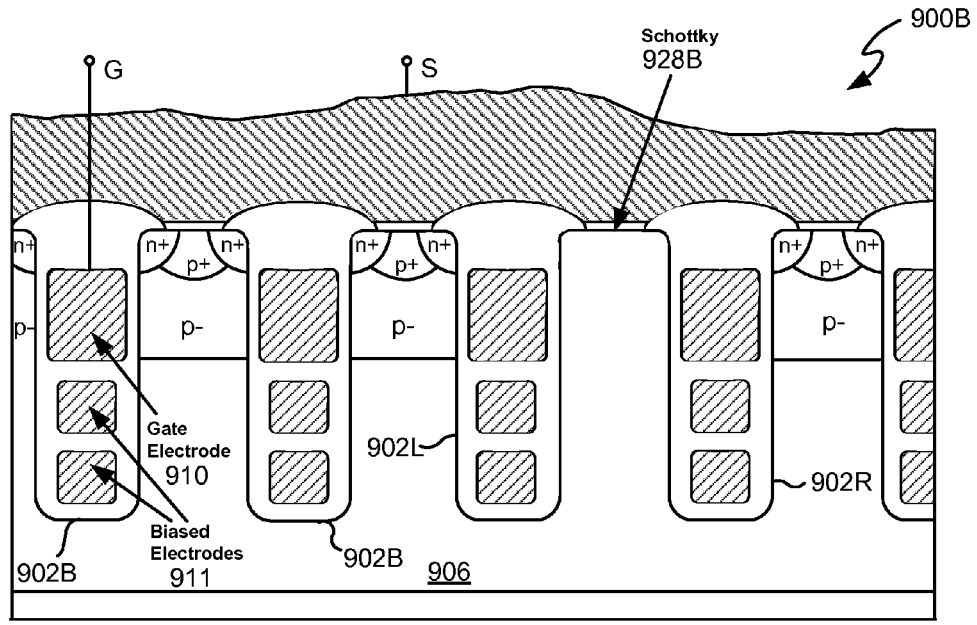
Figure 9C:
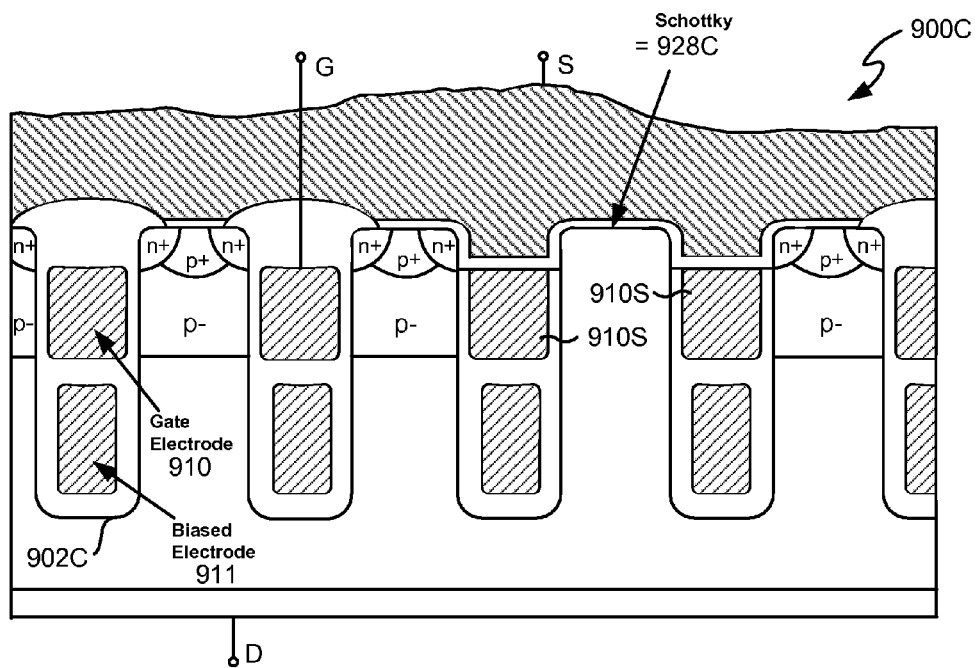
Figure 9D:
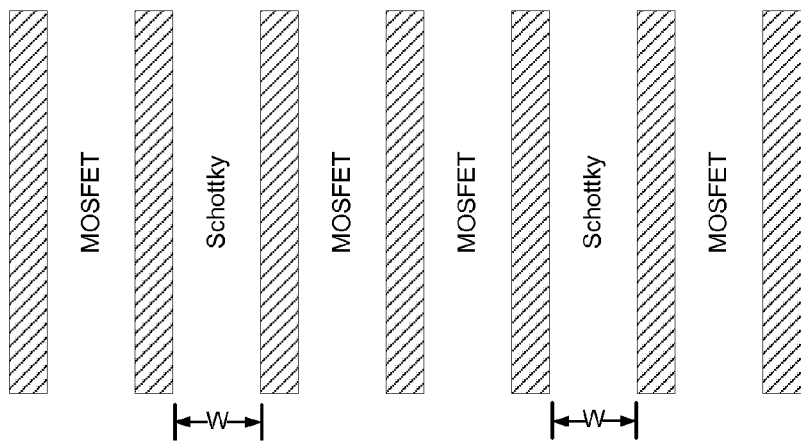
FIGS. 9D, 9E and 9F illustrate exemplary layout variations for interspersing Schottky diode cells within the active cell array of a power MOSFET.
Figure 9E:
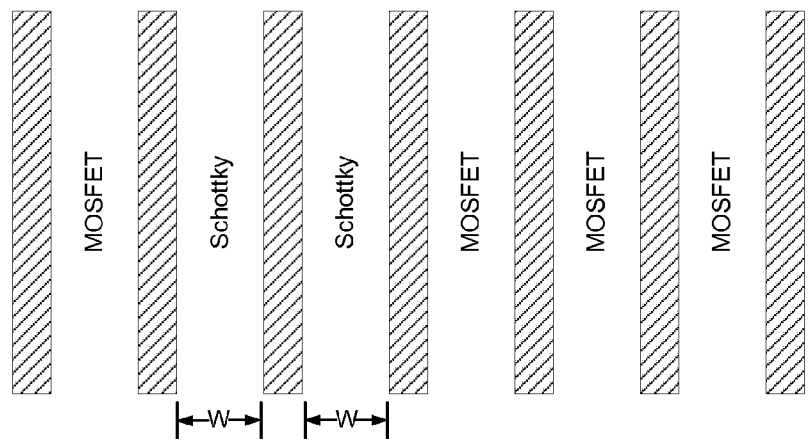
Figure 9F:
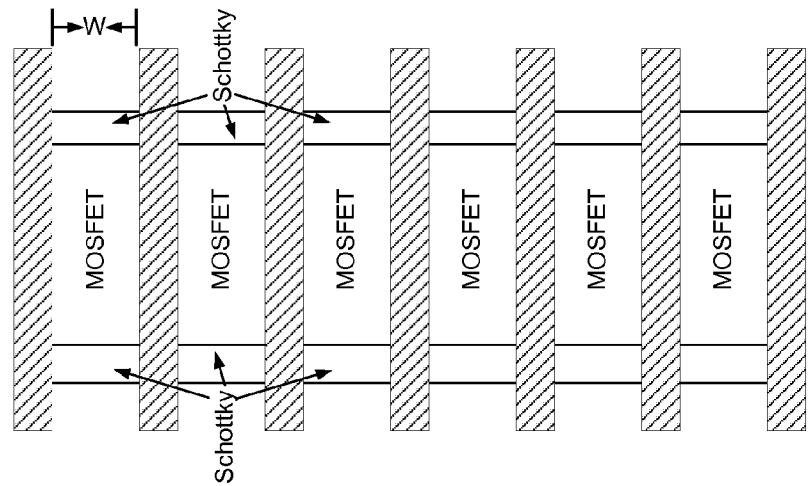

It is to be understood that a Schottky diode formed between dielectric-filled trenches of the type depicted in FIG. 8 can be integrated with a variety of different types of MOSFETs, including MOSFETs with a planar gate structure, trench gate MOSFETs without any shielding electrode with or without thick dielectric at the bottom of the trench, etc. An exemplary embodiment for a dual gate trench MOSFET with integrated Schottky diode is shown in FIG. 9A. MOSFET 900A includes gate trench 902 wherein a primary gate G1 is formed above a secondary gate G2 to reduce parasitic capacitance and increase switching frequency. MOSFET 900A also includes dielectric-filled trenches 920 with p doped liners 926 formed along their exterior sidewalls for vertical charge control to enhance the device blocking voltage. One method of forming the liners for many of the embodiments described above (e.g., those shown in FIGS. 5B, 6, 7, 8 and 9A) uses a plasma doping process. Schottky diode 928A is formed between two adjacent dielectric-filled trenches 920A and 920B as shown. In another variation, a monolithically integrated Schottky diode and trench MOSFET is formed without the dielectric-filled trenches. FIG. 9B is a cross-sectional view of an exemplary device 900B according to this embodiment. MOSFET 900B includes active trenches 902B each having electrodes 911 buried under a gate electrode 910. A Schottky diode 928B is formed between two trenches 902L and 902R as shown. The charge balancing effect of biased electrodes 911 allows for increasing the doping concentration of the drift region without compromising the reverse blocking voltage. Higher doping concentration in the drift region in turn reduces the forward voltage drop for this structure. As in previously described trench MOSFETs with buried electrodes, the depth of each trench as well as the number of the buried electrodes may vary. In one variation shown in FIG. 9C, trench 902C has only one buried electrode 911 and gate electrodes 910S in Schottky cell 928C connect to the source electrode as shown. The gate of the Schottky diode can alternatively connect to the gate terminal of the MOSFET. FIGS. 9D, 9E and 9F show exemplary layout variations for Schottky diode interspersed within the active cell array of MOSFET. FIGS. 9D and 9E show single mesa Schottky and double mesa Schottky layouts, respectively, while FIG. 9F shows a layout wherein Schottky regions are perpendicular to MOSFET trenches. These and other variations of an integrated Schottky diode, including alternative multiples of Schottky to MOSFET regions, can be combined with any of the transistor structures described herein.

Figure 10:
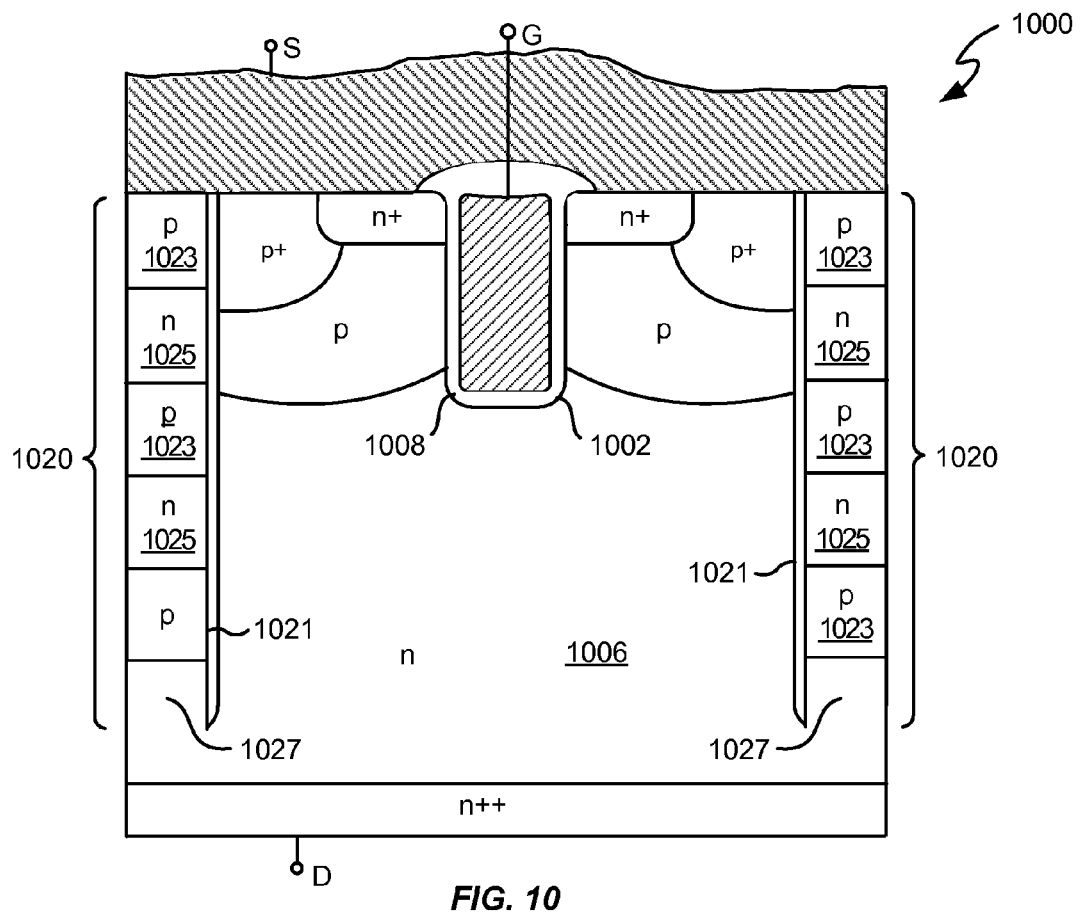
FIG. 10 provides a simplified cross-sectional view of an exemplary trench power MOSFET with buried diode charge balancing structure.

In another embodiment, the voltage blocking capability of a power device is enhanced by use of one or more diode structures in series, buried inside a trench lined with dielectric, and arranged parallel to the current flow in the device drift region. FIG. 10 provides a simplified cross-sectional view of an exemplary trench MOSFET 1000 according to this embodiment. Diode trenches 1020 are disposed on either sides of a gate trench 1002, extending well into drift region 1006. Diode trenches 1020 include one or more diode structures made up of opposite conductivity type regions 1023 and 1025 that form one or more PN junctions inside the trench. In one embodiment, trench 1020 includes a single region having a polarity that is opposite that of the drift region such that a single PN junction is formed at the interface with the drift region. P-type and n-type doped polysilicon or silicon may be used to form regions 1023 and 1025, respectively. Other types of material such as silicon carbide, gallium arsenide, silicon germanium, etc. could also be used to form regions 1023 and 1025. A thin dielectric layer 1021 extending along the trench inner sidewalls insulates the diode in the trench from drift region 1006. As shown, there is no dielectric layer along the bottom of trenches 1020, thus allowing the bottom region 1027 to be in electrical contact with the underlying substrate. In one embodiment, similar considerations to those dictating the design and manufacture of the gate oxide 1008 are applied in designing and forming dielectric layer 1021. For example, the thickness of dielectric layer 1021 is determined by such factors as the voltage it is required to sustain and the extent to which the electric field in the diode trench is to be induced in the drift region (i.e., the extent of coupling through the dielectric layer).

In operation, when MOSFET 1000 is biased in its blocking state, PN junctions inside diode trench 1020 are reverse biased with the peak electric field occurring at each diode junction. Through dielectric layer 1021, the electric field in the diode trench induces a corresponding electric field in drift region 1006. The induced field is manifested in the drift region in the form of an up-swing spike and a general increase in the electric field curve in the drift region. This increase in the electric field results in a larger area under the electric field curve which in turn results in a higher breakdown voltage. Variations on this embodiment are described in greater detail in commonly-assigned U.S. patent application Ser. No. 10/288,982, entitled "Drift Region Higher Blocking Lower Forward Voltage Drop Semiconductor Structure," by Kocon et al., which is hereby incorporated by reference in its entirety.

Figure 11:
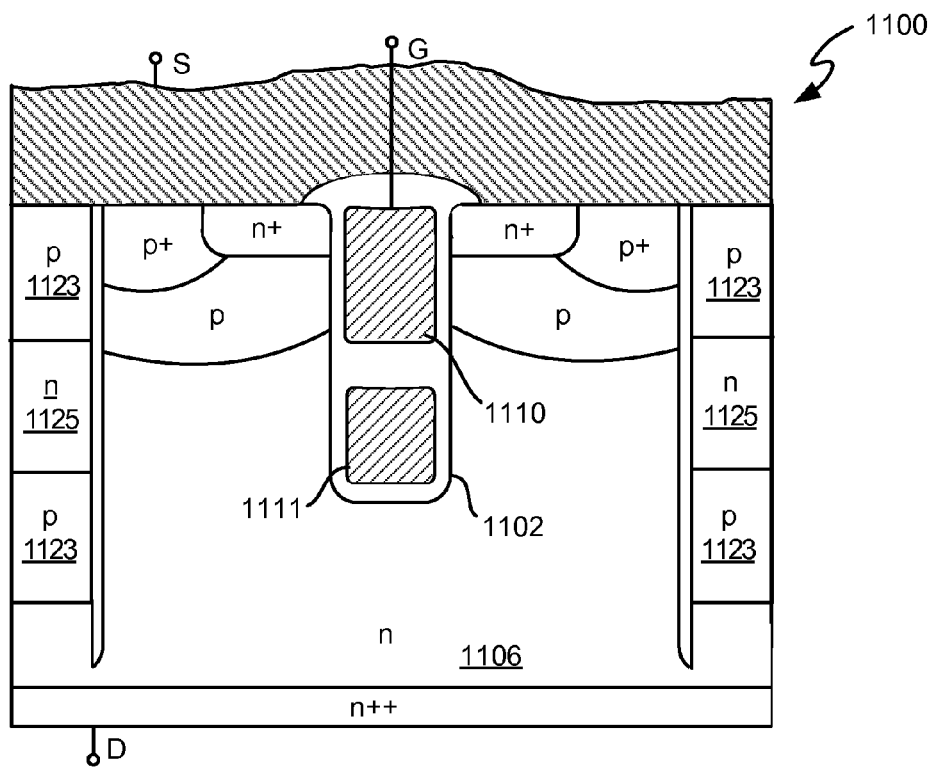
FIGS. 11 and 12 show exemplary embodiments for power MOSFETs that combine shielded gate and dual gate techniques with buried diode charge balancing, respectively.
Figure 12:
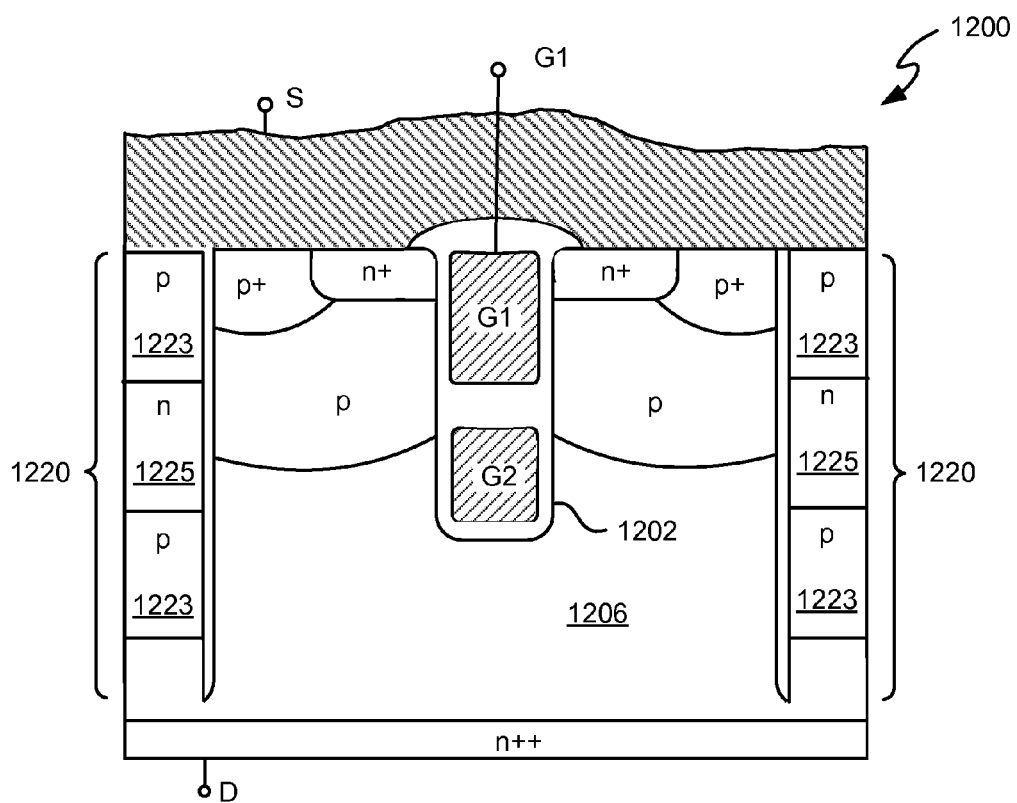

Other embodiments for power devices that combine trenched diodes for charge balancing with techniques to reduce parasitic capacitance such as shielded gate or dual gate structures are possible. FIG. 11 shows one example of a MOSFET 1100 according to one such embodiment. MOSFET 1100 uses a shield electrode 1111 inside active trench 1102 under gate electrode 1110, to reduce gate-to-drain capacitance Cgd for the transistor as described above in connection with, for example, MOSFET 300A in FIG. 3A. A different number of PN junctions are employed in MOSFET 1100 as compared to MOSFET 1000. FIG. 12 is a cross-sectional view of a MOSFET 1200 that combines the dual gate technique with the trenched diode structure. Active trench 1202 in MOSFET 1200 includes a primary gate G1 and a secondary gate G2 and operates in the same manner as the active trenches in the dual gate MOSFET described in connection with FIG. 4B. Diode trenches 1220 provide charge balancing to increase the device blocking voltage while the dual gate active trench structure improves the device switching speed.

Figure 13:
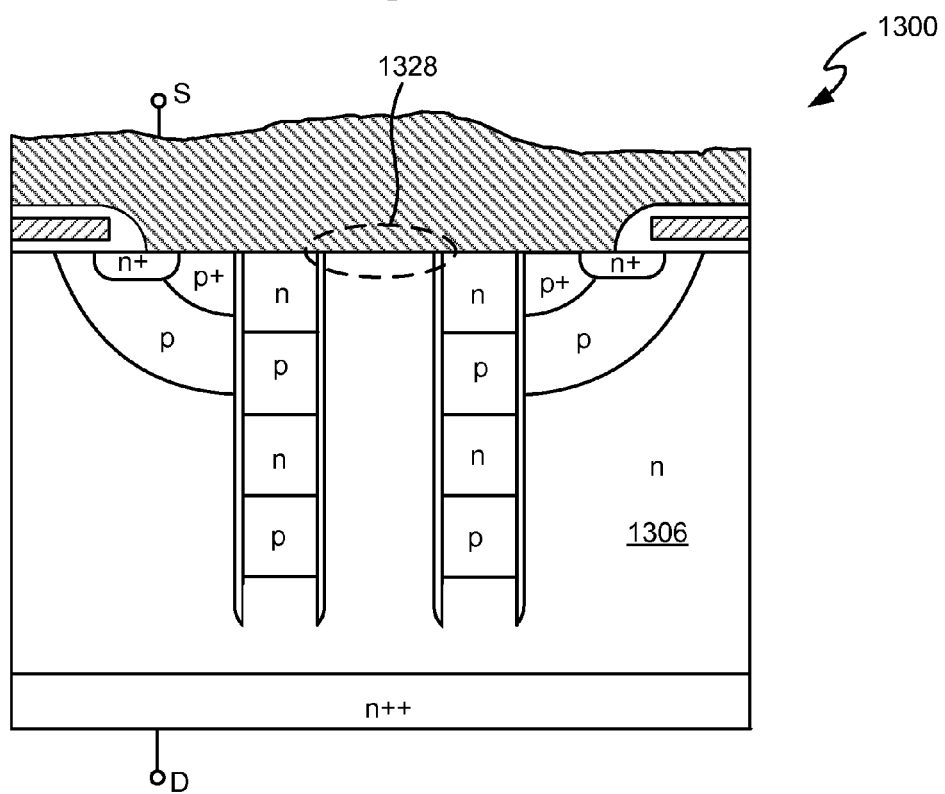
FIG. 13 is a simplified cross-sectional view of an exemplary planar power MOSFET that combines the buried diode charge balancing technique with integrated Schottky diode.

Yet another embodiment combines the trenched diode charge balancing technique with integrated Schottky diode in a planar gate MOSFET 1300 as shown in FIG. 13. Similar advantages can be obtained by the integration of Schottky diode 1328 with the MOSFET as described in connection with the embodiments of FIGS. 8 and 9. In this embodiment, a planar gate structure is shown for illustrative purposes, and those skilled in the art will appreciate that the combination of an integrated Schottky diode and trenched diode structure can be employed in a MOSFET having any of the other types of gate structures including trench gate, dual gate and shielded gate. Any one of the resulting embodiments can also be combined with the trenched body technique to further minimize the fringing parasitic capacitance, as described in connection with MOSFET 400D or 400E of FIGS. 4D and 4E. Other variations and equivalents are possible. For example, the number of regions of opposite conductivity inside the diode trenches may vary as can the depth of the diode trenches. The polarities of the opposite conductivity regions may be reversed as can the polarity of the MOSFET. Also, any of the PN regions (923,925 or 1023,1025, etc.) may be independently biased if desired by, for example, extending the respective regions along the third dimension and then up to the silicon surface where electrical contact can be made to them. Further, multiple diode trenches may be used as demanded by the size of the device and the voltage requirements of the application, and the spacing and arrangement of the diode trenches can be implemented in various stripe or cellular designs.

In another embodiment, a class of accumulation-mode transistors is provided that employs various charge balancing techniques for smaller forward voltage loss and higher blocking capability. In a typical accumulation-mode transistor there is no blocking junction and the device is turned off by lightly inverting the channel region next to the gate terminal to pinch off the current flow. When the transistor is turned on by applying a gate bias, an accumulation layer rather than an inversion layer is formed in the channel region. Since there is no inversion channel forming, channel resistance is minimized. In addition, there is no PN body diode in an accumulation-mode transistor which minimizes the losses that are otherwise incurred in certain circuit applications such as synchronous rectifiers. The drawback of conventional accumulation-mode devices is that the drift region has to be lightly doped to support a reverse bias voltage when the device is in blocking mode. A more lightly doped drift region translates to higher on-resistance. Embodiments described herein overcome this limitation by employing various charge balancing techniques in an accumulation-mode device.

Figure 14:
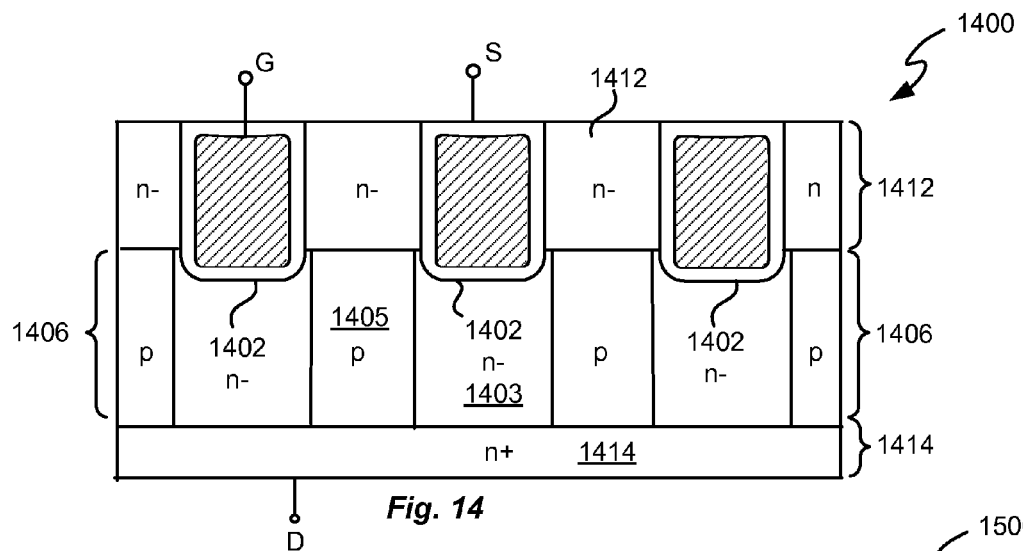
FIG. 14 shows a simplified embodiment of an exemplary accumulation-mode power transistor with alternate conductivity regions arranged in parallel to the current flow.

Referring to FIG. 14, there is shown a simplified embodiment of an exemplary accumulation-mode transistor 1400 with alternate conductivity regions arranged in parallel to the current flow. In this example, transistor 1400 is an n-channel transistor with a gate terminal formed inside trenches 1402, an n-type channel region 1412 that is formed between trenches, a drift region 1406 that includes opposite polarity columnar n-type and p-type sections 1403 and 1405, and an n-type drain region 1414. Unlike enhancement-mode transistors, accumulation-mode transistor 1400 does not include a blocking (p-type in this example) well or body region inside which the channel is formed. Instead, a conducting channel is formed when an accumulation layer is formed in region 1412. Transistor 1400 is normally on or off depending on doping concentration of region 1412 and doping type of the gate electrode. It is turned off when n-type region 1412 is entirely depleted and lightly inverted. The doping concentrations in opposite polarity regions 1403 and 1405 are adjusted to maximize charge spreading, which enables the transistor to support higher voltages. The use of columnar opposite polarity regions parallel to current flow flattens the electric field distribution by not allowing it to decrease linearly away from the junction formed between regions 1412 and 1406. The charge spreading effect of this structure allows the use of a more highly doped drift region which reduces transistor on-resistance. The doping concentration of the various regions may vary; for example, n-type regions 1412 and 1403 may have the same or different doping concentrations. Those skilled in the art appreciate that an improved p-channel transistor can be obtained by reversing the polarities of the various regions of the device shown in FIG. 14. Other variations of the columnar opposite polarity regions inside the drift region are described in greater detail in connection with ultra-high voltage devices described further below.

Figure 15:
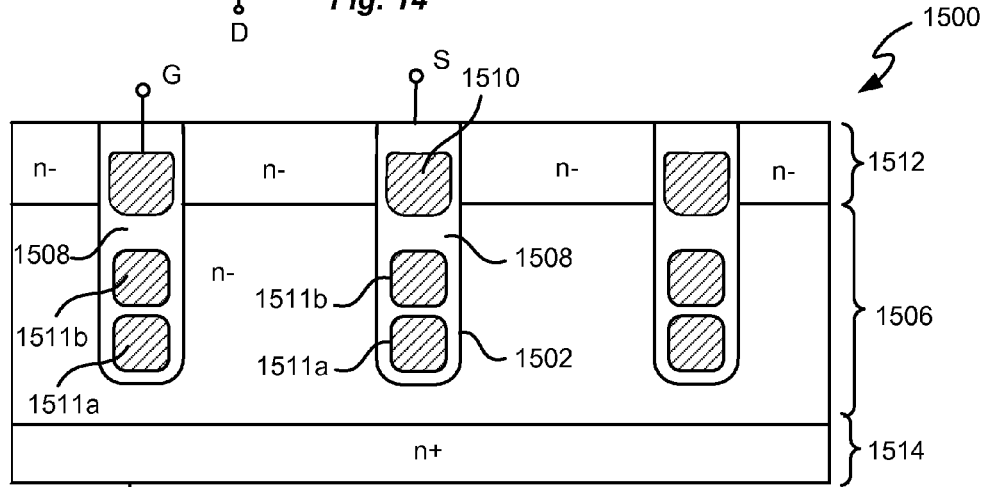
FIG. 15 is a simplified diagram of another accumulation-mode device with trenched electrodes for charge spreading purposes.
Figure 16:
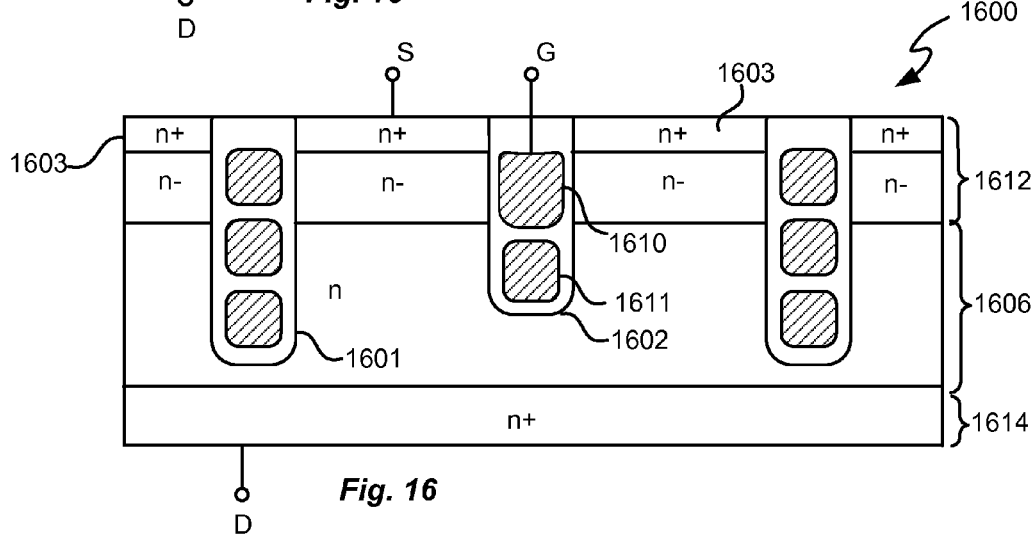
FIG. 16 is a simplified diagram of an exemplary dual trench accumulation-mode device.

FIG. 15 is a simplified diagram of another accumulation-mode device 1500 with trenched electrodes for charge spreading purposes. All regions 1512, 1506 and 1514 are of the same conductivity type, in this example, n-type. For a normally off device, gate polysilicon 1510 is made p-type. The doping concentration of region 1512 is adjusted to form a depleted blocking junction under no bias conditions. Inside each trench 1502, one or more buried electrodes 1511 are formed under gate electrode 1510, all surrounded by dielectric material 1508. As described in connection with enhancement-mode MOSFET 300A of FIG. 3A, buried electrodes 1511 act as field plates and can be biased, if desired, to a potential that optimizes their charge spreading function. Since charge spreading can be controlled by independently biasing buried electrodes 1511, the maximum electric field can be increased significantly. Similar to the buried electrodes employed in MOSFET 300A, different variations of the structure are possible. For example, the depth of trench 1502 and the size and number of buried electrodes 1511 can vary depending on the application. Charge spreading electrodes can be buried inside trenches that are separate from active trenches that house the transistor gate electrode, in a similar fashion to that shown for the trench structures of MOSFET 300B in FIG. 3B. An example of such an embodiment is shown in FIG. 16. In the example shown in FIG. 16, n-type region 1612 includes more heavily doped n+ source regions 1603 that can be optionally added. Heavily doped source regions 1603 can extend along the top edge of n-type region 1612 as shown or can be formed as two regions adjacent trench walls along the top edge of n-type region 1612 (not shown in this Figure). In some embodiments, the inclusion of n+ regions 1603 may necessitate lowering the doping concentration of n-type region 1606 in order to ensure the transistor can properly shut off. This optional heavily doped source region can be used in the same manner in any one of the accumulation transistors described herein.

Figure 17:
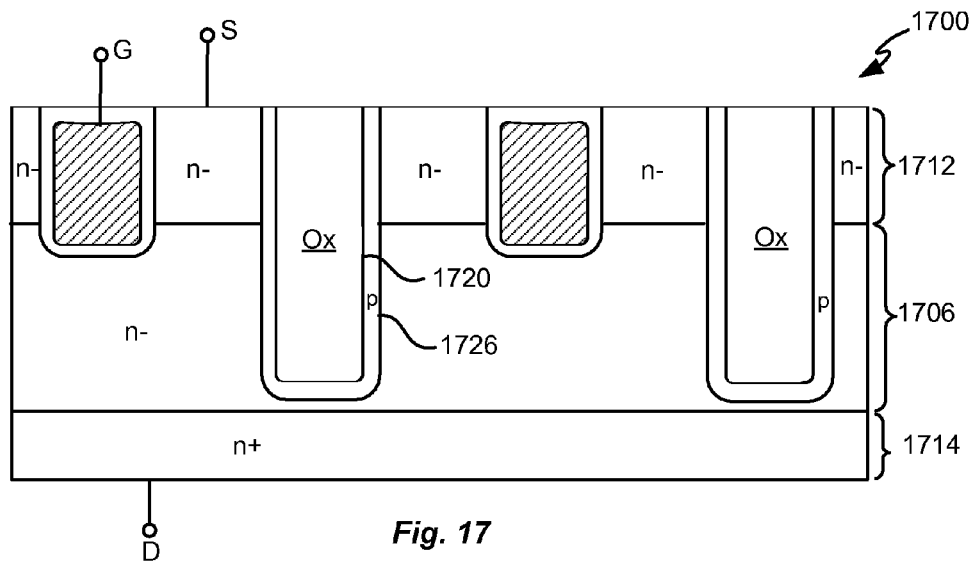
FIGS. 17 and 18 show other simplified embodiments for exemplary accumulation-mode devices with dielectric-filled trenches having opposite-polarity exterior liner.
Figure 18:
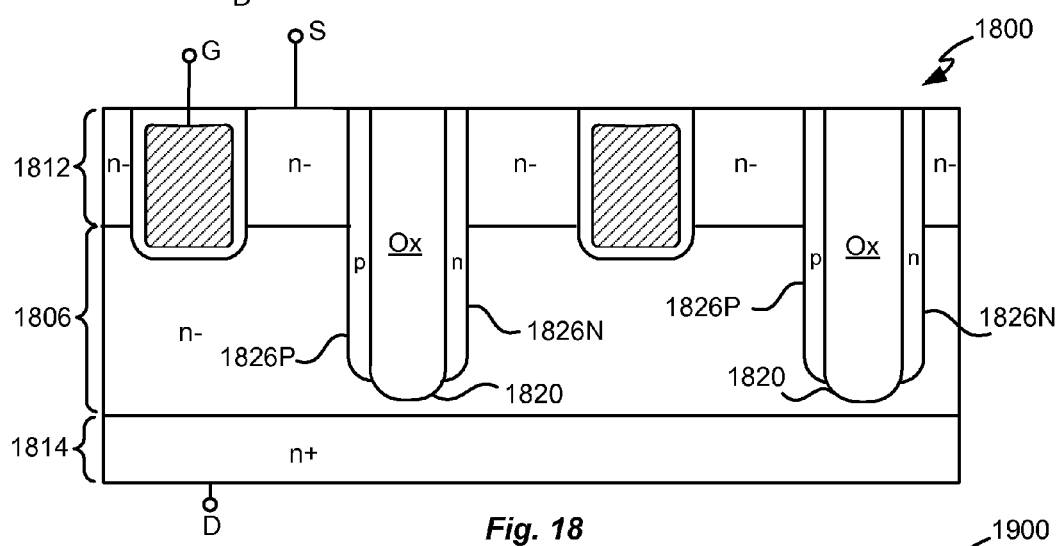

Another embodiment for an improved accumulation-mode transistor employs dielectric-filled trenches with an opposite polarity exterior liner. FIG. 17 is a simplified cross-sectional view of an accumulation transistor 1700 according to this embodiment. Dielectric-filled trenches 1720 extend downward from the surface of the silicon well into drift region 1706. Trenches 1720 are substantially filed with dielectric material such as silicon dioxide. In this exemplary embodiment, transistor 1700 is an n-channel transistor with trenched gate structure. A p-type region 1726 lines the exterior walls of dielectric-filled trenches 1720 as shown. Similar to the enhancement-mode transistors 500A, 500B and 500C described in connection with FIGS. 5A, 5B and 5C, respectively, trenches 1720 reduce the output capacitance of the transistor while p-type liner 1726 provides for charge balancing in the drift region to increase the blocking capability of the transistor. In an alternative embodiment shown in FIG. 18, oppositely doped liners 1826N and 1826P are formed adjacent the opposite sides of a dielectric-filled trench 1820. That is, a dielectric-filled trench 1820 has a p-type liner 1826P extending along the exterior sidewall on one side, and an n-type liner 1826N extending along the exterior sidewall on the other side of the same trench. Other variations of this combination of accumulation transistor with dielectric-filled trenches, as described in connection with the corresponding enhancement-mode transistors, are possible. These include, for example, an accumulation transistor with a planar (as opposed to trenched) gate structure and floating p-type regions instead of p-type liner 1726 as in the device shown in FIG. 5A; an accumulation transistor with a p-type liner that covers only the exterior side-walls and not the bottom of trenches 1726 as in the device shown in FIG. 5B; and an accumulation transistor with a single trench structure with a p-type liner that covers the lower portion of the trench as in the device shown in FIG. 5C, among others.

Figure 19:
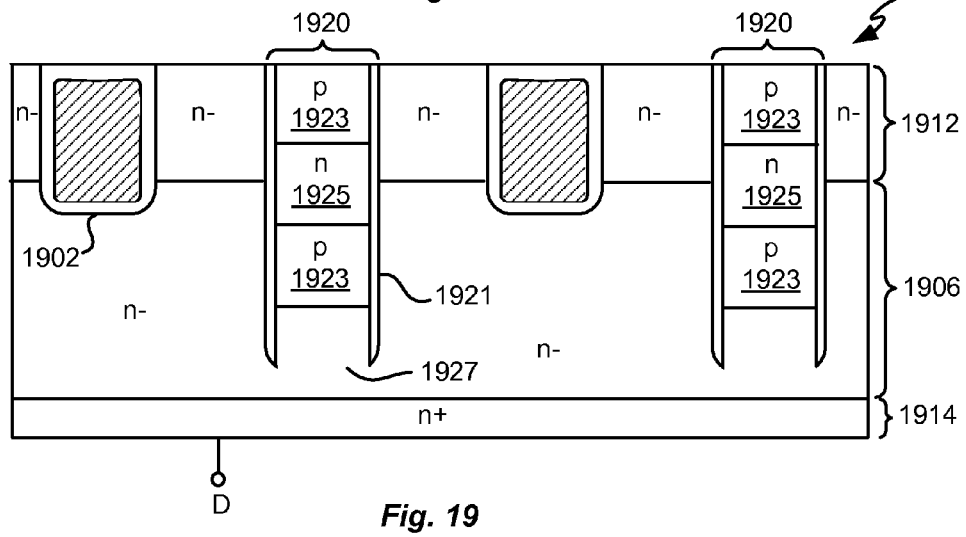
FIG. 19 is another simplified embodiment for an accumulation-mode device that employs one or more buried diodes.

In another embodiment, an accumulation-mode transistor employs one or more diodes formed in series inside a trench for charge balancing purposes. A simplified cross-sectional view of an exemplary accumulation-mode transistor 1900 according to this embodiment is shown in FIG. 19. Diode trenches 1920 are disposed on either side of a gate trench 1902, extending well into drift region 1906. Diode trenches 1920 include one or more diode structures made up of opposite conductivity type regions 1923 and 1925 that form one or more PN junctions inside the trench. P-type and n-type doped polysilicon or silicon may be used to form regions 1923 and 1925. A thin dielectric layer 1921 extending along the trench inner sidewalls insulates the diodes in the trench from drift region 1906. As shown, there is no dielectric layer along the bottom of trenches 1920, thus allowing the bottom region 1927 to be in electrical contact with the underlying substrate. Other variations of this combination of accumulation transistor with trenched diodes, as described in connection with the corresponding enhancement-mode transistors shown in FIGS. 10, 11, 12 and 13 and variations thereof, are possible.

Figure 20:
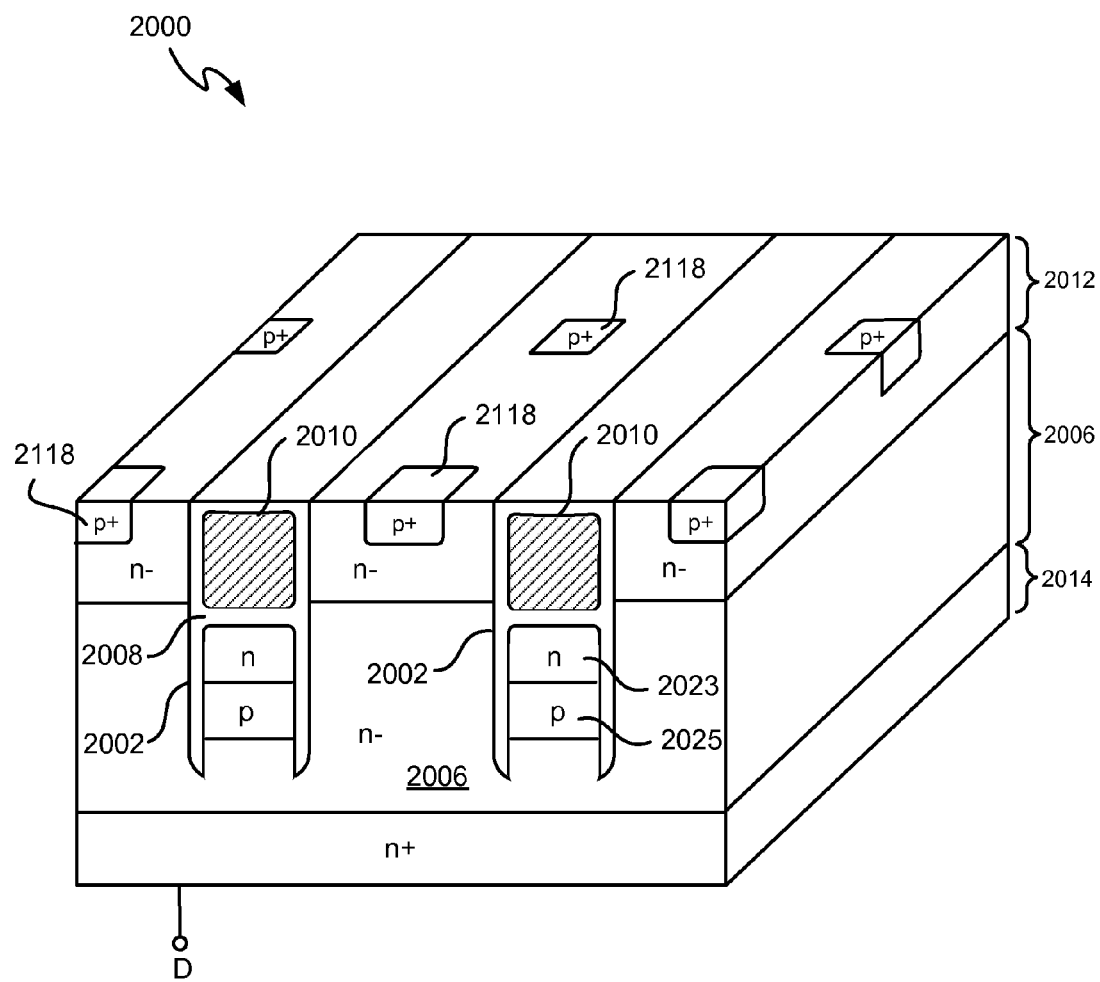
FIG. 20 is a simplified isometric view of an exemplary accumulation-mode transistor that includes heavily-doped opposite polarity region along the surface of the silicon.

Any one of the accumulation-mode transistors described above can employ a heavily doped opposite polarity region in the top (source) region. FIG. 20 is a simplified three-dimensional view of an exemplary accumulation-mode transistor 2000 that shows this feature in combination with other variations. In this embodiment, the charge balancing diodes in accumulation-mode transistor 2000 are formed inside the same trench as the gate. Trench 2002 includes gate electrode 2010 below which n-type 2023 and p-type 2025 silicon or polysilicon layers form PN junctions. A thin dielectric layer 2008 separates the diode structure from gate terminal 2002 as well as drift region 2006. Heavily doped p+ regions 2118 are formed at intervals along the length of the mesa formed between trenches in source regions 2012, as shown. Heavily doped p+ regions 2118 reduce the area of n-region 2012 and reduce device leakage. P+ regions 2118 also allow for p+ contact which will improve hole current flow in avalanche and improve device robustness. Variations on an exemplary vertical MOS-gated accumulation transistor have been discussed to illustrate the various features and advantages of this class of device. One of skill in the art appreciates that these can be implemented in other types of devices including lateral MOS-gated transistors, diodes, bipolar transistors and the like. Charge spreading electrodes can be formed either inside the same trench as the gate or inside separate trenches. The various exemplary accumulation-mode transistors described above have the trenches terminating in the drift regions, but they can also terminate in the more heavily doped substrate connecting to the drain. The various transistors can be formed in stripe or cellular architecture including hexagonal or square shaped transistor cells. Other variations and combinations as described with some of the other embodiments are possible, many of which are further described in previously referenced U.S. Patent Application Nos. 60/506,194 and 60/588,845, both of which are incorporated herein by reference in their entirety.

Figure 21:
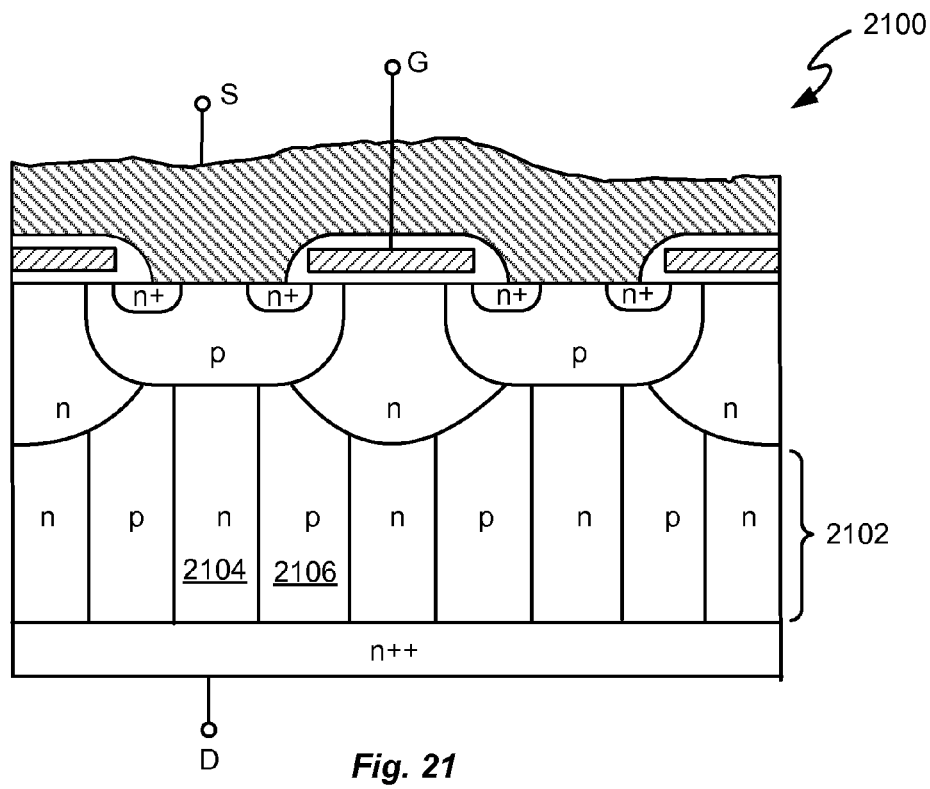
FIG. 21 shows a simplified example of a super-junction power MOSFET with alternating opposite-polarity regions in the voltage sustaining layer.

Another class of power switching devices designed for very high voltage applications (e.g., 500V-600V and above), employs alternating vertical sections of p-doped and n-doped silicon in the epitaxial region between the substrate and the well. Referring to FIG. 21, there is shown one example of a MOSFET 2100 that employs this type of structure. In MOSFET 2100, region 2102 that is sometimes referred to as the voltage sustaining or the blocking region, comprises the alternating n-type sections 2104 and p-type sections 2106. The effect of this structure is that when voltage is applied to the device, the depletion region spreads horizontally into each side of sections 2104 and 2106. The entire vertical thickness of blocking layer 2102 is depleted before the horizontal field is high enough to produce avalanche breakdown because the net quantity of charge in each vertical section 2104,2106 is less than that needed to produce the breakdown field. After the region is fully depleted horizontally, the field continues to build vertically until it reaches the avalanche field of approximately 20 to 30 volts per micron. This greatly enhances the voltage blocking capability of the device extending the voltage range of the device to 400 volts and above. Different variations of this type of super-junction device are described in greater detail in commonly-owned U.S. Pat. Nos. 6,081,009 and 6,066,878 both to Nielson, which are hereby incorporated by reference in their entirety.

Figure 22:
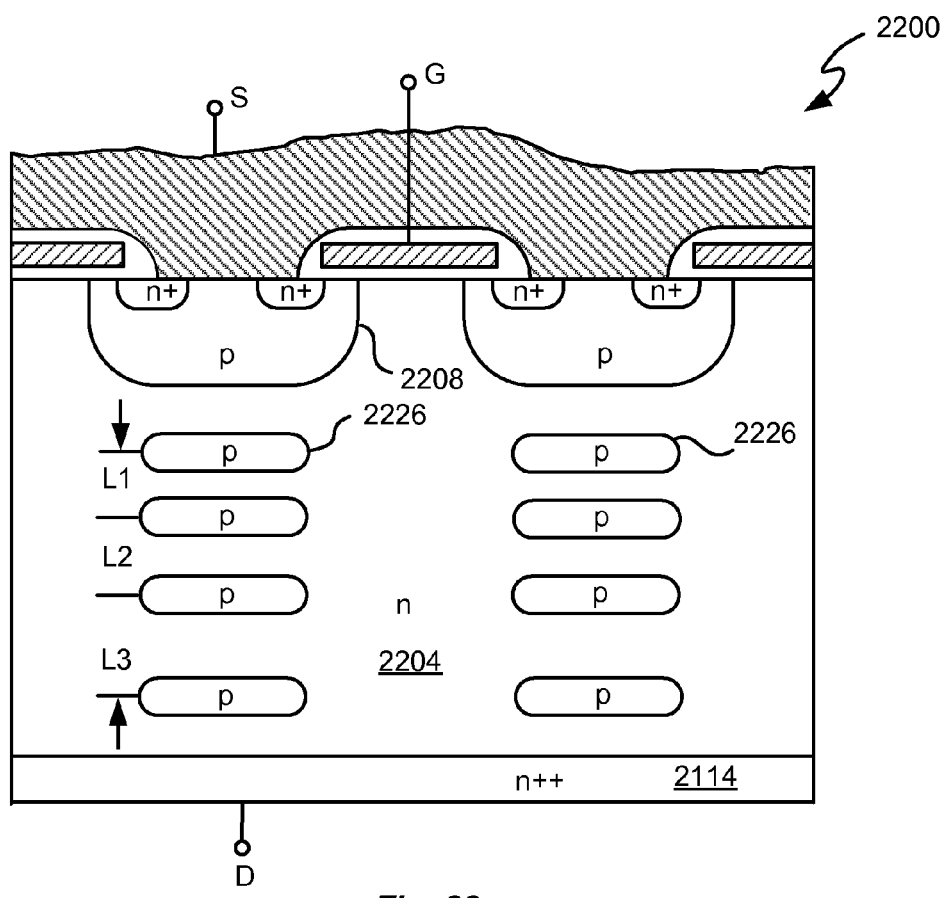
FIG. 22 shows an exemplary embodiment for a super-junction power MOSFET with opposite-polarity islands non-uniformly spaced in the vertical direction in the voltage sustaining layer.

A variation on the super-junction MOSFET 2100 uses floating p-type islands in the n-type blocking region. The use of floating p-type islands as opposed to the pillar approach, allows the thickness of the charge balance layer to be reduced which reduces $R_{DSon}$. In one embodiment, instead of uniformly spacing the p-type islands, they are spaced apart so as to maintain the electric filed near the critical electric field. FIG. 22 is a simplified cross-sectional view of a MOSFET 2200 that shows one example of a device according to this embodiment. In this example, the deeper floating p regions 2226 are spaced farther from the ones above. That is, the distance L3 is larger than the distance L2, and the distance L2 is larger than the distance L1. By manipulating the distance between the floating junctions in this manner, minority carriers are introduced in a more granular fashion. The more granular the sources of these carriers the lower $R_{DSon}$ and the higher breakdown voltage can be made. It is understood by those skilled in the art that many variations are possible. For example, the number of floating regions 2226 in the vertical direction is not limited to four as shown, and the optimum number may vary. Also, the doping concentration in each floating region 2226 may vary; for example, in one embodiment, the doping concentration in each floating region 2226 decreases gradually as the region gets closer to substrate 2114.

Figure 23:
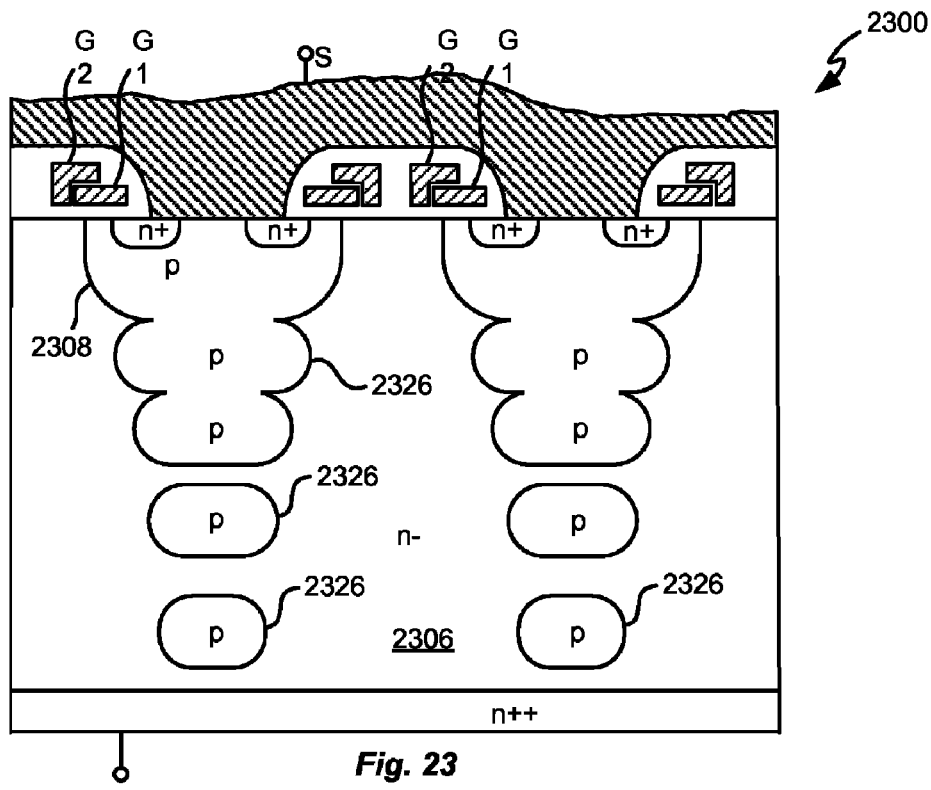
FIGS. 23 and 24 show exemplary embodiments for super-junction power MOSFETs with dual gate and shielded gate structures, respectively.
Figure 24:
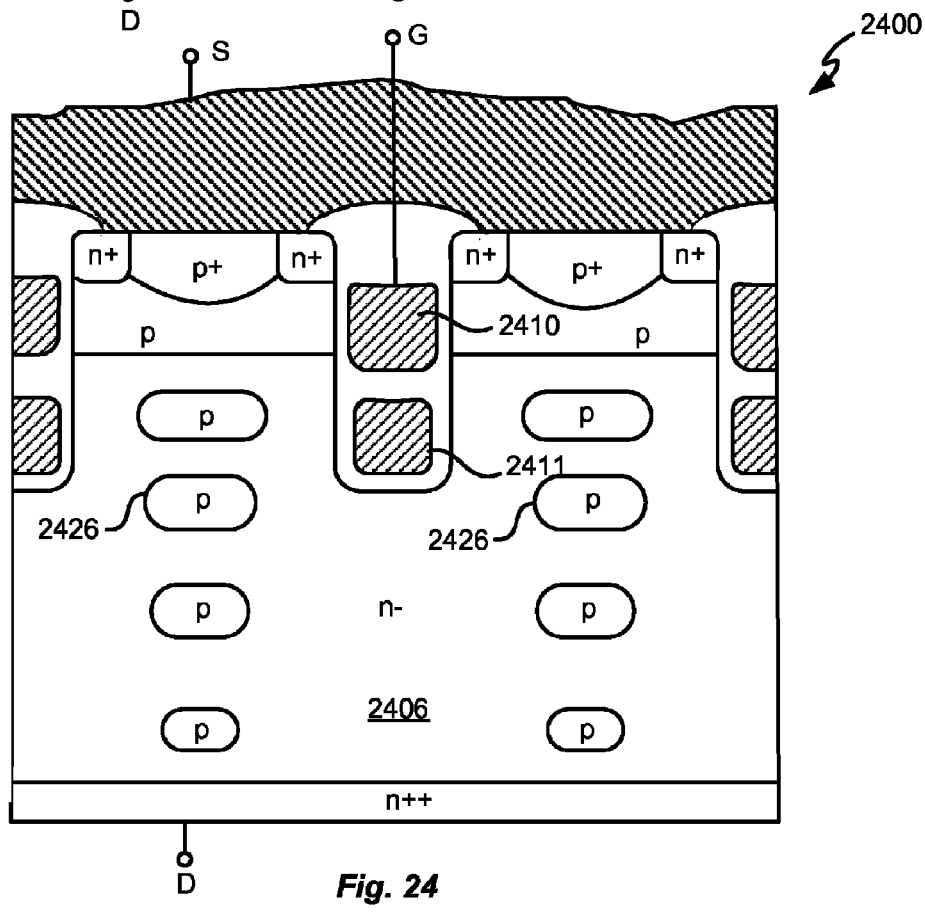

Further, many of the techniques for reducing parasitic capacitance to enhance switching speed, including shielded gate and dual gate structures, as described in connection with low voltage and medium voltage devices, can be combined with the high voltage devices described in FIGS. 21 and 22 and variations thereof. FIG. 23 is a simplified cross-sectional view of a high voltage MOSFET 2300 that combines a variation of the super-junction architecture with a dual gate structure. MOSFET 2300 has a planar dual gate structure made up of gate terminals G1 and G2 similar to, for example, the dual gate transistor shown in FIG. 4B above. Opposite polarity (p-type in this example) regions 2326 are vertically disposed in n-type drift region 2306 under p-well 2308. The size and spacing of p-type regions 2326 vary in this example whereby the more closely disposed regions 2326 nearer p-well 2308 make contact to each other while regions 2326 disposed further below are floating and smaller in size as shown. FIG. 24 depicts yet another embodiment for a high voltage MOSFET 2400 that combines the super-junction technology with shielded gate structure. MOSFET 2400 is a trench gate device with a gate electrode 2410 that is shielded from drift region 2406 with a shield electrode 2411 similar to, for example, MOSFET 300A in FIG. 3A. MOSFET 2400 also includes opposite polarity floating regions 2426 disposed in drift region 2406 parallel to current flow.

Termination Structures

Discrete devices of the various types described above have a breakdown voltage limited by the cylindrical or spherical shape of the depletion region at the edge of the die. Since this cylindrical or spherical breakdown voltage is typically much lower than the parallel plane breakdown voltage BVpp in the active area of the device, the edge of the device needs to be terminated so as to achieve a breakdown voltage for the device that is close to the active area breakdown voltage. Different techniques have been developed to spread the field and voltage uniformly over the edge termination width to achieve a breakdown voltage that is close to BVpp. These include field plates, field rings, junction termination extension (JTE) and different combinations of these techniques. The above-referenced, commonly-owned U.S. Pat. No. 6,429,481 to Mo et al. describes one example of a field termination structure that includes a deep junction (deeper than the well) with an overlying field oxide layer, surrounding the active cell array. In the case of an n-channel transistor, for example, the termination structure includes a deep p+ region that forms a PN junction with the n-type drift region.

Figure 25A:
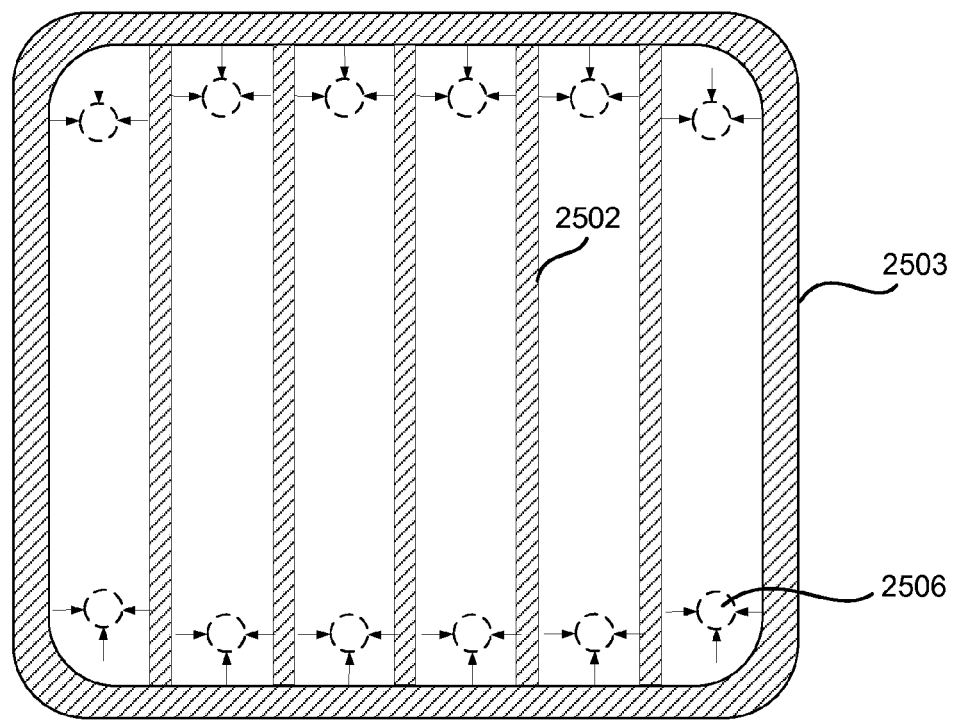
FIG. 25A shows a top view of active and termination trench layout for a trench transistor.
Figure 25B:
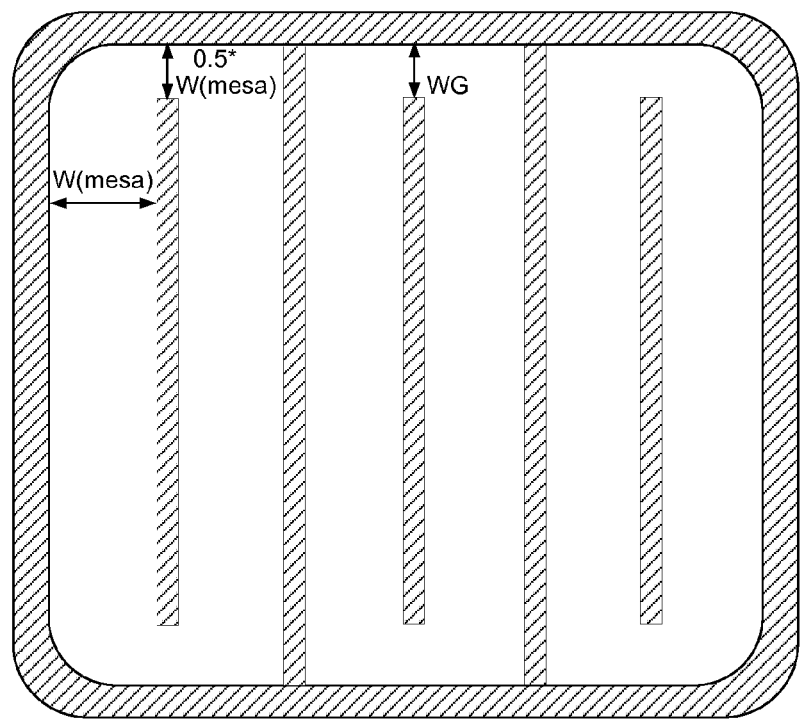
FIGS. 25B-25F show simplified layout views of alternative embodiments for trench termination structures.
Figure 25C:
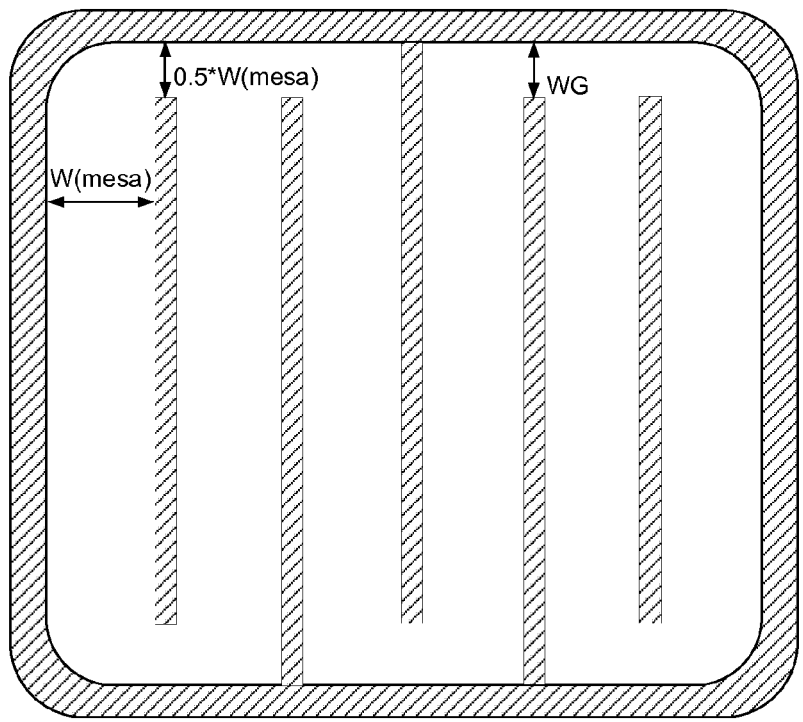
Figure 25D:
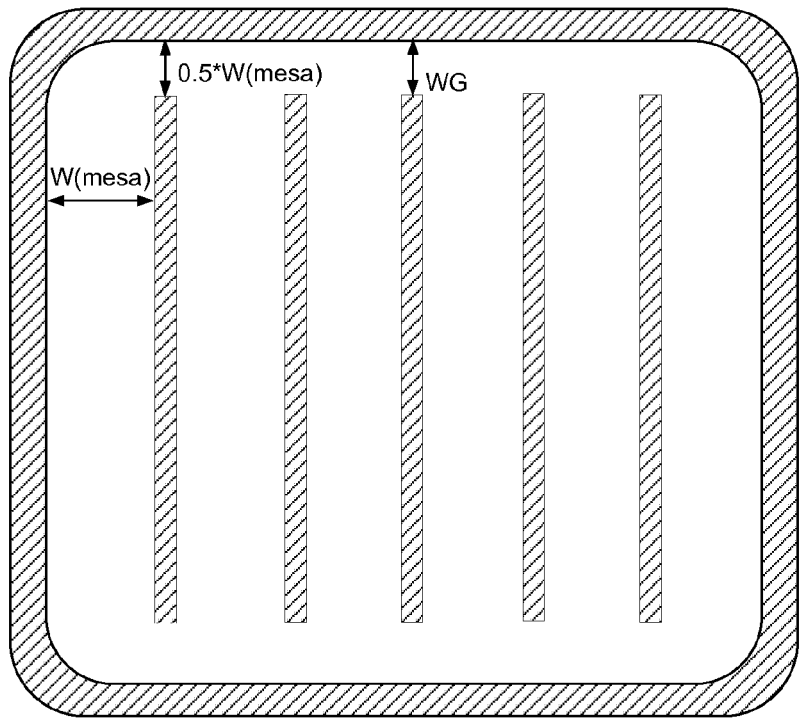
Figure 25E:
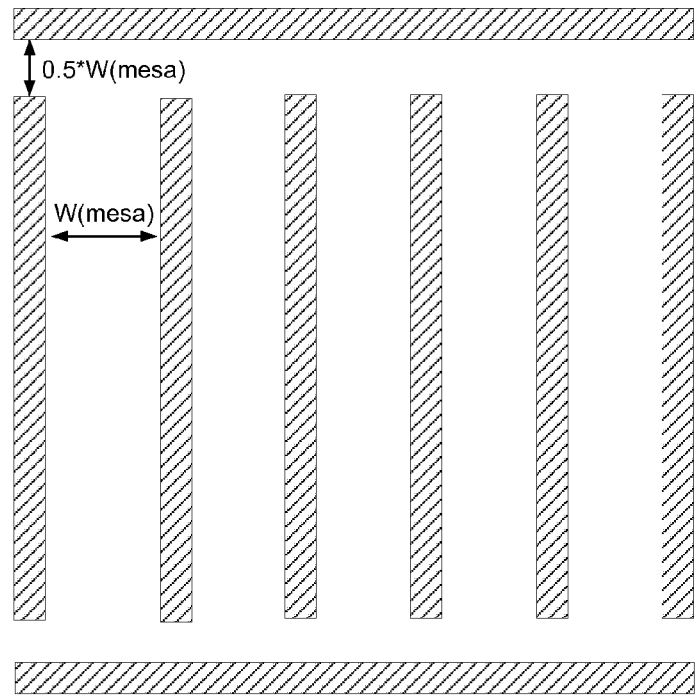
Figure 25F:
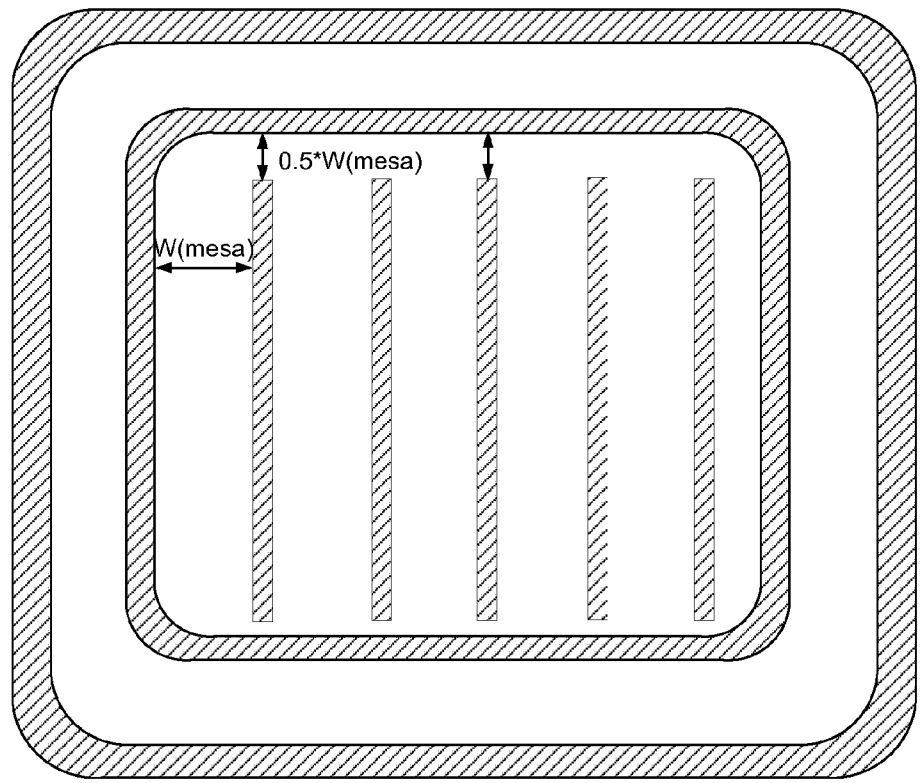

In alternative embodiments, one or more ring-shaped trenches surrounding the periphery of the cell array act to lessen the electric field and increase avalanche breakdown. FIG. 25A shows a commonly-used trench layout for a trench transistor. Active trenches 2502 are surrounded by a ring-shaped termination trench 2503. In this structure, regions 2506 shown by the dotted circles at the ends of the mesas deplete faster than other regions causing increased field in this area which reduces the breakdown voltage under reverse bias conditions. This type of layout is therefore limited to lower voltage devices (e.g., <30V). FIGS. 25B to 25F show a number of alternative embodiments for termination structures with different trench layouts to reduce the high electric field regions shown in FIG. 25A. As can be seen by the diagrams, in these embodiments some or all active trenches are disconnected from the termination trench. The gap $W_G$ between the ends of the active trenches and the termination trench function to reduce the electric field crowding effect observed in the structure shown in FIG. 25A. In one exemplary embodiment, $W_G$ is made approximately half the width of the mesa between trenches. For higher voltage devices, multiple termination trenches as shown in FIG. 25F can be employed to further increase the breakdown voltage of the device. Commonly-owned U.S. Pat. No. 6,683,363, entitled "Trench Structure for Semiconductor Devices," by Challa, which is hereby incorporated in its entirety, describes variations on some of these embodiments in greater detail.

Figure 26A:
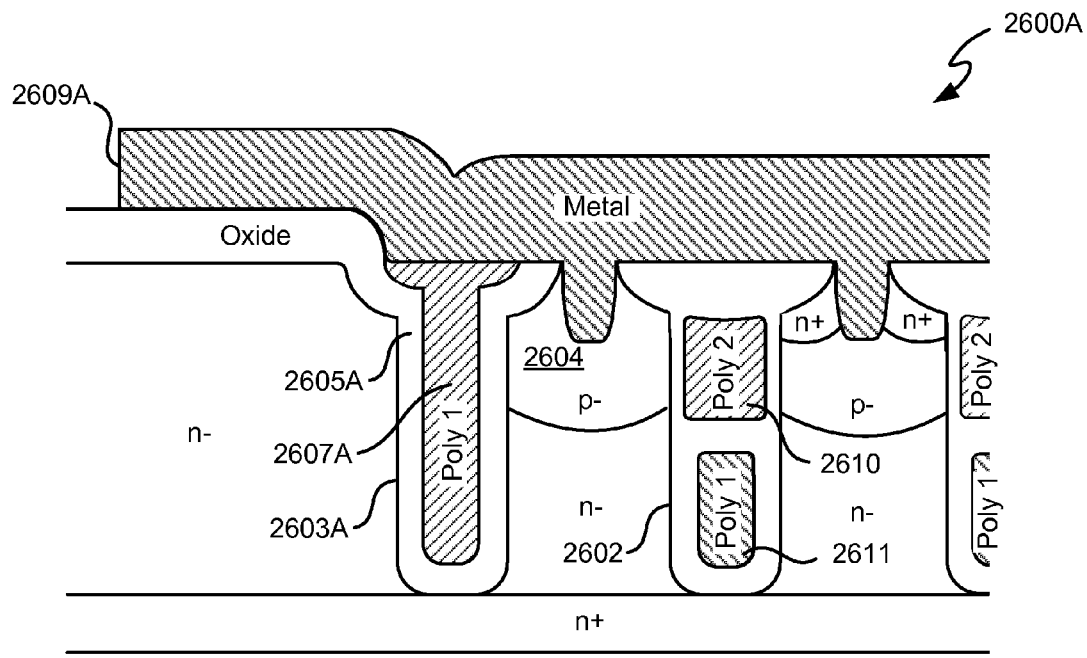
FIGS. 26A-26C are cross-sectional views of exemplary trench termination structures.
Figure 26B:
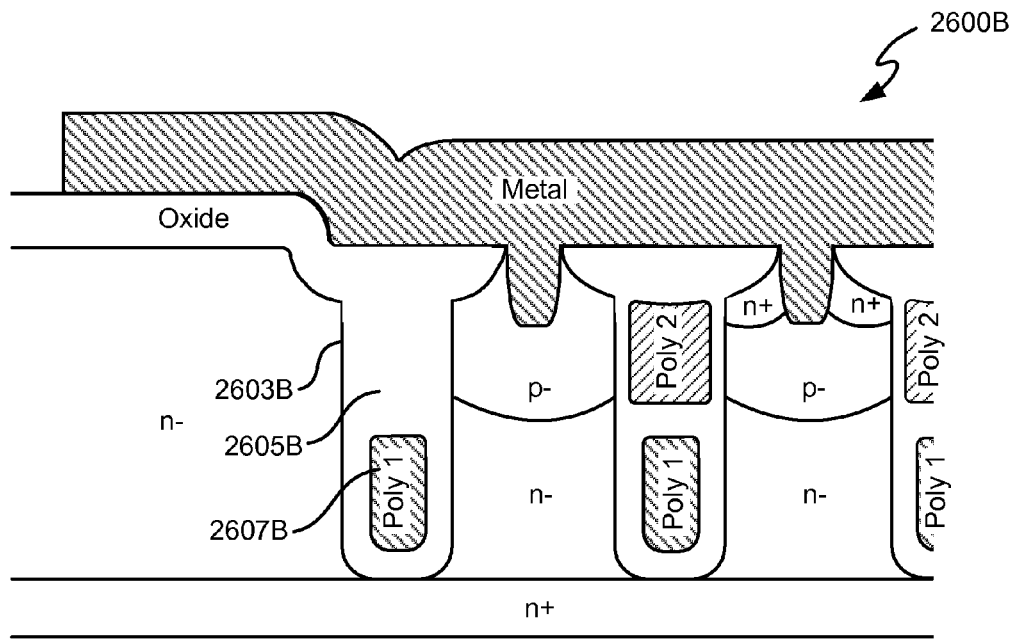
Figure 26C:
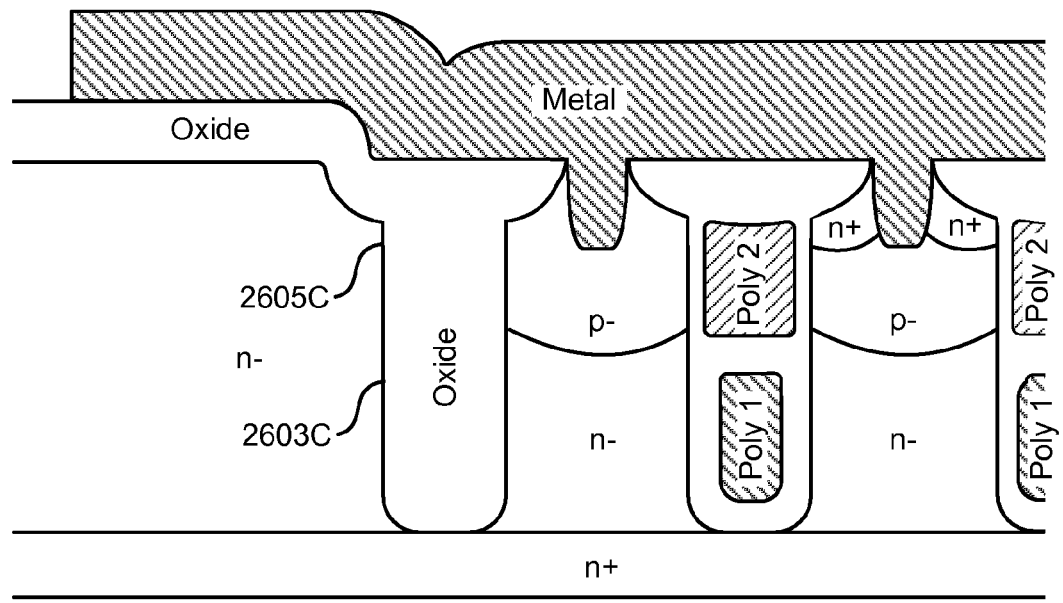

FIGS. 26A through 26C depict cross-sectional views of various exemplary trench termination structures for charge balanced trench MOSFETs. In the exemplary embodiment shown, MOSFET 2600A uses a shielded gate structure with a shield poly electrode 2611 buried under gate poly 2610 inside active trench 2602. In the embodiment shown in FIG. 26A, termination trench 2603A is lined with a relatively thick layer of dielectric (oxide) 2605A and filled with conductive material such as poly 2607A. The thickness of oxide layer 2605A, the depth of termination trench 2603A and the spacing between the termination trench and the adjacent active trench (i.e., width of the last mesa) are determined by the device reverse blocking voltage. In the embodiment shown in FIG. 26A, trenches are wider at the surface (T-trench structure) and a metal field plate 2609A is used over the termination region. In an alternative embodiment (not shown), the field plate can be formed from polysilicon by extending poly 2607A inside termination trench 2603A above the surface and over the termination region (to the left of the termination trench in FIG. 26A). Many variations are possible. For example, a p+ region (not shown) under the metal contacts to silicon can be added for better Ohmic contact. P-well region 2604 in the last mesa adjacent termination trench 2603A and it's respective contact can be optionally removed. Also, floating p-type region(s) can be added to the left of termination trench 2603A (i.e., outside active area).

In another variation, instead of filling termination trench 2603 with poly, a poly electrode is buried in the lower portion of the trench inside an oxide-filled trench. This embodiment is shown in FIG. 26B, wherein approximately half of termination trench 2603B is filled with oxide 2605B with the lower half having a poly electrode 2607B buried inside the oxide. The depth of trench 2603B and height of buried poly 2607B can be varied based on the device processing. In yet another embodiment shown in FIG. 26C, a termination trench 2603C is substantially filled with dielectric with no conductive material buried therein. For all three embodiments shown in FIGS. 26A, B and C, the width of the last mesa separating the termination trench from the last active trench may be different than the width of a typical mesa formed between two active trenches, and can be adjusted to achieve optimal charge balancing in the termination region. All variations described above in connection with the structure shown in FIG. 26A can apply to those shown in FIGS. 26B and 26C. Further, those skilled in the art appreciate that while the termination structures have been described herein for a shielded gate device, similar structures can be implemented as termination regions for all the various trench based devices described above.

Figure 27:
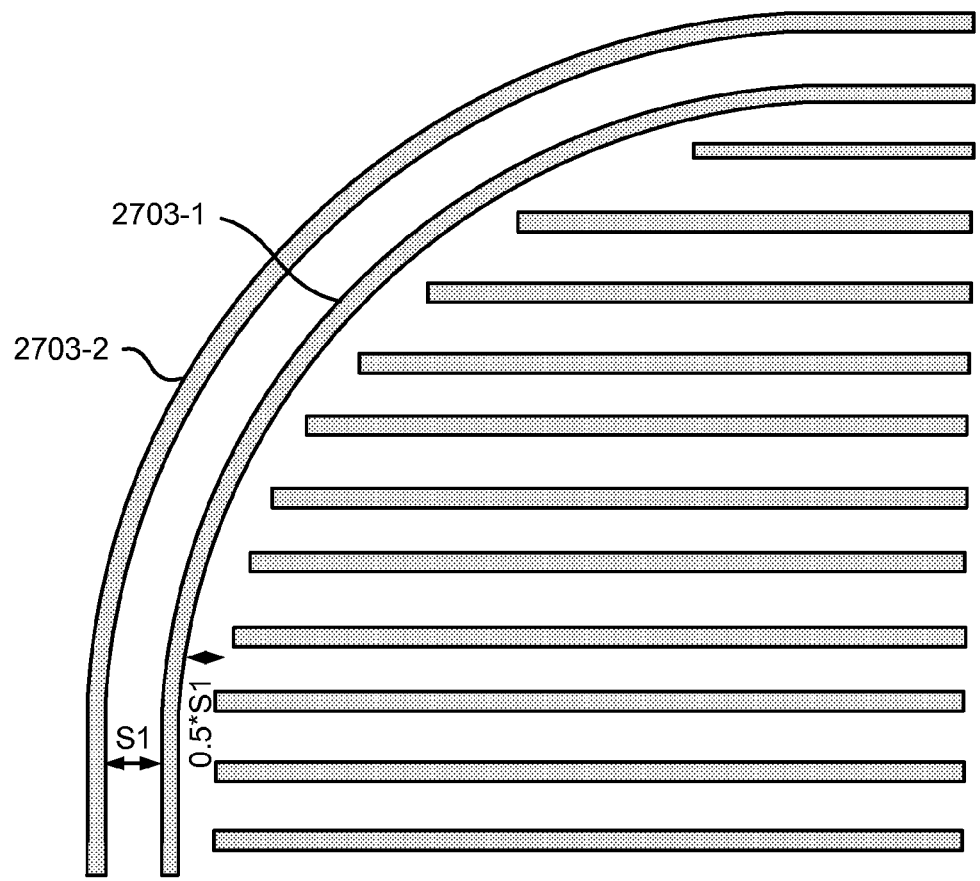
FIG. 27 shows an exemplary device with termination trenches having large radius of curvature.

For lower voltage devices the corner designs for the trench termination ring may not be critical. However, for higher voltage devices the rounding of the corners of the termination ring with a larger radius of curvature may be desirable. The higher the device voltage requirements, the larger may be the radius of curvature at the corners of termination trench. Also the number of termination rings can be increased as the device voltage increases. FIG. 27 shows an exemplary device with two termination trenches 2703-1 and 2703-2 having a relatively larger radius of curvature. The spacing between the trenches can also be adjusted based on the device voltage requirements. In this embodiment, the distance S1 between termination trenches 2703-1 and 2703-2 is approximately twice the distance between the first termination trench 2703-1 and the end of the active trenches.

Figure 28A:
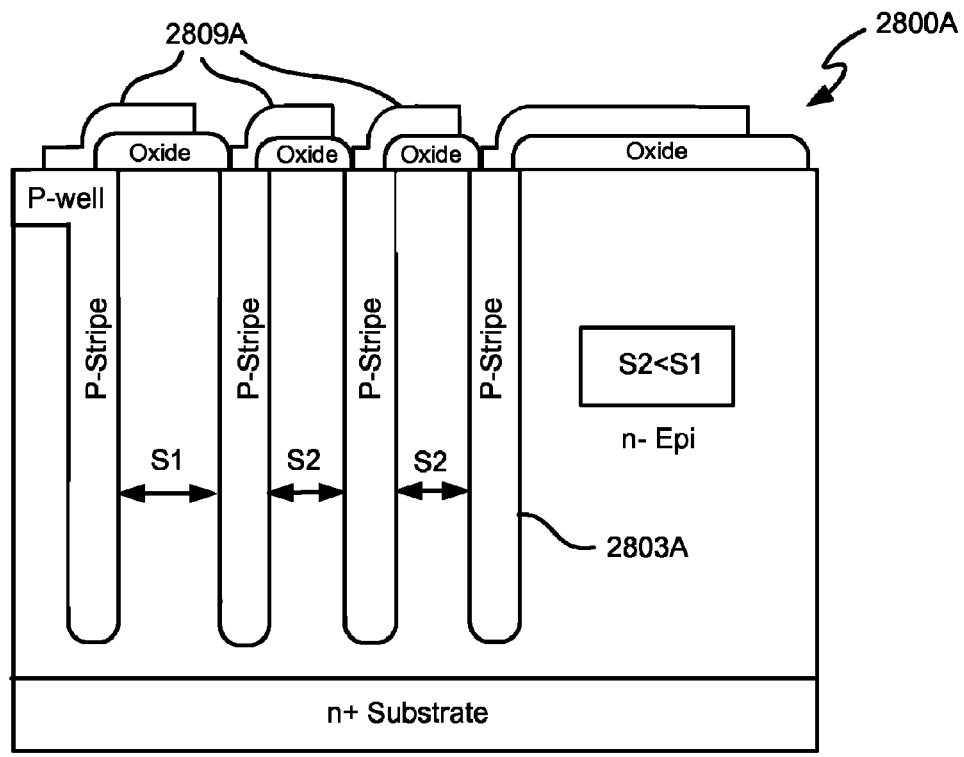
FIGS. 28A-28D are cross-sectional views of termination regions with silicon pillar charge balance structures.
Figure 28B:
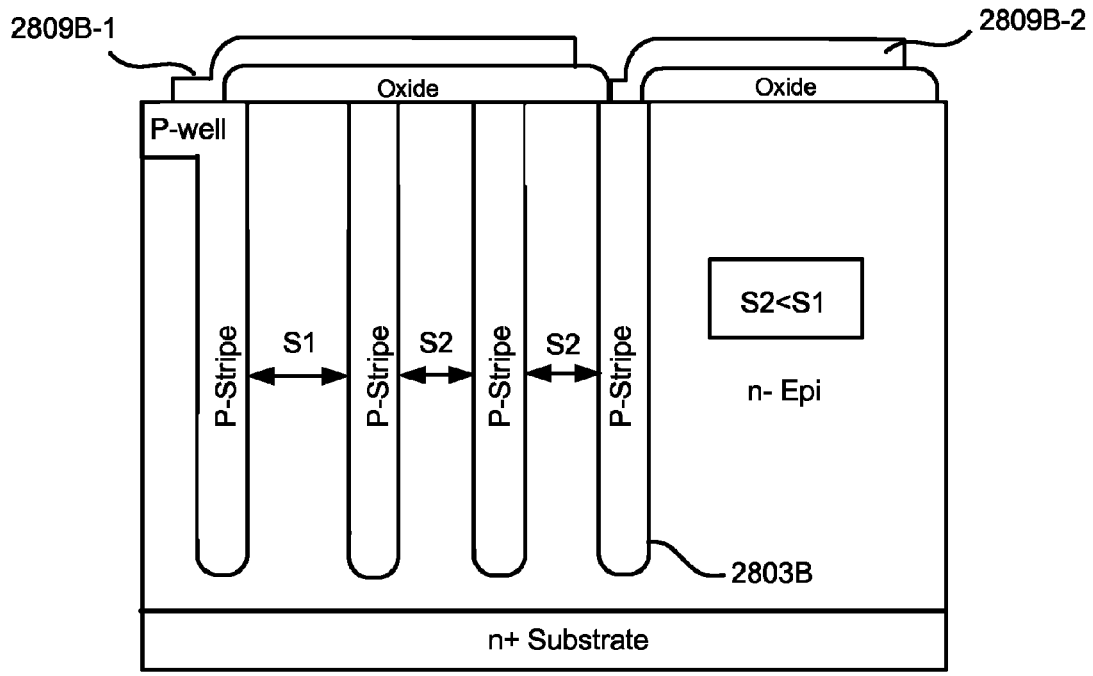
Figure 28C:
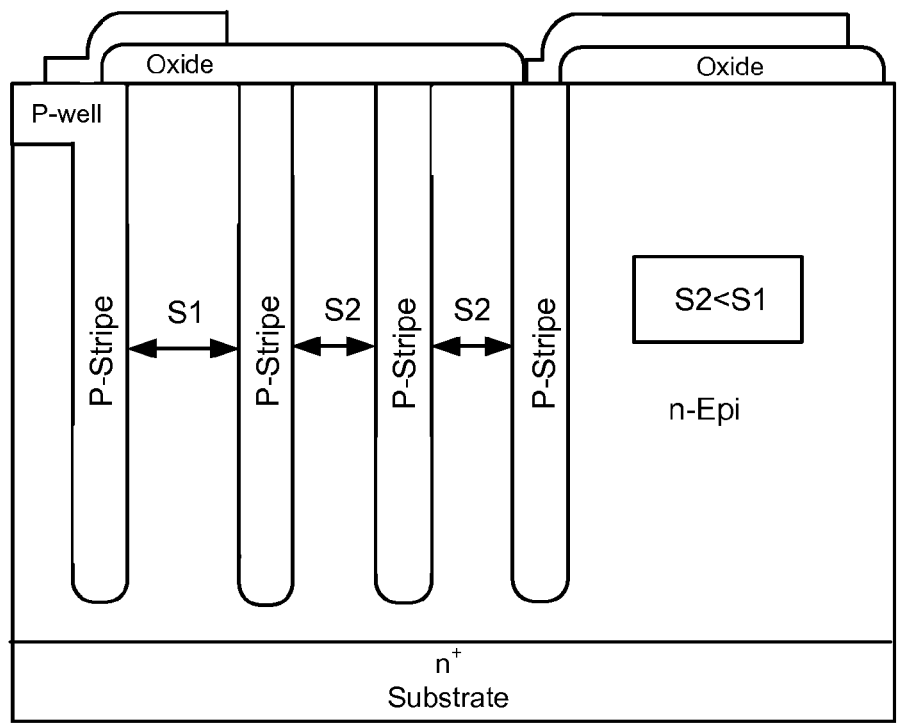
Figure 28D:
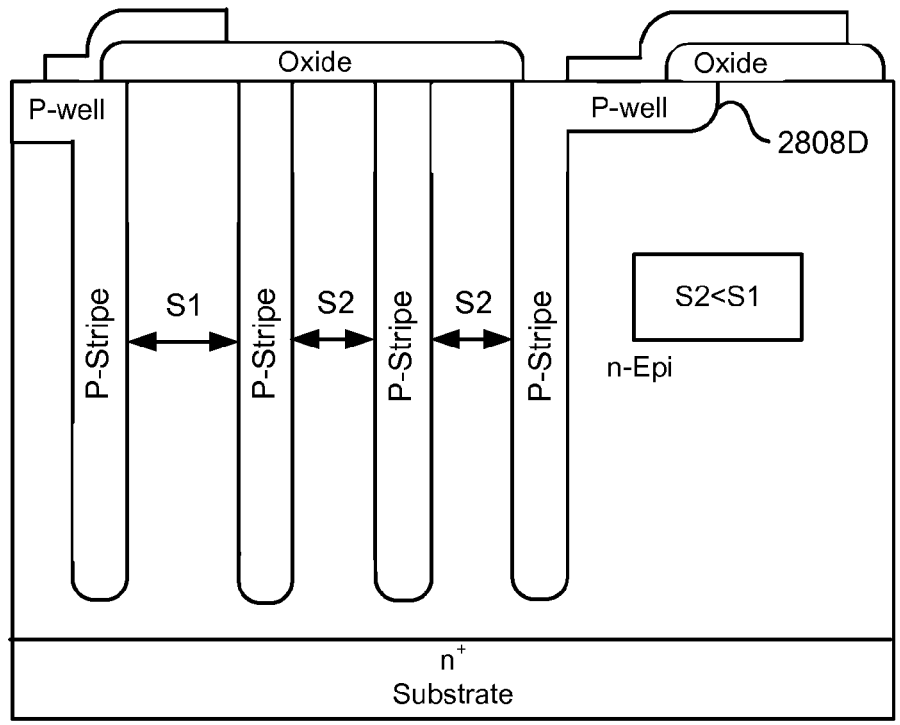

FIGS. 28A, 28B, 28C, and 28D show exemplary cross-sectional views for various termination regions with silicon pillar charge balance structures. In the embodiment shown in FIG. 28A, field plates 2809A contact every ring of p-type pillar 2803A. This allows wider mesa regions because of lateral depletion due to field plates. The breakdown voltage generally depends on the field oxide thickness, the number of rings and the depth and spacing of termination pillars 2803A. Many different variations for this type of termination structure are possible. For example, FIG. 28B shows an alternative embodiment wherein a large field plate 2809B-1 covers all the pillars 2803B except the last pillar, which is connected to another field plate 2809B-2. By grounding large field plate 2809B-1, the mesa regions between the p-type pillars deplete quickly and the horizontal voltage drop will not be significant, causing lower breakdown voltage than the embodiment shown in FIG. 28A. In another embodiment shown in FIG. 28C, the termination structure has no field plates on the middle pillars. Because there is no field plate on the middle pillars, they have narrower mesa region to deplete adequately. In one embodiment, a gradually decreasing mesa width towards the outer ring yields optimal performance. The embodiment shown in FIG. 28D facilitates contact to p-type pillars by providing a wider well region 2808D and increasing the spacing between the field oxide layers as shown.

In the case of ultra-high voltage devices that employ various super-junction techniques of the type described above, the breakdown voltage is much higher than the conventional BVpp. For a super-junction device, the charge balance or super-junction structures (e.g., opposite polarity pillars or floating regions, buried electrodes, etc.) are also used in the termination region. Standard edge termination structures in combination with charge balance structures, such as field plates on the top surface at the edge of the device can also be used. In some embodiments, standard edge structures on the top can be eliminated by using a rapidly decreasing charge in the termination junction. For example, p-type pillars in the termination region can be formed with decreasing charge the farther they get from the active area creating a net n-type balance charge.

Figure 29A:
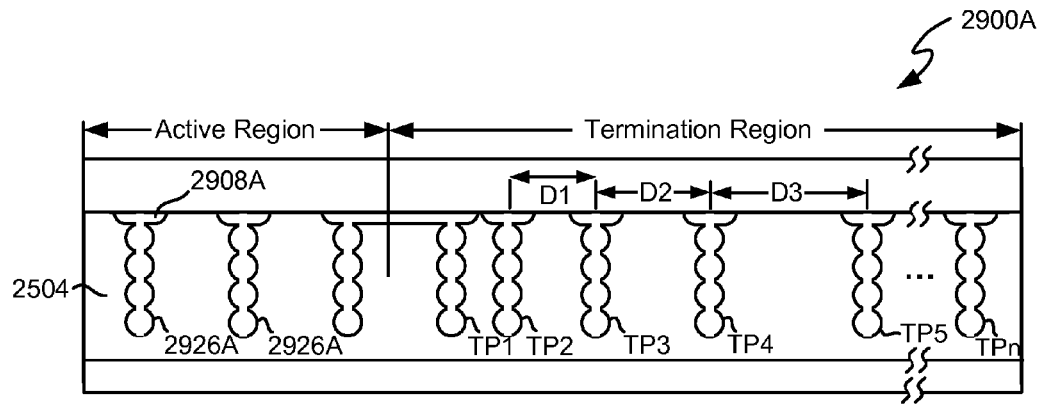
FIGS. 29A-29C are cross-sectional views of exemplary embodiments of ultra-high voltage devices employing super-junction techniques.

In one embodiment, the spacing between the p-type pillars in the termination region is varied as the pillars move farther away from the active regions. A highly simplified cross-sectional view of one exemplary embodiment of a device 2900A according to this embodiment is shown in FIG. 29A. In the active area of device 2900A, opposite conductivity pillars 2926A made of, for example, multiple connected p-type spheres are formed under the p-type well 2908A in n-type drift region 2904A. At the edge of the device, under the termination region, p-type termination pillars TP1, TP2, to TPn are formed as shown. Instead of having uniform spacing as in the active area, the center-to-center spacing between termination pillars TP1 to TPn increases as the pillars move farther away from the interface with the active region. That is, distance D1 between TP2 and TP3 is smaller than distance D2 between TP3 and TP4, and distance D2 is smaller than distance D3 between TP4 and TP5, and so on.

Figure 29B:
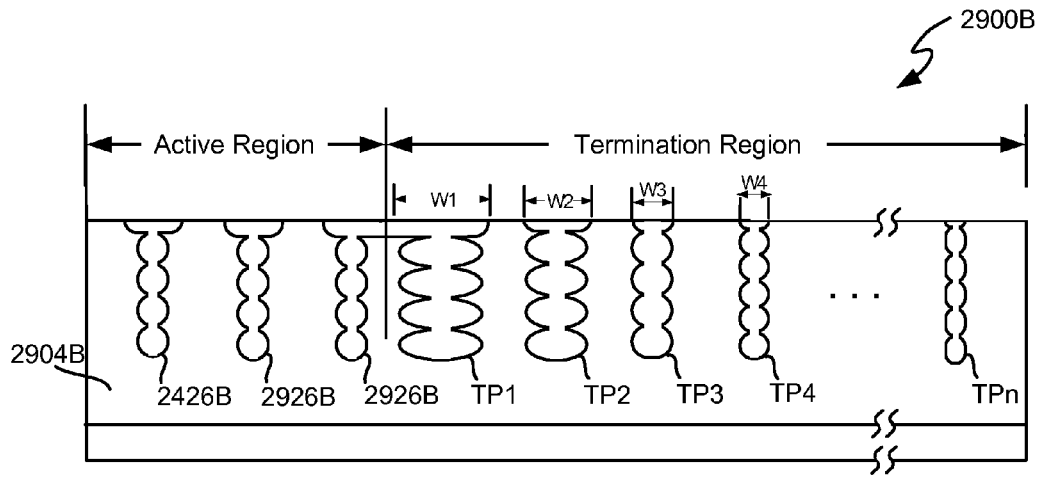
Figure 29C:
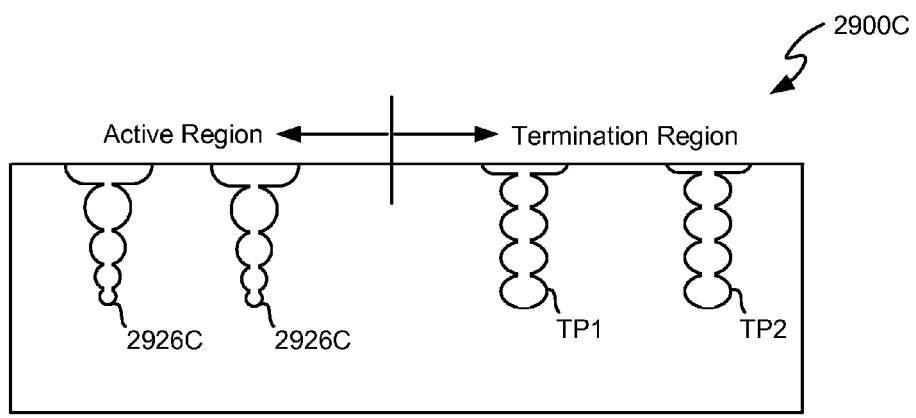

Several variations of this type of super-junction termination structure are possible. For example, instead of forming p-type termination pillars TP1-TPn at varying distances inside voltage sustaining layer 2904A, the center-to-center spacing could remain uniform but the width of each termination pillar could vary. FIG. 29B shows a simplified example of a termination structure according to this embodiment. In this example, termination pillar TP1 has a width W1 that is larger than the width W2 of termination pillar TP2, and W2 in turn is made larger than the width W3 of termination pillar TP3 and so on. In terms of the spacing between the opposite polarity charge balancing regions in the termination region, the resulting structure in device 2900B is similar to that of device 2900A, even though in device 2900B the center-to-center spacing between trench pillars may be the same. In another exemplary embodiment shown in a simplified cross-sectional view in FIG. 29C, the width of each opposite polarity pillar 2926C in the active region is decreased from the top surface to the substrate, whereas the width for termination pillars TP1 and TP2 remains substantially the same. This achieves the desired breakdown voltage while utilizing less area. Those skilled in the art appreciate that the various termination structures described above can be combined in any desired manner, including for example, the center-to-center spacing and/or the overall width of termination pillars in device 2900C shown in FIG. 29C can be varied as described in connection with the embodiments shown in FIGS. 29A and 29B.

Process Techniques

Figure 30A:
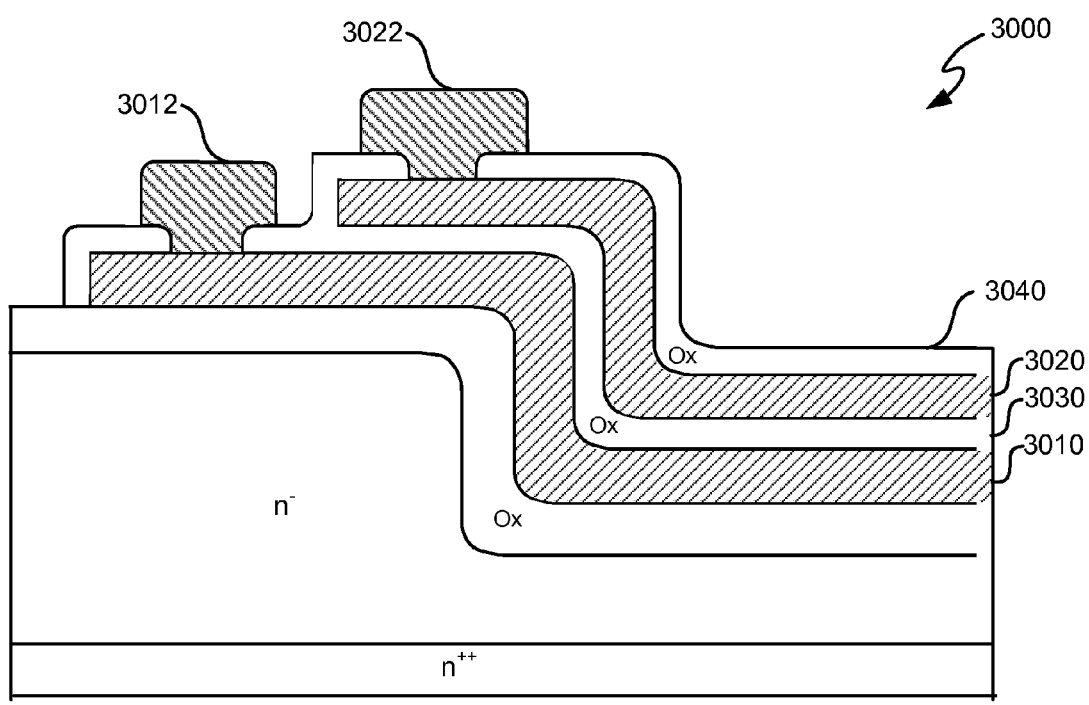
FIG. 30A shows an example of edge contacting for a trench device.
Figure 30B:
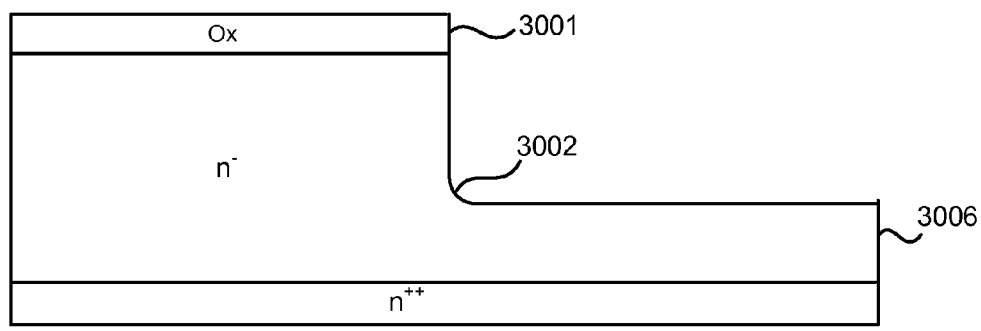
FIGS. 30B-30F show exemplary process steps in forming the edge contacting structure for a trench device.
Figure 30C:
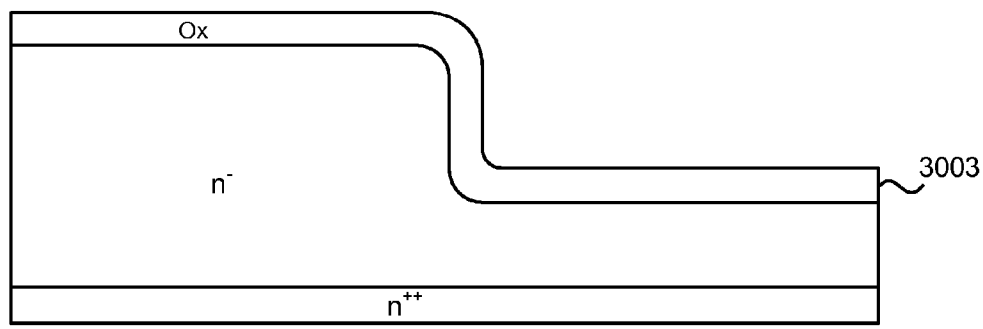
Figure 30D:
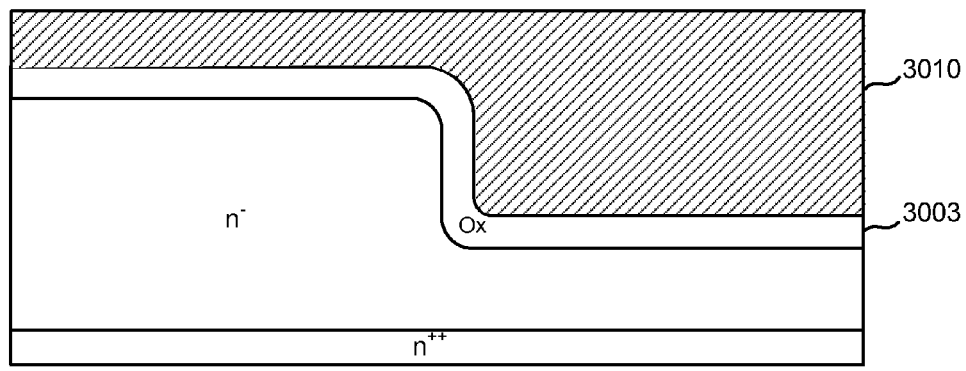
Figure 30E:
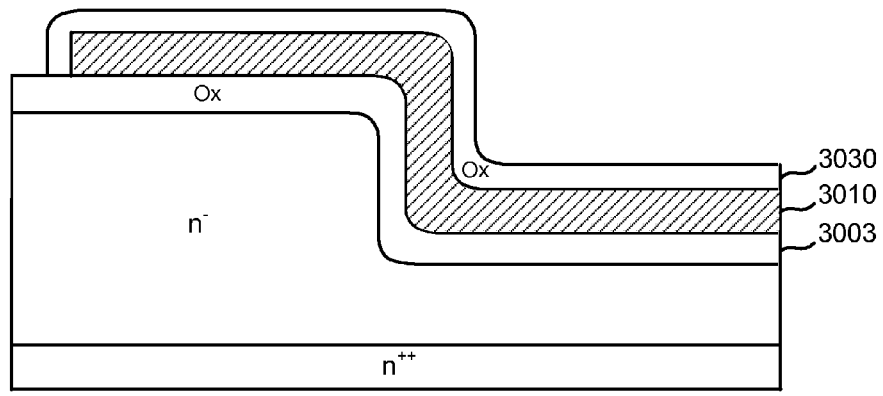
Figure 30F:
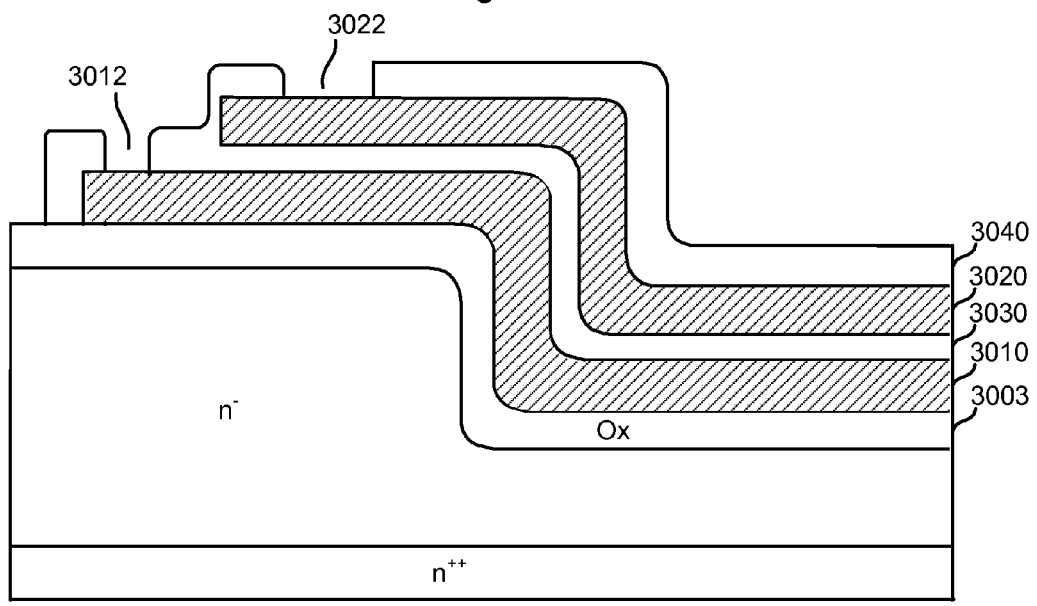

A number of different devices with trench structures having multiple buried electrodes or diodes have thus far been described. In order to bias these trenched electrodes, these devices allow for electrical contact to be made to each of the buried layers. A number of methods for forming the trench structures with buried electrodes and for making contact to the buried poly layers inside the trenches are disclosed herein. In one embodiment, contacts to trenched poly layers are made at the edge of the die. FIG. 30A shows one example of edge contacting for a trench device 3000 with two poly layers 3010 and 3020. FIG. 30A depicts a cross-sectional view of the device along the longitudinal axis of a trench. According to this embodiment, where the trench terminates near the edge of the die, poly layers 3010 and 3020 are brought up to the surface of the substrate for contact purposes. Openings 3012 and 3022 in dielectric (or oxide) layers 3030 and 3040 allow for metal contact to the poly layers. FIGS. 30B to 30F illustrate various processing steps involved in forming the edge contact structure of FIG. 30A. In FIG. 30B, a dielectric (e.g., silicon dioxide) layer 3001 is patterned on top of epitaxial layer 3006, and the exposed surface of the substrate is etched to form trench 3002. A first oxide layer 3003 is then formed across the top surface of the substrate including the trench as shown in FIG. 30C. A first layer of conductive material (e.g., polysilicon) 3010 is then formed on top of oxide layer 3003 as shown in FIG. 30D. Referring to FIG. 30E, poly layer 3010 is etched away inside the trench and another oxide layer 3030 is formed over poly 3010. Similar steps are carried out to form the second oxide-poly-oxide sandwich as shown in FIG. 30F, where the top oxide layer 3040 is shown as being etched to make openings 3012 and 3022 for metal contact layer to poly layers 3010 and 3020, respectively. The last steps can be repeated for additional poly layers, and poly layers can be tied together by the overlying metal layer if desired.

Figure 31A:
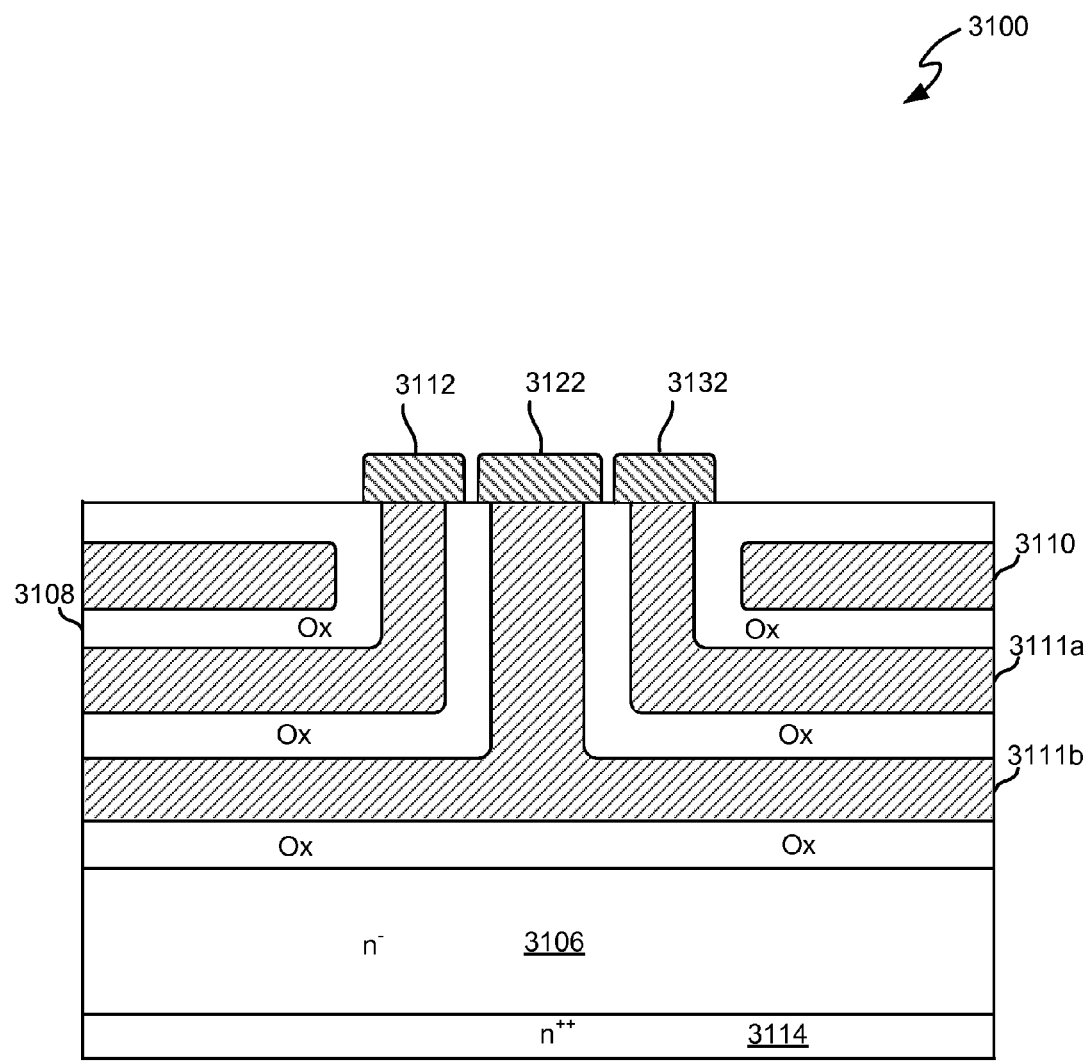
FIG. 31A is an example of an active area contact structure for multiple buried poly layers.

In another embodiment, contacts to multiple poly layers in a given trench are made in the active area of the device instead of along the edge of the die. FIG. 31A depicts one example of the active area contact structure for multiple buried poly layers. In this example, a cross-sectional view along the longitudinal axis of the trench shows a poly layer 3110 which provides the gate terminal and poly layers 3111a and 3111b that provide two shield layers. While three separate metal lines 3112, 3122 and 3132 are shown as making contact to the shield poly layers, they can be all tied together and connected to the source terminal of the device, or any other contacting combination can be used as required by a particular application. An advantage of this structure is the planar nature of the contact as compared to the multi-layer edge contact structure shown in FIG. 30A.

Figure 31B:
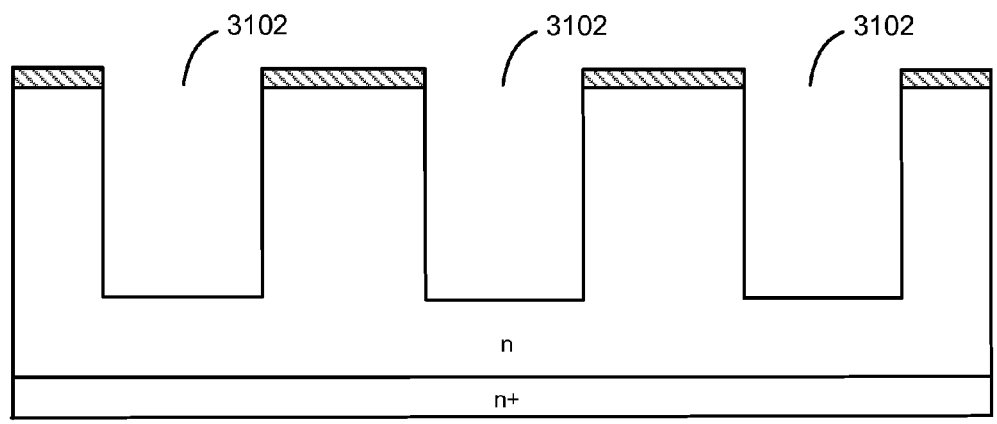
FIGS. 31B-31M show an exemplary process flow for forming an active area shield contact structure for a trench.
Figure 31C:
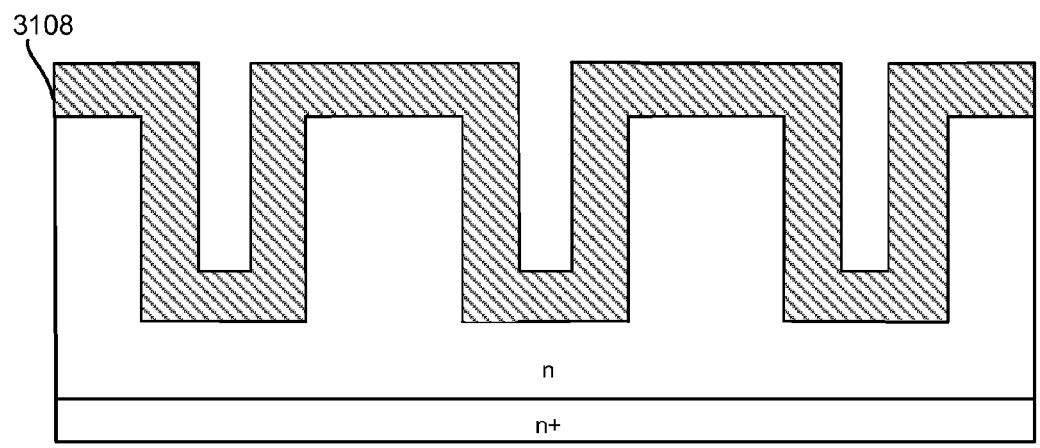
Figure 31D:
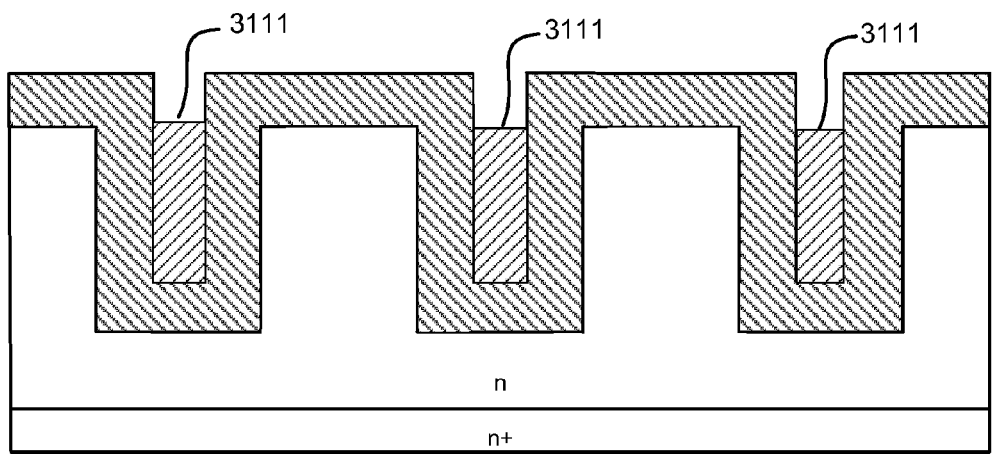
Figure 31E:
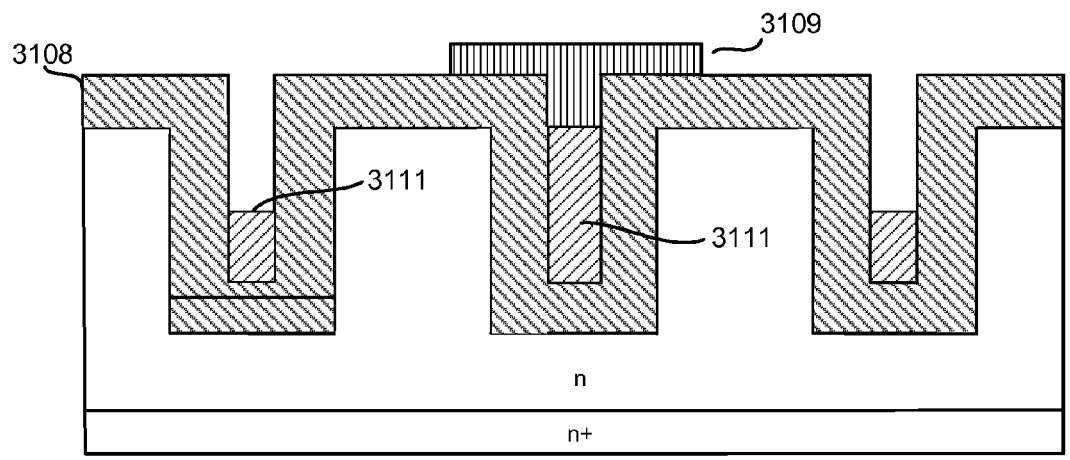
Figure 31F:
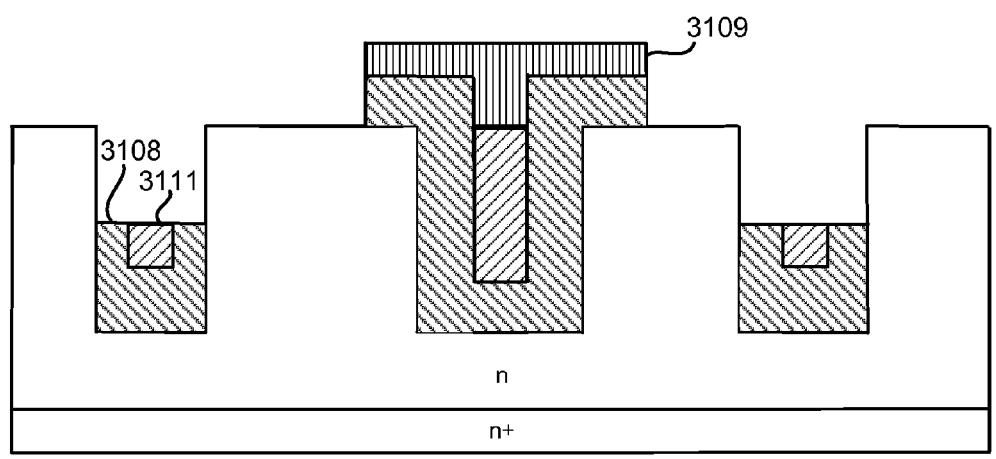
Figure 31G:
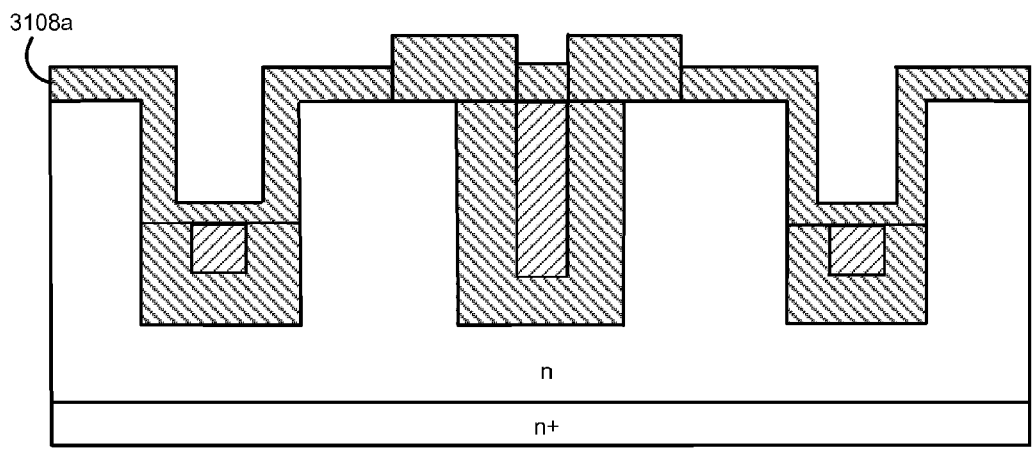
Figure 31H:
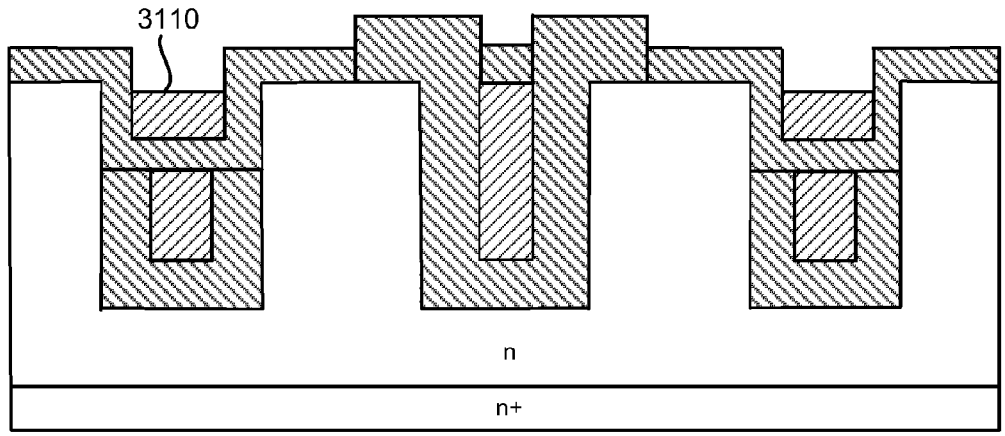
Figure 31I:
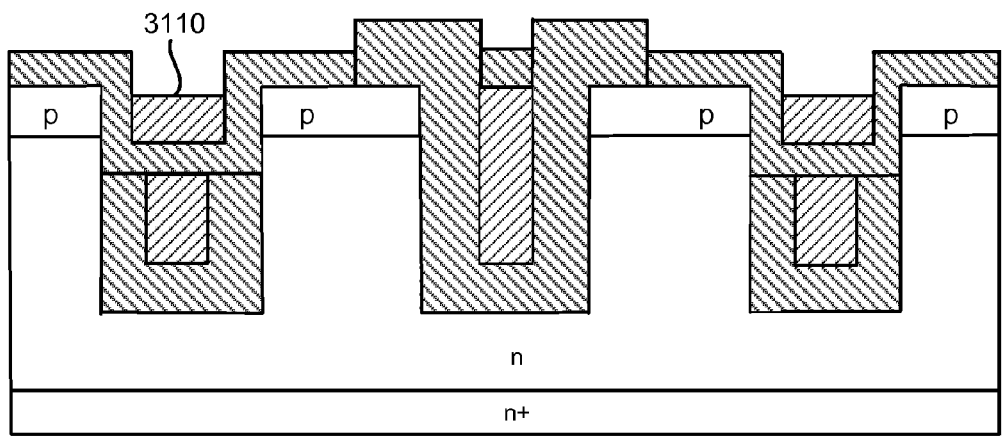
Figure 31J:
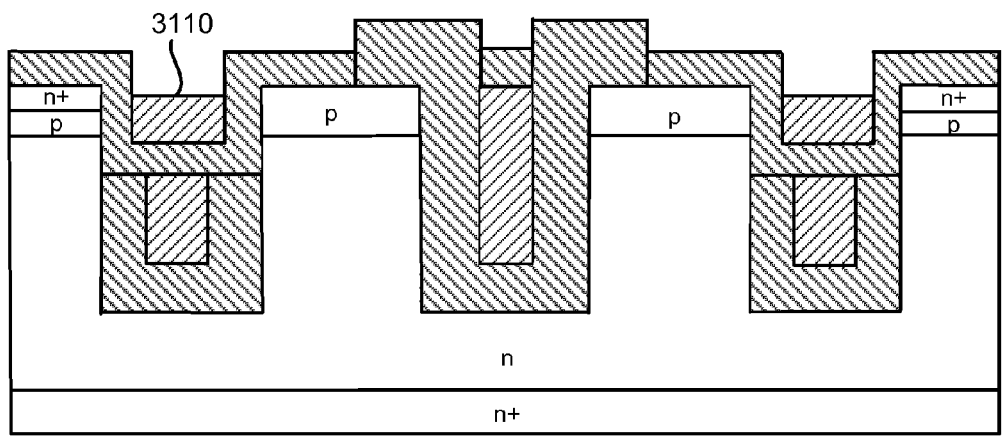
Figure 31K:
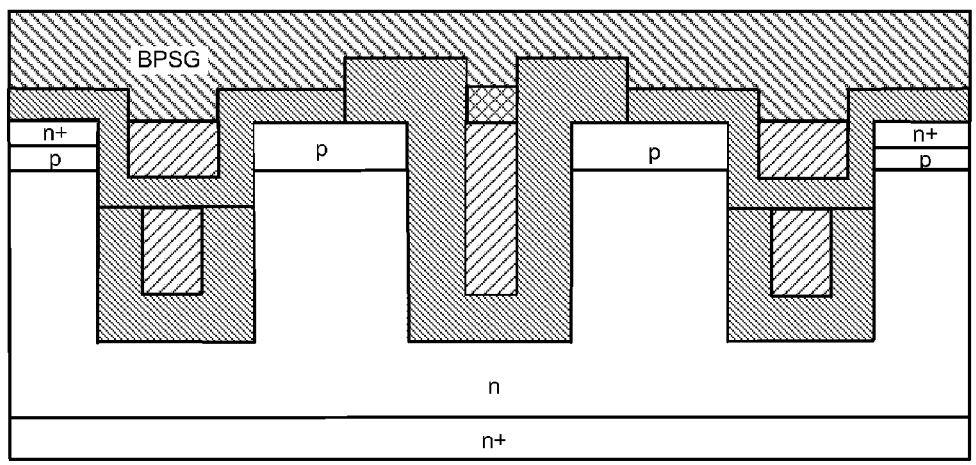
Figure 31L:
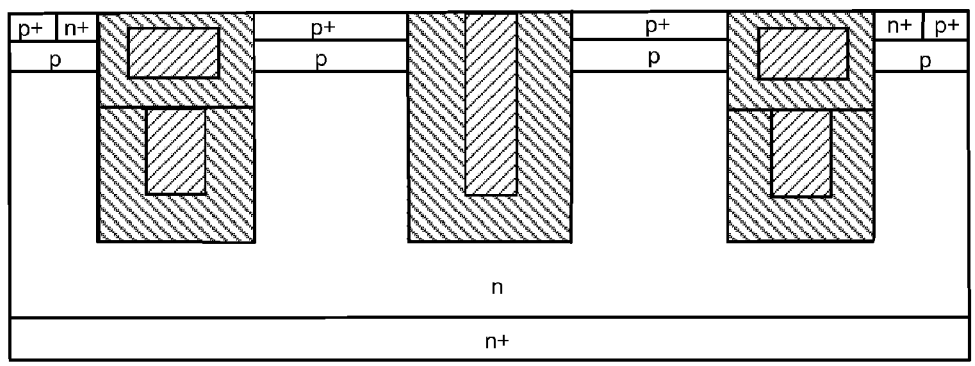
Figure 31M:
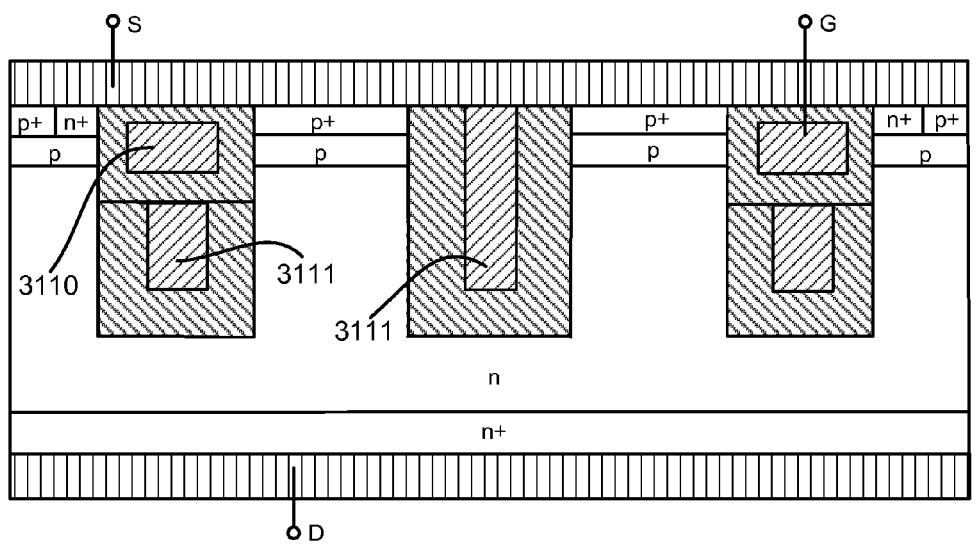
Figure 31N:
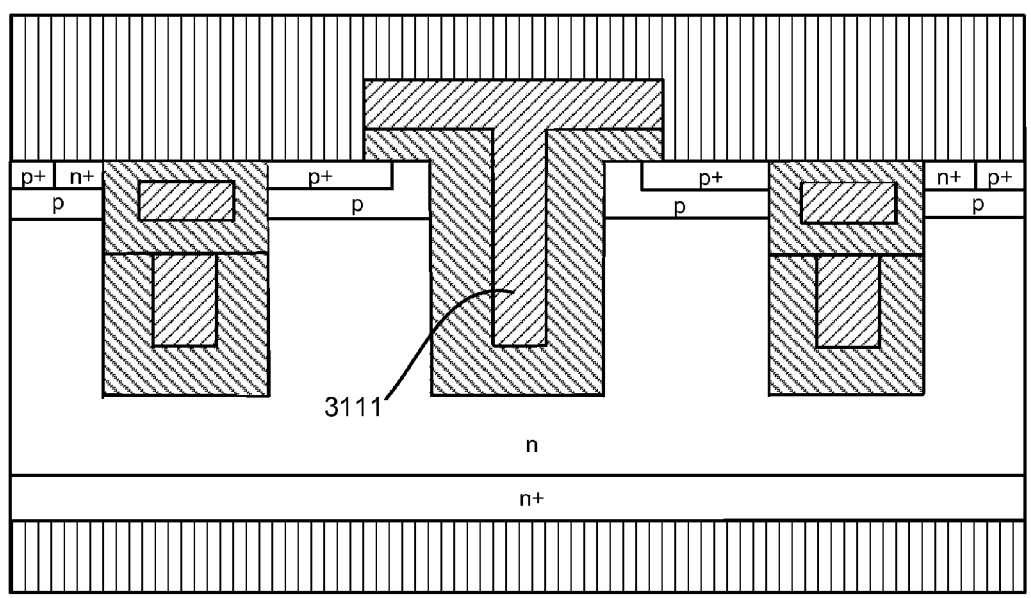
FIG. 31N is a cross-sectional view of an alternate embodiment for an active area shield contact structure.

FIGS. 31B to 31M illustrate one example of a process flow for forming an active area shield contact structure for a trench with two layers of poly. Etching of trenches 3102 in FIG. 31B is followed by shield oxide 3108 formation in FIG. 31C. Shield polysilicon 3111 is then deposited and recessed inside the trenches as shown in FIG. 31D. Shield poly 3111 is additionally recessed in FIG. 31E, except for locations where shield contact at the surface of the substrate is desired. In FIG. 31E, a mask 3109 protects the poly inside the middle trench from further etch. In one embodiment, this mask is applied at different locations along different trenches such that for the middle trench, for example, shield poly is recessed in other portions of the trench in the third dimension (not shown). In another embodiment, shield poly 3111 inside one or more select trenches in the active area is masked along the entire length of the trench. Shield oxide 3108 is then etched as shown in FIG. 31F, and a thin layer of gate oxide 3108a is then formed across the top of the substrate after mask 3109 is removed as shown in FIG. 31G. This is followed by gate poly deposition and recess (FIG. 31H), p well implant and drive (FIG. 31I), and n+ source implant (FIG. 31J). FIGS. 31K, 31L and 31M depict the steps of BPSG deposition, contact etch and p+ heavy body implant, followed by metallization, respectively. FIG. 31N shows a cross-sectional view of an alternative embodiment for an active area shield contact structure wherein shield poly 3111 forms a relatively wider platform on top of shield oxide. This facilitates contacting the shield poly, but introduces topography that may further complicate the fabrication process.

Figure 32A:
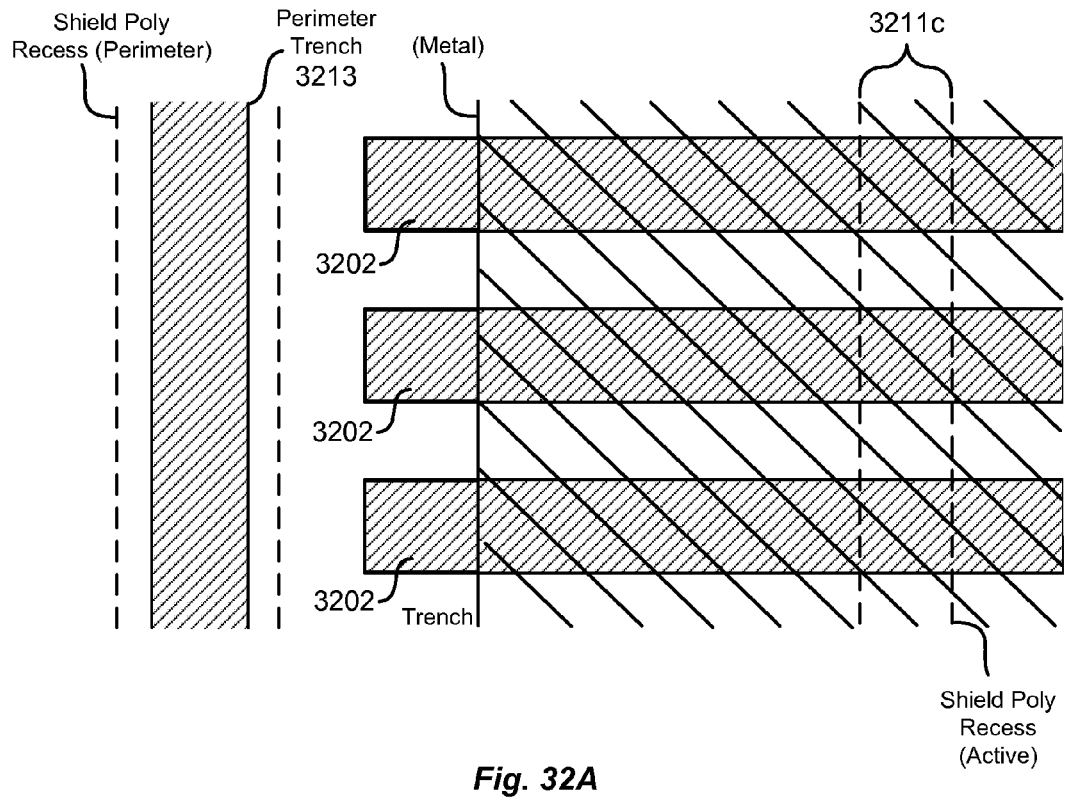
FIGS. 32A and 32B are layout views of an exemplary trench device with active area shield contact structure.
Figure 32B:
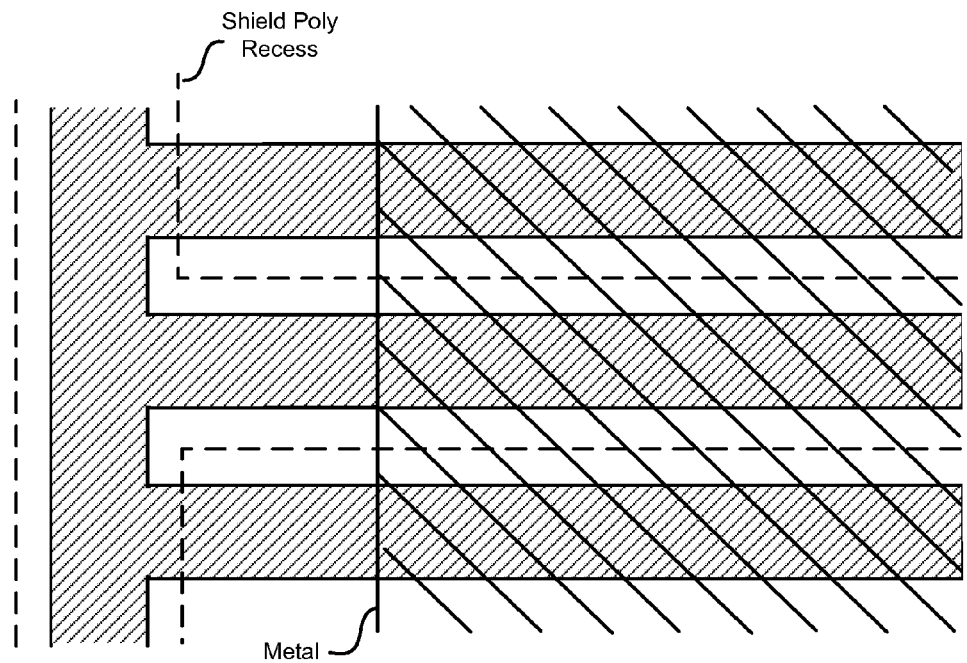
Figure 32C:
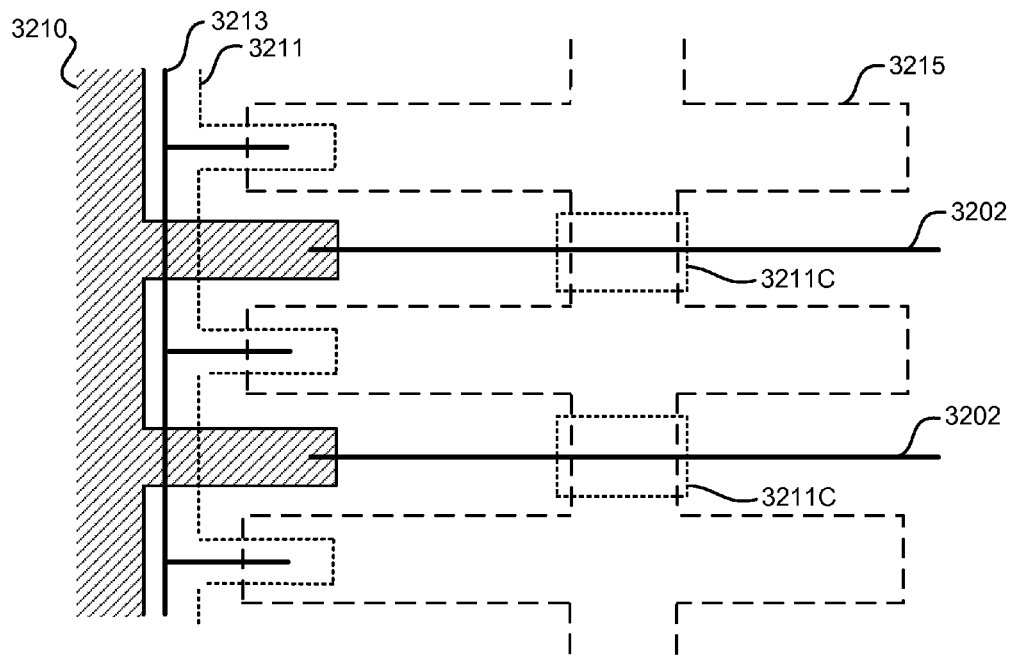
FIGS. 32C-32D are simplified layout diagrams of two embodiments for making contact to the perimeter trench in a trench device with broken trench structure.
Figure 32D:
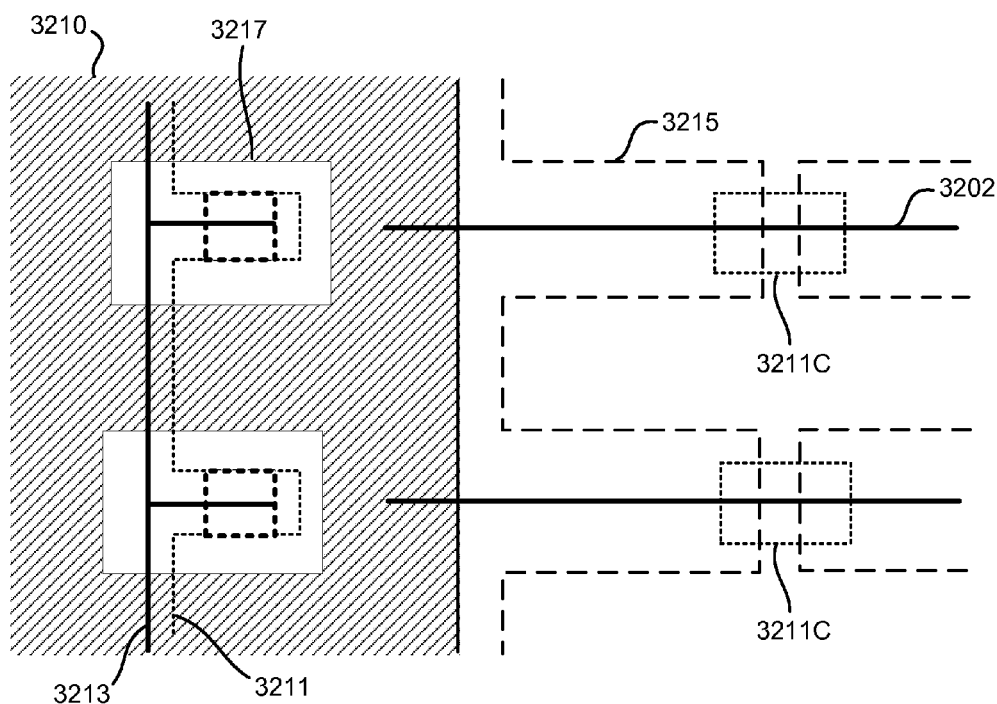

A simplified top-down layout view of an exemplary trench device with an active area shield contact structure is shown in FIG. 32A. A mask defining shield poly recess prevents the recessing of the shield poly at location 3211C in the active region as well as in perimeter shield trench 3213. A modification of this technique uses a "dogbone"-like shape for the shield poly recess mask that provides a wider region at the intersection with each trench 3202 for contact to the shield poly. This allows the shield poly in the masked region to also be recessed but to the original surface of the mesa, thus eliminating topography. The top-down layout view for an alternative embodiment is shown in FIG. 32B, wherein active area trenches are connected to the perimeter trench. In this embodiment, the shield poly recess mask prevents recessing of shield poly along the length of a selected trench (middle trench in the example shown) for active area shield trench contact to source metal. FIGS. 32C and 32D are simplified layout diagrams showing two different embodiments for making contact to the perimeter trench in a trench device with broken trench structure. In these figures, active trenches 3202 and perimeter trench 3213 are depicted by a single line for illustrative purposes. In FIG. 32C, extensions or fingers from perimeter gate poly runner 3210 are staggered with respect to perimeter shield poly fingers to space the perimeter contacts away from the perimeter trench. Source and shield contact area 3215 also makes contact to shield poly in the active region in locations 3211C as shown. The embodiment shown in FIG. 32D eliminates the offset between active and perimeter trenches to avoid possible limitations arising from trench pitch requirements. In this embodiment, active trenches 3202 and horizontal extensions from perimeter trench 3213 are aligned, and windows 3217 in gate poly runner 3210 allow for contacts to be made to shield poly around the perimeter. Active area contacts are made in locations 3211C as in previous embodiments.

Figure 33A:
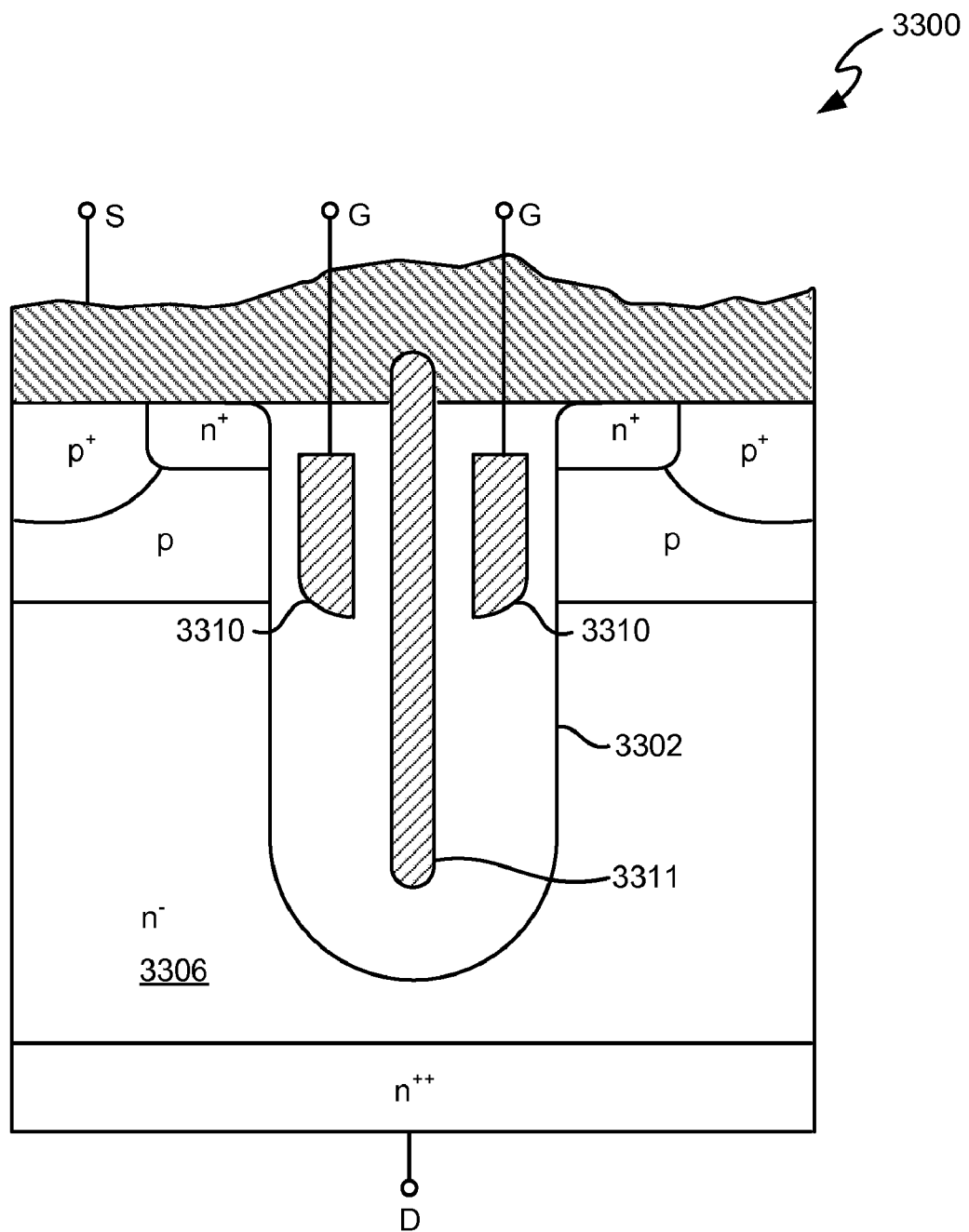
FIG. 33A is an alternate embodiment for contacting trenched shield poly layers in the active area.
Figure 33B:
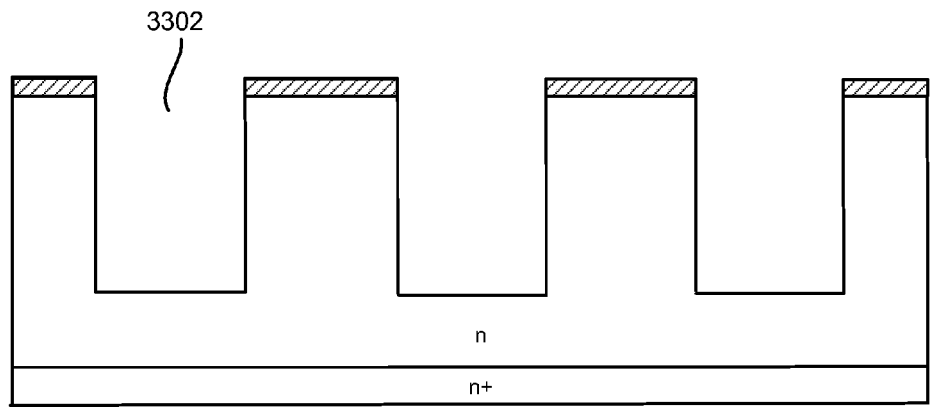
FIGS. 33B-33M show an example of a process flow for contacting an active area shield structure of the type shown in FIG. 33A.
Figure 33C:
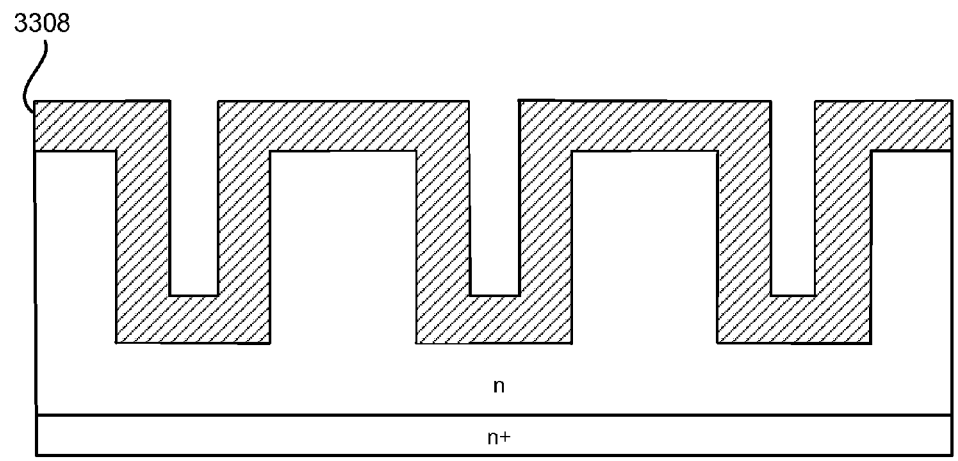
Figure 33D:
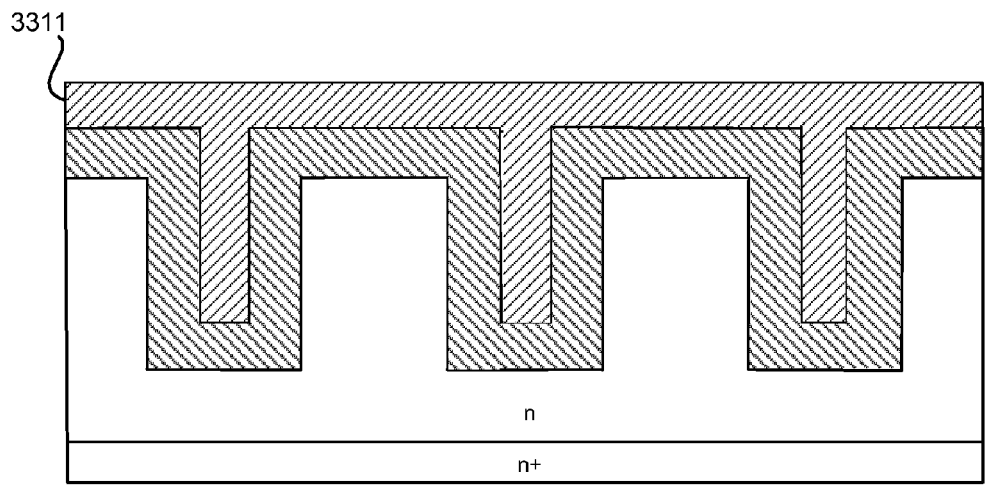
Figure 33E:
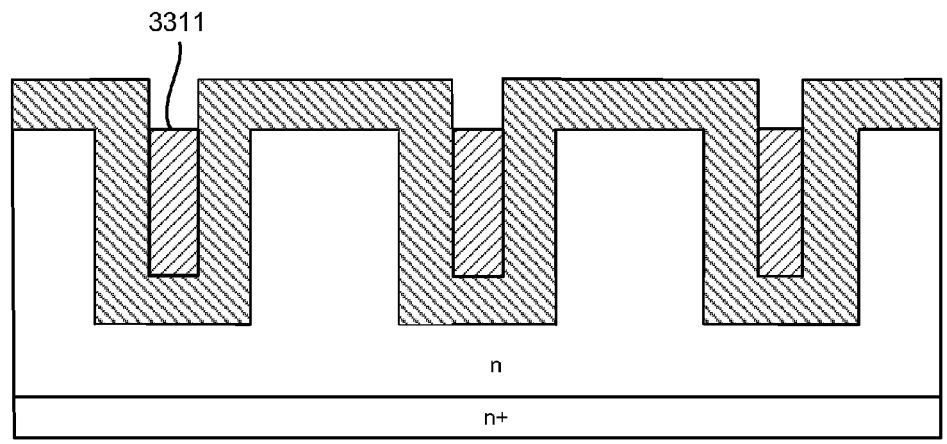
Figure 33F:
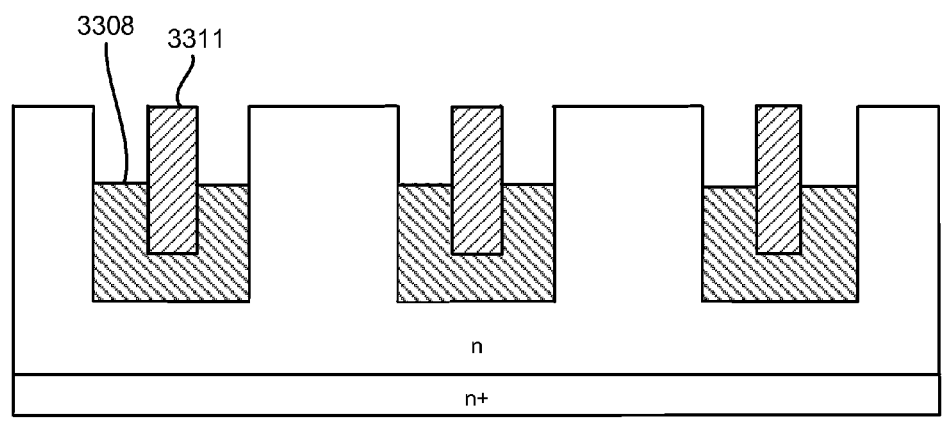
Figure 33G:
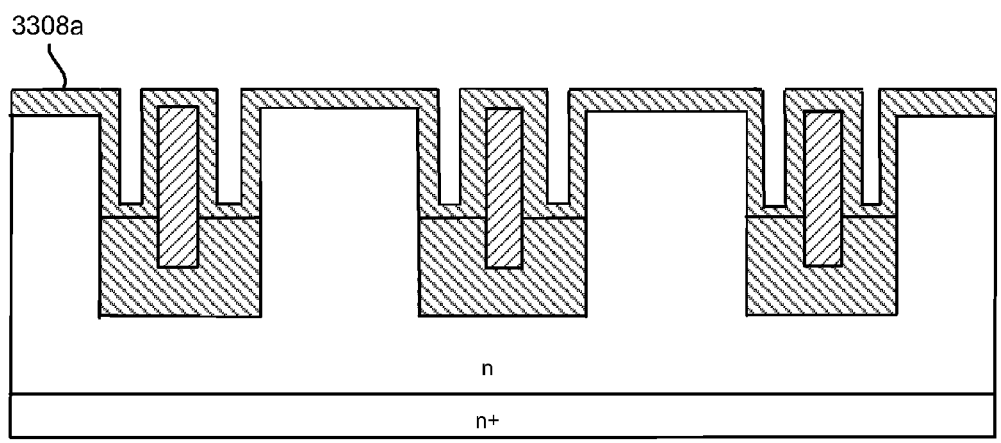
Figure 33H:
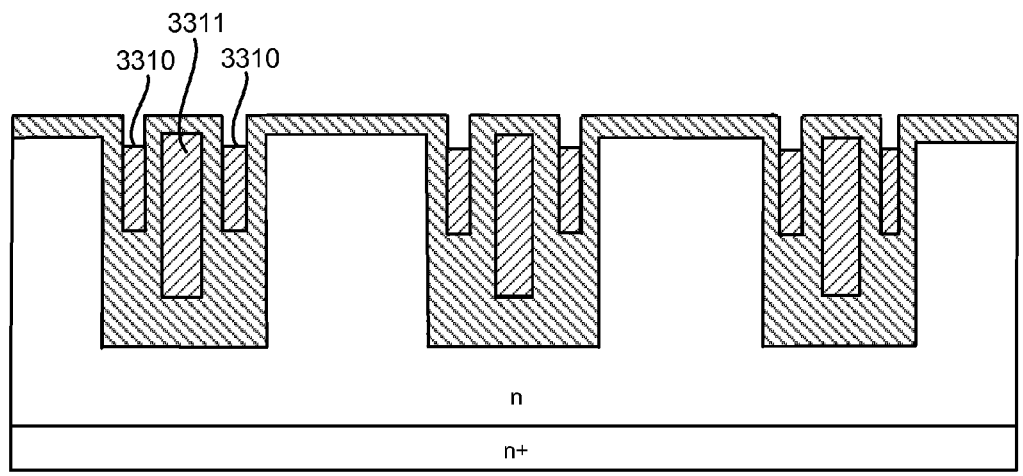
Figure 33I:
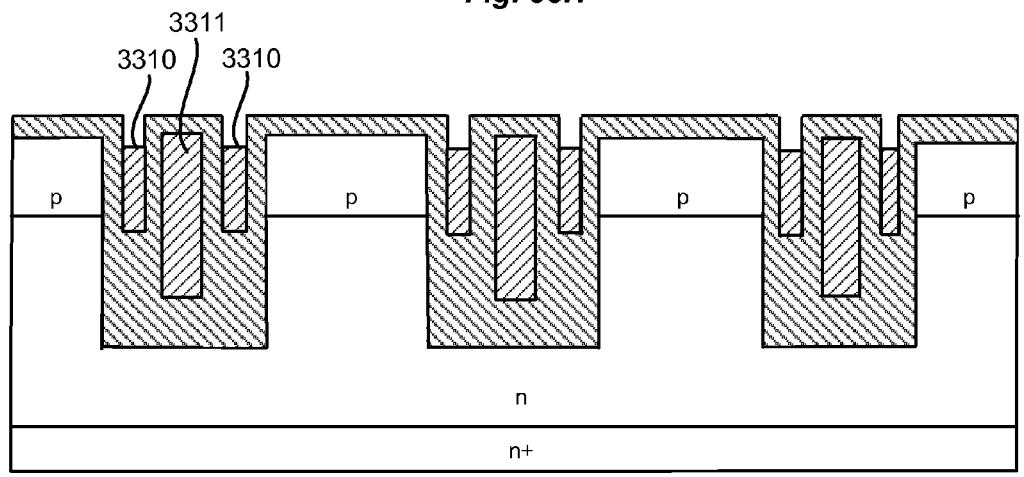
Figure 33J:
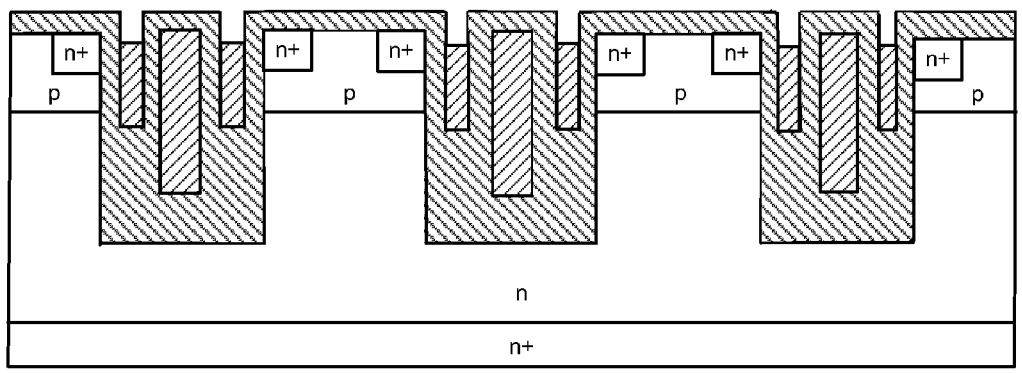
Figure 33K:
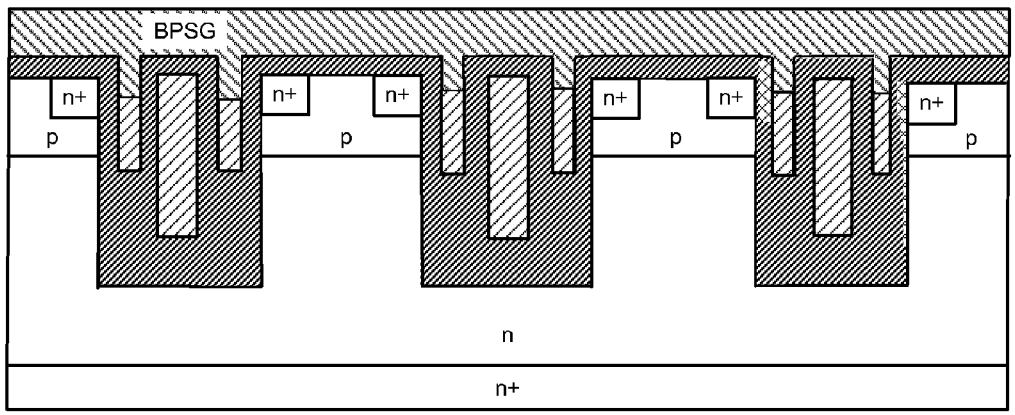
Figure 33L:
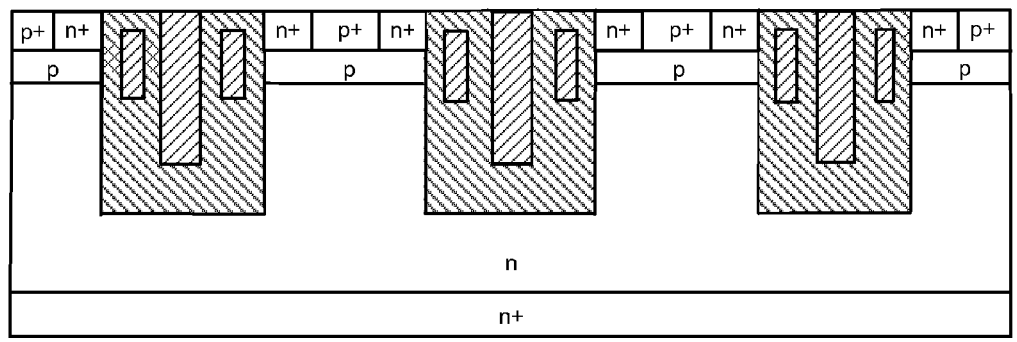
Figure 33M:
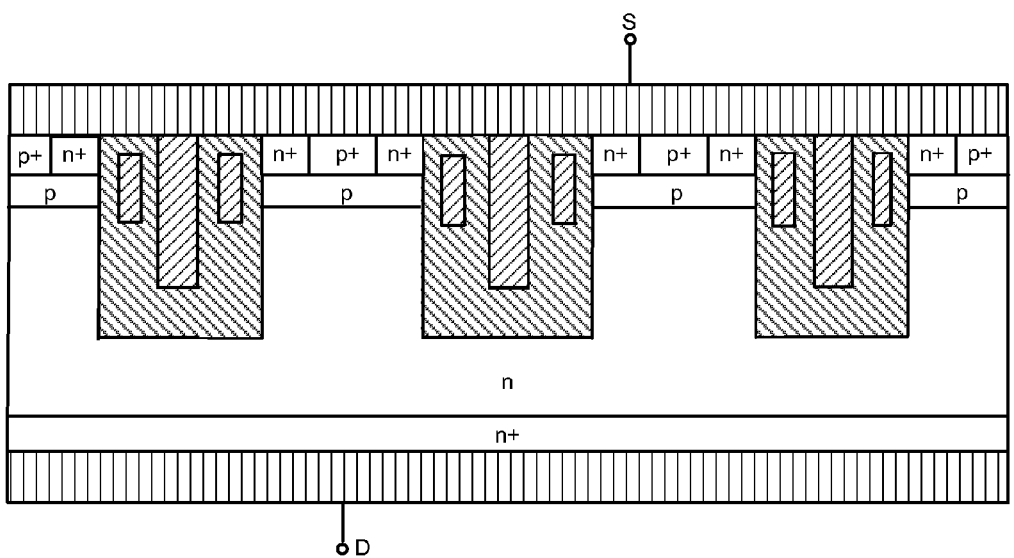

An alternative embodiment for contacting trenched shield poly layers in the active area is shown in FIG. 33A. In this embodiment, instead of recessing the shield poly it extends vertically over a substantial part of the active trench up to the silicon surface. Referring to FIG. 33A, shield poly 3311 splits gate poly 3310 into two as it extends vertically along the height of trench 3302. The two gate poly segments are connected in the third dimension at a suitable location inside the trench or as they exit the trench. One advantage of this embodiment is the area that is saved by making source poly contact inside the active trench instead of using silicon space that would be dedicated for the trenched poly contact. FIGS. 33B to 33M illustrate one example of a process flow for forming an active area shield contact structure of the type shown in FIG. 33A. Etching of trenches 3302 in FIG. 33B is followed by shield oxide 3308 formation in FIG. 33C. Shield polysilicon 3311 is then deposited inside the trenches as shown in FIG. 33D. Shield poly 3311 is etched and recessed inside the trenches as shown in FIG. 33E. Shield oxide 3308 is then etched as shown in FIG. 33F, leaving an exposed portion of shield polysilicon 3311 that forms two troughs on its sides inside the trench. A thin layer of gate oxide 3308a is then formed across the top of the substrate, sidewalls of the trenches and troughs inside the trenches as shown in FIG. 33G. This is followed by gate poly deposition and recess (FIG. 33H), p-well implant and drive (FIG. 33I), and n+ source implant (FIG. 33J). FIGS. 33K, 33L and 33M depict the steps of BPSG deposition, contact etch and p+ heavy body implant, followed by metallization, respectively. Variations on this process flow are possible. For example, by re-ordering some of the process steps, the process steps forming gate poly 3310 can be conducted prior to the steps forming shield poly 3311.

Specific process recipes and parameters and variations thereof for performing many of the steps in the above process flows are well-known. For a given application, certain process recipes, chemistries and material types can be fine tuned to enhance manufacturability and performance of the device. Improvements can be made from the starting material, i.e., the substrate on top of which the epitaxial (epi) drift region is formed. In most power applications, reduction in the transistor on-resistance $R_{DSon}$ is desirable. The ideal on-resistance of a power transistor is a strong function of the critical field which is defined as the maximum electric field in the device under breakdown conditions. Transistor specific on-resistance can be significantly reduced if the device is fabricated in a material with critical field higher than that of silicon, provided that reasonable mobility is maintained. While many of the power devices features, including structures and processes, described thus far have been described in the context of a silicon substrate, other embodiments using substrate material other than silicon are possible. According to one embodiment, the power devices described herein are fabricated in a substrate made of wide-bandgap material, including for example, silicon carbide (SiC), gallium nitride (GaN), gallium arsenide (GaAs), indium phosphide (InP), diamond and the like. These wide-bandgap materials exhibit a critical field that is higher than the critical field for silicon and can allow for a significant reduction in transistor on-resistance.

Another primary contributor to the transistor on-resistance is the thickness and doping concentration of the drift region. The drift region is typically formed by epitaxially grown silicon. To reduce $R_{DSon}$, it is desirable to minimize the thickness of this epi drift region. The thickness of the epi layer is dictated in part by the type of starting substrate. For example, a red-phosphorus doped substrate is a common type of starting substrate material for discrete semiconductor devices. A property of phosphorus atoms, however, is that they diffuse quickly in silicon. The thickness of the epi region that is formed on top of the substrate is therefore determined to accommodate the up-diffusion of phosphorus atoms from the underlying heavily doped substrate.

Figure 34:
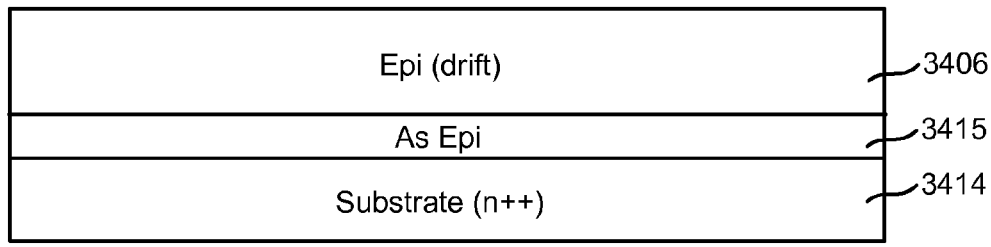
FIG. 34 shows an epi layer having a spacer or buffer (barrier) layer to reduce thickness of epi drift region.

In order to minimize the thickness of the epi layer, according to one embodiment shown in FIG. 34, an epi spacer or buffer (or barrier) layer 3415 having dopants with relatively less diffusivity such as Arsenic, is formed above a phosphorus substrate 3414. The combined phosphorous-doped substrate and Arsenic-doped buffer layer provides the foundation for the subsequent formation of epi drift region 3406. The Arsenic dopant concentration in layer 3415 is determined by the breakdown voltage requirements of the device, and the thickness of Arsenic epi layer 3415 is determined by specific thermal budget. A regular epi layer 3406 may then be deposited on top of the Arsenic epi, the thickness of which would be determined by device requirements. The much lower diffusivity of Arsenic allows the overall thickness of the epi drift region be reduced resulting in a reduction in transistor on-resistance.

Figure 35:
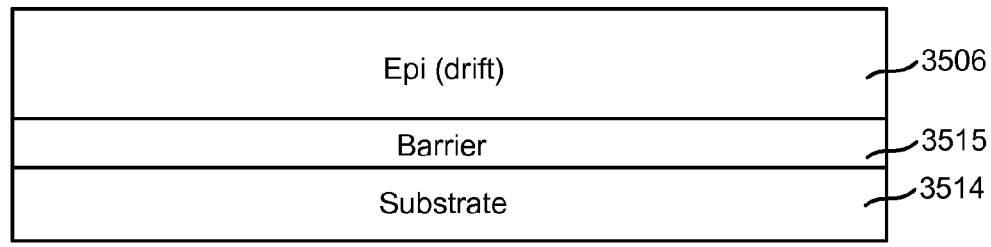
FIG. 35 shows an alternative embodiment for a device with a barrier layer.

In an alternative embodiment, in order to counter the up-diffusion of dopant species from the heavily doped substrate to the epi layer a diffusion barrier is employed between the two layers. According to one exemplary embodiment shown in FIG. 35, a barrier layer 3515 composed of, e.g., silicon carbide $Si_xC_{1-x}$ is deposited epitaxially on either boron or phosphorus substrates 3514. Epi layer 3506 is then deposited atop barrier layer 3515. The thickness and carbon composition may vary according to the thermal budget of the process technology. Alternately, carbon dopants can be first implanted into substrate 3514, after which thermal treatment activates the carbon atoms to form a $Si_xC_{1-x}$ compound at the surface of substrate 3514.

Figure 36:
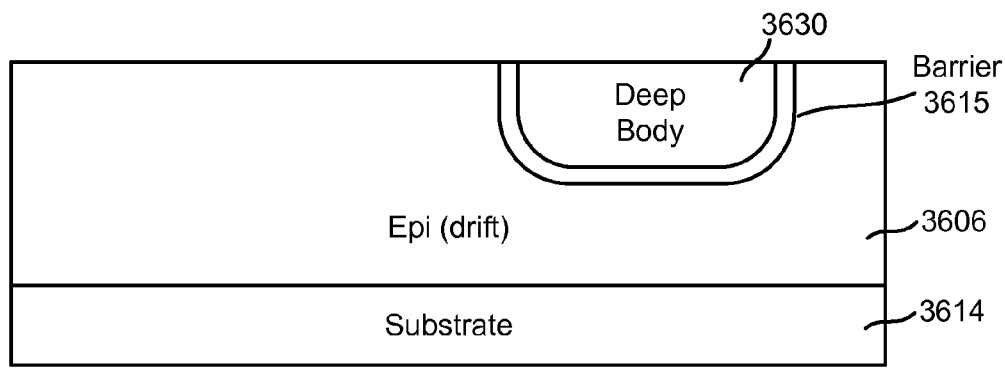
FIG. 36 shows a barrier layer employed at a deep body-epi junction to minimize epi layer thickness.
Figure 37:
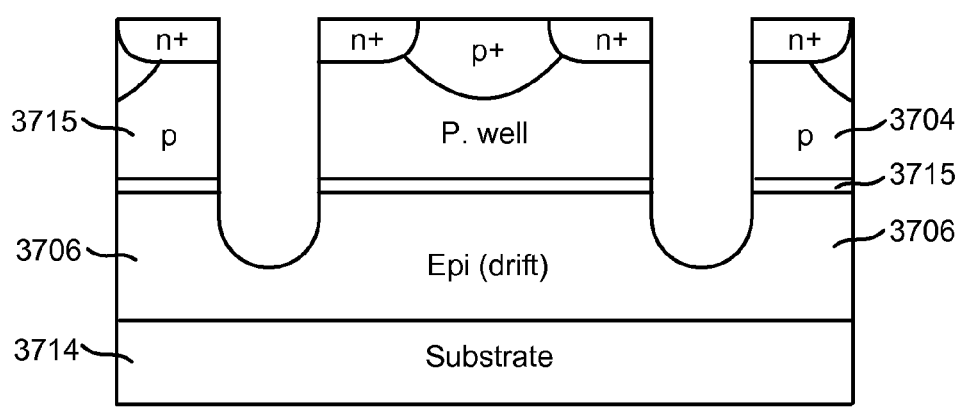
FIG. 37 is a simplified example of the well-drift region junction of a transistor employing a diffusion barrier layer.

Another aspect of certain trench transistor technologies that limits the ability to reduce the thickness of the epi is the junction formed between the deep body and epi layer that is sometimes employed in the active region and sometimes in the termination region. The formation of this deep body region commonly involves an implant step early in the process. Due to the large subsequent thermal budget required by the formation of field oxide and gate oxide, the junction at the deep body and drift region is graded to a large extent. To avoid early breakdown at the edge of the die, a much thicker drift region is needed which results in higher on-resistance. The use of a diffusion barrier layer can also be employed at the deep body-epi junction in order to minimize the required epi thickness. According to an exemplary embodiment shown in FIG. 36, carbon dopants are implanted through the deep body window and before the deep body implant is carried out. The subsequent thermal process activates the carbon atoms to form a layer of $Si_xC_{1-x}$ compound 3615 at the boundary of deep body region 3630. Silicon carbide layer 3615 serves as a diffusion barrier preventing boron diffusion. The resulting deep body junction is shallower allowing the thickness of epi layer 3606 to be reduced. Yet another junction in a typical trench transistor that can benefit from a diffusion barrier is the well-drift region junction. A simplified example of an embodiment employing such a barrier layer is shown in FIG. 37. In the exemplary process flow for the structure of FIG. 31M, a p-well is formed between the two steps shown in FIGS. 31H and 31I. Prior to implanting the well dopants (p-type for this exemplary n-channel embodiment), carbon is implanted first. The subsequent thermal process activates the carbon atoms to form a layer 3715 of $Si_xC_{1-x}$ at the p-well epi junction. Layer 3715 serves as a diffusion barrier to prevent boron diffusion so that the depth of p-well 3704 can be preserved. This helps reduce transistor channel length without increasing the potential for reach-through. Reach-through occurs when the edge of the advancing depletion boundary reaches the source junction as the drain-source voltage increases. By acting as a diffusion barrier, layer 3715 also prevents reach-through.

As discussed above, reducing the transistor channel length is desirable because it results in reduced on-resistance. In another embodiment, transistor channel length is minimized by forming the well region using epitaxially grown silicon. That is, instead of the conventional method of forming the well that involves an implant into the drift epi layer followed by a diffusion step, the well region is formed on top of the epi drift layer. There are advantages other than a shorter channel length that can be obtained from an epi-well formation. In shielded gate trench transistors, for example, the distance by which the gate electrode extends below the bottom of the well where it meets the trench (gate to drain overlap) is critical in determining gate charge Qgd. Gate charge Qgd directly impacts the switching speed of the transistor. It is desirable, therefore, to be able to accurately minimize and control this distance. However, in fabrication processes where the well is implanted and diffused into the epi as shown, for example, in FIG. 31I above, this distance is difficult to control.

To better control the gate-to-drain overlap at the corner of the well, various methods for forming a trench device with a self-aligned well are proposed. In one embodiment, a process flow involving deposition of an epi-well enables the self-alignment of the bottom of the body junction to the bottom of the gate. Referring to FIGS. 38A-38D, there is shown a simplified process flow for one example of a self-aligned epi-well trench device with buried electrode (or shielded gate). A trench 3802 is etched into a first epi layer 3806 that is formed on top of substrate 3814. For an n-channel transistor, substrate 3814 and first epi layer 3806 are of n-type material.

Figure 38A:
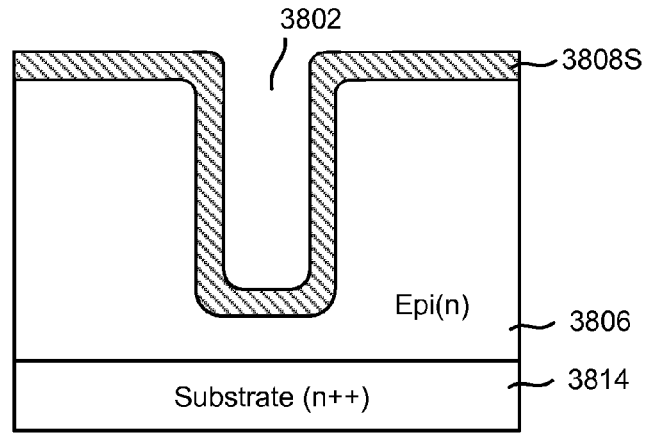
FIGS. 38A-38D show a simplified process flow for an example of a self-aligned epi-well trench device with buried electrode.
Figure 38B:
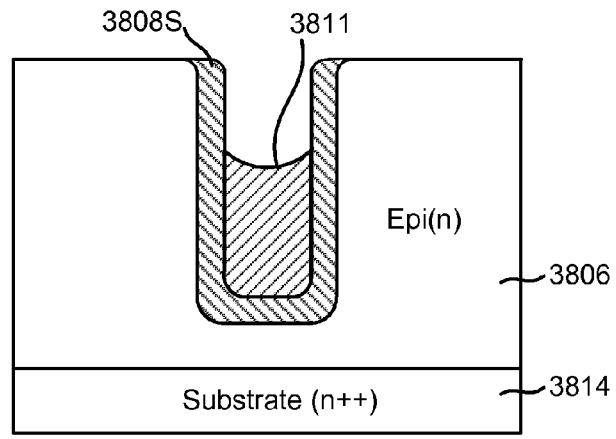
Figure 38C:
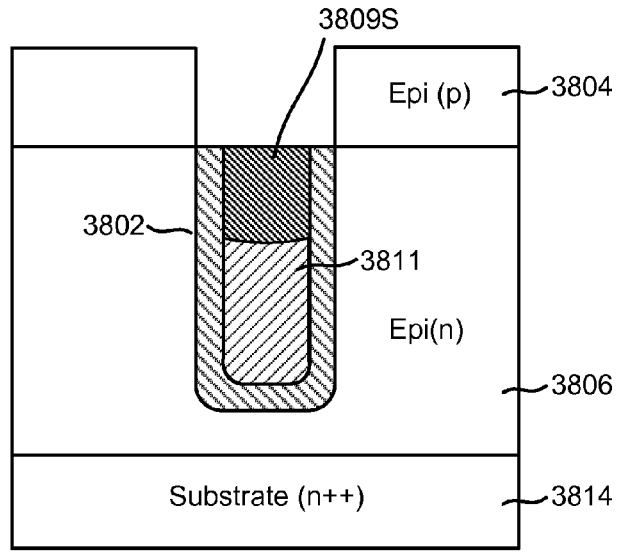
Figure 38D:
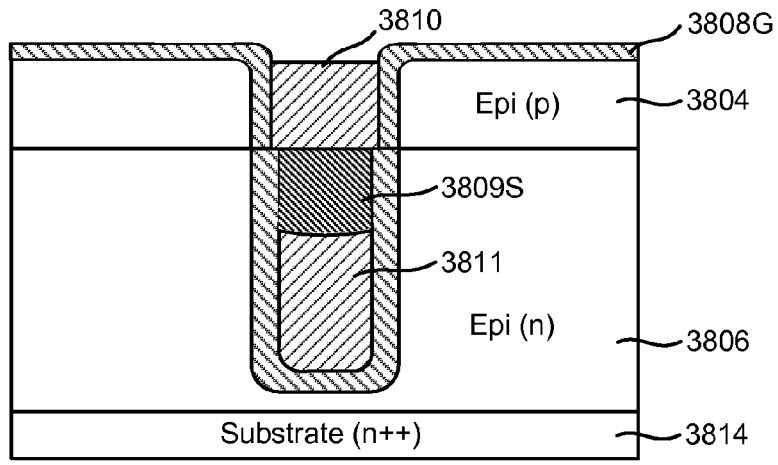

FIG. 38A shows a layer of shield dielectric 3808S grown on the top surface of epi layer 3806 including inside trench 3802. Conductive material 3811 such as polysilicon is then deposited inside trench 3802 and etched back below the epi mesa as shown in FIG. 38B. Additional dielectric material 3809S is deposited to cover shield poly 3811. After etching back the dielectric to clear the mesa, a second layer of epi 3804 is selectively grown on top of first epi layer 3806, as shown in FIG. 38C. The mesas formed by epi layer 3804 create an upper trench portion above original trench 3802 as shown. This second epi layer 3804 has dopants of opposite polarity (e.g., p-type) to that of the first epi layer 3806. The dopant concentration in second epi layer 3804 is set to the desired level for the transistor well region. After the step of selective epi growth (SEG) that forms layer 3804, a layer of gate dielectric 3808G is formed on the top surface and along the trench sidewalls. Gate conductive material (poly) is then deposited to fill the remaining portion of trench 3802, and then planarized as shown in FIG. 38D. The process continues as in, for example, the process flow shown in FIGS. 31J to 31M to complete the transistor structure.

As shown in FIG. 38D, this process results in gate poly 3810 that is self-aligned with well epi 3804. To lower the bottom of gate poly 3810 below epi well 3804, the top surface of inter-poly dielectric layer 3809S as shown in FIG. 38C can be etched slightly to the desired location inside trench 3802. This process, therefore, provides for accurate control of the distance between the bottom of the gate electrode and the well corner. Those skilled in the art appreciate that the SEG well formation process is not limited to a shielded gate trench transistor and can be employed in many other trench gate transistor structures several of which have been described herein. Other methods of forming SEG mesa structures are described in commonly-assigned U.S. Pat. Nos. 6,391,699 to Madson et al. and 6,373,098, to Brush et al., which are hereby incorporated by reference in their entirety.

Figure 39A:
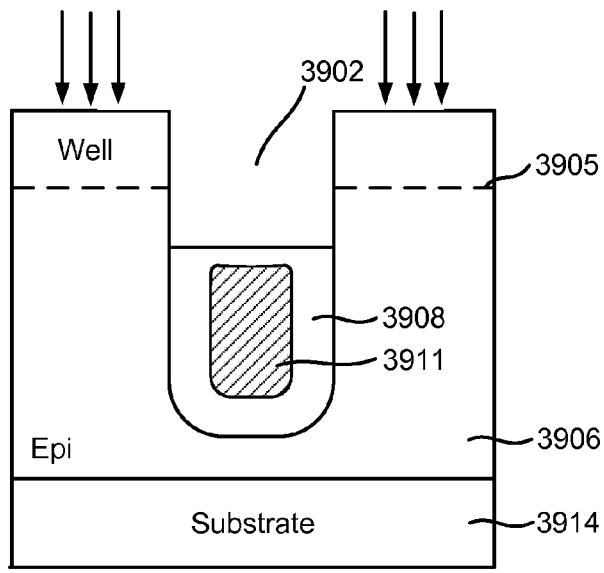
FIGS. 39A-39B show an exemplary process flow for an angled well implant.
Figure 39B:
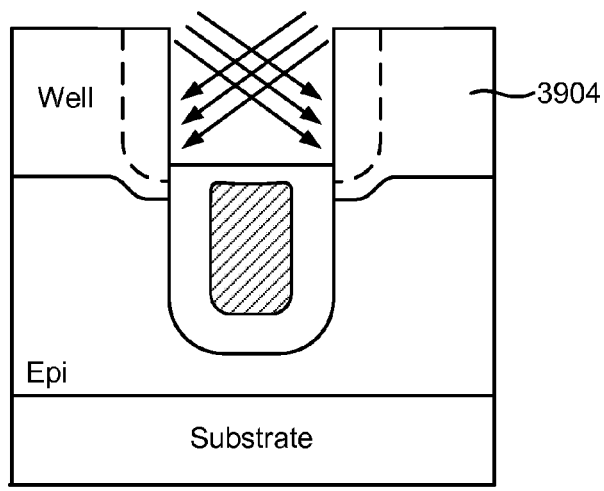

An alternative method for controlling the corner of the well for self-alignment purposes does not rely on SEG well formation and instead employs a process involving angled well implant. FIGS. 39A and 39B illustrate an exemplary process flow for this embodiment. Instead of forming the well after the trench is filled with gate poly as shown, for example, in FIGS. 31H and 31I, in this embodiment a first well implant 3905 at a given partial dose is performed after embedding shield poly in dielectric layer 3908 inside trench 3902 and before the remaining portion of the trench is filled. A second but angled well implant is then performed through the sidewalls of trench 3902 as shown in FIG. 39B. The drive cycle is then completed to obtain the desired contour for the well to drift epi interface at the trench corner. The implant dose, energy and the particulars of the drive cycles will vary depending on the structural requirements of the device. This technique can be employed in a number of different device types. In an alternative embodiment, the trench pitch and the angle implant are adjusted such that when the angle implant is diffused, it merges with the region from a neighboring cell to form a continuous well, eliminating the need for the first well implant.

Figure 40A:
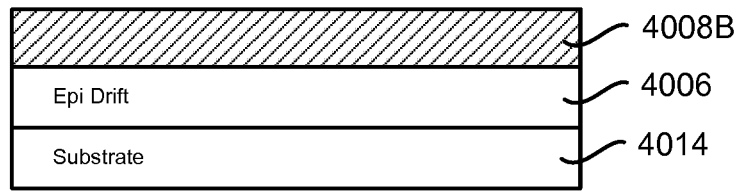
FIGS. 40A-40E show an example of a self-aligned epi well process.
Figure 40B:
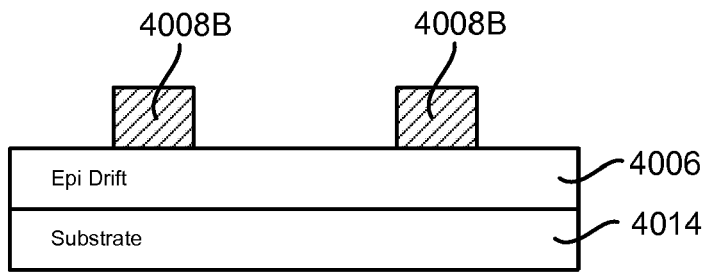
Figure 40C:
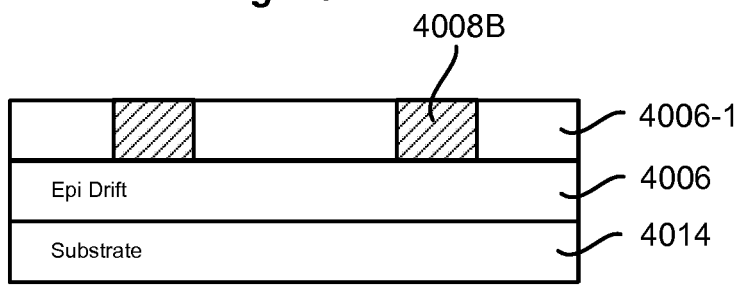

Another embodiment for a self-aligned epi well process for forming a trench device is described in connection with FIGS. 40A to 40E. As discussed above, to reduce gate-to-drain capacitance some trench gate transistors employ a gate dielectric layer that is thicker at the bottom of the trench below the gate poly than the dielectric layer along the inner vertical sidewalls. According to the exemplary process embodiment shown in FIGS. 40A to 40E, a dielectric layer 4008B is first formed on top of an epi drift layer 4006 as shown in FIG. 40A. Dielectric layer 4208B is formed with the desired thickness for the bottom of the trench, and is then etched leaving dielectric columns, as shown in FIG. 40B, that have the same width as the trench that will subsequently be formed. Next, in FIG. 40C, a selective epi growth step is performed to form a second epi drift layer 4006-1 around dielectric columns 4008B. Second drift epi layer 4006-1 is of the same conductivity type and can be of the same material as the first epi drift layer 4006. Alternatively, it is possible to use other types of materials for second epi drift layer 4006-1. In one exemplary embodiment, second drift epi layer 4006-1 is formed by an SEG step strained with a silicon germanium ($Si_xGe_{1-x}$) alloy. The SiGe alloy improves the carrier mobility at the accumulation region near the bottom of the trench. This improves the switching speed of the transistor and reduces $R_{DSon}$. The use of other compounds such as GaAs or GaN are also possible.

Figure 40D:
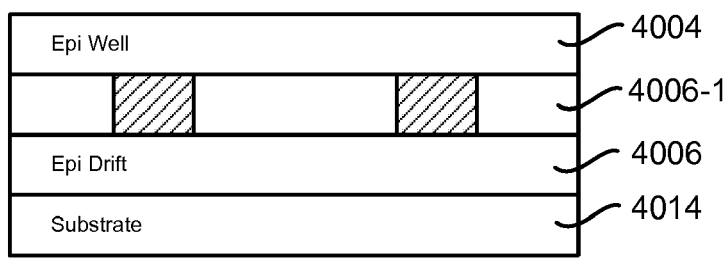
Figure 40E:
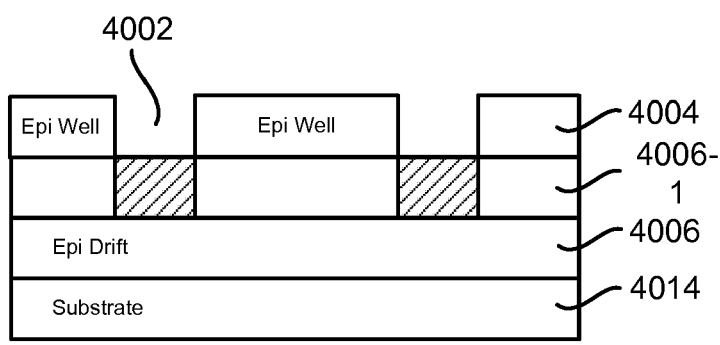

A blanket epi well layer 4004 is then formed on the top surface, and is then etched to form trenches 4002 as shown in FIGS. 40D and 40E, respectively. This is followed by gate oxide formation and gate poly deposition (not shown). The resulting structure is a trench gate with a self-aligned epi well. Conventional processing techniques can be used to complete the remaining process steps. Those skilled in the art appreciate that variations are possible. For example, instead of forming a blanket epi well layer 4004 and then etching trenches 4002, epi well 4002 can be selectively grown only on top of second drift epi layer 4006-1 forming trenches 4002 as it grows.

The various processing techniques described above enhance device performance by focusing on the formation of the well region to reduce channel length and $R_{DSon}$. Similar enhancements can be achieved by improving other aspects of the process flow. For example, device resistance can be further reduced by reducing the substrate thickness. A wafer thinning process is therefore commonly performed in order to reduce the thickness of the substrate. Wafer thinning is typically performed by mechanical grind and tape processes. The grind and tape processes impose mechanical forces on the wafer that cause damage to the wafer surface resulting in manufacturing problems.

Figure 40R:
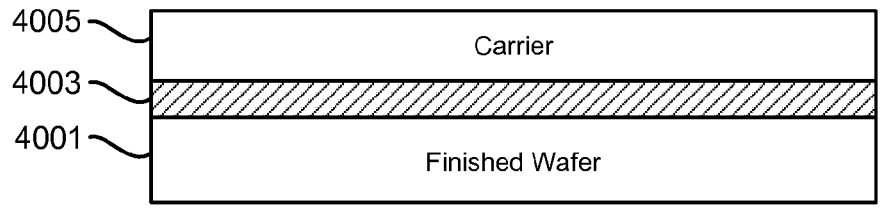
FIGS. 40R-40U show a method for reducing substrate thickness.
Figure 40S:
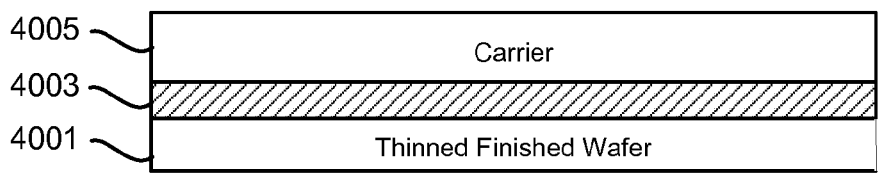
Figure 40T:
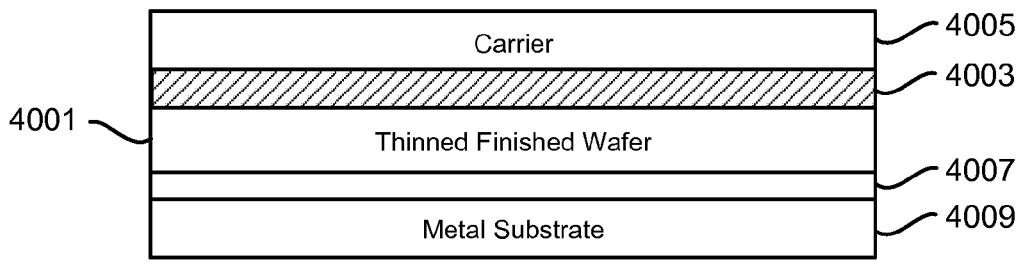
Figure 40U:
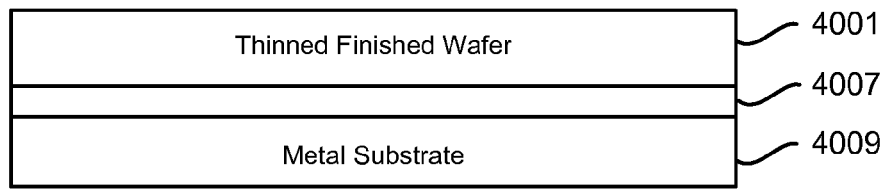

In an embodiment described hereinafter, an improved wafer thinning process significantly reduces substrate resistance. Illustrated in FIGS. 40R, 40S, 40T and 40U, is one method for reducing the thickness of the substrate. After finishing the fabrication of the desired circuitry on a wafer, the top of the wafer where the circuitry is fabricated is temporarily bonded to a carrier. FIG. 40R shows a finished wafer 4001 that is bonded to a carrier 4005 by a bonding material 4003. The backside of the finished wafer is then polished to the desired thickness using a process such as grinding, chemical etching or the like. FIG. 40S shows the same sandwich as FIG. 40R with finished wafer 4001 having been thinned. After the polishing of the backside of wafer 4001, the backside of the wafer is bonded to a low resistance (e.g., metal) wafer 4009 as shown in FIG. 40T. This could be accomplished using conventional methods using, for example, a thin coating of solder 4007 to bond metal wafer 4009 to thinned finished wafer 4001 under temperature and pressure. Carrier 4005 is then removed and the top surface of thinned finished wafer 4001 is cleaned before further processing. The highly conductive metal substrate 4009 facilitates heat dissipation, reduction in resistance and provides mechanical strength for the thinned wafer.

Figure 41:
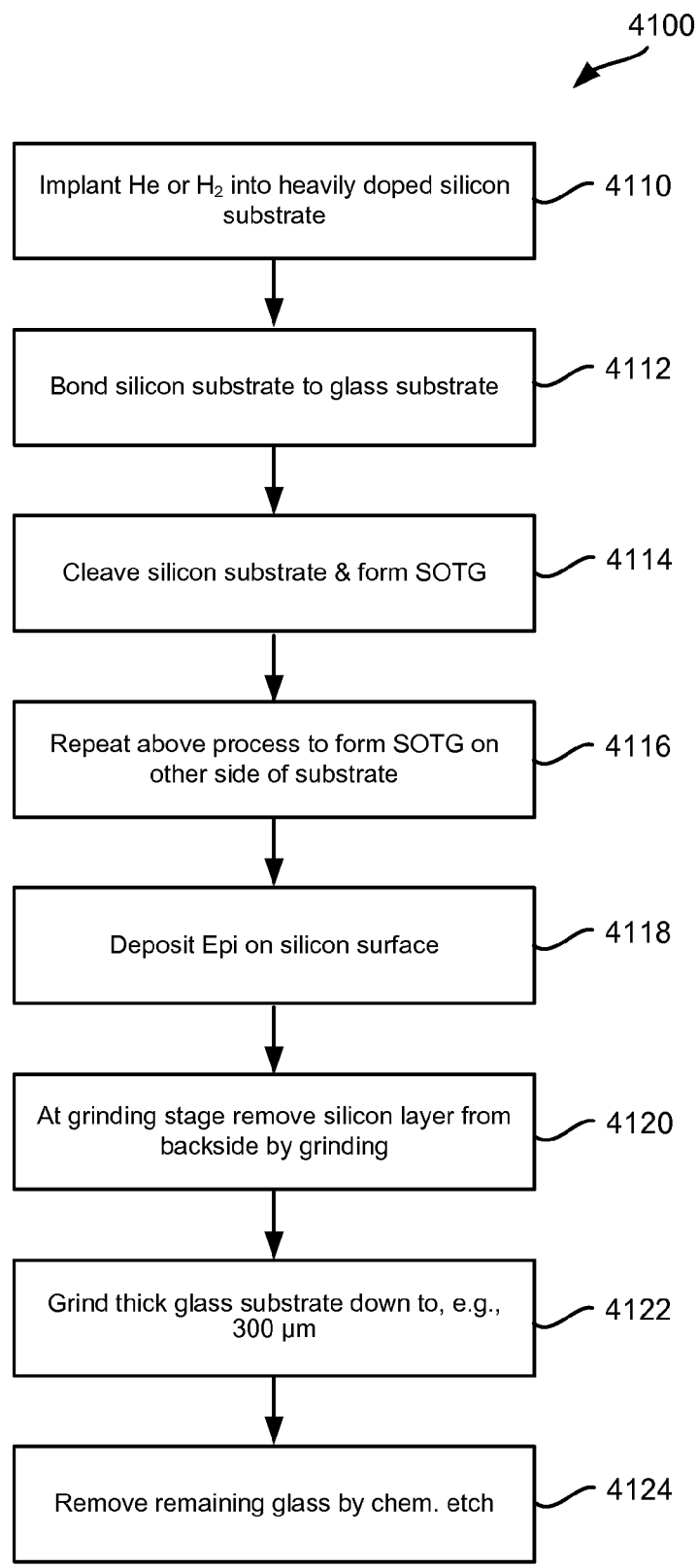
FIG. 41 shows an example of a process flow using a chemical process as the final thinning step.

An alternative embodiment achieves thinner wafers without the drawbacks of the conventional mechanical processes by performing the final thinning step using a chemical process. According to this embodiment, active devices are formed in silicon layers of a silicon-on-thick-glass (SOTG) substrate. At the grinding stage, the wafer can be thinned by chemically etching away glass at the backside of SOTG substrate. FIG. 41 sets out an exemplary process flow according to this embodiment. Starting from a silicon substrate, first at step 4110 a dopant such as, e.g., He or $H_2$ is implanted into the silicon substrate. Next, at 4112, the silicon substrate is bonded to a glass substrate. Different bonding processes can be used. In one example, a silicon wafer and a glass wafer are sandwiched and heated up to around, e.g., 400 C to bond the two substrates. The glass can be, e.g., silicon dioxide and the like, and may have a thickness of, for example, about 600 um. This is followed by an optional cleaving of the silicon substrate at 4114 and forming of the SOTG substrate. To protect the substrate from stress during handling and subsequent processing, the bonding process can be repeated to form SOTG layer on the other side of the substrate (step 4116). An epi layer is next deposited on the silicon surface of the substrate (step 4118). This can be performed on the backside in addition to the front side. The doping level of the backside epi is preferably similar to that of the backside silicon, while the front-side epi is doped as required by the device. The substrate is then subjected to the various steps in the fabrication process for forming the active device on the front-side silicon layers.

In one embodiment, to further enhance the substrate strength in withstanding stress introduced by front-side processing steps, the backside substrate can be patterned to approximate an inverse structure of the front-side die frame. In this way, the glass substrate is etched into a grid to help the thin substrate sustain the stress in the wafer. At grinding, first the silicon layer from the back side is removed by a conventional grinding process (step 4120). This is followed by another grinding step 4122 that removes a portion (e.g., half) of the glass. The remaining portion of the glass is then removed by a chemical etch process using, e.g., hydrofluoric acid. The etching of the backside glass can be performed without the risk of attacking or causing mechanical damage to active silicon layers. This eliminates the need for taping the wafer, which eliminates the need for tape and re-tape equipment and the process risks associate with each of those operations. Accordingly, this process allows for further minimizing substrate thickness to enhance device performance. It is to be understood that many variations of this improved wafer thinning process are possible. For example, depending on the desired thickness for the final substrate, the thinning step may or may not involve grinding and chemical etch may be sufficient. Also, the improved wafer thinning process is not limited to processing of discrete devices and can be utilized in the processing of other types of devices. Other wafer thinning processes are described in commonly-assigned U.S. Pat. No. 6,500,764, to Pritchett, which is hereby incorporated in its entirety.

There are a number of other structural and processing aspects of the power transistor and other power devices that can significantly impact their performance. The shape of the trench is one example. To reduce the potentially damaging electric fields that tend to concentrate around the corners of the trench, it is desirable to avoid sharp corners and instead form trenches that have rounded corners. To improve reliability, it is also desirable to have trench sidewalls with smooth surfaces. The different etch chemistries offer trade-offs among several responses, such as: silicon etch rate, selectivity to the mask layer, etch profile (sidewall angle), top corner rounding, sidewall roughness, and rounding of the trench bottom. A fluorinated chemistry, for example SF6, provides a high silicon etch rate (greater than 1.5 um/min), rounded trench bottoms, and a straight profile. The drawbacks of the fluorinated chemistry are rough sidewalls and difficulties with control of the top of the trench (can be re-entrant). A chlorinated chemistry, for example $Cl_2$, provides smoother sidewalls, and better control of the etch profile and the top of the trench. The trade-offs with the chlorinated chemistry are lower silicon etch rate (less than 1.0 um/min), and less rounding of the trench bottom.

Additional gases can be added to each chemistry to aid in passivating the sidewall during the etch. Sidewall passivation is used to minimize lateral etching, while etching to the desired trench depth. Additional processing steps can be used to smooth the trench sidewalls, and achieve rounding of the top corner and the bottom of the trench. The surface quality of trench sidewalls is important because it affects the quality of an oxide layer that can be grown on the trench sidewall. Regardless of the chemistry used, a breakthrough step is typically used before the main etch step. The purpose of the breakthrough step is to remove any native oxide on the surface of the silicon that may mask the etching of the silicon during the main etch step. Typical breakthrough etch chemistries involve $CF_4$ or $Cl_2$.

Figure 42A:
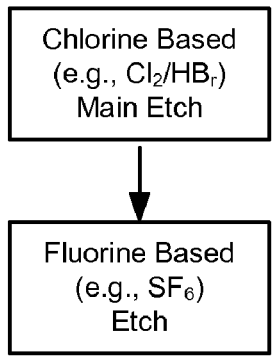
FIGS. 42A-42F show examples of improved etch processes.

One embodiment for an improved etch process shown in FIG. 42A employs a chlorine based main silicon trench etch followed by a fluorine based etch step. One example of this process employs $Cl_2$/HBr main etch step followed by an $SF_6$ etch step. The chlorinated step is used to etch the main trench to a portion of the desired depth. This defines the trench profile with some degree of taper, and with smooth sidewalls. The subsequent fluorinated step is used to etch the remainder of the trench depth, rounding the trench bottom, and providing further smoothing of any dangling silicon bonds on the trench sidewall. The fluorinated etch step is preferably performed at relatively low fluorine flow, low pressure, and low power to control the smoothing and the rounding. Due to the difference in etch rates between the two etch chemistries, the times of the two steps can be balanced to achieve a more reliable and manufacturable process with an acceptable overall etch time, while maintaining the desired trench profile, sidewall roughness, and trench bottom rounding.

Figure 42B:
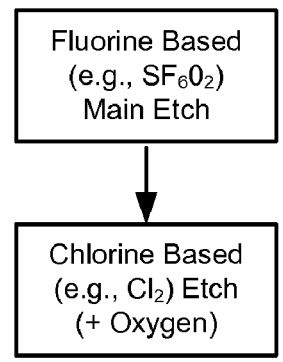

In another embodiment shown in FIG. 42B, an improved method for silicon etch includes a fluorine based main etch step followed by a chlorine based second etch step. One example of this process uses an $SF_6/O_2$ main etch followed by a $Cl_2$ step. The fluorine step is used to etch the main trench for the majority of the depth. This step produces a trench with a straight sidewall and with a rounded trench bottom. Optionally, oxygen could be added to this step to provide sidewall passivation, and to aid in maintaining a straight sidewall by reducing lateral etching. A chlorine follow-up step rounds the top corners of the trench and reduces the roughness of the sidewall. The high silicon etch rate of the fluorine step increases the manufacturability of the process by increasing the throughput of the etch system.

Figure 42C:
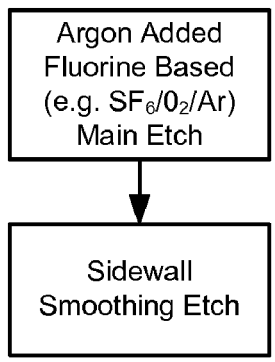

In yet another embodiment, shown in FIG. 42C, an improved silicon etch process is obtained by adding argon to a fluorine based chemistry. An example of a chemistry used for the main etch step according to this embodiment is $SF_6/O_2/Ar$. The addition of argon to the etch step increases ion bombardment and therefore makes the etch more physical. This helps with controlling the top of the trench, and eliminates the tendency for the top of the trench to be re-entrant. The addition of argon may also increase the rounding of the trench bottom. An additional etch process may be needed for sidewall smoothing.

Figure 42D:
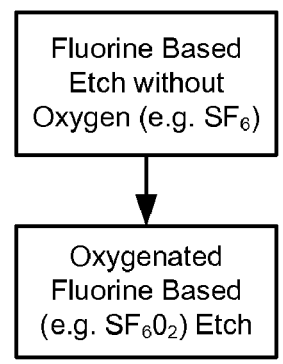

An alternative embodiment for an improved silicon etch process uses a fluorine based chemistry with oxygen removed from the start of the main etch step, as shown in FIG. 42D. One example of this process uses an $SF_6$ step followed by an $SF_6/O_2$ step. In the first phase of the etch there is a lack of sidewall passivation due to the absence of $O_2$. This results in an increase in the amount of lateral etching at the top of the trench. Then the second etch step, $SF_6/O_2$, continues etching the remainder of the trench depth with a straight profile, and a rounded trench bottom. This results in a trench structure that is wider at the top, sometimes referred to as a T-trench. Examples of devices utilizing a T-trench structure are described in detail in commonly-assigned U.S. patent application Ser. No. 10/442,670, entitled "Structure and Method for Forming a Trench MOSFET Having Self-Aligned Features," by Robert Herrick, hereby incorporated by reference in its entirety. The time periods for the two main etch steps can be adjusted to achieve the desired depth for each portion of the T-Trench (top T portion, bottom straight sidewall portion). Additional processing could be used to round off the top corner of the T-Trench and smooth the trench sidewalls. These additional processing methods could include, for example: (1) a fluorine-based step at the end of the trench etch recipe, or (2) a separate fluorine-based etch on a separate etch system, or (3) a sacrificial oxide, or any other combination. A chemical mechanical planarization (CMP) step could be used to remove the top re-entrant portion of the trench profile. An $H_2$ anneal can also be used to assist in rounding and making favorable slope trench profile.

For high voltage applications where trenches tend to be deeper, there are additional considerations. For example, due to the deeper trenches the silicon etch rate is important to produce a manufacturable process. The etch chemistry for this application is typically a fluorinated chemistry, because a chlorinated etch chemistry is too slow. Also a straight-to-tapered trench profile is desired, with smooth sidewalls. Due to the depth of the trench, the etch process needs to also have excellent selectivity to the mask layer. If the selectivity is poor then a thicker mask layer is required, which increases the overall aspect ratio of the feature. Sidewall passivation is also very critical; a fine balance needs to be achieved. Too much sidewall passivation will cause the bottom of the trench to narrow to the point where it closes; too little sidewall passivation will result in the increased lateral etching.

Figure 42E:
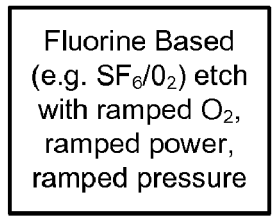

In one embodiment, a deep trench etch process is provided that optimally balances all of these requirements. According to this embodiment, shown in FIG. 42E, the etch process includes a fluorine-based chemistry with ramped $O_2$, ramped power, and/or ramped pressure. One exemplary embodiment uses a $SF_6/O_2$ etch step in a manner that maintains etch profile and silicon etch rate throughout the etch. By ramping the $O_2$, the amount of sidewall passivation can be controlled throughout the etch to avoid increased lateral etching (in case of too little passivation) or pinching off of the bottom of the trench (in case of too much passivation). Examples of using fluorine based etch with ramping oxygen gas flows are described in detail in commonly owned U.S. Pat. No. 6,680,232, entitled "Integrated Circuit Trench Etch with Incremental Oxygen Flow," by Grebs et al., which is hereby incorporated by reference. Ramping of the power and the pressure will aid in controlling the ion flux density and in maintaining the silicon etch rate. If the silicon etch rate decreases significantly during the etch as the trench is etched deeper, the total etch time will increase. This will result in a low wafer throughput for the process on the etcher. Also, ramping the $O_2$ may help in controlling the selectivity to the masking material. An exemplary process according to this embodiment for trenches that are deeper than, e.g., 10 μm, may have an $O_2$ flow rate of 3 to 5 sccm per minute, at a power level of 10-20 watts per minute and pressure level of 2-3 mT per minute.

An alternative embodiment of a deep trench etch process uses a more aggressive fluorine based chemistry such as $NF_3$. Since $NF_3$ is more reactive than $SF_6$ for silicon etching, an increased silicon etch rate could be achieved with an NF3 process. Additional gases may need to be added for sidewall passivation and profile control.

Figure 42F:
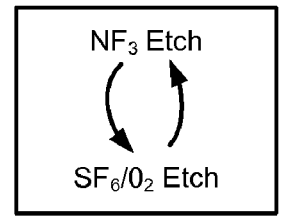

In another embodiment, an $NF_3$ etch step is followed by an $SF_6/O_2$ process. According to this embodiment, the $NF_3$ step is used to etch the majority of the trench depth with a high silicon etch rate. Then the $SF_6/O_2$ etch step is used to passivate the existing trench sidewall, and etch the remaining portion of the trench depth. In a variation of this embodiment shown in FIG. 42F, $NF_3$ and $SF_6/O_2$ etch steps are performed in an alternating fashion. This yields a process with a higher silicon etch rate than a straight $SF_6/O_2$ process. It balances between a fast etch rate step ($NF_3$), and a step that generates sidewall passivation ($SF_6/O_2$) for profile control. The balance of the steps controls the sidewall roughness. There may also be a need to ramp the $O_2$, power, and pressure for the $SF_6/O_2$ portion of the etch to maintain the silicon etch rate, and to generate enough sidewall passivation to aid in controlling the etch profile. Those skilled in the art will appreciate that the various process steps described in connection with the above embodiments can be combined in different ways to achieve optimum trench etch processing. It is to be understood that these trench etch processes can be employed for any of the trenches in any of the power devices described herein, as well as for any other type of trench used in other types of integrated circuits.

Figure 43A:
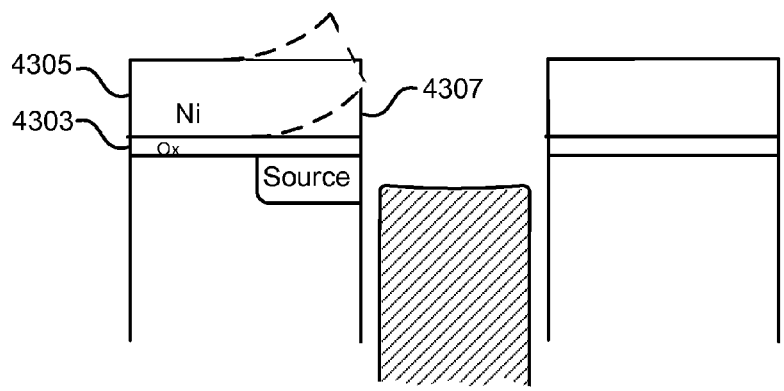
FIGS. 43A and 43B show embodiments of a trench etch process that eliminates the bird's beak problem.
Figure 43B:
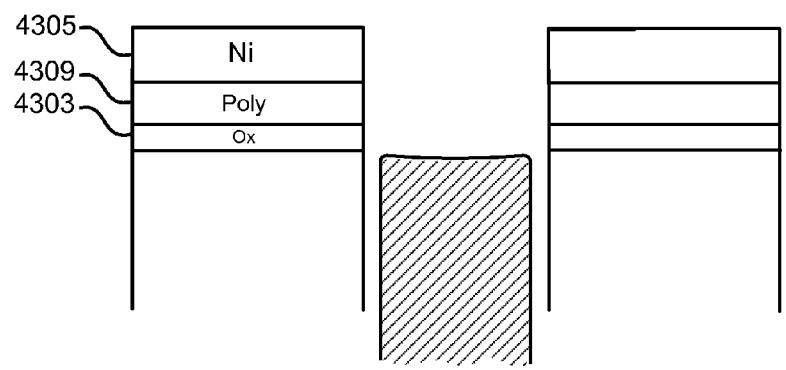
Figure 44A:
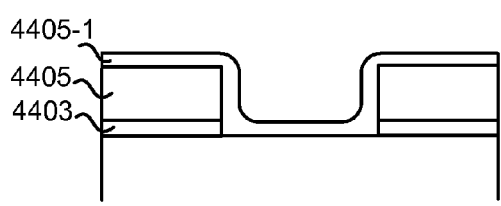
FIGS. 44A and 44B show alternative etch processes.
Figure 44B:
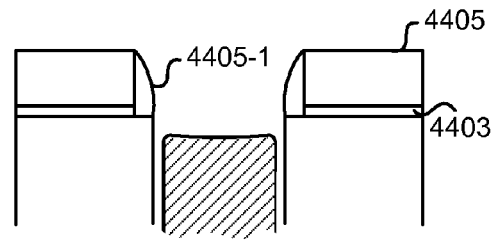

Prior to the trench etch process, a trench etch mask is formed on the surface of the silicon and is patterned to expose areas to be trenched. As shown in FIG. 43A, in a typical device the trench etch first etches through a layer of nitride 4305 and another thin layer of pad oxide 4303 before it etches the silicon substrate. After the trench is formed during the formation of an oxide layer in the trench, pad oxide 4303 can also grow at the edge of the trench lifting the overlying nitride layer. This results in what is commonly referred to as a "bird's beak" structure 4307 as the pad oxide grows locally near the trench edge under nitride layer 4305. The source region that will be subsequently formed next to the trench edge under the pad oxide with the bird's beak structure will be shallower near the trench. This is highly undesirable. To eliminate the bird's beak effect, in one embodiment, shown in FIG. 43B, a layer of non-oxidizing material such as polysilicon 4309 is sandwiched between nitride layer 4305 and pad oxide 4303. Poly layer 4309 prevents pad oxide 4303 from further oxidation during subsequent trench oxide formation. In another embodiment, shown in FIG. 44A, after etching through nitride layer 4405 and pad oxide 4403 defining the trench opening, a thin layer of non-oxidizing material 4405-1 such as nitride is formed on the surface structure. Protective layer 4405-1 is then removed from the horizontal surfaces leaving spacers along the vertical edges of the nitride-pad oxide structure as shown in FIG. 44B. The nitride spacers protect pad oxide 4403 from further oxidation during subsequent steps reducing the bird's beak effect. In an alternative embodiment, to reduce the degree of any bird's beak formation both embodiments shown in FIGS. 43B and 44B can be combined. That is, a layer of polysilicon can be sandwiched between pad oxide and the overlying nitride in addition to the spacers that result from the process described in connection with FIGS. 44A and 44B. Other variations are possible, including, for example, adding another layer (e.g., oxide) on top of the nitride to aid in the nitride selectivity while etching silicon trenches.

Figure 45A:
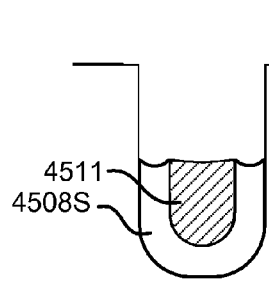
FIG. 45A-45C show a process of forming an improved inter-poly dielectric layer.

As described above in connection with various transistors with shielded gate structures, a layer of dielectric material isolates the shield electrode from the gate electrode. This inter-electrode dielectric layer that is sometimes referred to as the inter-poly dielectric or IPD must be formed in a robust and reliable fashion so that it can withstand the potential difference that may exist between the shield electrode and the gate electrode. Referring back to FIGS. 31E, 31F and 31G, there is shown a simplified flow for the relevant process steps. After the etch back of shield poly 3111 inside the trench (FIG. 31E), shield dielectric layer 3108 is etched back to the same level as shield poly 3111 (FIG. 31F). Gate dielectric layer 3108a is then formed on the top surface of the silicon as shown in FIG. 31G. It is this step that forms the IPD layer. An artifact of the shield dielectric recess etch is the formation of shallow troughs on the top surface of the shield dielectric remaining on either sides of the shield electrode. This is shown in FIG. 45A. The resulting structure with the uneven topography can cause conformality problems, especially with subsequent filling steps. In order to eliminate such problems, various improved methods for forming the IPD are presented.

Figure 45B:
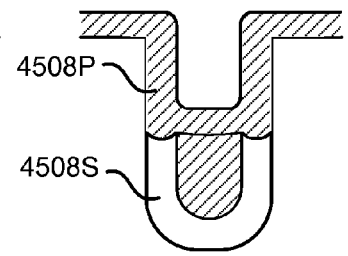
Figure 45C:
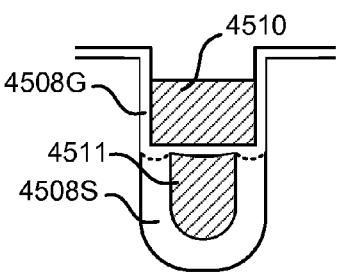

According to one embodiment, after the shield dielectric recess etch, a polycrystalline silicon (poly) liner 4508P is deposited as shown in FIG. 45B using, for example, a low pressure chemical vapor deposition (LPCVD) process. Alternatively, poly liner 4508P can be formed only over the shield poly and shield dielectric and leaving trench sidewalls substantially free of poly by using a selective growth process for poly or collimated sputtering of poly. Poly liner 4508P is subsequently oxidized converting it into silicon dioxide. This can be performed by a conventional thermal oxidation process. In the embodiment where no poly is formed on the trench sidewalls, this oxidation process also forms gate dielectric layer 4508G. Otherwise, after etching the oxidized poly layer from the sidewalls of the trench, a thin layer of gate dielectric 4508G is formed and the remaining trench cavity is filled with gate electrode 4510 as shown in FIG. 45C. An advantage of this process is that poly deposits in a very conformal fashion. This minimizes voids and other defects and creates a more even surface once poly is deposited on top of the shield dielectric and shield electrode. The result is an improved IPD layer that is more robust and reliable. By lining the trench sidewalls and the adjacent silicon surface areas with polysilicon prior to oxidation, a subsequent oxidation step causes less mesa consumption and minimizes undesirable widening of the trench.

Figure 46A:
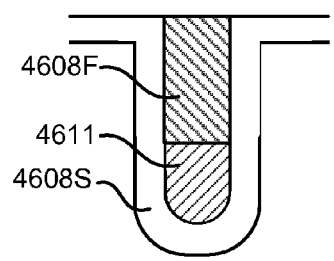
FIGS. 46A, 46B and 46C illustrate an alternate method of forming an IPD layer.
Figure 46B:
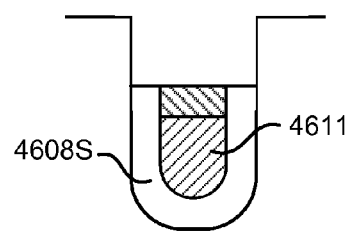
Figure 46C:
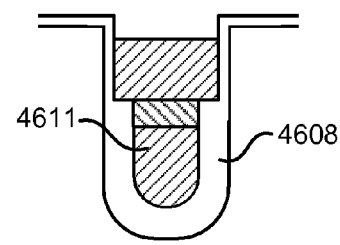

In an alternative embodiment, simplified cross-sectional views of which are shown in FIGS. 46A, 46B and 46C, the cavity inside the trench resulting from the shield poly recess etch is filled with a dielectric fill material 4608F having similar etch rate as the etch rate of shield dielectric 4608S. This step may be carried out using any one of high density plasma (HDP) oxide deposition, chemical vapor deposition (CVD) or spin-on glass (SOG) processes, followed by a planarization step to obtain a planar surface at the top of the trench. Dielectric fill material 4608F and shield dielectric material 4608S are then uniformly etched back such that a layer of insulating material having the requisite thickness remains over shield electrode 4611 as shown in FIG. 46B. The trench sidewalls are then lined with gate dielectric after which the remaining trench cavity is filled with gate electrode as shown in FIG. 46C. The result is a highly conformal IPD layer that is free of topographical non-uniformities.

Figure 47A:
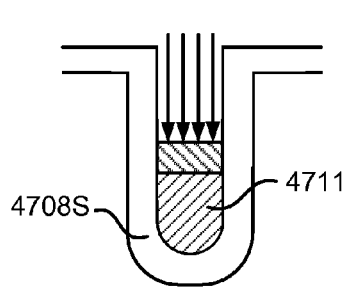
FIGS. 47A and 47B are cross-sectional views of yet another method of forming a high quality inter-poly dielectric layer.
Figure 47B:
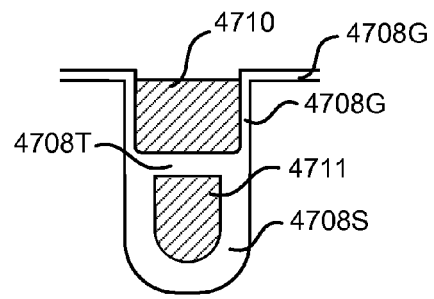

An exemplary embodiment for another method of forming high quality IPD is shown in the simplified cross-sectional views of FIGS. 47A and 47B. After the formation of shield dielectric layer 4708S inside the trench and filling the cavity with shield poly 4711, a shield poly etch back step is performed to recess the shield poly inside the trench. In this embodiment, the shield poly recess etch leaves more poly in the trench such that the top surface of the recessed shield poly is higher than the final target depth. The thickness of the extra poly on the top surface of the shield poly is designed to be approximately the same as the target IPD thickness. This upper portion of the shield electrode is then physically or chemically altered to further enhance its oxidation rate. A method to chemically or physically alter the electrode can be performed by ion implanting impurities such as fluorine or argon ions into the polysilicon to enhance the oxidation rate of the shield electrode, respectively. The implant is preferably performed at zero degrees, i.e., perpendicular to the shield electrode as shown in FIG. 47A, so as not to physically or chemically alter the trench sidewalls. Next, shield dielectric 4708S is etched to remove the dielectric from the trench sidewalls. This shield dielectric recess etch causes a slight recess in the remaining shield dielectric adjacent shield electrode 4711 (similar to that shown in FIG. 45A). This is followed by a conventional oxidation step whereby the altered top portion of shield poly 4711 oxidizes at a faster rate than the sidewalls of the trench. This results in the formation of a substantially thicker insulator 4708T over the shield electrode than along the sidewalls of the trench silicon surface. The thicker insulator 4708T over the shield electrode forms the IPD. The altered poly oxidizes in the lateral direction as well compensating for some of the trough formed in the top surface of the shield dielectric as a result of the shield dielectric recess etch. Conventional steps are then carried out to form the gate electrode in the trench resulting in the structure shown in FIG. 47B. In one embodiment, the shield electrode is altered to obtain an IPD-to-gate oxide thickness ratio in the range of 2-to-1 to 5-to-1. As an example, if a 4-to-1 ratio is selected, for about 2000 Å of IPD formed over the shield electrode, about 500 Å of gate oxide is formed along the trench sidewalls.

In an alternative embodiment, the physical or chemical alternation step is carried out after a shield dielectric recess etch. That is, shield oxide 4708S is etched to remove the oxide from the trench sidewalls. This exposes the upper portion of the shield electrode and the silicon to a physical or chemical alteration method as described above. With the trench sidewalls exposed, the alteration step is confined to horizontal surfaces, i.e. silicon mesa and shield electrode only. The alteration method, such as ion implanting of dopants, would be performed at zero degrees (perpendicular to the shield electrode) so as not to physically or chemically alter the trench sidewall. Conventional steps are then carried out to form the gate electrode in the trench thus resulting in a thicker dielectric over the shield electrode.

Figure 48:
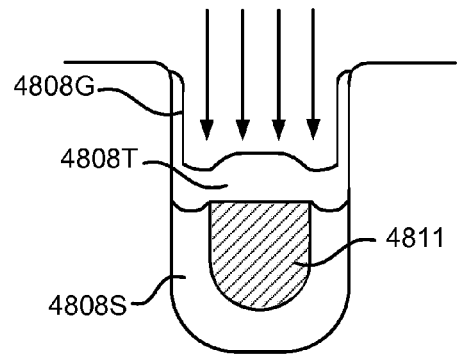
FIGS. 48 and 49A-49D show other embodiments for formation of an improved IPD layer.

Yet another embodiment for forming an improved IPD layer is shown in FIG. 48. According to this embodiment, a thick insulator layer 4808T made of, e.g., oxide, is formed over the recessed shield oxide 4808S and shield electrode 4811. Thick insulator 4808T is preferentially formed (i.e., "bottom up fill") using such directional deposition techniques as high density plasma (HDP) deposition or plasma-enhanced chemical vapor deposition (PECVD). Directional deposition results in the formation of a substantially thicker insulator along the horizontal surfaces (i.e., over the shield electrode and the shield oxide) than along the vertical surfaces (i.e., along the trench sidewalls) as shown in FIG. 48. An etch step is then performed to remove the oxide off the sidewalls, while leaving sufficient oxide over the shield polysilicon. Conventional steps are then carried out to form the gate electrode in the trench. An advantage of this embodiment, other than obtaining a conformal IPD, is that mesa consumption and trench widening is prevented because the IPD is formed through a deposition process rather than an oxidation process. Another benefit of this technique is the rounding obtained at the top corners of the trench.

Figure 49A:
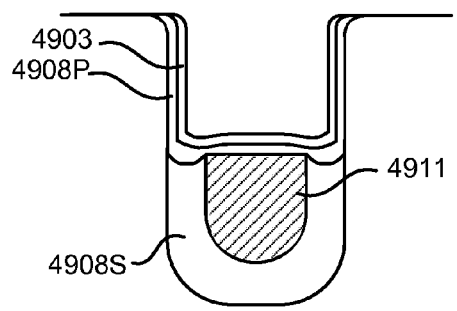
Figure 49B:
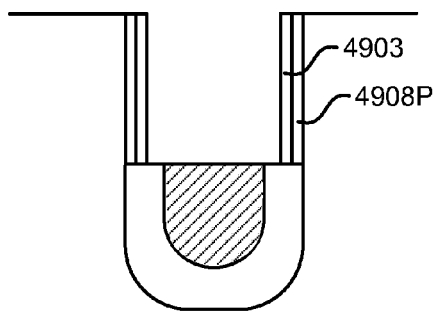
Figure 49C:
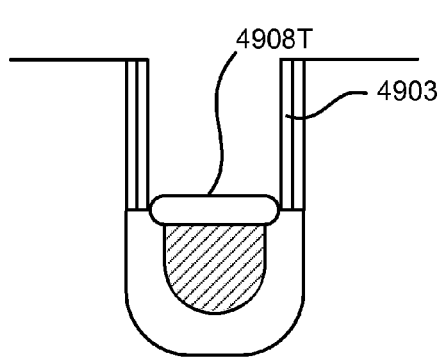
Figure 49D:
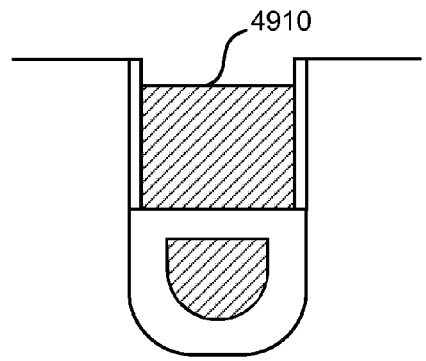

In another embodiment, after the shield dielectric and shield poly recess a thin layer of screen oxide 4908P is grown inside the trench. Then, a layer of silicon nitride 4903 is deposited to cover screen oxide 4908P as shown in FIG. 49A. Silicon nitride layer 4903 is then anisotropically etched such that it is removed from the bottom surface of the trench (i.e., above shield poly) but not from the trench sidewalls. The resulting structure is shown in FIG. 49B. The wafer is then exposed to an oxidizing ambient, causing a thick oxide 4908T to form on the shield polysilicon surface as shown in FIG. 49C. Since nitride layer 4903 is resistant to oxidation, no significant oxide growth occurs along the trench sidewalls. Nitride layer 4903 is then removed by wet etching, using for example hot phosphoric acid. Conventional process steps follow to form the gate oxide and gate dielectric, as shown in FIG. 49D.

In some embodiments the formation of the IPD layer involves an etch process. For example, for embodiments where the IPD film is deposited over topography a film layer much thicker than the desired final IPD thickness may be deposited first. This is done to get a planar film layer to minimize the dishing of the starting layer into the trenches. The thicker film, which may completely fill the trench and extend over the silicon surface, is then etched to reduce its thickness to the target IPD layer thickness. According to one embodiment, this IPD etch process is performed in at least two etch steps. The first step is intended to planarize the film back to the silicon surface. In this step the uniformity of the etch is important. The second step is intended to recess the IPD layer to the desired depth (and thickness) within the trench. In this second step, the etch selectivity of the IPD film to silicon is important. During the recess etch step the silicon mesa is exposed, as well as the silicon trench sidewall as the IPD layer is recessed into the trench. Any loss of silicon on the mesa affects the actual trench depth and, if a T-trench is involved, the depth of the T is also affected.

In one exemplary embodiment shown in FIG. 50A, an anisotropic plasma etch step 5002 is used to planarize the IPD film down to the surface of the silicon. An exemplary etch rate for the plasma etch may be 5000 A/min. This is followed by an isotropic wet etch 5004 to recess the IPD into the trench. The wet etch is preferably performed using a controlled solution selective to silicon so as not to attack the silicon sidewall when exposed and to provide a repeatable etch to obtain a specific recess depth. An exemplary chemistry for the wet etch may be 6:1 buffered oxide etch (BOE) which produces an etch rate of about 1100 A/min at 25C. Commonly-assigned U.S. Pat. No. 6,465,325 to Rodney Ridley, which is hereby incorporated by reference in its entirety, provides details for exemplary plasma and wet etch recipes suitable for this process. The first plasma etch step for planarization results in less dishing of the IPD layer over the trenches than would a wet etch. The second wet etch step for the recess etch results in better selectivity to silicon and less damage to the silicon than would occur with a plasma etch. In an alternative embodiment shown in FIG. 50B, a chemical mechanical planarization (CMP) process is used to planarize the IPD film down to the silicon surface. This is followed by a wet etch to recess the IPD into the trench. The CMP process results in less dishing of the IPD layer over the trenches. The wet etch step for the recess etch results in better selectivity to silicon and less damage to the silicon that would occur with CMP. Other combinations of these processes are also possible.

Formation of a high quality insulating layer is desirable in structures other than the IPD, including the trench and planar gate dielectric, inter-layer dielectric and the like. The most commonly used dielectric material is silicon dioxide. There are several parameters that define a high quality oxide film. The primary attributes are uniform thickness, good integrity (low interface trap density), high electric field breakdown strength, and low leakage levels, among others. One of the factors that impacts many of these attributes is the rate at which the oxide is grown. It is desirable to be able to accurately control the growth rate of the oxide. During thermal oxidation, there is a gas phase reaction with charged particles on the wafer surface. In one embodiment, a method for controlling oxidation rate is implemented by influencing the charge particles, typically silicon and oxygen, by the application of an external potential to the wafer to either increase or decrease the rate of oxidation. This differs from the plasma enhanced oxidation in that no plasma (with reactive species) is created above the wafer. Also, according to this embodiment the gas is not accelerated toward the surface; it is merely prevented from reacting with the surface. In an exemplary embodiment, a reactive ion etch (RIE) chamber with high temperature capability can be used to regulate the level of energy needed. The RIE chamber is used not for etching, but for applying a DC bias to control the energy needed to slow and stop oxidation. FIG. 51 is a flow diagram for an exemplary method according to this embodiment. Initially, the RIE chamber is used to apply a DC bias to the wafer in a test environment (5100). After determining the potential energy needed to inhibit the surface reaction (5200), an external bias is applied that is large enough to prevent oxidation from occurring (5120). Then, by manipulating the external bias, such as pulsing or other methods, the rate of oxidation at even extremely high temperatures can be controlled (5130). This method allows for obtaining the benefits of high temperature oxidation (better oxide flow, lower stress, elimination of differential growth on various crystal orientations, etc.) without the drawback of rapid and non-uniform growth.

While techniques such as those described above in connection with FIG. 51 can improve the quality of the resulting oxide layer, oxide reliability remains a concern especially in trench-gated devices. One of the main degradation mechanisms is due to high electric fields at the trench corners, which results from localized thinning of the gate oxide at these points. This leads to high gate leakage currents and low gate oxide breakdown voltage. This effect is expected to become more severe as trench devices are further scaled to reduce on-resistance, and as reduced gate voltage requirements lead to thinner gate oxides.

In one embodiment, concerns with gate oxide reliability are alleviated by using dielectric materials with higher dielectric constant (high-K dielectrics) than silicon-dioxide. This allows equivalent threshold voltage and transconductance with a much thicker dielectric. According to this embodiment, the high-K dielectric reduces gate leakage and increases the gate dielectric breakdown voltage, without degradation of the device on-resistance or drain breakdown voltage. High-K materials that exhibit the required thermal stability and suitable interface-state densities to be integrated into trench-gated and other power devices include $Al_2O_3$, $HfO_2$, $Al_xHf_yO_z$, $TiO_2$, $ZrO_2$ and the like.

As discussed above, to improve the switching speed of a trench gated power MOSFET it is desirable to minimize the transistor gate-to-drain capacitance $C_{gd}$. Using a thicker dielectric layer at the bottom of the trench as compared to the trench sidewalls is one of several methods described above for reducing $C_{gd}$. One method for forming a thick bottom oxide layer involves the formation of a thin layer of screen oxide along the sidewalls and the bottom of the trench. The thin oxide layer is then covered by a layer of oxidization-inhibiting material such as nitride. The nitride layer is then etched anisotropically, such that all the nitride is removed from the horizontal bottom surface of the trench but the trench sidewalls remain coated by the nitride layer. After the removal of the nitride from the bottom of the trench, an oxide layer having the desirable thickness is formed at the bottom of the trench. Thereafter, a thinner channel oxide layer is formed after the removal of the nitride and screen oxide from the trench sidewalls. This method for forming a thick bottom oxide and variations thereof are described in greater detail in commonly-assigned U.S. Pat. No. 6,437,386, to Hurst et al., which is hereby incorporated in its entirety. Other methods of forming a thick oxide at the bottom of a trench involving selective oxide deposition are described in commonly-owned U.S. Pat. No. 6,444,528 to Murphy, which is hereby incorporated in its entirety.

Figure 52:
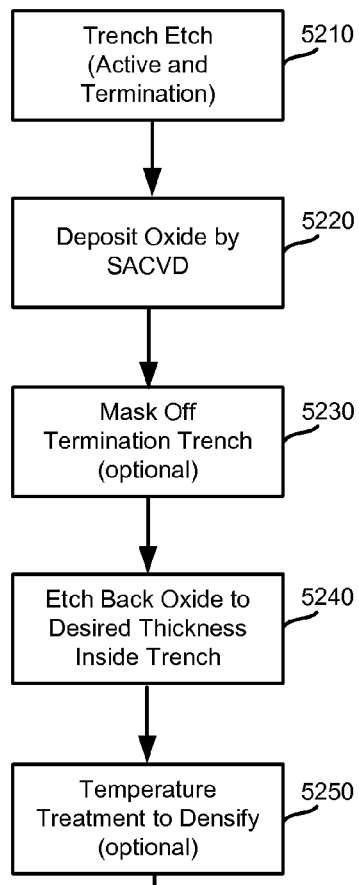
FIG. 52 shows an improved method for forming thick oxide at the bottom of a trench using a sub-atmospheric chemical vapor deposition process.

In one embodiment, an improved method of forming thick oxide at the bottom of a trench uses a sub-atmospheric chemical vapor deposition (SACVD) process. According to this method, an exemplary flow diagram for which is shown in FIG. 52, after etching the trench (5210), SACVD is used to deposit a highly conformal oxide film (5220), using for example thermal Tetraethoxyorthsilane (TEOS) that fills the trench without voids in the oxide. The SACVD step can be carried out at sub-atmospheric pressures ranging from 100 Torr to 700 Torr, and at an exemplary temperature in the range from about 450° C. to about 600° C. The TEOS (in mg/min) to Ozone (in $cm^3$/min) ratio can be set between the range of, for example, 2 to 3, preferably about 2.4. Using this process, an oxide film having a thickness anywhere from about 2000 Å to 10,000 Å or greater can be formed. It is to be understood that these numbers are for illustrative purposes only and may vary depending on the specific process requirements and other factors such as the atmospheric pressure of the location of the fabrication facility. The optimal temperature may be obtained by balancing the rate of deposition with the quality of the resulting oxide layer. At higher temperatures the deposition rate slows down which may reduce film shrinkage. Such film shrinkage can cause a gap to form in the oxide film in the center of the trench along the seam.

After the oxide film is deposited, it is etched back from the silicon surface and inside the trench to leave a relatively flat layer of oxide with the desired thickness at the bottom of the trench (5240). This etch can be preformed by a wet etch process, or a combination of wet and dry etch processes, using for example, diluted HF. Because the SACVD-formed oxide tends to be porous it absorbs ambient moisture after deposition. In a preferred embodiment, a densification step 5250 is performed following the etch-back step to ameliorate this effect. Densification can be performed by temperature treatment at, for example, 1000° C. for about 20 minutes.

An added benefit to this method is the ability to mask off (step 5230) an end trench during the etch-back step of the SACVD oxide, leaving an oxide-filled termination trench. That is, for the various embodiments of termination structures described above that include a dielectric-filled trench, the same SACVD step can be used to fill the termination trench with oxide. Also, by masking the field termination region during etch-back, the same SACVD process step can result in the formation of field oxide in the termination region, eliminating otherwise required process steps to form thermal field oxide. Furthermore, this process provides additional flexibility as it allows a complete reworking of both the termination dielectric layer and the thick bottom oxide in case it is etched too far since silicon is not consumed by thermal oxidation process but instead provided in both locations during the SACVD deposition.

Figure 53:
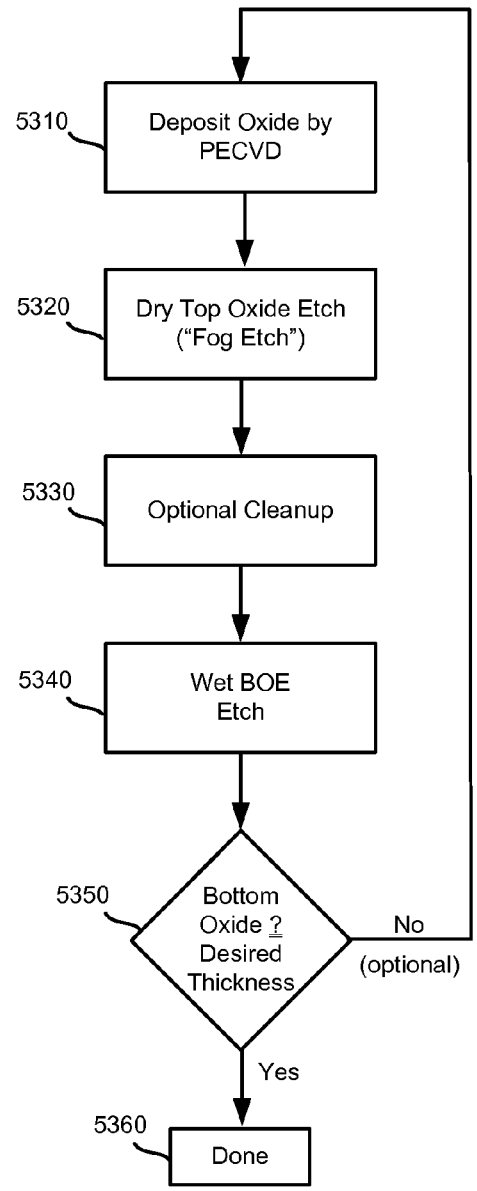
FIG. 53 is an exemplary flow diagram of a method for forming thick oxide at the bottom of a trench using a directional Tetraethoxyorthsilicate process.

In another embodiment, another method for forming thick oxide at the bottom of the trench uses a directional TEOS process. According to this embodiment, an exemplary flow diagram for which is shown in FIG. 53, the conformal properties of TEOS are combined with the directional nature of plasma enhanced chemical vapor deposition (PECVD) to selectively deposit oxide (5310). This combination enables a higher deposition rate on horizontal surfaces than vertical surfaces. For example, an oxide film deposited using this process may have a thickness of about 2500 Å at the bottom of the trench and an average thickness of about 800 Å on the trench sidewalls. The oxide is then isotropically etched until all the oxide from the sidewalls is removed, leaving a layer of oxide at the bottom of the trench. The etch process may include a dry top oxide etch step 5320 followed by a wet buffered oxide etch (BOE) step 5340. For the exemplary embodiment described herein, after the etch there remains a layer of oxide at the bottom of the trench having a thickness of, e.g., 1250 Å with all sidewall oxide removed.

In a specific embodiment, a dry top oxide etch is employed that concentrates on the top surface of the structure, etching the oxide off the top area at an accelerated rate while etching the oxide in the bottom of the trench at a much reduced rate. This type of etch, referred to herein as "fog etch" involves a careful balancing of the etch conditions and etch chemistry to yield the desired selectivity. In one example, this etch is performed at a relatively low power and low pressure using a plasma etcher with a top power source such as the LAM 4400. Exemplary values for the power and pressure may be anywhere in the range of 200-500 Watts and 250-500 mTorr, respectively. Different etch chemistries can be used. In one embodiment, a combination of a fluorine chemistry, e.g., C2F6, and chlorine, mixed at an optimal ratio of, for example, about 5:1 (e.g., C2F6 at 190 sccm and Cl at 40 sccm), yields the desired selectivity. Using chlorine as part of oxide etch chemistry is unusual because chlorine is more commonly used for etching metal or polysilicon and it normally inhibits etching of oxide. However, for purposes of this type of selective etch, this combination works well because the C2F6 aggressively etches the oxide near the top surface where the higher energy allows the C2F6 to overcome the impact of the chlorine, while closer to the trench bottom chlorine slows down the etch rate. This primary dry etch step 5320 maybe followed by a cleanup etch 5330 prior to the BOE dip 5340. It is to be understood that according to this embodiment, the optimal selectivity is achieved by fine tuning the pressure, energy, and etch chemistry which may vary depending on the plasma etch machine.

The PECVD/etch process according to this embodiment, can be repeated one or more times if desired to obtain a bottom oxide with the target thickness. This process also results in the formation of thick oxide on the horizontal mesa surface between trenches. This oxide can be etched after polysilicon is deposited in the trenches and etched back on the surface, so that the trench bottom oxide is protected from the subsequent etch step.

Figure 54:
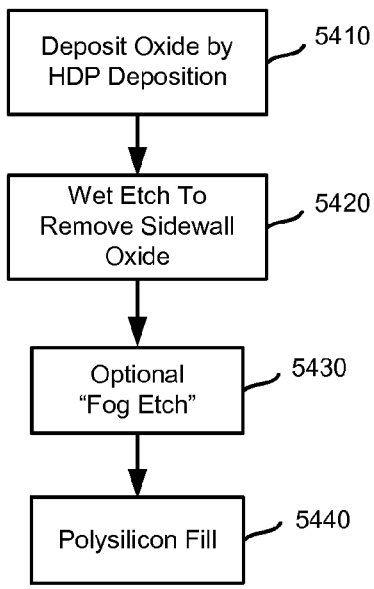
FIGS. 54 and 55 show another embodiment for forming thick bottom oxide.
Figure 55:
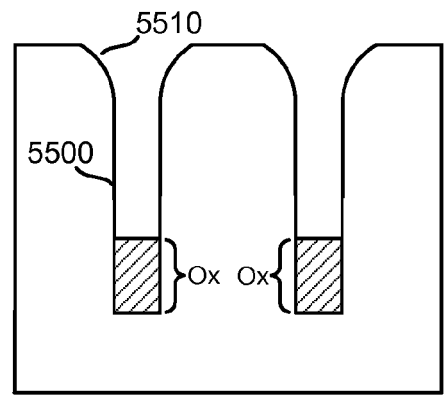

Other methods for selectively forming thick oxide at the bottom of the trench are possible. FIG. 54 shows a flow diagram for one exemplary method that uses high density plasma (HDP) deposition to keep oxide from building up on the trench sidewalls (5410). A property of the HDP deposition is that it etches as it deposits, resulting in less of an oxide buildup on the trench sidewalls relative to the oxide on the trench bottom, as compared to the directional TEOS method. A wet etch (step 5420) can then be employed to remove some or clear the oxide from the sidewalls, while leaving a thick oxide on the trench bottom. An advantage of this process is that the profile at the top of the trench slopes away (5510) from the trench (5500) as shown in FIG. 55, making void-free poly fill easier to achieve. A "fog etch" (step 5430) as described above can be employed to etch some oxide off the top before poly fill (step 5440) so that less oxide would need to be etched from the top after poly etch. The HDP deposition process can also be used to deposit oxide between two poly layers in a trench with buried electrodes (e.g., trench MOSFETs with shielded gate structures).

Figure 56:
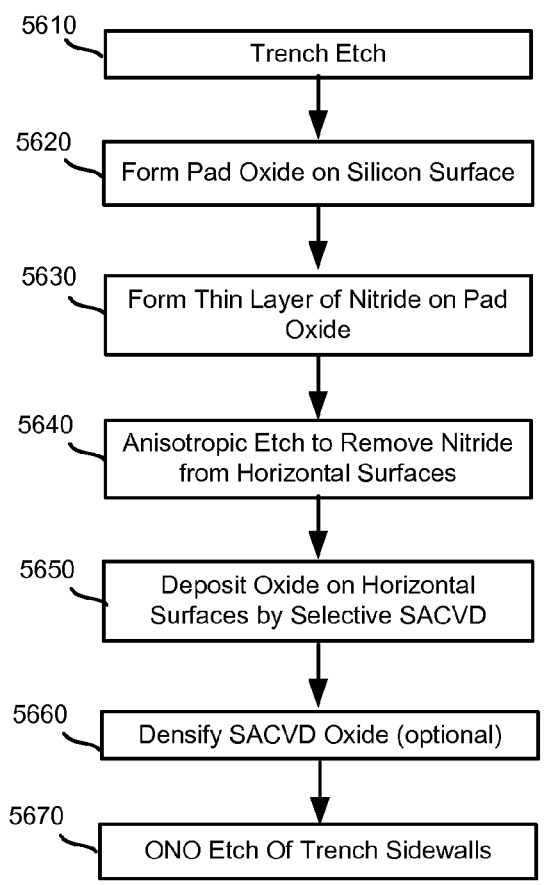
FIGS. 56-59 show another process for forming a thick dielectric layer at the bottom of a trench.

According to yet another method shown in FIG. 56, a selective SACVD process is used to form a thick oxide on the trench bottom. This method makes use of the ability of SACVD to become selective at a lower TEOS:Ozone ratio. Oxide has an extremely slow deposition rate on silicon nitride but deposits readily on silicon. The lower the ratio of TEOS to Ozone, the more selective the deposition becomes. According to this method, after etching the trenches (5610), pad oxide is grown on the silicon surface of the trench array (5620). A thin layer of nitride is then deposited on the pad oxide (5630). This is followed by an anisotropic etch to remove the nitride from horizontal surfaces leaving nitride on the trench sidewalls (5640). Selective SACVD oxide is then deposited (5650) on horizontal surfaces including the trench bottom at a TEOS:Ozone ratio of, for example, about 0.6, at about 405° C. The SACVD oxide is then optionally densified by temperature treatment (5660). An oxide-nitride-oxide (ONO) etch is then performed to clear nitride and oxide on the sidewalls of the trench (5670).

As discussed previously, one reason for the use of a thicker oxide layer at the bottom of the gate trench as compared to its sidewalls is to reduce Qgd or gate-to-drain charge which improves switching speed. The same reason dictates that the depth of the trench be about the same as the depth of the well junction to minimize trench overlap into the drift region. In one embodiment, a method for forming a thicker dielectric layer at the bottom of a trench extends the thicker dielectric layer up the sides of the trench. This makes the thickness of the bottom oxide independent of the trench depth and the well junction depth, and allows the trench and the poly inside the trench to be deeper than the well junction without appreciably increasing Qgd.

Figure 57A:
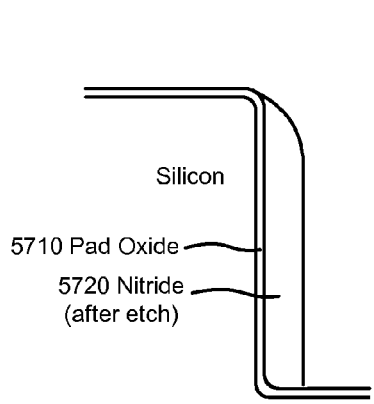
Figure 57B:
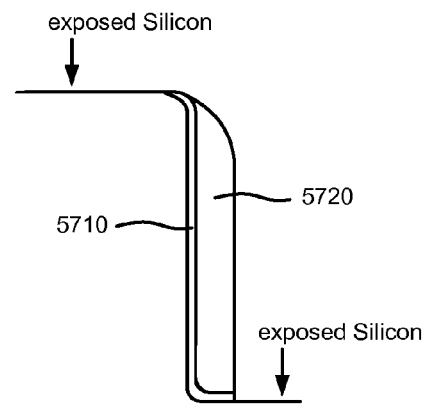
Figure 58A:
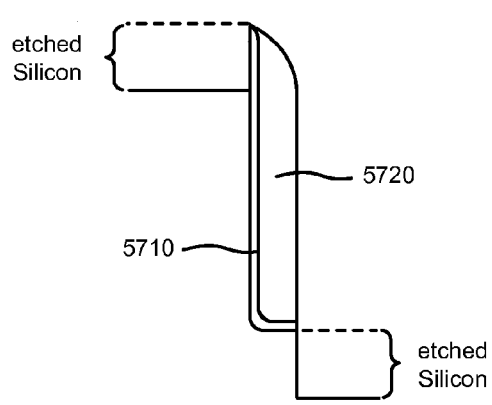
Figure 58B:
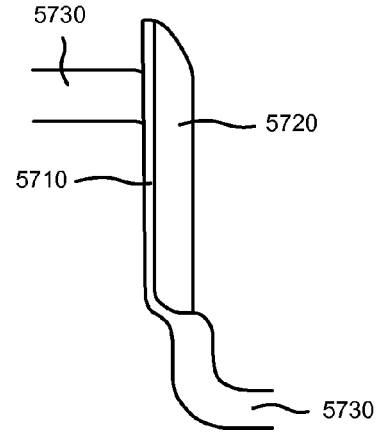
Figure 59:
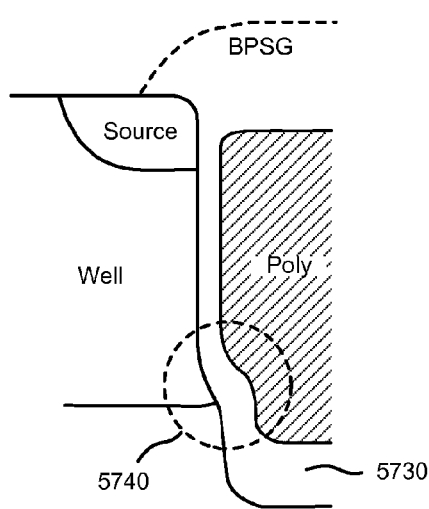

An exemplary embodiment for a method of forming a thick bottom dielectric layer according to this method is shown in FIGS. 57 to 59. FIG. 57A illustrates a simplified and partial cross-section of a trench lined with a thin layer of pad oxide 5710 and nitride layer 5720 after it has been etched to cover only the sidewalls of the trench. This enables the etching of pad oxide 5710 to expose the silicon at the bottom of the trench and top surface of the die as shown in FIG. 57B. This is followed by an anisotropic etch of the exposed silicon resulting in a structure as shown in FIG. 58A, wherein both top silicon and the silicon at the bottom of the trench have been removed to the desired depth. In an alternative embodiment, the silicon on the top silicon can be masked such that during silicon etch, only the bottom of the trench is etched. Next, an oxidation step is performed to grow thick oxide 5730 in locations not covered by nitride layer 5720 resulting in the structure shown in FIG. 58B. The oxide thickness may be, for example, about 1200 Å to 2000 Å. Nitride layer 5720 is then removed and pad oxide 5710 is etched away. The etching of the pad oxide will cause some thinning of thick oxide 5730. The rest of the process can employ the standard flow to form the gate poly and well and source junctions resulting in the exemplary structure shown in FIG. 59.

As shown in FIG. 59, the resulting gate oxide includes a bottom thick layer 5730 that extends along the sidewalls of the trench to above the well junction in region 5740. In some embodiments, wherein the channel doping in the well region alongside the trench is graded with lighter doping near the drain side 5740, this region would normally have a lower threshold voltage compared to the region near the source. Extending the thicker oxide along the sides of the trench overlapping into the channel in region 5740 would therefore not increase the device threshold voltage. That is, this embodiment allows optimizing the well junction depth and sidewall oxide to minimize Qgd without adversely impacting the device on-resistance. Those skilled in this art will appreciate that this method of forming thick oxide at the bottom of trench can be applied to the variety of the devices described above including the shielded gate, dual gate in combination with the various charge balancing structures, as well as any other trench gate devices.

Those skilled in the art will also appreciate that any of the above processes for forming a thick oxide at the bottom of a trench and for IPD can be employed in the process for forming any of the trench gated transistors described herein. Other variations for these processes are possible. For example, as in the case of the process described in connection with FIGS. 47A and 47B, chemical or physical alteration of the silicon can enhance its oxidation rate. According to one such exemplary embodiment, a halogen ion species, e.g., fluorine, bromine, etc., is implanted at a zero angle into the silicon at the bottom of the trench. The implant may occur at an exemplary energy of about 15 KeV or less, at an exemplary dose greater than $1E^{14}$ (e.g., $1E^{15}$ to $5E^{17}$), and at an exemplary temperature between the range of 900° C. to 1150° C. In the halogen implanted areas at the trench bottom oxide grows at an accelerated rate as compared to the trench sidewalls.

A number of the trench devices described above include trench sidewall doping for charge balance purposes. For example, all of the embodiments shown in FIGS. 5B and 5C, and 6 through 9A have some type of trench sidewall doping structure. Sidewall doping techniques are somewhat limited due to the physical constraints of narrow, deep trenches and/or perpendicular sidewall of the trench. Gaseous sources or angled implants can be used to form the trench sidewall doped regions. In one embodiment, an improved trench sidewall doping technique uses plasma doping or pulsed-plasma doping technology. This technology utilizes a pulsed voltage that is applied to a wafer encompassed in a plasma of dopant ions. The applied voltage accelerates the ions from a cathode sheath toward and into the wafer. The applied voltage is pulsed and the duration continued until the desired dose is achieved. This technique enables implementing many of these trench devices with conformal doping techniques. Additionally, the high throughput of this process reduces the overall cost of the manufacturing process.

Those skilled in the art will appreciate that the use of plasma doping or pulsed-plasma doping technology is not limited to trench charge balance structures, but can also be applied to other structures, including trenched termination structures and trenched drain, source or body connections. For example, this methodology can be used to dope the trench sidewalls of shielded trench structures such as those described in connection with FIGS. 4D, 4E, 5B, 5C, 6, 7, 8, and 9A. In addition, this technique can be used to create a uniformly-doped channel region. The penetration of the depletion region into the channel region (p-well junction) when the power device is reverse biased is controlled by the charge concentration on both sides of the junction. When the doping concentration in the epi layer is high, depletion into the junction can allow punch-through to limit the breakdown voltage or require a longer channel length than desired to maintain low on-resistance. To minimize the depletion into the channel, higher channel doping concentration may be required which can cause the threshold to increase. Since the threshold is determined by the peak concentration below the source in a trench MOSFET, a uniform doping concentration in the channel can provide a better trade-off between channel length and breakdown.

Other methods that can be employed to obtain more uniform channel concentration include forming the channel junction using an epitaxial process, using multiple energy implants, and other techniques for creating an abrupt junction. Another technique employs a starting wafer with a lightly doped cap layer. In this way compensation is minimized and up diffusion can be harnessed to create a more uniform channel doping profile.

A trench device can take advantage of the fact that the threshold is set by the channel doping concentration along the trench sidewalls. A process which allows a high doping concentration away from the trenches while maintaining a low threshold can help to prevent the punch-through mechanism. Providing the p-well doping before the gate oxidation process allows for segregation of well p-type impurities, e.g., boron, into the trench oxide to reduce the concentration in the channel, thus reducing the threshold. Combining this with the techniques above can provide a shorter channel length without punch-through.

Figure 60:
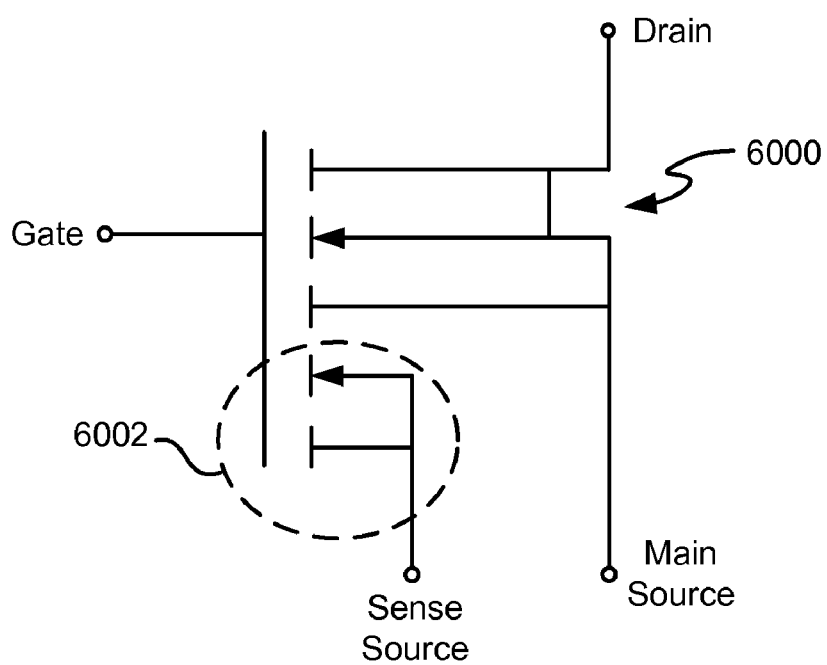
FIG. 60 is a simplified diagram of a MOSFET with a current sense device.

Some power applications require measuring the amount of current flowing through the power transistor. This is typically accomplished by isolating and measuring a portion of the total device current that is then used to extrapolate the total current flowing through the device. The isolated portion of the total device current flows through a current sensing or detecting device that generates a signal which is indicative of the magnitude of the isolated current and which is then used to determine the total device current. This arrangement is commonly known as a current mirror. The current sensing transistor is usually fabricated monolithically with the power device with both devices sharing a common substrate (drain) and gate. FIG. 60 is a simplified diagram of a MOSFET 6000 with a current sense device 6002. The current flowing through the main MOSFET 6000 is divided between the main transistor and current sense portion 6002 in proportion to the active areas of each. The current flowing through the main MOSFET is thus calculated by measuring the current through the sense device and then multiplying it by the ratio of the active areas.

Figure 61A:
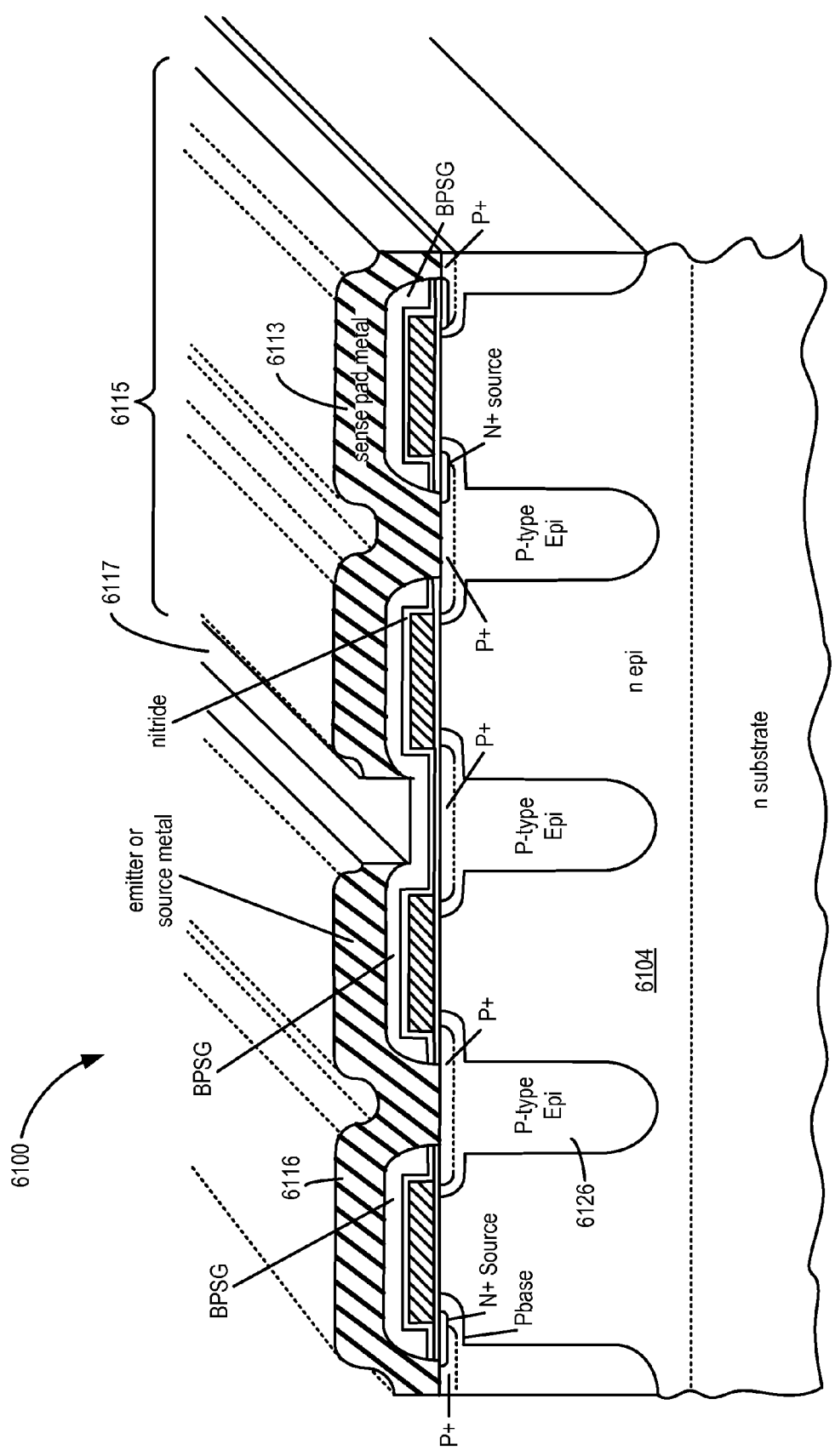
FIG. 61A is an example of a charge balance MOSFET with a planar gate structure and isolated current sense structure.
Figure 61B:
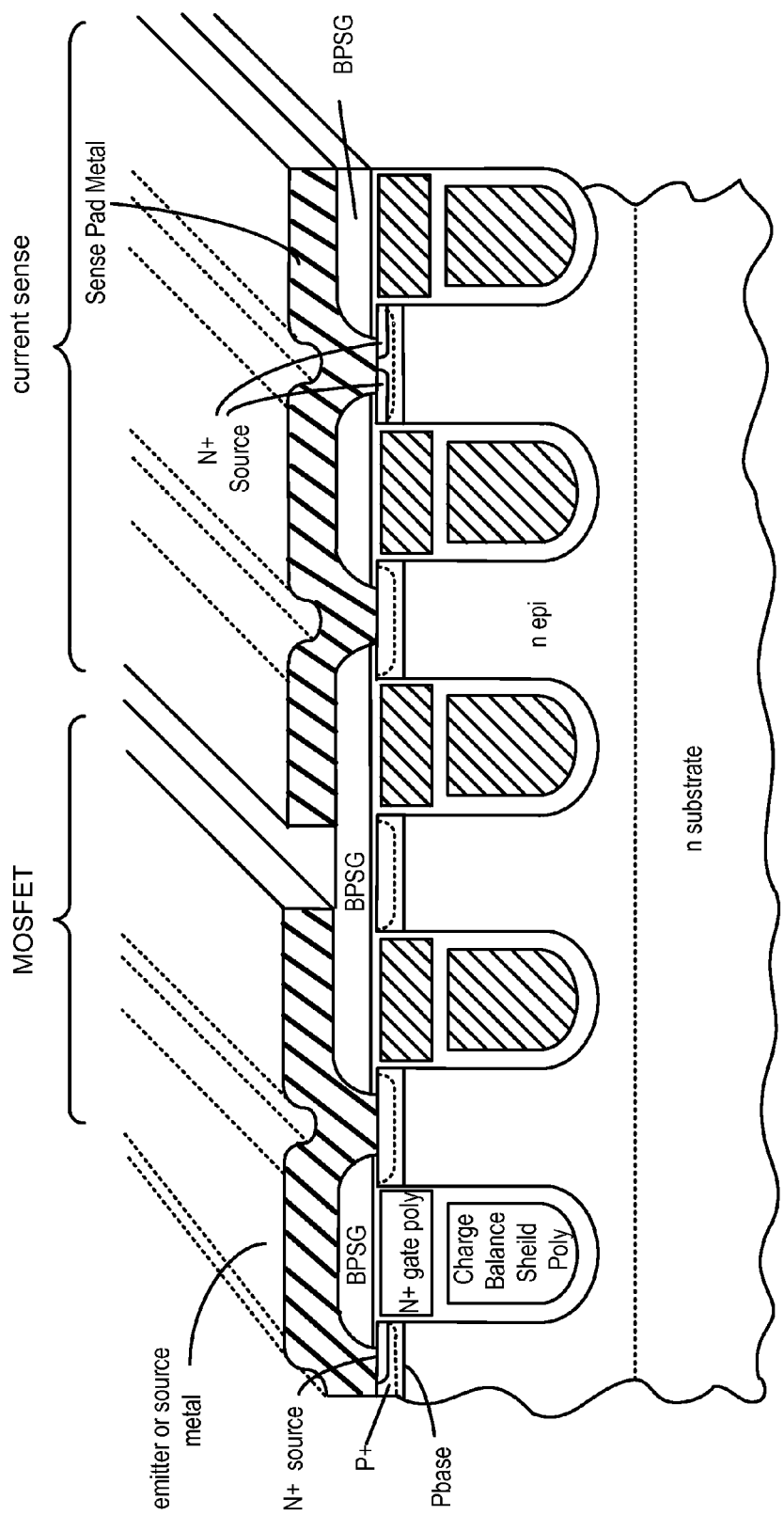
FIG. 61B shows an example of integrating a current sense device with a trench MOSFET.

Various methods for isolating the current sense device from the main device are described in commonly-owned U.S. patent application Ser. No. 10/315,719, entitled "Method of Isolating the Current Sense on Power Devices While Maintaining a Continuous Strip Cell," to Yedinak et al., which is hereby incorporated in its entirety. Embodiments for integrating the sense device along with various power devices, including those with charge balancing structures, are described hereinafter. According to one embodiment, in a power transistor with charge balance structures and a monolithically integrated current sense device, the current sense area is preferably formed with the same continuous MOSFET structure as well as the charge balance structure. Without maintaining continuity in the charge balance structure, the device breakdown voltage will be degraded due to a mismatch in charge causing the voltage supporting region to be not fully depleted. FIG. 61A shows one exemplary embodiment for a charge balance MOSFET 6100 with a planar gate structure and isolated current sense structure 6115. In this embodiment, the charge balance structure includes opposite conductivity (in this example p-type) pillars 6126 formed inside (n-type) drift region 6104. P-type pillars 6126 can be formed, for example, as doped polysilicon or epi filled trenches. As depicted in FIG. 61A, the charge balance structures maintain continuity under current sense structure 6115. Sense pad metal 6113 covering the surface area of current sense device 6115 is electrically separated from source metal 6116 by dielectric region 6117. It is to be understood that current sense devices with similar structures can be integrated with any of the other power devices described herein. For example, FIG. 61B shows an example of how a current sense device can be integrated with a trench MOSFET with shielded gate where charge balancing can be obtained by adjusting the depth of the trench and biasing the shield poly inside the trench.

There are a number of power applications where it is desirable to integrate diodes on the same die as the power transistor. Such applications include temperature sensing, electrostatic discharge (ESD) protection, active clamping, and voltage dividing among others. For temperature sensing, for example, one or more series connected diodes are monolithically integrated with the power transistor whereby the diode's anode and cathode terminals are brought out to separate bond pads, or connected to monolithic control circuit components using conductive interconnections. The temperature is sensed by the change in the diode (or diodes) forward voltage (Vf). For example, with appropriate interconnection to the gate terminal of the power transistor, as the diode Vf drops with temperature, the gate voltage is pulled low reducing the current flowing through the device until the desired temperature is achieved.

Figure 62A:
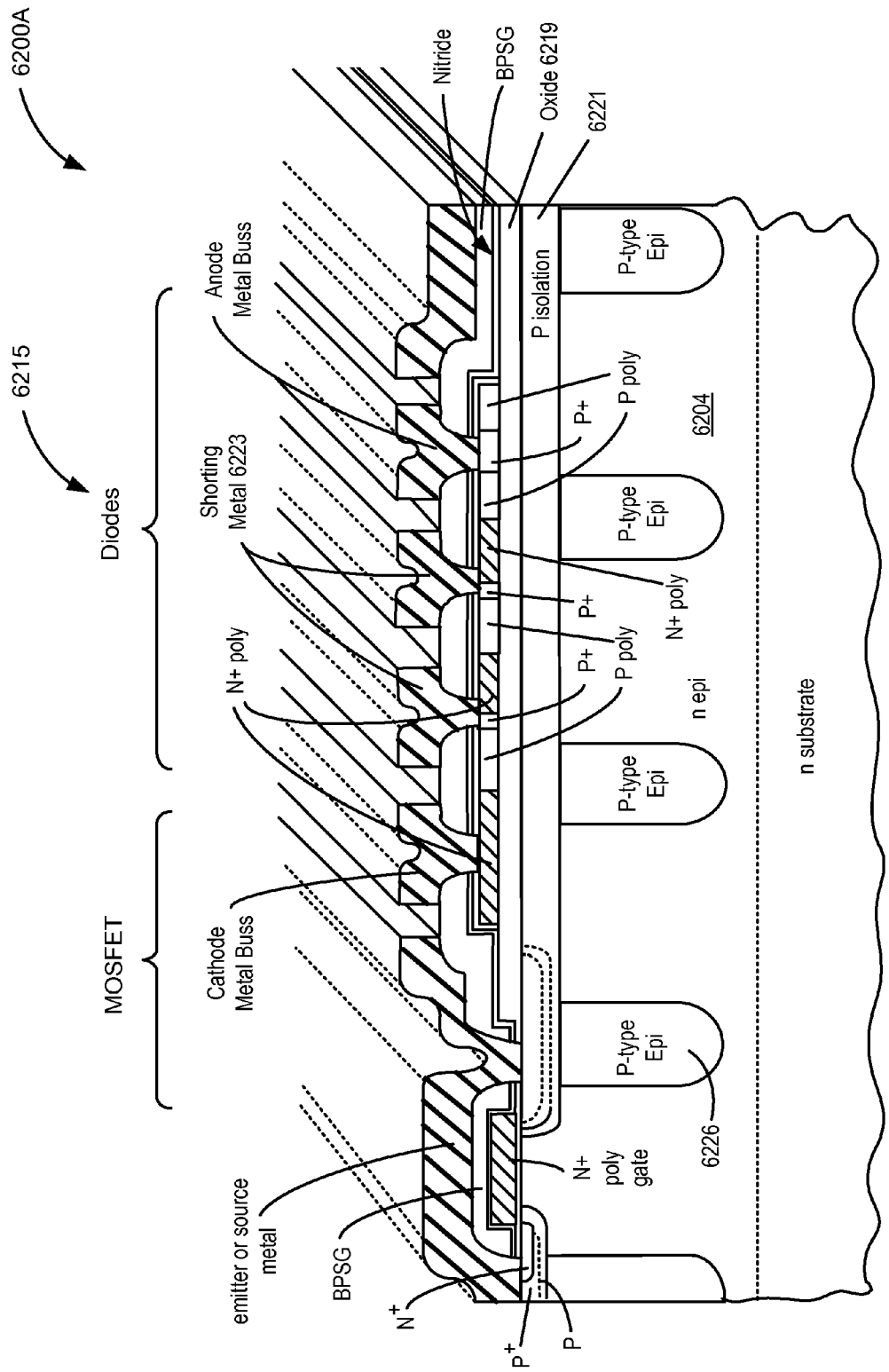
FIGS. 62A-62C show alternative embodiments for a MOSFET with series temperature sensing diodes.
Figure 62B:
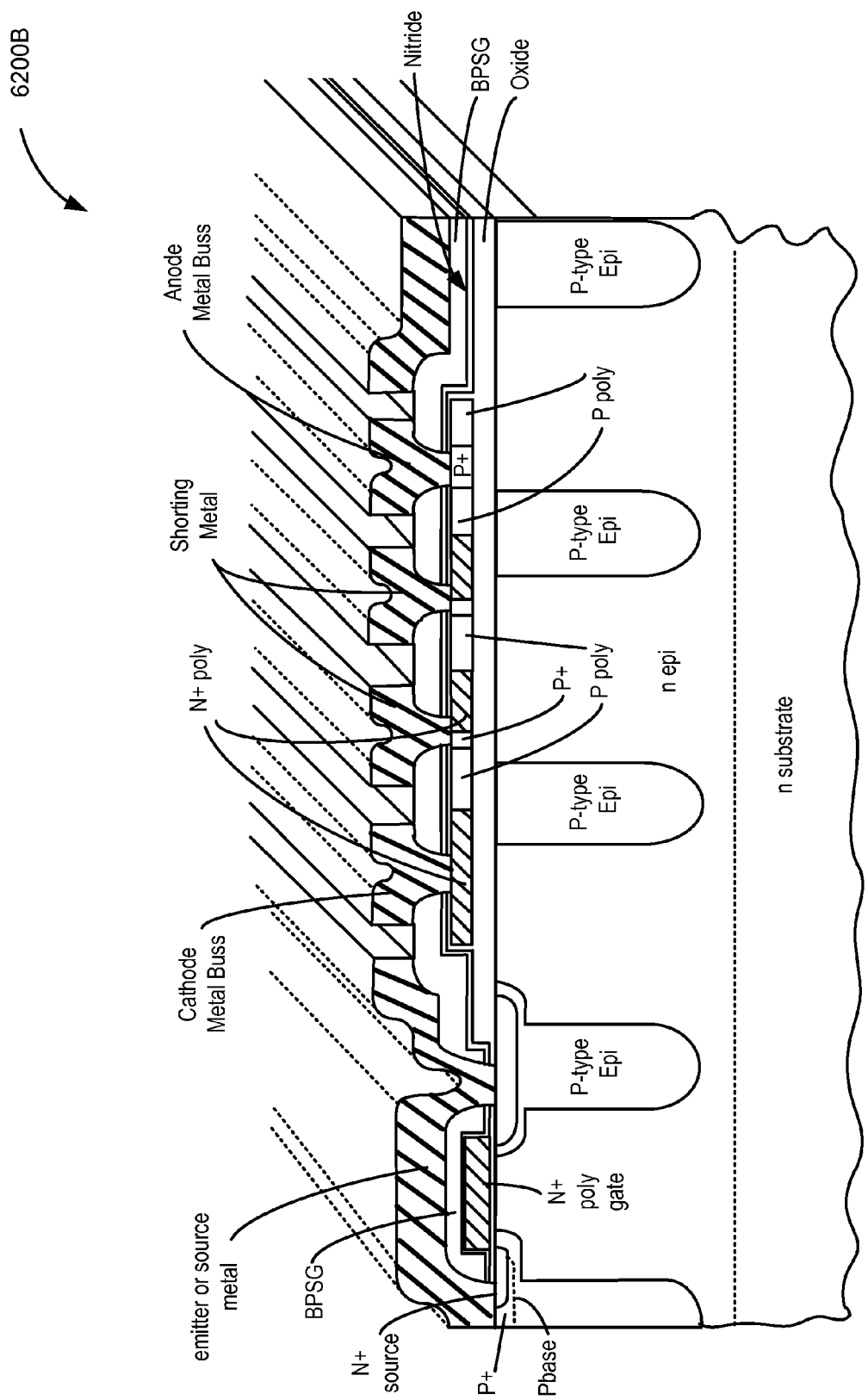
Figure 62C:
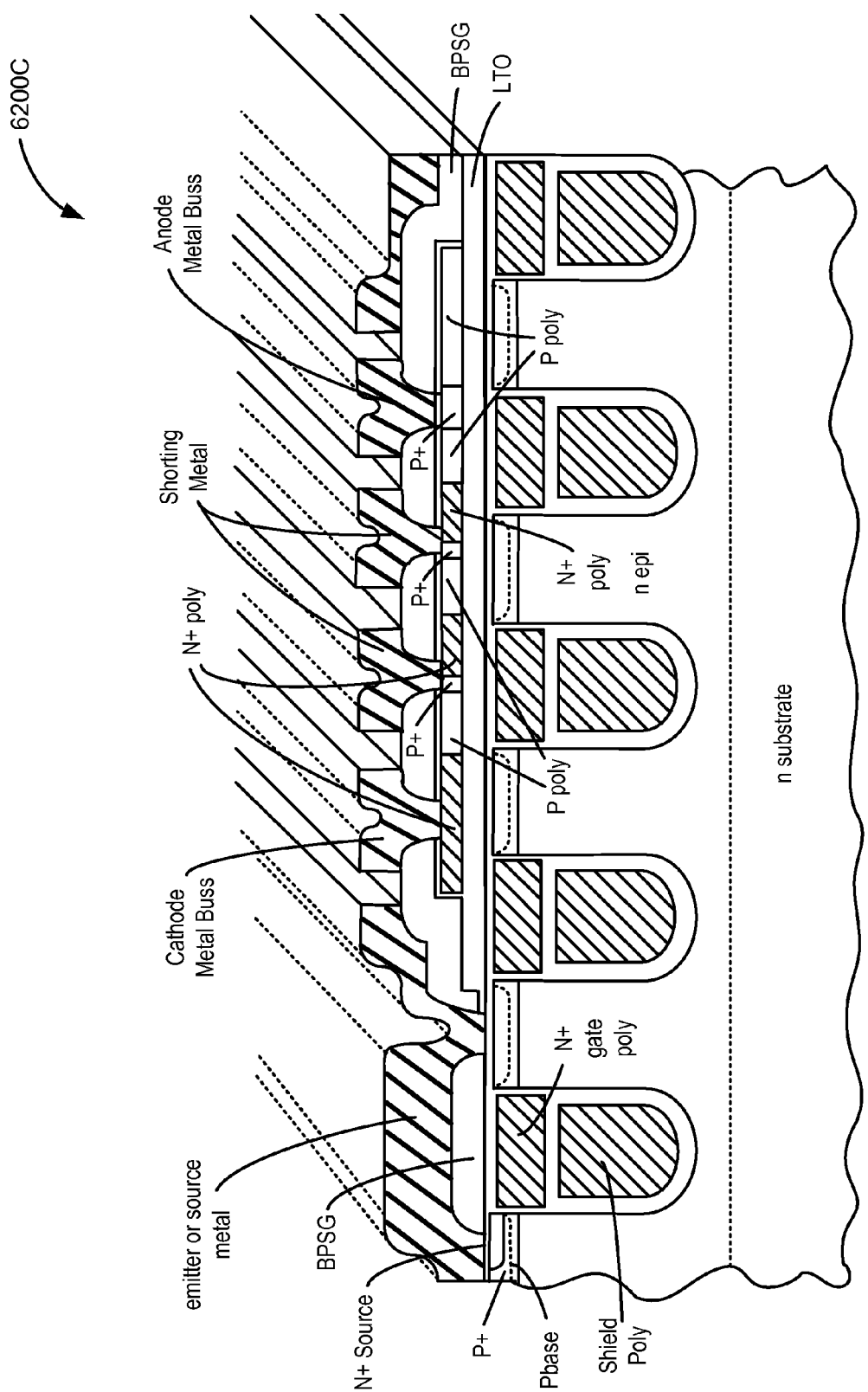

FIG. 62A shows an exemplary embodiment for a MOSFET 6200A with series temperature sensing diodes. MOSFET 6200A includes a diode structure 6215 wherein doped polysilicon with alternating conductivity form three series temperature sensing diodes. In this illustrative embodiment, the MOSFET portion of device 6200A employs p-type epi-filled charge balance trenches forming opposite conductivity regions inside n-type epi drift region 6204. As depicted, the charge balance structure preferably maintains continuity under temperature sense diode structure 6215. The diode structure is formed on top of a field dielectric (oxide) layer 6219 atop the surface of the silicon. A p-type junction isolation region 6221 can be optionally diffused under dielectric layer 6219. A device 6200B without this p-type junction is shown in FIG. 62B. To make sure that series forward biased diodes are obtained, shorting metal 6223 is used to short the P/N+ junctions that are reversed biased. In one embodiment, p+ is implanted and diffused across the junctions to form a N+/P/P+/N+structure where p+ appears under shorting metals 6223 to obtain improved ohmic contact. For the opposite polarity N+ can also be diffused across the N/P+ junction to form P+/N/N+/P+ structure. Again, those skilled in the art will appreciate that this type of temperature sensing diode structure can be employed in any one of the various power devices in combination with many of the other features described herein. FIG. 62C, for example, depicts a MOSFET 6200C with a shielded trench gate structure, where the shield poly can be used for charge balancing.

Figure 63A:
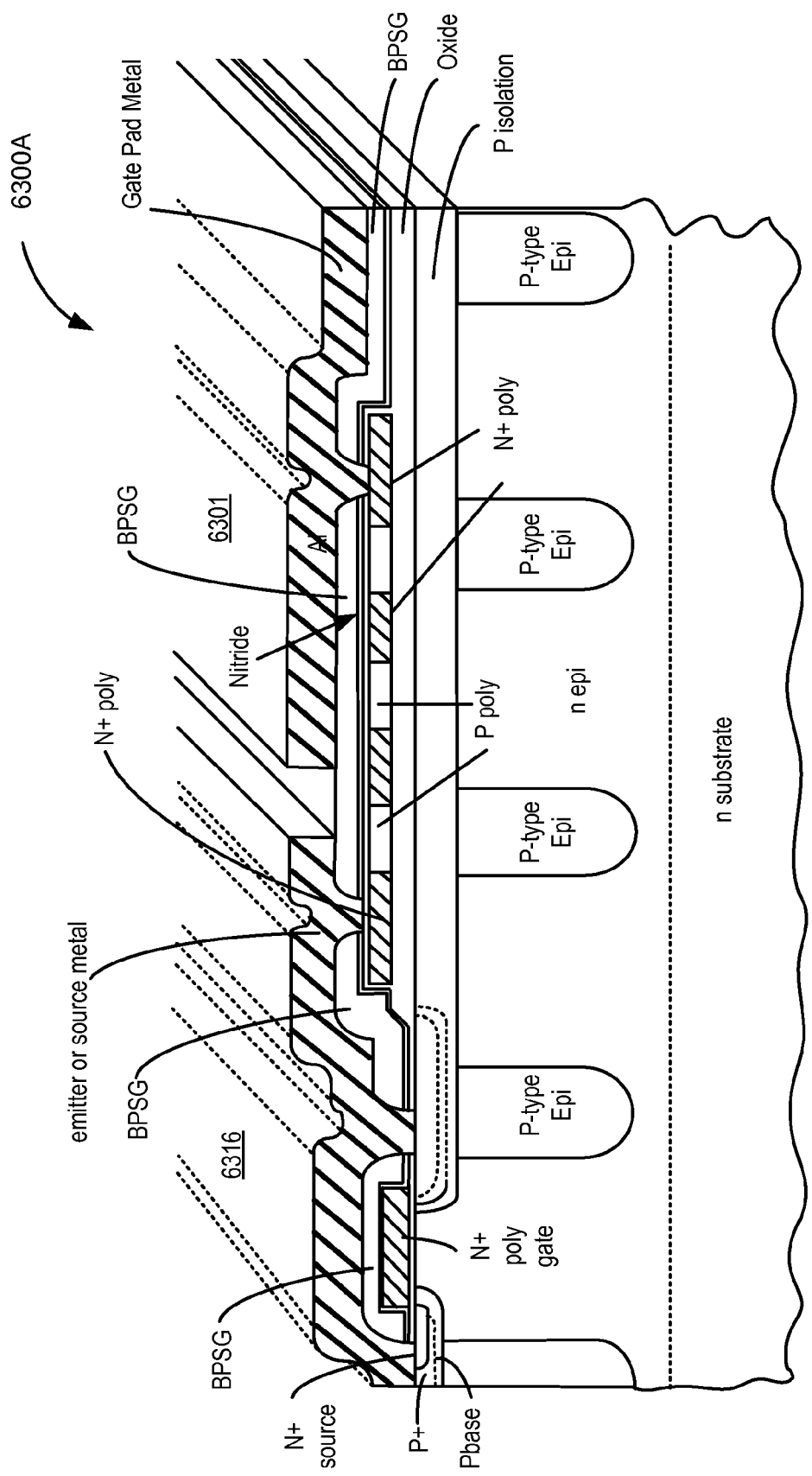
FIGS. 63A and 63B show alternative embodiments for a MOSFET with ESD protection.
Figure 63B:
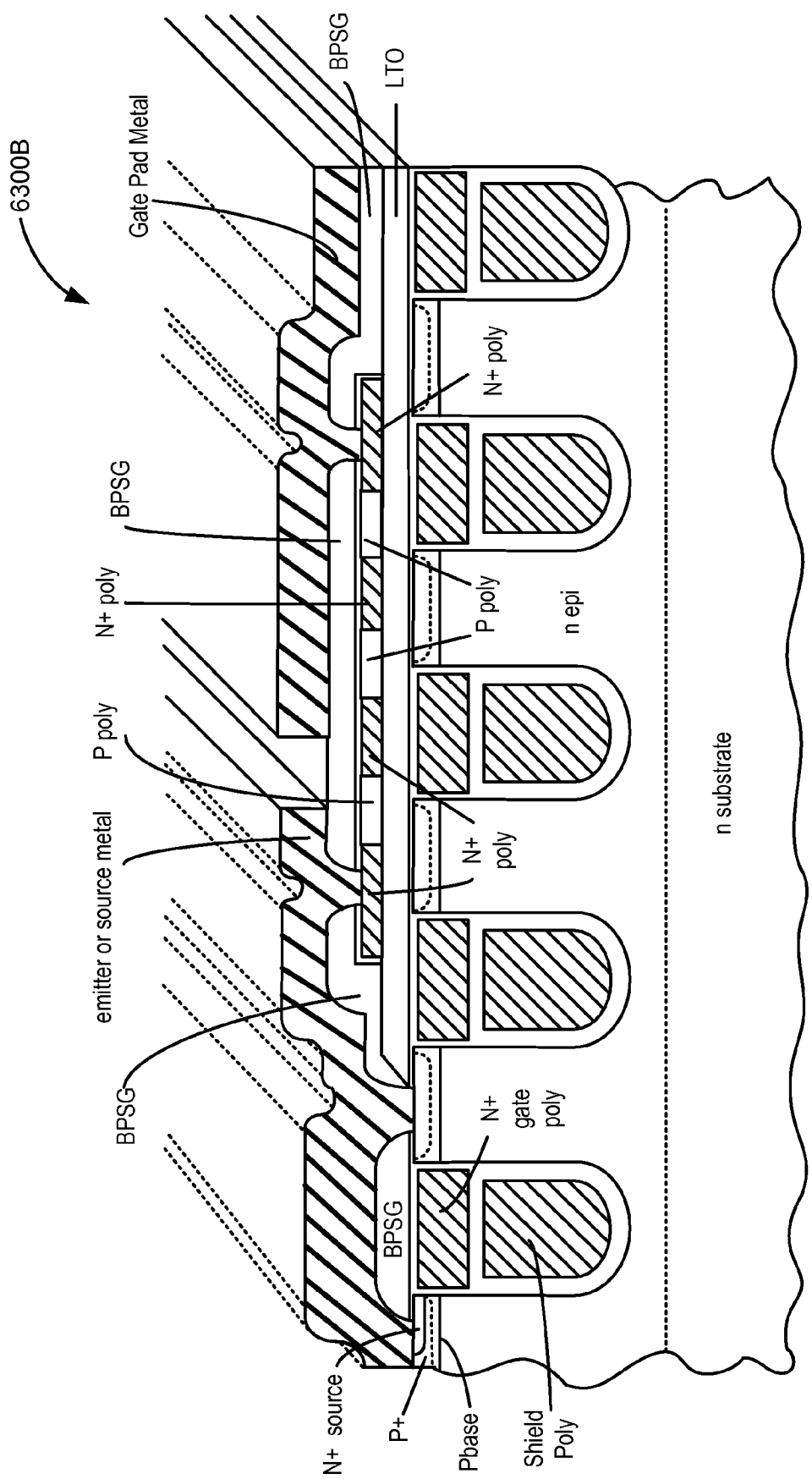

In another embodiment, by employing similar isolation techniques as shown in devices 6200 for temperature sensing diodes, asymmetrical ESD protection is implemented. For ESD protection purposes, one end of the diode structure is electrically connected to the source terminal and the other end to the gate terminal of the device. Alternatively, symmetrical ESD protection is obtained by not shorting any of the back to back N+/P/N+ junctions as shown in FIGS. 63A and 63B. The exemplary MOSFET 6300A shown in FIG. 63A employs a planar gate structure and uses opposite conductivity pillars for charge balancing, while exemplary MOSFET 6300B shown in FIG. 63B is a trench gate device with a shielded gate structure. To prevent non-uniformities in charge balance, the charge balance structure is continued under gate bond pad metal and any other control element bond pads.

Figure 64A:
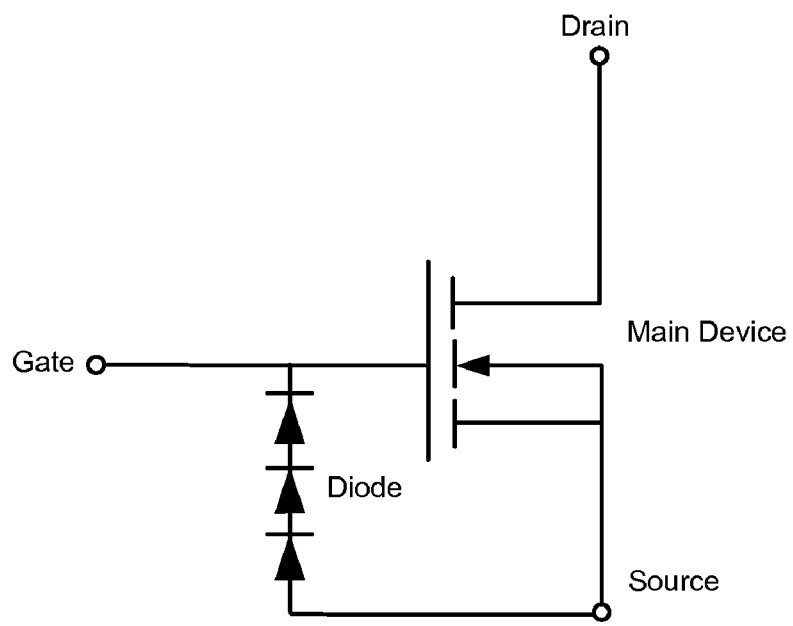
FIGS. 64A-64D show examples of ESD protection circuits.
Figure 64B:
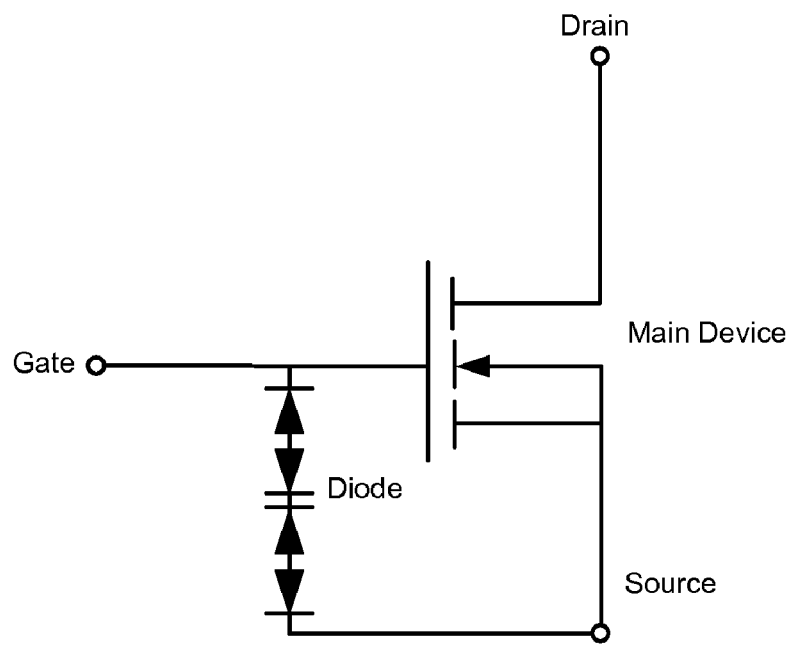
Figure 64C:
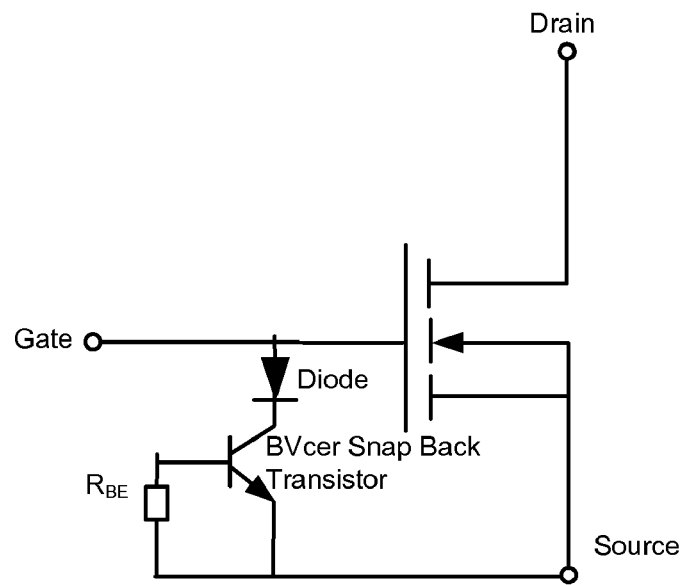
Figure 64D:
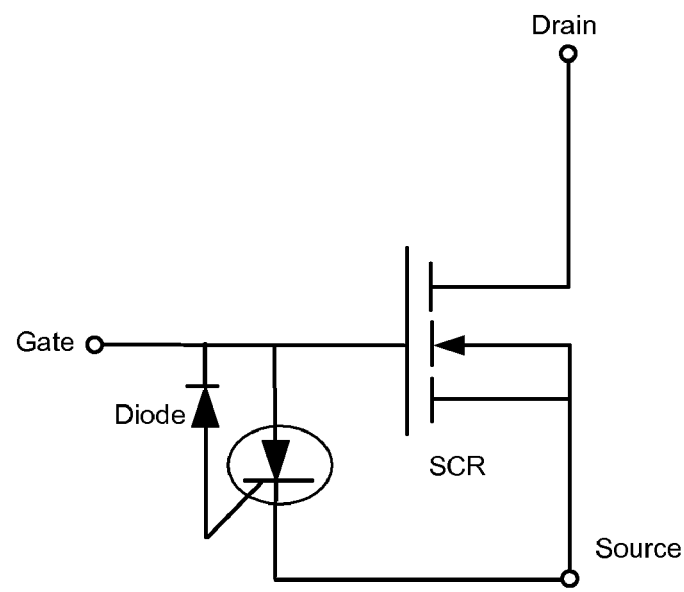

Exemplary ESD protection circuits are shown in FIGS. 64A to 64D wherein the main device, the gate of which is being protected by the diode structures described above, can be any one of the power devices described herein using any one of the charge balancing or other techniques. FIG. 64A shows a simplified diagram for an asymmetrical isolated poly diode ESD protection, while FIG. 64B depicts a standard back to back isolated poly diode ESD protection circuit. The ESD protection circuit shown in FIG. 64C uses an NPN transistor for $BV_{cer}$ snap-back. The subscript "cer" in $BV_{cer}$ refers to a reverse biased collector-emitter bipolar transistor junction in which a connection to the base uses a resistor to control the base current. A low resistance causes most of the emitter current to be removed through the base preventing the emitter-base junction from turning-on, that is, injecting minority carriers back into the collector. The turn-on condition can be set by the resistor value. When carriers are injected back into the collector the sustaining voltage between the emitter and collector is reduced—a phenomenon referred to as "snap-back." The current at which the $BV_{cer}$ snap-back is triggered can be set by adjusting the value of the base-emitter resistor $R_{BE}$. FIG. 64D shows an ESD protection circuit that uses a silicon-controlled rectifier or SCR and diode as shown. By using a gate cathode short structure, the trigger current can be controlled. The diode breakdown voltage can be used to offset the voltage at which the SCR latches. The monolithic diode structure as described above can be employed in any of these and other ESD protection circuits.

In some power applications, an important performance characteristic of a power switching device is its equivalent series resistance or ESR that is a measure of the impedance of the switching terminal or gate. For example, in synchronous buck converters using power MOSFETs, lower ESR helps reduce switching losses. In the case of trench gated MOSFETs, their gate ESR is determined in large part by the dimenstions of the polysilicon filled trenches. For example, the length of the gate trenches may be constrained by package limitations such as the minimum wire bond pad size. It is known that applying a silicide film to polysilicon lowers the resistance of the gate. Implementing silicided poly in trench MOSFETs, however, poses a number of challenges. In typical planar discrete MOS structures, the gate poly can be silicided after the junctions have been implanted and driven to their respective depths. For trench gate devices where the gate poly is recessed, applying silicide becomes more complicated. The use of conventional silicide limits the maximum temperature a wafer can be subjected too post silicide treatment to approximately less than 900° C. This places a significant constraint on the stage of the fabrication process when diffused regions such as sources, drains and wells, are formed. The most typical metal used for silicides is titanium. Other metals such as tungsten, tantalum, cobalt and platinum can also be used allowing a higher thermal budget post silicide processing which provides more processing latitude. The gate ESR can also be reduced by various layout techniques.

Figure 65:
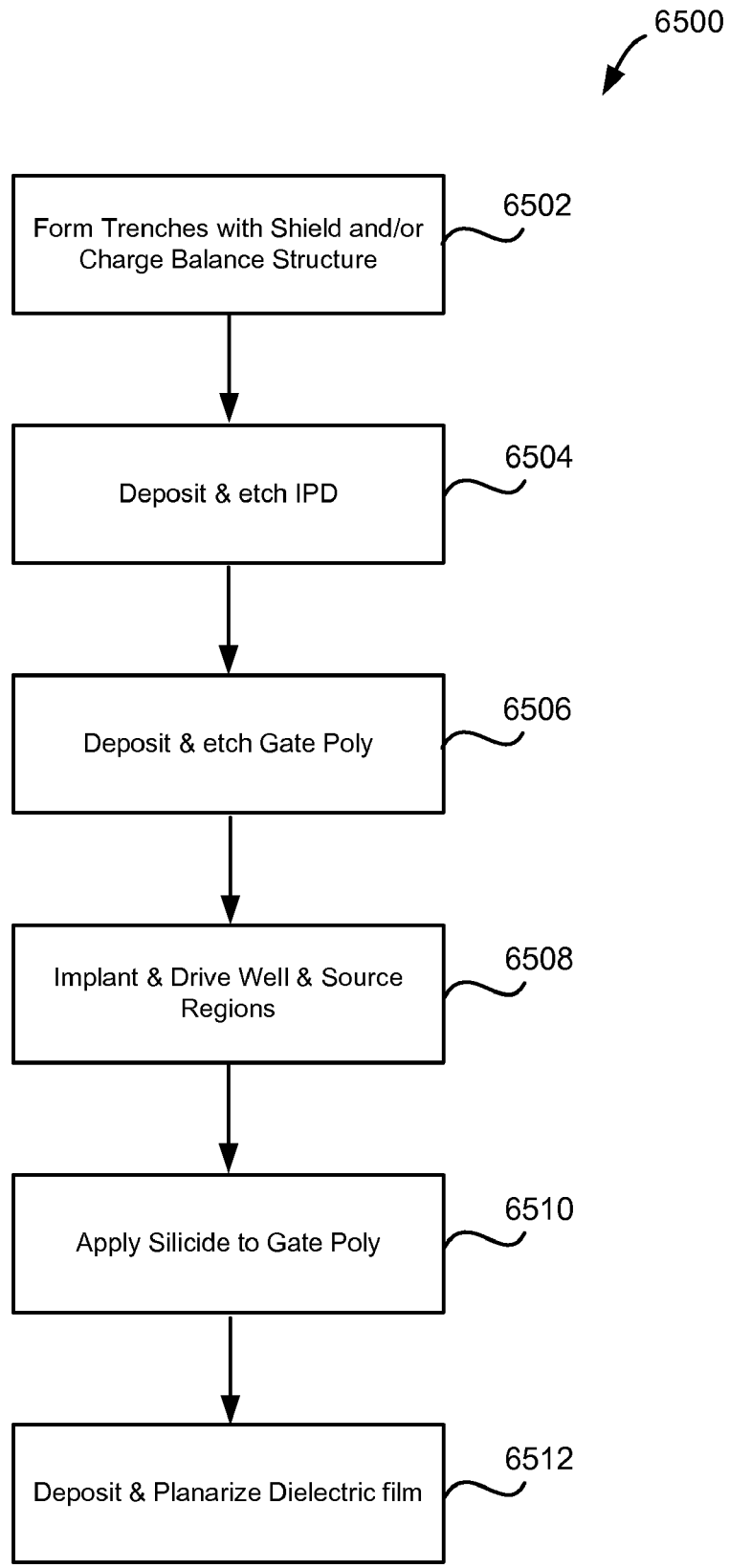
FIG. 65 shows an exemplary process for forming charge balanced power devices with lower ESR.

Described below are various embodiments for forming charge balanced power switching devices with lower ESR. In one embodiment shown in FIG. 65, a process 6500 includes forming trenches with a lower electrode formed at a lower portion of the trench for shielding and/or charge balance purposes (step 6502). This is followed by depositing and etching an IPD layer (step 6504). The IPD layer can be formed by known processes. Alternatively, any one of the processes described above in connection with FIGS. 45 to 50 can be used to form the IPD layer. Next, an upper electrode or gate poly is deposited and etched at step 6506 using known processes. This is followed by implanting and driving the well and source regions (step 6508). It is after step 6508 that silicide is applied to the gate poly at step 6510. This is then followed by deposition and planarization of a dielectric at step 6512. In a variation of this process, step 6512, where the dielectric field is deposited and planarized, is preformed first and then contact holes are opened to reach the source/body and the gate, after which silicide contacts are formed. These two embodiments rely on the heavy body implant region being activated by a low temperature anneal that is lower than the silicide film transition point.

In another embodiment, the poly gate is replaced by a metal gate. According to this embodiment, a metal gate is formed by depositing, e.g., Ti, using a collimated source to improve fill capability in a trench structure. After applying the metal gate and once the junctions have been implanted and driven, dielectric options include HDP and TEOS to isolate the gate from source/body contacts. In alternative embodiments, a damascene or dual damascene approach with various metal options from aluminum to copper top-metals is used to form the gate terminal.

Figure 66A:
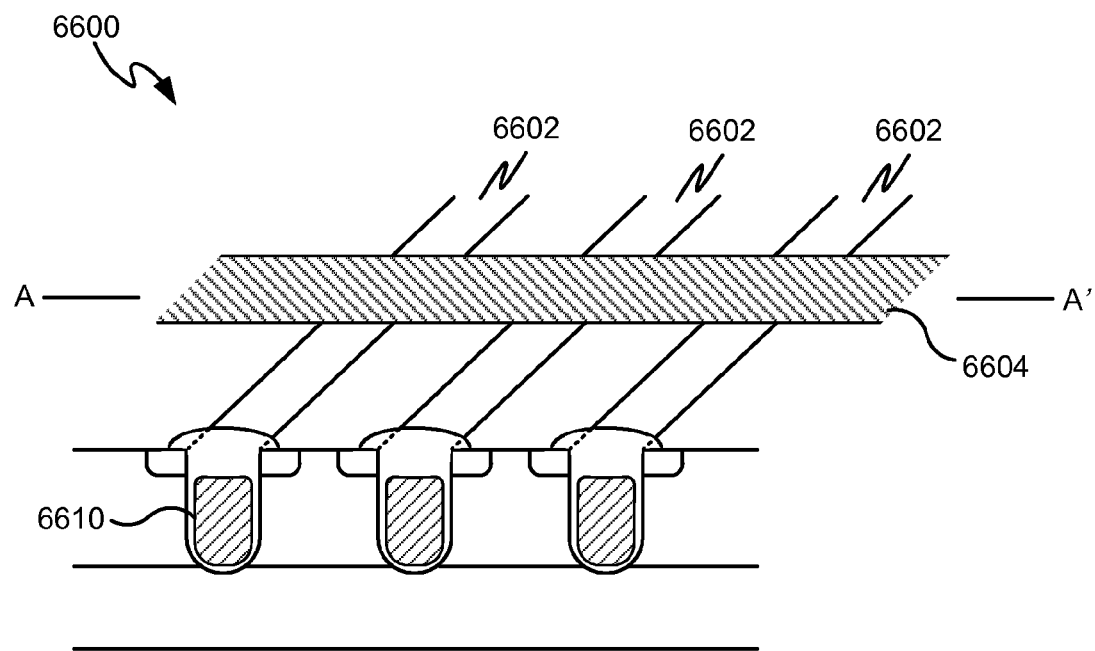
FIGS. 66A and 66B show a layout technique to reduce ESR.
Figure 66B:
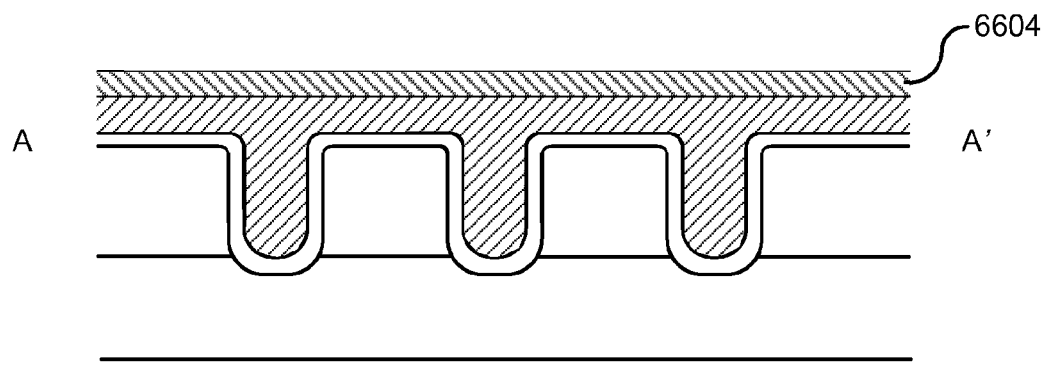

The layout of the gate conductor can also affect the gate ESR and overall switching speed of the device. In another embodiment shown in FIGS. 66A and 66B, a layout technique combines perpendicular silicided surface poly stripes with recessed trench poly to reduce gate ESR. Referring to FIG. 66A, a highly simplified device structure 6600 is shown wherein a silicide-coated poly line 6604 extends along the surface of the silicon perpendicular to trench stripes 6602. FIG. 66B illustrates a simplified cross-sectional view of device 6600 along the AA' axis. Silicided poly line 6604 contacts the gate poly at intersections with trenches. Multiple silicided poly lines 6604 can extend atop the silicon surface to reduce the resistivity of the gate electrode. This and other layout techniques made possible by, for example, processes having two or more layers of interconnect, can be employed to improve gate ESR in any one of the trench gate devices described herein.

Circuit Applications

With the dramatic reduction in the device on-resistance as provided by, for example, the various device and process techniques described herein, the chip area occupied by the power device can be reduced. As a result, the monolithic integration of these high-voltage devices with low voltage logic and control circuitry becomes more viable. In typical circuit applications, the types of functions that can be integrated on the same die as the power transistor include power control, sensing, protection and interface circuitry. An important consideration in the monolithic integration of power devices with other circuitry is the technique used to electrically isolate the high voltage power devices from the low voltage logic or control circuitry. There exist a number of known approaches to achieve this, including junction isolation, dielectric isolation, silicon-on-insulator, and the like.

Figure 67:
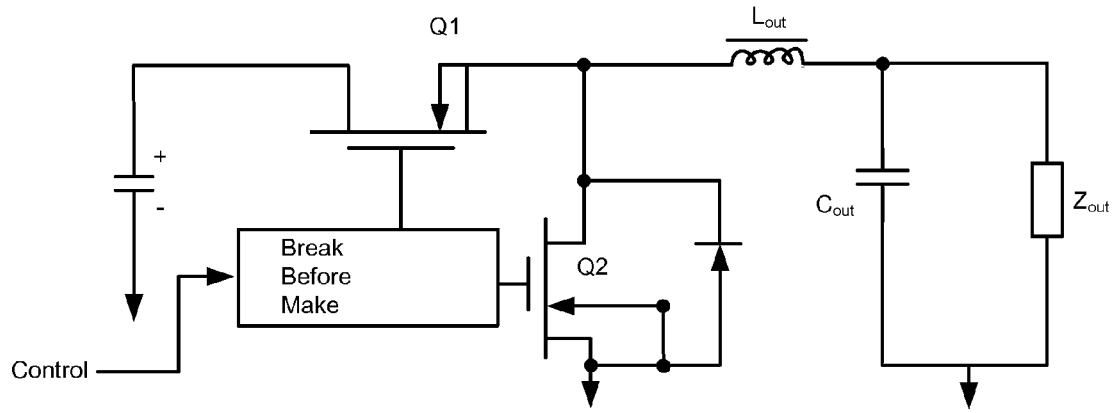
FIG. 67 shows a DC-DC converter circuit using power switching.
Figure 68:
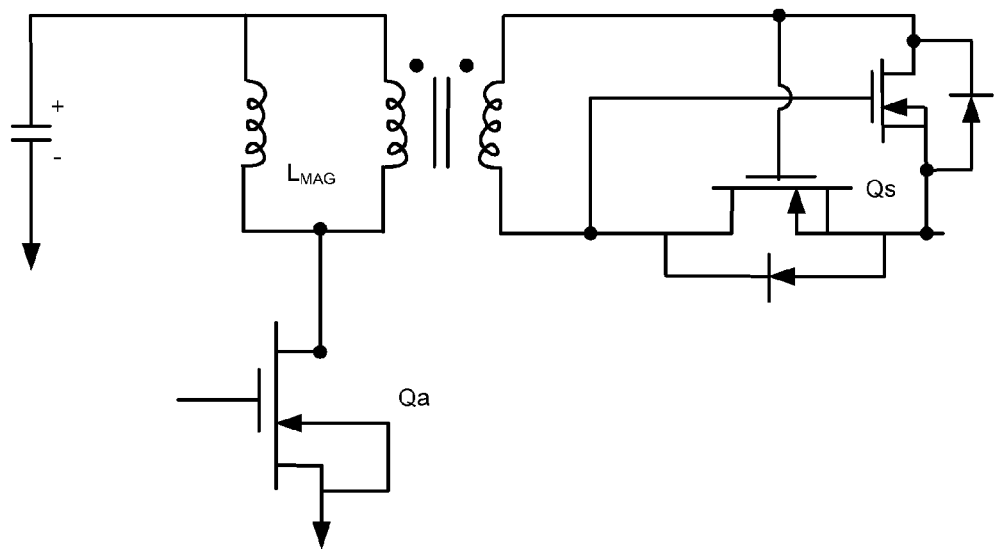
FIG. 68 shows another DC-DC converter circuit using power switching.

Below, a number of circuit applications for power switching will be described wherein the various circuit components can be integrated on the same chip to varying degrees. FIG. 67 depicts a synchronous buck converter (DC-DC converter) requiring lower voltage devices. In this circuit, n-channel MOSFET Q1, commonly referred to as the "high side switch," is designed to have a moderately low on-resistance but fast switching speed to minimize the power losses. MOSFET Q2, commonly referred to as the low side switch, is designed to have a very low on-resistance and moderately high switching speed. FIG. 68 depicts another DC-DC converter that is more suitable for medium to high voltage devices. In this circuit, the main switching device Qa exhibits fast switching speed, and high blocking voltage. Because this circuit uses a transformer, lower current flows through transistor Qa which allows it to have a moderately low on-resistance. For the synchronous rectifier Qs, a MOSFET with low to very low on-resistance, fast switching speed, very low reverse recovery charge, and low inter-electrode capacitance can be used. Other embodiments and improvements to such DC-DC converters are described in greater detail in commonly-assigned U.S. patent application Ser. No. 10/222,481, entitled "Method and Circuit for Reducing Losses in DC-DC Converters," by Elbanhawy, which is hereby incorporated in its entirety.

Any one of the various power device structures described above can be used to implement the MOSFETs in the converter circuits of FIGS. 67 and 68. The dual gate MOSFET of the type shown in FIG. 4A, for example, is one type of device that offers particular advantages when used in implementing synchronous buck converters. In one embodiment, a special drive scheme takes advantage of all the features offered by the dual gate MOSFET. An example of this embodiment is shown in FIG. 69, wherein a first gate terminal G2 of high side MOSFET Q1 has its potential determined by the circuit made up of diode D1, resistors R1 and R2, and capacitor C1. The fixed potential at gate electrode G2 of Q1 can be adjusted for best Qgd to optimize the switching time of the transistor. The second gate terminal G1 of high side switch transistor Q1 receives the normal gate drive signal from the pulse width modulated (PWM) controller/driver (not shown). The two gate electrodes of the low side switch transistor Q2 are similarly driven, as shown.

In an alternative embodiment, an example of which is shown in FIG. 70A, both gate electrodes of the high side switch are driven separately to further optimize the performance of the circuit. According to this embodiment, different waveforms drive gate terminals G1 and G2 of high side switch Q1 to achieve best switching speed during transitions and best on-resistance $R_{DSon}$ during the rest of the cycle. In the example shown, a voltage Va of about 5 volts during switching delivers very low Qgd to the gate of high side switch Q1 resulting in high switching speed, but $R_{DSon}$ before and after transitions td1 and td2 is not at its lowest value. This, however, does not adversely impact the operation of the circuit since during switching $R_{DSon}$ is not a significant loss contributor. To ensure the lowest $R_{DSon}$ during the rest of the pulse duration, the potential $V_{g2}$ at gate terminal G2 is driven to a second voltage Vb higher than Va during time period $t_p$ as shown in the timing diagram of FIG. 70B. This driving scheme results in optimal efficiency. Variations on these driving schemes are described in greater detail in commonly-assigned U.S. patent application Ser. No. 10/686,859, entitled "Driver for Dual Gate MOSFETs," by Elbanhawy, which is hereby incorporated by reference in its entirety.

Packaging Technologies

An important consideration for all power semiconductor devices is the housing or package that is used to connect the device to the circuit. The semiconductor die is typically attached to a metal pad using either metal bonding layers such as solder or metal filled epoxy adhesives. Wires are usually bonded to the top surface of the chip and then to leads that protrude through the molded body. The assembly is then mounted to a circuit board. The housing provides both electrical and thermal connections between the semiconductor chip and the electronic system and its environment. Low parasitic resistance, capacitance, and inductance are desired electrical features for the housing that enable a better interface to the chip.

Improvements to the packaging technology have been proposed that focus on reducing resistance and inductance in the package. In certain package technologies, solder balls or copper studs are distributed on the relatively thin (e.g., 2-5 µm) metal surface of the chip. By distributing the metal connections on the large area metal surface, the current path in the metal is made shorter and metal resistance is reduced. If the bumped side of the chip is connected to a copper lead frame or to the copper traces on a printed circuit board the resistance of the power device is reduced compared to a wire bonded solution.

Figure 71:
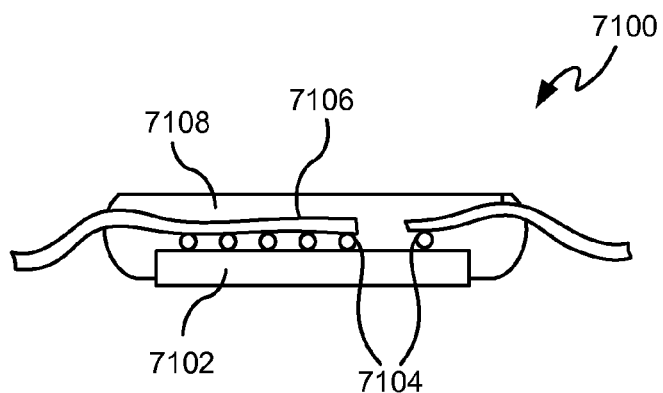
FIG. 71 is a simplified cross-sectional view of a molded package.
Figure 72:
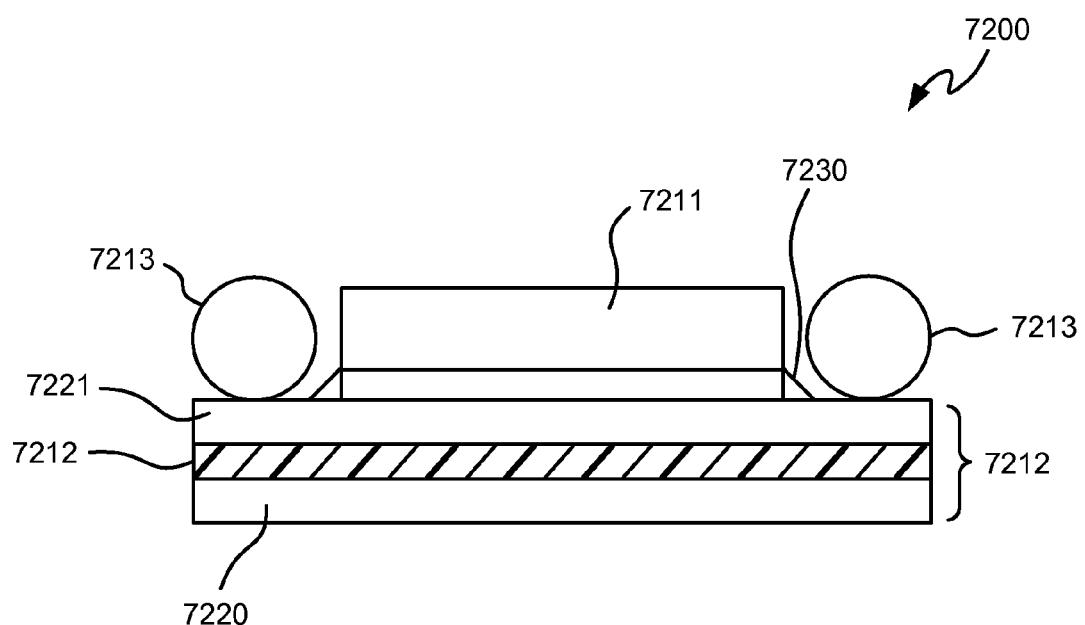
FIG. 72 is a simplified cross-sectional view of an unmolded package.

FIGS. 71 and 72 illustrate simplified cross-sectional views of molded and unmolded packages, respectively, using solder balls or copper studs that connect lead frames to the metal surface of the chip. Molded package 7100 as shown in FIG. 71 includes a leadframe 7106 that connects to a first side of a die 7102 via solder balls or copper studs 7104. The second side of die 7102 which faces away from leadframe 7106 is exposed through a molding material 7108. In typical vertical power transistors, the second side of the die forms the drain terminal. The second side of the die can form a direct electrical connection to a pad on the circuit board, thus providing a low resistance thermal and electrical path for the die. This type of package and variations thereof are described in greater detail in commonly-assigned U.S. patent application Ser. No. 10/607,633, entitled "Flip Chip in Leaded Molded Package and Method of Manufacture Thereof," by Joshi et al., which is hereby incorporated in its entirety.

FIG. 72 shows an unmolded embodiment of a package 7200. In the exemplary embodiment shown in FIG. 72, package 7200 has a multi-layer substrate 7212 that includes a base layer 7220 comprising, e.g. metal, and a metal layer 7221 separated by an insulating layer 7222. Solder structures 7213 (e.g., solder balls) are attached to substrate 7212. A die 7211 is attached to substrate 7212, with solder structures 7213 disposed around the die. Die 7211 can be coupled to substrate 7212 with a die attach material such as solder 7230. After the illustrated package is formed, it is flipped over and mounted onto a circuit board (not shown) or other circuit substrate. In embodiments where a vertical power transistor is fabricated on die 7211, solder balls 7230 form the drain terminal connection and the chip surface forms the source terminal. The reverse connection is also possible by reversing the connection of die 7211 to substrate 7212. As shown, package 7200 is thin and unmolded as a molding material is not needed. Various embodiments for unmolded packages of this type are described in greater detail in commonly-assigned U.S. patent application Ser. No. 10/235,249, entitled "Unmolded Package for a Semiconductor Device," by Joshi, which is hereby incorporated in its entirety.

Alternative methods in which the top surface of the chip is connected directly to the copper by either solder or conductive epoxy have been proposed. Because the stress induced between the copper and silicon chip increases with the area of the chip, the direct connection method may be limited since the solder or epoxy interface can only be stressed so much before breaking. Bumps, on the other hand, allow for more displacement before breaking and have been demonstrated to work with very large chips.

Another important consideration in package design is heat dissipation. Improvements in the power semiconductor performance often result in a smaller chip area. If the power dissipation in the chip does not decrease, the heat energy concentrates in a smaller area that can result in a higher temperature and degraded reliability. Means to increase the heat transfer rate out of the package include reducing the number of thermal interfaces, using materials with higher thermal conductivity, and reducing the thickness of the layers such as silicon, solder, die attach, and die attach pad. Commonly-assigned U.S. Pat. No. 6,566,749, to Rajeev Joshi, entitled "Semiconductor Die Package with Improved Thermal and Electrical Performance," which is hereby incorporated in its entirety, discusses solutions to the problems of heat dissipation, especially for dies including vertical power MOSFETs for RF applications. Other techniques for improving overall package performance are described in greater detail in commonly-assigned U.S. Pat. Nos. 6,133,634, and 6,469,384, both to Rajeev Joshi, as well as U.S. patent application Ser. No. 10/271,654, entitled "Thin Thermally Enhanced Flip Chip in a Leaded Molded Package," to Joshi et al. It is to be understood that any one of the various power devices described herein can be housed in any of the packages described herein or any other suitable package.

Using more surfaces of the housing for heat removal also increases the ability of the housing to maintain a lower temperature such as thermal interfaces on both the top and bottom of the housing. Increased surface area combined with airflow around those surfaces increases the heat removal rate. The housing design could also enable easy interface with an external heat sink. While thermal conduction and infrared radiation techniques are the common methods, application of alternate cooling methods are possible. For example, thermionic emission as described in commonly-assigned U.S. patent application Ser. No. 10/408,471, entitled "Power Circuitry With A Thermionic Cooling System," by Reno Rossetti, which is hereby incorporated by reference, is one method of heat removal that can be used to cool down power devices.

Integration of other logic circuitry including power delivery and control functions in a single package presents additional challenges. For one, the housing requires more pins to interface with other electronic functions. The package should allow for both high current power interconnects in the package and low current signal interconnections. Various packaging technologies that can address these challenges include chip-to-chip wire bonding to eliminate special interface pads, chip-on-chip to save space inside the housing, and multi-chip modules that allow distinctive silicon technologies to be incorporated into a single electronic function. Various embodiments for multi-chip package techniques are described in commonly-assigned U.S. patent application Ser. No. 09/730,932, entitled "Stacked Package Using Flip Chip in Leaded Molded Package Technology," by Rajeev Joshi, and No. 10/330,741, entitled "Multichip Module Including Substrate with an Array of Interconnect Structures," also by Rajeev Joshi, both of which are hereby incorporated by reference in their entirety.

While the above provides a complete description of the preferred embodiments of the invention, many alternatives, modifications, and equivalents are possible. For example, many of the charge balancing techniques are described herein in the context of a MOSFET and in particular a trench gated MOSFET. Those skilled in the art will appreciate that the same techniques can apply to other types of devices, including IGBTs, thyristors, diodes and planar MOSFETs, as well as lateral devices. For this and other reasons, therefore, the above description should not be taken as limiting the scope of the invention, which is defined by the appended claims.

What is claimed is:

1. A semiconductor device comprising:
a drift region of a first conductivity type;
a well region extending above the drift region and having a second conductivity type opposite the first conductivity type;
an active trench extending through the well region and into the drift region, the active trench having its sidewalls and bottom lined with dielectric material, and substantially filled with a first conductive layer forming an upper electrode and a second conductive layer forming a lower electrode, the upper electrode being disposed above the lower electrode and separated therefrom by inter-electrode dielectric material;
source regions having the first conductivity type formed in the well region adjacent the active trench;
a first termination trench extending below the well region and disposed at an outer edge of an active region of the device;
wherein the first termination trench is lined with a layer of dielectric material that is thicker than the dielectric material lining the sidewalls of the active trench, and the termination trench comprises a conductive material; and
wherein the conductive material inside the first termination trench is buried under dielectric material in a lower portion of the termination trench.

2. The semiconductor device of claim 1 wherein the conductive material inside the first termination trench electrically couples to source metal.

3. The semiconductor device of claim 1 wherein the first termination trench is substantially filled with dielectric material.

4. The semiconductor device of claim 1 wherein a first width of a mesa formed between the first termination trench and an adjacent active trench is different than a second width of a mesa formed between two active trenches.

5. The semiconductor device of claim 1 wherein the first termination trench surrounds an active area of the device in the shape of a ring.

6. The semiconductor device of claim 5 further comprising a second termination trench that surrounds the active area of the device outside the first termination trench.

7. The semiconductor device of claim 6 wherein a distance S1 between the first and second termination trenches is approximately twice a distance S2 between the first termination trench and an end of the active trench.

* * * * *